United States Patent
Negishi et al.

(10) Patent No.: US 9,329,433 B2
(45) Date of Patent: May 3, 2016

(54) LIGHT-EMITTING DEVICE MANUFACTURING METHOD, LIGHT-EMITTING DEVICE, LIGHTING DEVICE, BACKLIGHT, LIQUID-CRYSTAL PANEL, DISPLAY DEVICE, DISPLAY DEVICE MANUFACTURING METHOD, DISPLAY DEVICE DRIVE METHOD AND LIQUID-CRYSTAL DISPLAY DEVICE

(75) Inventors: Tetsu Negishi, Osaka (JP); Akihide Shibata, Osaka (JP); Kenji Komiya, Osaka (JP); Fumiyoshi Yoshioka, Osaka (JP); Hiroshi Iwata, Osaka (JP); Akira Takahashi, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 68 days.

(21) Appl. No.: 13/634,030
(22) PCT Filed: Feb. 22, 2011
(86) PCT No.: PCT/JP2011/053792
§ 371 (c)(1), (2), (4) Date: Sep. 11, 2012
(87) PCT Pub. No.: WO2011/111516
PCT Pub. Date: Sep. 15, 2011

(65) Prior Publication Data
US 2013/0027623 A1    Jan. 31, 2013

(30) Foreign Application Priority Data

Mar. 12, 2010 (JP) .................... 2010-055953
Mar. 19, 2010 (JP) .................... 2010-063449
Mar. 30, 2010 (JP) .................... 2010-078690
May 17, 2010 (JP) .................... 2010-113318
Feb. 1, 2011 (JP) .................... 2011-019919

(51) Int. Cl.
*H01J 9/24* (2006.01)
*G02F 1/1335* (2006.01)
(Continued)

(52) U.S. Cl.
CPC .......... *G02F 1/133603* (2013.01); *H01L 24/95* (2013.01); *H01L 25/0753* (2013.01);
(Continued)

(58) Field of Classification Search
CPC .............. H01L 25/0655; H01L 51/003; H01L 2221/10; H05B 33/10
USPC ................................. 445/23, 46, 51
See application file for complete search history.

(56) References Cited

U.S. PATENT DOCUMENTS 5,265,792 A    11/1993    Harrah et al.
6,531,328 B1 *    3/2003    Chen .............................. 438/26
(Continued)

FOREIGN PATENT DOCUMENTS

JP    57-45983    3/1982
JP    62-113321    7/1987
(Continued)

OTHER PUBLICATIONS

Sugimoto, M et al. "High-Output White LED Light Source," *Matsushita Electric Works Technical Report* 53 (1): 4-9. (Translation of Abstract).
(Continued)

*Primary Examiner* — Andrew Coughlin
(74) *Attorney, Agent, or Firm* — Morrison & Foerster LLP

(57) ABSTRACT

A metal line 731 is formed in a linear area S of an insulative substrate 720, and moreover a metal line 732 is formed generally parallel to the metal line 731 with a specified distance thereto. The metal line 731 is connected to an n-type semiconductor core 701 of bar-like structure light-emitting elements 710A to 710D, and the metal line 732 is connected to a p-type semiconductor layer 702. By dividing the insulative substrate 720 into a plurality of divisional substrates, a plurality of light-emitting devices in each of which a plurality of bar-like structure light-emitting elements 710 are placed on the divisional substrates are formed.

20 Claims, 75 Drawing Sheets

(51) Int. Cl.
| | |
|---|---|
| *H01L 25/075* | (2006.01) |
| *H01L 23/00* | (2006.01) |
| *H01L 33/06* | (2010.01) |
| *H01L 33/18* | (2010.01) |
| *H01L 33/20* | (2010.01) |
| *H01L 33/38* | (2010.01) |
| *H01L 33/62* | (2010.01) |

(52) U.S. Cl.
CPC ............... *G02F1/133605* (2013.01); *G02F 2001/133612* (2013.01); *G02F 2001/133614* (2013.01); *G02F 2001/133628* (2013.01); *H01L 33/06* (2013.01); *H01L 33/18* (2013.01); *H01L 33/20* (2013.01); *H01L 33/38* (2013.01); *H01L 33/62* (2013.01); *H01L 2224/48091* (2013.01); *H01L 2224/48227* (2013.01); *H01L 2224/49107* (2013.01); *H01L 2224/73265* (2013.01); *H01L 2924/09701* (2013.01); *H01L 2924/12036* (2013.01); *H01L 2924/12041* (2013.01); *H01L 2924/15787* (2013.01); *H01L 2924/15788* (2013.01); *H01L 2924/3025* (2013.01); *H01L 2933/0041* (2013.01)

(56) References Cited

U.S. PATENT DOCUMENTS

| | | | | |
|---|---|---|---|---|
| 2004/0070338 | A1* | 4/2004 | Noguchi et al. | 313/512 |
| 2005/0088087 | A1* | 4/2005 | Ogawa | 313/511 |
| 2006/0086384 | A1 | 4/2006 | Nakata | |
| 2006/0239037 | A1 | 10/2006 | Repetto et al. | |
| 2006/0273328 | A1 | 12/2006 | Niu et al. | |
| 2007/0041214 | A1 | 2/2007 | Ha et al. | |
| 2007/0228421 | A1 | 10/2007 | Shioya et al. | |
| 2008/0102545 | A1 | 5/2008 | Yamagata et al. | |
| 2008/0217628 | A1 | 9/2008 | Lee et al. | |
| 2008/0251381 | A1 | 10/2008 | Shibata et al. | |
| 2009/0267108 | A1* | 10/2009 | Lin et al. | 257/99 |
| 2010/0171440 | A1 | 7/2010 | Satou et al. | |
| 2011/0006334 | A1 | 1/2011 | Ishii et al. | |
| 2011/0089850 | A1 | 4/2011 | Shibata et al. | |

FOREIGN PATENT DOCUMENTS

| | | |
|---|---|---|
| JP | 6-177435 | 6/1994 |
| JP | 11-204836 | 7/1999 |
| JP | 11-242451 | 9/1999 |
| JP | 2000-82849 | 3/2000 |
| JP | 2001-203427 | 7/2001 |
| JP | 2002-111059 | 4/2002 |
| JP | 2002-353517 | 12/2002 |
| JP | 2004-296162 | 10/2004 |
| JP | 2004-532133 | 10/2004 |
| JP | 2006-58483 | 3/2006 |
| JP | 2006-507692 | 3/2006 |
| JP | 2006-303509 | 11/2006 |
| JP | 2006-332650 | 12/2006 |
| JP | 2007-184566 | 7/2007 |
| JP | 2007-227680 | 9/2007 |
| JP | 2008-66297 | 3/2008 |
| JP | 2008-135418 | 6/2008 |
| JP | 2008-235444 | 10/2008 |
| JP | 2008-260073 | 10/2008 |
| JP | 2008-304538 | 12/2008 |
| JP | 2009-181883 | 8/2009 |
| JP | 2009-237011 | 10/2009 |
| JP | 2009-245780 | 10/2009 |
| JP | 2009-260395 | 11/2009 |
| JP | 2009-267164 | 11/2009 |
| JP | 2010-66723 | 3/2010 |
| JP | 2010-506744 | 3/2010 |
| JP | 2010-514207 | 4/2010 |
| JP | 2011-86758 | 4/2011 |
| JP | 2011-91201 | 5/2011 |
| JP | 2011-103435 | 5/2011 |
| JP | 2011-119586 | 6/2011 |
| JP | 2011-119612 | 6/2011 |
| JP | 2011-119617 | 6/2011 |
| KR | 10-2008-0081837 | 9/2008 |
| KR | 10-2008-0083412 | 9/2008 |
| KR | 10-2009-0096704 | 9/2009 |
| WO | WO-02/080280 | 10/2002 |
| WO | WO-04/001858 | 12/2003 |
| WO | WO-2004/032193 | 4/2004 |
| WO | WO-2008/060455 | 5/2008 |
| WO | WO-2008/079076 | 7/2008 |
| WO | WO-2008/079077 | 7/2008 |
| WO | WO-2008/079079 | 7/2008 |
| WO | WO-2009/107535 | 9/2009 |

OTHER PUBLICATIONS

Murakami, G. (2009). "Transitions in Semiconductor Packaging Technology for LEDs and LDs, Part 13," *Semiconductor FPD World, Press Journal Inc*: 114-117.

Search Report mailed May 17, 2011 directed towards International Application No. PCT/JP2011/053792; 7 pages.

Hayden, O. et al. (Mar. 2005). "Core-Shell Nanowire Light-Emitting Diodes," *Advanced Materials* 17(6):701-704.

Office Action mailed Apr. 1, 2014, directed to a counterpart Japanese Application No. 2010-063449; 7 pages.

\* cited by examiner 2081  2080  2082

2257
2251 2260 2250 2252

2351 2360 2352
2350

2351 2360 2352
2350

LIGHT-EMITTING ELEMENT 1

LIGHT-EMITTING ELEMENT 2

LIGHT-EMITTING DEVICE MANUFACTURING METHOD, LIGHT-EMITTING DEVICE, LIGHTING DEVICE, BACKLIGHT, LIQUID-CRYSTAL PANEL, DISPLAY DEVICE, DISPLAY DEVICE MANUFACTURING METHOD, DISPLAY DEVICE DRIVE METHOD AND LIQUID-CRYSTAL DISPLAY DEVICE

REFERENCE TO RELATED APPLICATIONS

This application is a national stage application under 35 USC 371 of International Application No. PCT/JP2011/053792, filed Feb. 22, 2011, which claims the priority of Japanese Patent Application Nos. 2010-055953, filed Mar. 12, 2010, 2010-063449, filed Mar. 19, 2010, 2010-078690, filed Mar. 30, 2010, 2010-113318, filed May 17, 2010, and 2011-019919, filed Feb. 1, 2011, the entire contents of which are incorporated herein by reference.

FIELD OF THE INVENTION

The present invention relates to a light-emitting device manufacturing method, a light-emitting device, a lighting device, a backlight, a liquid-crystal panel, a display device, a display device manufacturing method, a display device drive method, and a liquid-crystal display device. The invention also relates to, for example, a liquid-crystal display device having a direct type backlight.

BACKGROUND OF THE INVENTION

Conventionally, there has been provided a light-emitting device which is so constructed that, as shown in FIG. 109, one (or some) LED chip 910 is mounted on a package substrate 900 with a lead frame 901 mounted thereon, an n-type electrode 905 and a p-type electrode 906 of the LED chip 910 are connected to the lead frame 901 by bonding wires 911, and thereafter a phosphor-containing resin 922 is filled on the LED chip 910 surrounded by a reflecting plate 921, and furthermore a transparent resin 923 is filled on the phosphor-containing resin 922 (see, e.g., Non-Patent Literature 1). The LED chip 910, in which a semiconductor layer 903 formed of GaN is stacked on a sapphire substrate 902, the semiconductor layer 903 having an active layer 904.

In the light-emitting device manufacturing method described above, interconnecting process subsequent to the mounting of one (or some) LED chip 910 onto the package substrate 900 is executed individually for one package. This causes increases in cost as a problem.

Also, in the light-emitting device in which one (or some) LED chip 910 is mounted, a brightness variation per LED chip results in a brightness variation of the light-emitting device as it is. As a result, there is a problem of worse yield of the light-emitting device.

Also conventionally, there has been a light-emitting device described in Matsushita Electric Works Technical Report vol. 53, No. 1, pp. 4-9 (Non-Patent Literature 2).

FIG. 110 is a perspective view showing the light-emitting device of the above-mentioned literature.

In FIG. 110, reference sign 3015 denotes packaged LED chips.

In this light-emitting device, as shown in FIG. 110, individually packaged LED chips 3015 are placed at specified positions so as to generate desired light.

Since the individually packaged LED chips 3015 are placed in plurality at specified positions, the light-emitting device has an advantage that a desired emission quantity of light can be obtained.

However, in the prior art, the LED chips 3015 and LED packages are manipulated and placed on the substrate independently one by one in either a packaging step or a mounting step, whichever it is. Thus, there is a problem that package cost and mounting cost are increased.

Also, a conventional display device is disclosed in, for example, JP 2002-353517 A (Patent Literature 1). In this display device, a plurality of LED (Light-Emitting Diode) chips are disposed in a two-dimensional matrix array. More specifically, LED chips of blue emitted light, LED chips of green emitted light, and LED chips of red emitted light are placed on substrates different from one another, so that full-color display is realized by using the three substrates.

The blue LED chip is electrically connected via a wire to an electrode (bonding pad) on a substrate on which the blue LED chip is to be mounted. Similarly, the green LED chip and the red LED chip are electrically connected indirectly each via a wire to an electrode on a substrate on which the green LED chip and the red LED chip, respectively, are to be mounted.

Unfortunately, in this conventional display device, since each LED chip and the electrode on the substrate are electrically connected to each other via a wire, there arises a need for a wire bonding step for forming the wires.

Thus, the conventional display device has problem that the manufacturing cost increases due to the formation of the wires.

Conventionally, an LCD (Liquid Crystal Display) device has a liquid-crystal panel, and a backlight device for illuminating the liquid-crystal panel.

The liquid-crystal panel has a TFT (Thin Film Transistor) substrate and a color filter substrate. The two substrates are placed in parallel and opposition to each other, with liquid crystals filled between those substrates.

The backlight device is placed directly under the liquid-crystal panel, and has a substrate different from the substrate of the liquid-crystal panel, and light-emitting elements placed on the different substrate (see, e.g., Patent Literature 2: JP 2009-181883 A).

However, in this conventional LCD device, since the substrate of the backlight device is given by using a substrate different from the substrate of the liquid-crystal panel, there has been a problem that the backlight device is increased in thicknesses, resulting in a thickened LCD device.

PATENT LITERATURE 1: JP 2002-353517 A
PATENT LITERATURE 2: JP 2009-181883 A
Non-Patent Literature 1: Gen Murakami, "Transitions in Semiconductor Packaging Technology for LEDs and LDs, Part 13," Semiconductor FPD World, Press Journal Inc., May 2009, pp. 114-117 (FIG. 5).
Non-Patent Literature 2: Matsushita Electric Works Technical Report, Vol. 53, No. 1, pp. 4-9.

SUMMARY OF THE INVENTION

Accordingly, an object of the present invention is to provide a light-emitting device manufacturing method, as well as a light-emitting device manufactured by the manufacturing method, the light-emitting device capable of reducing its manufacturing cost, lessening characteristic variations and improving its yield by virtue of collectively interconnecting a plurality of light-emitting elements placed on one substrate.

Another object of the invention is to provide a lighting device capable of reducing its manufacturing cost, lessening characteristic variations and improving its yield.

Still another object of the invention is to provide a backlight capable of reducing its manufacturing cost, lessening characteristic variations and improving its yield.

Yet another object of the invention is to provide a liquid-crystal panel capable of reducing its manufacturing cost, lessening characteristic variations and improving its yield.

A further object of the invention is to provide a light-emitting device manufacturing method capable of suppressing its package cost and mounting cost.

Still further object of the invention is to provide a display device capable of being manufactured with low cost and implementing high-definition display.

Yet further object of the invention is to provide a thin-type liquid-crystal display device in which its backlight part composed of light-emitting elements is formed thin.

In order to achieve the above object, a light-emitting device manufacturing method according to a first aspect of the present invention comprises:

a placement step for placing a plurality of light-emitting elements on one substrate;

an interconnection step for collectively interconnecting part or entirety of the plurality of light-emitting elements placed on the substrate; and a substrate dividing step for, after the placement step and the interconnection step, dividing the substrate into a plurality of divisional substrates to form a plurality of light-emitting devices in which a plurality of light-emitting elements are placed on the divisional substrates.

With this constitution, after a plurality of light-emitting elements placed on one substrate are collectively interconnected, the substrate is divided into of light-emitting devices in each of which a plurality of light-emitting elements are placed on the divisional substrates are formed. Thus, the interconnection step can be simplified and the manufacturing cost can be cut down. Given that light-emitting elements each having a brightness variation of X % are assembled as a set of n light-emitting elements, the overall brightness variation results in $Y=X/\sqrt{n}$ (%), so that characteristic variations can be reduced and the yield can be improved.

In an embodiment, in the placement step, the plurality of light-emitting elements are collectively placed on the one substrate.

According to this embodiment, since a plurality of light-emitting elements are placed collectively on one substrate in the placement step, the interconnection step can be simplified, thus making it possible to achieve a further reduction of manufacturing cost.

In an embodiment, an interconnect pattern for interconnecting the plurality of light-emitting elements is formed on the substrate, and the interconnect pattern is not formed in cutting areas of the substrate involved in the substrate dividing step.

According to this embodiment, the interconnect pattern formed for interconnecting a plurality of bar-like structure light-emitting elements on the substrate is not formed in substrate cutting areas for the substrate dividing step. As a result of this, no electroconductive interconnect rubbish is scattered in cutting process so that failures due to short-circuits by electroconductive interconnect rubbish or the like can be prevented.

In an embodiment, an interconnect pattern for interconnecting the plurality of light-emitting elements is formed on the substrate, and the interconnect pattern that, even if cut off in the substrate dividing step, does not affect electrical connections is formed in cutting areas of the substrate.

According to this embodiment, an interconnect pattern that does not affect electrical connections even if cut in the substrate dividing step is formed in substrate cutting areas. In this case, an interconnect pattern can be formed so as to continuously stretch over adjacent divisional substrates, making it more easily achievable to form the interconnect pattern, and moreover cutting, even if involved in the substrate division, does not cause any problems in circuit operation.

In an embodiment, the light-emitting elements are not placed in cutting areas of the substrate involved in the substrate dividing step.

According to this embodiment, by the placement that no light-emitting elements are placed in substrate cutting areas for the substrate dividing step, there are no light-emitting elements that are broken by cutting, so that effective use of the light-emitting elements can be made.

In an embodiment, out of the plurality of light-emitting elements, those light-emitting elements which, even if cut off in the substrate dividing step, have no influence on a desired light emission quantity are placed in cutting areas of the substrate.

According to this embodiment, out of the plurality of light-emitting elements, light-emitting elements which, even if cut in the substrate dividing step, have no influence on a desired light emission quantity, are placed in cutting areas of the substrate. Thus, even if bar-like structure light-emitting elements 710 that have been broken by cutting do not emit light, uncut other plural light-emitting elements fulfill light emission. This eliminates the need for considering that the light-emitting elements are kept from being placed in cutting areas of the substrate in the placement step, so that the placement step can be simplified.

An embodiment further comprises a phosphor application step for, after the placement step and the interconnection step and before the substrate dividing step, applying a phosphor onto the substrate; and a protective-film application step for, after the phosphor application step, applying a protective film onto the substrate.

According to this embodiment, after the placement step and the interconnection step and before the substrate dividing step, it occurs that the phosphor application step for applying the phosphor onto the substrate and the protective-film application step for applying the protective film onto the substrate subsequent to the phosphor application step are executed at a time with one substrate on which a plurality of light-emitting elements have been placed. Thus, the manufacturing cost can be largely cut down as compared with cases where it has conventionally been done package by package.

In an embodiment, in the phosphor application step, the phosphor is applied selectively to regions where the plurality of light-emitting elements are placed.

According to this embodiment, the phosphor is applied selectively to areas where the plurality of light-emitting elements are placed. Thus, the quantity of use of the phosphor that occupies a large proportion of the material cost can be cut down, allowing a cost cut to be achieved.

In an embodiment, 100 or more of the light-emitting elements are placed in each of the divisional substrates.

According to this embodiment, by the placement of 100 or more light-emitting elements on each of the divisional substrates, an overall brightness variation resulting from assembling of a plurality of light-emitting elements having brightness variations can be reduced to 1/10 or less that of one light-emitting element.

Generally, a brightness variation per light-emitting element may reach as much as 50% depending on variations of the forward voltage (Vf). Conventionally, it has been practiced that light-emitting elements having proved out of specifications in lighting tests are excluded or light-emitting elements are classified into light-emitting element groups of similar brightnesses and used as such. However, given that light-emitting elements each having a brightness variation of X % are assembled as a set of n light-emitting elements, the overall brightness variation results in $Y=X/\sqrt{n}$ (%). That is, assuming that n=100, even if each light-emitting element has a variation of 50%, the overall brightness variation is reduced to $\frac{1}{10}$, which equals 5%, so that specifications can be satisfied. Thus, the need for lighting tests for individual light-emitting elements is eliminated, allowing a cost cut to be achieved.

In an embodiment, in the substrate dividing step, the substrate is divided into at least two or more types of the divisional substrates of different shapes.

According to this embodiment, in the substrate dividing step, the substrate is divided into at least two or more types of divisional substrates of different shapes. Thus, light-emitting devices ready for various modes can be provided with simplicity.

In an embodiment, the placement step for placing the plurality of light-emitting elements onto the substrate includes:

a substrate formation step for preparing the substrate having at least a first electrode and a second electrode on its mounting surface;

an application step for applying a solution containing the plurality of light-emitting elements onto the substrate; and an array step for applying a voltage to at least the first electrode and the second electrode to make the plurality of light-emitting elements arrayed at positions defined by at least the first electrode and the second electrode.

According to this embodiment, a substrate having, on its mounting surface, at least a first electrode and a second electrode is prepared, and a liquid containing a plurality of light-emitting elements is applied onto the substrate. Thereafter, a voltage is applied to at least the first electrode and the second electrode, so that the plurality of light-emitting elements are arrayed at positions defined by at least the first electrode and the second electrode. As a result of this, the plurality of light-emitting elements can be easily arrayed to specified positions on the substrate. Thus, without the need for placing light-emitting diodes one by one to specified positions on the substrate as in conventional cases, a multiplicity of fine light-emitting diodes can be placed at specified positions with high accuracy.

In an embodiment, at least the first electrode and the second electrode are used as electrodes for driving the plurality of light-emitting elements.

According to this embodiment, at least the first electrode and the second electrode are used as electrodes for driving the plurality of light-emitting elements. Thus, the interconnection step can be simplified, allowing a cost cut to be achieved.

In an embodiment, the plurality of light-emitting elements are bar-like shaped, and the plurality of light-emitting elements are placed on the mounting surface of the substrate so that a longitudinal direction of the plurality of light-emitting elements becomes parallel to the mounting surface of the substrate.

According to this embodiment, a plurality of light-emitting elements are placed on the mounting surface of the substrate so that a longitudinal direction of the plurality of bar-like light-emitting elements becomes parallel to the mounting surface of the substrate. By this placement, a ratio of the axial (longitudinal) length to the radial length can be made larger, so that lateral outflow of heat to the substrate side is fulfilled more efficiently than when the light-emitting surface is flat, square-shaped under a condition of an equal light-emitting surface area of the light-emitting element. Thus, temperature increases during emission are further suppressed, so that further longer life and higher efficacy can be achieved.

In an embodiment, each of the bar-like light-emitting elements has a tubular-shaped light-emitting surface that concentrically surrounds a bar-like core.

According to this embodiment, since the bar-like light-emitting element has a tubular light-emitting surface concentrically surrounding the bar-like core, the light-emitting surface area per light-emitting element is increased as compared with light-emitting elements equal in volume and having a flat light-emitting surface, so that the number of light-emitting elements to obtain a specified brightness can be cut down, allowing a cost cut to be achieved.

In an embodiment, each of the bar-like light-emitting elements has a first-conductive-type bar-like semiconductor core, and a second-conductive-type tubular-shaped semiconductor layer covering an outer periphery of the semiconductor core, and a one-end side of the semiconductor core of the bar-like light-emitting element is exposed.

According to this embodiment, the bar-like light-emitting element has a first-conductive-type bar-like semiconductor core, and a second-conductive-type tubular semiconductor layer covering an outer periphery of the semiconductor core, and one end side of the semiconductor core is exposed. Thus, it becomes possible that one electrode is connected to one-end-side exposure portion of the semiconductor core while another electrode is connected to the other-end-side semiconductor layer of the semiconductor core, allowing the connections to be achieved with electrodes apart from each other at both ends. Thus, the electrode connected to the semiconductor layer and the exposure portion of the semiconductor core can be prevented from short-circuiting each other, thus allowing the interconnections to be easily achieved.

In an embodiment, the plurality of light-emitting elements are a plurality of elements formed on an epitaxial substrate, and the individual elements are separated from on the epitaxial substrate.

According to this embodiment, a plurality of elements formed on an epitaxial substrate are formed, and a plurality of light-emitting elements separated from on the epitaxial substrate are used. Thus, the epitaxial substrate can be reused, making it possible to achieve a cost cut as compared with the case where the epitaxial substrate is used as it is divided together with the light-emitting elements.

Also, a second aspect of the present light-emitting device comprises:

divisional substrates resulting from dividing one substrate;

a plurality of light-emitting diodes placed on the divisional substrates; and a first electrode and a second electrode which are formed on the divisional substrates with a specified distance therebetween and to which the plurality of light-emitting diodes are connected, wherein the plurality of light-emitting diodes mixedly include light-emitting diodes having an anode connected to the first electrode and a cathode connected to the second electrode, and light-emitting diodes having a cathode connected to the first electrode and an anode connected to the second electrode, and the plurality of light-emitting diodes are driven with an AC voltage applied to between the first electrode and the second electrode by an AC power supply.

According to this embodiment, since a plurality of light-emitting diodes to be connected between the first, second electrodes do not need to be arrayed with their polarity uniformized, the step for uniformizing the polarity (orientation) of a plurality of light-emitting diodes during the manufacture becomes unnecessary, allowing a step simplification to be achieved. Also, it is unnecessary to provide any marks on light-emitting diodes for identification of the polarity (orientation) of the light-emitting diodes, and unnecessary as well to form the light-emitting diodes into any special configuration for polarity identification. Thus, the manufacturing process for the light-emitting diodes can be simplified, allowing the manufacturing cost to be cut down. In addition, with the light-emitting diodes smaller in size or the light-emitting diodes larger in number, the placement step can be simplified far more than in cases where the light-emitting diodes are arrayed with their polarity uniformized.

In an embodiment, the divisional substrates are mounted on a heat sink plate.

According to this embodiment, since divisional substrates are fitted on the heat sink plate, the heat-releasing effect is further improved.

In an embodiment, a lighting device includes the light-emitting device.

With this constitution, by the use of the light-emitting device, the manufacturing cost can be cut down, and characteristic variations are lessened so that the yield can be improved.

In an embodiment, a backlight includes the light-emitting device.

With this constitution, by the use of the light-emitting device, the manufacturing cost can be cut down, and characteristic variations are lessened so that the yield can be improved.

In an embodiment, a liquid-crystal panel includes the light-emitting device.

With this constitution, by the use of the light-emitting device, the manufacturing cost can be cut down, and characteristic variations are lessened so that the yield can be improved.

Also, a liquid-crystal panel of the present invention comprises:

a transparent substrate;

a plurality of light-emitting elements placed on one surface of the transparent substrate and connected to interconnections formed on the one surface of the transparent substrate; and a plurality of thin film transistors formed on the other surface of the transparent substrate.

With this constitution, by the use of the transparent substrate in which the liquid-crystal panel substrate and the backlight substrate are integrated into one unit, both component cost and manufacturing cost can be cut down, and moreover a further thinner-type liquid-crystal panel can be obtained.

Also, a liquid-crystal panel of the present invention comprises:

a transparent substrate;

a plurality of light-emitting elements placed on one surface of the transparent substrate and connected to interconnections formed on the one surface of the transparent substrate; and a color filter formed on the other surface of the transparent substrate.

With this constitution, by the use of the transparent substrate in which the color filter and the backlight substrate are integrated into one unit, both component cost and manufacturing cost can be cut down, and moreover a further thinner-type liquid-crystal panel can be obtained.

Also, a light-emitting device manufacturing method of the present invention comprises:

a substrate preparation step for preparing a first substrate having a first electrode and a second electrode;

an element feeding step for positioning onto the first substrate an element-containing liquid having a first liquid and a plurality of light-emitting elements positioned within the first liquid; and an element array step for, with a voltage applied to the first electrode and the second electrode, arraying two or more of the light-emitting elements to predetermined positions determined based on an electric field generated by the voltage application.

According to this invention, without manipulating the individual light-emitting elements one by one, a plurality of light-emitting elements can be arrayed at specified positions by one-time process, thus allowing the manufacturing cost to be cut down.

In an embodiment, in the element array step, the element-containing liquid is moved relative to the first substrate.

According to this embodiment, since the light-emitting elements move on the flow of the liquid in proximity to the surface of the first substrate, the light-emitting elements are allowed to approach, in shorter time, a specified place defined by the first electrode and the second electrode. Thus, arraying time for the light-emitting elements can be shortened.

An embodiment comprises:

a second-substrate placement step for placing a second substrate generally parallel to the first substrate, wherein in the element feeding step, the element-containing liquid is filled between the first substrate and the second substrate.

According to this embodiment, since evaporation of the liquid can be prevented by the first substrate and the second substrate, which are placed generally parallel to each other, light-emitting elements can be arrayed at specified places with high accuracy and high yield.

In an embodiment, the second substrate has a third electrode opposed to the first electrode and the second electrode, and in at least one step of the element feeding step and the element array step, a voltage is applied to between the first electrode and the third electrode.

According to this embodiment, asymmetric voltages are applied to between the first electrode and the third electrode, so that the light-emitting elements can be moved toward the first electrode or the third electrode. Thus, the arraying time can be shortened and moreover light-emitting elements that have not been arrayed can promptly be collected or treated in other ways.

In an embodiment, in the element array step, the element-containing liquid is fluidized between the first substrate and the second substrate.

According to this embodiment, a flow passage of the element-containing liquid can be defined by the first substrate and the second substrate, so that evaporation of the liquid can be prevented and moreover occurrence of convection due to cooling caused by vaporization can be prevented. Thus, the light-emitting elements can be arrayed at specified places with high accuracy and high yield.

Also, according to this embodiment, since the light-emitting elements move on the flow of the liquid in proximity to the surface of the first substrate, the light-emitting elements more easily approach specified places defined by the first electrode and the second electrode, so that the arraying time can be shortened.

Also, according to this embodiment, the gap between the first substrate and the second substrate is kept constant at any place on the first substrate. As a result of this, the flow velocity of the liquid can be kept constant at any place wherever it is on the first substrate, so that the light-emitting elements can be arrayed at specified places with high yield.

Also, according to this embodiment, since the flow velocity of the liquid can be easily changed by adjusting the quantity of the liquid injected into the flow passage defined by the first and second substrates. Thus, the light-emitting elements can be arrayed at specified places with high yield.

In an embodiment, a surface of the first electrode and a surface of the second electrode are overlaid with an insulating film.

According to this embodiment, since no electric current flows through the first and second electrodes, voltage drops can be made very small, so that the array yield can be improved. As a first substrate becomes larger in scale so that the number of light-emitting elements to be arrayed becomes larger in number, interconnect lengths of the first and second electrodes become longer, causing voltage drops to become noticeable, and posing a possibility that the arraying is no longer done at ends of the interconnect lines.

Also, according to this embodiment, since no electric current flows between the first electrode and the second electrode, dissolution of the electrodes by an electrochemical effect can be prevented, so that worsening of the array yield due to disconnections or liquid contaminations can be prevented. With the metal electrodes in contact with an electrolyte, application of a voltage to between the electrodes may cause the metal to dissolve into the electrolyte.

In an embodiment, the surface of the first substrate is made from a material identical to a material of the surface of each of the light-emitting elements.

According to this embodiment, light-emitting elements sticking to the surface of the first substrate can be reduced, so that the array yield can be improved. As to the reason of this, the light-emitting elements and the surface of the first substrate, when being of the same material, become equal in zeta-potential to each other so as to repel each other, so that the light-emitting elements can be prevented from sticking to the surface of the first substrate.

In an embodiment, the element-containing liquid contains a surface active agent.

According to this embodiment, aggregations among the light-emitting elements or sticking of the light-emitting elements to the insulating film or the substrates or the electrodes can be prevented.

In an embodiment, a maximum distance between different two points in each of the light-emitting elements is not more than 50 µm.

According to this embodiment, even light-emitting elements having a maximum size of 50 µm or less can be easily placed at specified places irrespectively of the number of light-emitting elements. Further, the invention method is suited for arraying of rather minute objects. Arraying a multiplicity of minute-sized light-emitting elements makes it possible to reduce brightness variations in plane lighting or the like, hence usefulness of the invention.

In an embodiment, each of the plurality of light-emitting elements has a bar-like shape.

According to this embodiment, since the light-emitting element is bar-like shaped, one end of the light-emitting element can be fixed on the first electrode while the other end of the light-emitting element can be fixed on the second electrode. Therefore, an excellent alignment accuracy can be achieved.

In an embodiment, each of the light-emitting elements includes:

a cylindrical-shaped first-conductive-type first semiconductor layer;

a tubular-shaped quantum well layer placed so as to cover an outer peripheral surface of the first semiconductor layer; and a tubular-shaped second-conductive-type second semiconductor layer placed so as to cover an outer peripheral surface of the quantum well layer.

In other words, the light-emitting element has a core-shell-shell structure in which n-type semiconductor-quantum well-p-type semiconductor are formed coaxially. Otherwise, the light-emitting elements has a core-shell-shell structure in which p-type semiconductor quantum well-n-type semiconductor are formed coaxially.

According to this embodiment, since a light-emitting layer can be formed generally all over the side face of each bar-like light-emitting element, the light-emission area per bar-like light-emitting element can be increased.

In an embodiment, each of the plurality of light-emitting elements has a bar-like shape, and a diameter of a cross section of each light-emitting element as taken along a direction vertical to an extending direction of the light-emitting element is larger than 500 nm.

According to this embodiment, arrayed bar-like light-emitting elements can be enhanced in strength, so that the arrayed bar-like light-emitting elements can be made inflexible. Therefore, stress within the light-emitting elements can be reduced, making it possible to suppress declines of the luminous efficacy due to stress.

In an embodiment, each of the light-emitting elements includes:

a cylindrical-shaped first-conductive-type first semiconductor layer;

a tubular-shaped quantum well layer placed so as to cover an outer peripheral surface of the first semiconductor layer; and a tubular-shaped second-conductive-type second semiconductor layer placed so as to cover an outer peripheral surface of the quantum well layer, wherein a diameter of a cross section of each light-emitting element as taken along a direction vertical to an extending direction of the light-emitting element is larger than 500 nm.

In other words, each light-emitting element has a bar-like core-shell-shell structure, and a diameter of each light-emitting element is larger than 500 nm.

According to this embodiment, since enough light-emission quantity of each light-emitting element can be ensured, enough light-emission density can be obtained even if only one light-emitting element is arrayed for one electrode pair.

An embodiment further comprises:

an element discharge step for discharging light-emitting elements that have not been arrayed at predetermined places out of the plurality of light-emitting elements.

According to this embodiment, light-emitting elements that have not been arrayed at specified places can be collected and moreover arrayed on another first substrate, thus allowing the manufacturing cost of the light-emitting device to be cut down.

Also, according to this embodiment, light-emitting elements that have not been arrayed at specified places can be prevented from aggregating and causing interconnect failures after drying process or the like.

An embodiment further comprises:

an element fixing step for, after the element array step, with a voltage applied to between the first electrode and the second electrode, the voltage higher than the voltage applied to between the first electrode and the second electrode in the element array step, fixing the light-emitting elements, which have been arrayed at predetermined positions, to the predetermined positions.

According to this embodiment, since the light-emitting elements can be fixed to specified positions, an excellent alignment accuracy can be achieved.

Also, according to this embodiment, since the light-emitting elements are not moved even with the flow velocity of the liquid increased and since the light-emitting elements are never moved in removal of the liquid, an outstandingly excellent alignment accuracy can be achieved.

An embodiment further comprises:

a substrate drying step for, after the element array step, drying the surface of the first substrate.

According to this embodiment, the light-emitting elements can be fixed between the electrodes by the substrate drying step. Also, a protective film can be formed on the surface of the first substrate by the substrate drying step, so that the light-emitting elements can be protected.

In an embodiment, a surface tension of the element-containing liquid is not more than 50 mN/m.

According to this embodiment, when the surface of the first substrate is dried in a state of being wetted by the liquid of large surface tension, it may occur that the liquid surface comes into contact with the light-emitting elements during the drying, causing the light-emitting elements to move with a result of occurrence of misalignment. In this embodiment, use of a liquid of smaller surface tension makes it possible to prevent the misalignment.

In an embodiment, a surface tension of the element-containing liquid is not more than 30 mN/m.

According to this embodiment, a liquid having a surface tension even smaller than 50 mN/m is used, misalignment can be prevented securely.

An embodiment further comprises a liquid replacement step for, after the element feeding step and before the substrate drying step, replacing the first liquid with a second liquid smaller in surface tension than the first liquid.

According to this embodiment, a liquid (arbitrary liquid) of larger surface tension may be used during the arraying of the light-emitting elements, while a liquid of smaller surface tension may be used during the drying. Therefore, a liquid that generates a large effect of electrostatic induction can be used during the arraying, so that the arraying of the light-emitting elements can be achieved efficiently. Moreover, a liquid of smaller surface tension can be used in the drying, so that misalignment of the light-emitting elements can be prevented.

In an embodiment, each of the light-emitting elements has, on its surface, a first region and a second region and emits light with a voltage applied to the first region and the second region, the method further comprising an element connecting step for connecting the first region and the first electrode to each other with an electrical conductor and moreover connecting the second region and the second electrode to each other with an electrical conductor.

According to this embodiment, since the light-emitting elements and the first electrode are connected to each other with an electrical conductor and moreover the light-emitting elements and the second electrode are connected to each other with an electrical conductor, electrical connections between the first and second electrodes and the minute light-emitting elements can be made successful. Thus, for light emission of the light-emitting device with a voltage applied to between the first electrode and the second electrode, occurrence of a state (open state) in which a voltage is no longer applied to the light-emitting elements can securely be prevented.

In an embodiment, each of the light-emitting elements has, on its surface, a first region and a second region and emits light with a voltage applied to the first region and the second region, the method further comprising an additional electrode formation step for forming a fourth electrode to be connected to two or more of the first regions of two or more of the light-emitting elements arrayed at predetermined positions, and a fifth electrode to be connected to two or more of the second regions of two or more of the light-emitting elements arrayed at predetermined positions.

According to this embodiment, applying voltages to the fourth electrode and the fifth electrode causes a voltage to be applied to the light-emitting element, making it possible to apply a voltage to the light-emitting element without using the first electrode and the second electrode. Therefore, an interconnecting/wiring structure (fourth electrode and fifth electrode) other than the electrode structure (first electrode and second electrode) involved in arraying of the light-emitting elements can be used for voltage application to the light-emitting elements. Thus, the degree of freedom for voltage application can be increased, making it easier to fulfill the voltage application.

An embodiment further comprises a substrate dividing step for, after the element array step, dividing the first substrate.

According to this embodiment, by one-time arraying of the light-emitting elements, a plurality of substrates in each of which a plurality of light-emitting elements are arrayed at specified places can be formed. Thus, the manufacturing cost can be cut down.

In an embodiment, in the element array step, the light-emitting elements counting 1000 or more in number are arrayed on the first substrate.

According to this embodiment, the cost for inspection of the light-emitting elements is unnecessary, allowing the manufacturing cost to be cut down.

Also, a display device of the invention comprises:

a substrate;

a plurality of first interconnect lines formed so as to extend in one direction on the substrate;

a plurality of second interconnect lines formed so as to extend in another direction on the substrate; and a plurality of light-emitting elements placed in a matrix array on the substrate, wherein one end portion of each of the light-emitting elements is electrically connected directly to one of the plurality of first interconnect lines while the other end portion of the light-emitting element is electrically connected directly to one of the plurality of second interconnect lines, and the or each light-emitting element has a length to width ratio of 5 to 400 and the length is 0.5 μm to 200 μm.

It is noted here that the light-emitting elements may be those which have a circular, elliptical, rectangular, polygonal or other-shaped cross section and which extend in a straight-line or curved shape or have a bent portion.

Also, the term 'width' refers to a width of the thickest portion of each light-emitting element.

With this constitution, one end portion of each of the light-emitting elements is electrically connected directly to one of the plurality of first interconnect lines while the other end portion of the light-emitting element is electrically connected directly to one of the plurality of second interconnect lines. Therefore, wires that have been needed for the display device of the prior art are unnecessary. As a consequence, material costs and manufacturing steps can be cut down so that the display device can be manufactured with lower cost, as compared with the prior-art display device.

Also, since the unnecessariness of wires makes bonding pads also unnecessary, it is unnecessary to place bonding pads between light-emitting elements, and distances among the light-emitting elements can be made narrower. Moreover, the light-emitting elements have length to width ratios falling within a range of 5 to 400, and those lengths are within a range of 0.5 µm to 200 µm, hence quite small sizes. Therefore, for the display devices of the invention, the pixel parts including the light-emitting elements can be made very small, making it implementable to fulfill high-definition display.

Also, since the length to width ratio is within a range of 5 to 400 and the length is not more than 200 µm, the light-emitting elements can be easily placed between the first interconnect lines and the second interconnect lines by applying a voltage to between the first interconnect lines and the second interconnect lines.

If the length to width ratio is less than 5 or if the ratio is over 400 or if the length is over 200 µm, then it becomes difficult to place the light-emitting elements to between the first interconnect lines and the second interconnect lines even with the voltage applied.

Also, since the length of each light-emitting element is set to 0.5 µm or more, the emission intensity can be enhanced so that a desired emission intensity can be obtained.

If the length of each light-emitting element is less than 0.5 µm, then the emission intensity is so low that a desired emission intensity cannot be obtained.

In prior-art display devices, since bonding pads are interveniently provided between LED chips, it has been practically hard to realize high-definition display because distances between LED chips cannot be made narrower.

Also, since the length to width ratio of each light-emitting element is 5 or more, the light-emitting element is bar-like shaped. As a result of this, the distance from the first interconnect line part electrically connected directly to one end portion of the light-emitting element to the second interconnect line part electrically connected directly to the other end portion of the light-emitting element can be increased. In other words, an electrical contact portion formed at one end portion of the light-emitting element, and an electrical contact portion formed at the other end portion of the light-emitting element can be set to a larger one. As a result, the formation step for the first interconnect lines and the second interconnect lines becomes easier to carry out, allowing the manufacturing cost to be cut down.

Now, functional effects by the setting of the length to width ratio of 5 or more are explained in more detail with reference to FIGS. 95 and 96.

First, it is assumed that light-emitting elements 1, 2 of FIGS. 95 and 96 are present. The light-emitting element 1 has a square (W1=L1) upper face, a thickness of H1, a volume of V1=W1×L1×H1=W1²×H1. Meanwhile, the light-emitting element 2 has a bar-like shape, a thickness H2 equal to the thickness H1 of the light-emitting element 1, a width W2 smaller than the width W1 of the light-emitting element 1, a length L2 larger than the length L1 of the light-emitting element 1, and a volume V2 equal to the volume V1. In this case, it holds that W2×=W1×L1. Then, since the volume V1 of the light-emitting element 1 is equal to the volume V2 of the light-emitting element 2, the material (e.g., expensive GaN) cost of the light-emitting element 1 is equal to that of the light-emitting element 2.

For electrical connections of the light-emitting elements 1, 2 to two interconnect lines, the light-emitting element 1 allows electrical contact portions to be formed at regions A1, B1, while the light-emitting element 2 allows electrical contact portions to be formed, at regions A2, B2. With electrical contact portions formed at the regions A1, A2, B1, B2, respectively, a distance between the electrical contact portions of the light-emitting element 1 is about L1, and a distance between the electrical contact portions of the light-emitting element 2 is about L2. As a result, the distance between the two interconnect lines for the light-emitting element 2 is longer than the distance between the two interconnect lines for the light-emitting element 1.

As shown above, an elongated distance between two interconnect lines for the light-emitting element 2 means that, for example, the exposure device for interconnections may be one of low specifications, thus allowing the equipment cost to be cut down. Further, a longer distance between the interconnect lines makes interconnection failures less likely to occur, so that a yield improving effect can also be obtained. Further, setting the distance between the interconnect lines to 10 µm or more makes it easier to use the ink jet for interconnect processes, and therefore roll-to-roll low-cost processes become applicable.

Thus, since the length to width ratio of each light-emitting element is 5 or more, the light-emitting element is bar-like shaped. Therefore, without increasing material costs of the light-emitting elements, the equipment cost can be cut down, the yield can be improved, and the total manufacturing cost can be cut down.

In an embodiment, each of the light-emitting elements includes:

a bar-like first-conductive-type semiconductor; and a second-conductive-type semiconductor which coaxially covers part of the first-conductive-type semiconductor.

It is noted here that the term 'first conductive type' refers to p-type or n-type. Also, the term 'second conductive type' refers to n-type when the first conductive type is p-type, and p-type when the first conductive type is n-type.

According to this embodiment, since the bar-like first-conductive-type semiconductor is partly covered coaxially by the second-conductive-type semiconductor, light-emission areas of the light-emitting elements become wider. Therefore, brightness of the display device can be enhanced.

In an embodiment, the plurality of light-emitting elements include red light-emitting elements for emitting red light, green light-emitting elements for emitting green light, and blue light-emitting elements for emitting blue light.

According to this embodiment, since the plurality of light-emitting elements include red light-emitting elements for emitting red light, green light-emitting elements for emitting green light, and blue light-emitting elements for emitting blue light, full-color display can be implemented without using any phosphor.

Also, with the display device of this embodiment used for a backlight of a liquid-crystal display device, the color filter of the liquid-crystal display device may be eliminated, allowing the manufacturing cost of the liquid crystal display device to be cut down.

Also, with the display device of this embodiment used for a backlight of a liquid-crystal display device, color purity and brightness of the liquid-crystal display device can be enhanced.

In an embodiment, light-emission areas of the red light-emitting elements, the green light-emitting elements and the blue light-emitting elements are adjusted so that when a flow of an equal current is given to the red light-emitting elements, the green light-emitting elements and the blue light-emitting elements, mixing of red light by the red light-emitting elements, green light by the green light-emitting elements, and blue light by the blue light-emitting elements allows white light to be obtained.

According to this embodiment, when a flow of an equal current is given to the red light-emitting elements, the green light-emitting elements and the blue light-emitting elements, mixing of red light by the red light-emitting elements, green light by the green light-emitting elements, and blue light by the blue light-emitting elements allows white light to be obtained.

In the case where, with a flow of an equal current given to the red light-emitting elements, the green light-emitting elements and the blue light-emitting elements, mixing of red light by the red light-emitting elements, green light by the green light-emitting elements, and blue light by the blue light-emitting elements does not yield white light, it follows that quantities of electric currents flowing to the red light-emitting elements, the green light-emitting elements and the blue light-emitting elements, respectively, have to be adjusted in order to obtain white color by one pixel part. As a result, there arises a problem that the driver circuit for driving the red light-emitting elements, the green light-emitting elements and the blue light-emitting elements is complicated. Besides, larger currents have to be given to light-emitting elements that are weaker in emission intensity out of the red light-emitting elements, the green light-emitting elements and the blue light-emitting elements, posing another problem that those light-emitting elements of weaker emission intensity become shorter in service life.

Thus, since it is unnecessary for the display device of this embodiment to adjust the quantities of currents flowing to the red light-emitting elements, the green light-emitting elements and the blue light-emitting elements, respectively, white color can be obtained with a simple driver circuit, and moreover degradations of the service life of the red light-emitting elements, the green light-emitting elements and the blue light-emitting elements can be prevented.

An embodiment further comprises a plurality of phosphors on which emitted light of the plurality of light-emitting elements goes incident, wherein emitted light of the light-emitting elements is ultraviolet light, and the plurality of phosphors include a red phosphor for emitting red light on incidence of the ultraviolet light, a green phosphor for emitting green light on incidence of the ultraviolet light, and a blue phosphor for emitting blue light on incidence of the ultraviolet light.

According to this embodiment, since the plurality of phosphors include a red phosphor for emitting red light on incidence of ultraviolet light, a green phosphor for emitting green light on incidence of ultraviolet light, and a blue phosphor for emitting blue light on incidence of ultraviolet light, full-color display can be implemented only with light-emitting elements for emitting ultraviolet light.

In an embodiment, respective light-emission areas of the plurality of light-emitting elements are adjusted so that when a flow of an equal current is given to the plurality of light-emitting elements, mixing of the red light by the red phosphor, the green light by the green phosphor, and the blue light by the blue phosphor allows white light to be obtained.

According to this embodiment, when a flow of an equal current is given to the plurality of light-emitting elements, mixing of the red light by the red phosphor, the green light by the green phosphor, and the blue light by the blue phosphor allows white light to be obtained.

In the case where, with a flow of an equal current given to the plurality of light-emitting elements, mixing of red light by the red phosphor, green light by the green phosphor, and blue light by the blue phosphor does not yield white light, it follows that quantities of electric currents flowing to the light-emitting elements, respectively, have to be adjusted. As a result, there arises a problem that the driver circuit for driving the plurality of light-emitting elements is complicated. Besides, larger currents have to be given to light-emitting elements that are weaker in emission intensity out of the plurality of light-emitting elements, posing another problem that those light-emitting elements of weaker emission intensity become shorter in service life.

Thus, since it is unnecessary for the display device of this embodiment to adjust the quantities of currents flowing to the individual light-emitting elements, respectively, white color can be obtained with a simple driver circuit, and moreover degradations of the service life of the plurality of light-emitting elements can be prevented.

In an embodiment, the substrate is a flexible board.

According to this embodiment, since the substrate is a flexible board, the degree of freedom of placement in the substrate can be enhanced.

Also, a display device manufacturing method of the present invention comprising:

a first-interconnect-line formation step for forming a plurality of first interconnect lines extending in one direction on a substrate;

an insulating film formation step for forming an insulating film on the substrate so as to cover the plurality of first interconnect lines;

an exposure step for removing parts of the insulating film to form a plurality of openings so that parts of the first interconnect lines are exposed within the openings, respectively;

a second-interconnect-line formation step for forming a plurality of second interconnect lines extending in another direction on the insulating film having the plurality of openings formed therein and moreover putting parts of the second interconnect lines into the openings, respectively;

an application step for applying a liquid containing a plurality of light-emitting elements onto the first interconnect lines and the second interconnect lines; and an array step for, with a voltage applied to the first interconnect lines and the second interconnect lines, arraying the plurality of light-emitting elements so that one end portions of the light-emitting elements are positioned on parts of the first interconnect lines within the openings while the other end portions of the light-emitting elements are positioned on parts of the second interconnect lines within the openings, respectively.

With this constitution, after the liquid containing a plurality of light-emitting elements is applied onto the first interconnect lines and the second interconnect lines, a voltage is applied to the first interconnect lines and the second interconnect lines, by which one end portions of the light-emitting elements can be placed onto parts of the first interconnect lines within the openings, respectively, while the other end portions of the light-emitting elements can be placed onto parts of the second interconnect lines within the openings. Thus, the work for arraying the plurality of light-emitting elements one by one is no longer necessary, and the placement of a plurality of light-emitting elements can be achieved at a time.

In an embodiment, the plurality of light-emitting elements include a plurality of red light-emitting elements for emitting red light, a plurality of green light-emitting elements for emitting green light, and a plurality of blue light-emitting elements for emitting blue light, the plurality of openings include a plurality of red light-emitting element-use openings for placement of the red light-emitting elements, a plurality of green light-emitting element-use openings for placement of the green light-emitting elements, and a plurality of blue light-emitting element-use openings for placement of the blue light-emitting elements, parts of the first interconnect lines are exposed in the red light-emitting element-use openings, in the green light-emitting element-use openings, and in the blue light-emitting element-use openings, parts of the second interconnect lines are put into the red light-emitting element-use openings, into the green light-emitting element-use openings, and into the blue light-emitting element-use openings, the application step includes:

a step for applying a liquid containing the plurality of red light-emitting elements onto the first interconnect lines and the second interconnect lines;

a step for applying a liquid containing the plurality of green light-emitting elements onto the first interconnect lines and the second interconnect lines; and a step for applying a liquid containing the plurality of blue light-emitting elements onto the first interconnect lines and the second interconnect lines, and wherein the array step includes:

a step for, with a voltage applied to the first interconnect lines and the second interconnect lines corresponding to the red light-emitting elements, arraying the plurality of red light-emitting elements so that one end portions of the red light-emitting elements are positioned onto parts of the first interconnect lines within the red light-emitting element-use openings while the other end portions of the red light-emitting elements are positioned onto parts of the second interconnect lines within the red light-emitting element-use openings;

a step for, with a voltage applied to the first interconnect lines and the second interconnect lines corresponding to the green light-emitting elements, arraying the plurality of green light-emitting elements so that one end portions of the green light-emitting elements are positioned onto parts of the first interconnect lines within the green light-emitting element-use openings while the other end portions of the green light-emitting elements are positioned onto parts of the second interconnect lines within the green light-emitting element-use openings; and a step for, with a voltage applied to the first interconnect lines and the second interconnect lines corresponding to the blue light-emitting elements, arraying the plurality of blue light-emitting elements so that one end portions of the blue light-emitting elements are positioned onto parts of the first interconnect lines within the blue light-emitting element-use openings while the other end portions of the blue light-emitting elements are positioned onto parts of the second interconnect lines within the blue light-emitting element-use openings.

According to this embodiment, with a voltage applied to the first interconnect lines and the second interconnect lines corresponding to the red light-emitting elements, one end portions of the red light-emitting elements can be positioned onto parts of the first interconnect lines within the red light-emitting element-use openings while the other end portions of the red light-emitting elements can be positioned onto parts of the second interconnect lines within the red light-emitting element-use openings. Thus, the work for placing the plurality of red light-emitting elements one by one is no longer necessary, and the placement of a plurality of light-emitting elements can be achieved at a time.

Also, with a voltage applied to the first interconnect lines and the second interconnect lines corresponding to the green light-emitting elements, one end portions of the green light-emitting elements can be positioned onto parts of the first interconnect lines within the green light-emitting element-use openings while the other end portions of the green light-emitting elements can be positioned onto parts of the second interconnect lines within the green light-emitting element-use openings. Thus, the work for placing the plurality of green light-emitting elements one by one is no longer necessary, and the placement of a plurality of light-emitting elements can be achieved at a time.

Also, with a voltage applied to the first interconnect lines and the second interconnect lines corresponding to the blue light-emitting elements, one end portions of the blue light-emitting elements can be positioned onto parts of the first interconnect lines within the blue light-emitting element-use openings while the other end portions of the blue light-emitting elements can be positioned onto parts of the second interconnect lines within the blue light-emitting element-use openings. Thus, the work for placing the plurality of blue light-emitting elements one by one is no longer necessary, and the placement of a plurality of light-emitting elements can be achieved at a time.

Thus, only by performing one-time arraying of the plurality of red light-emitting elements, one-time arraying of the plurality of green light-emitting elements, and one-time arraying of the plurality of blue light-emitting elements, i.e., only by performing the arraying process three times, a plurality of red light-emitting elements, green light-emitting elements and blue light-emitting elements can be placed to desired positions, respectively.

In an embodiment, emitted light of the light-emitting elements is ultraviolet light, the plurality of openings include a plurality of red phosphor-use openings, a plurality of green phosphor-use openings, and a plurality of blue phosphor-use openings, parts of the first interconnect lines are exposed in the red phosphor-use openings, in the green phosphor-use openings, and in the blue phosphor-use openings, and parts of the second interconnect lines are put into the red phosphor-use openings, into the green phosphor-use openings, and into the blue phosphor-use openings, the display device manufacturing method further comprising a phosphor formation step for forming in the red phosphor-use openings a red phosphor which emits red light upon reception of the ultraviolet light, forming in the green phosphor-use openings a green phosphor which emits green light upon reception of the ultraviolet light, and forming in the blue phosphor-use openings a blue phosphor which emits blue light upon reception of the ultraviolet light.

According to this embodiment, a red phosphor which emits red light upon reception of the ultraviolet light is formed in the red phosphor-use openings, a green phosphor which emits green light upon reception of the ultraviolet light is formed in the green phosphor-use openings, and a blue phosphor which emits blue light upon reception of the ultraviolet light is formed in the blue phosphor-use openings. Thus, full-color display can be implemented with light-emitting elements for emitting ultraviolet light.

Also, the full-color display allows light-emitting elements to be provided in one type, and therefore can be realized with low cost.

Also, in one embodiment, there is provided a display device manufacturing method, wherein the or each light-emitting element has a length to width ratio of 5 to 400 and the length is 0.5 µm to 200 µm.

In an embodiment, there is provided a display device driving method, wherein an AC voltage is applied to the first interconnect lines and the second interconnect lines so that the light-emitting elements emit light.

With this constitution, since light emission by the light-emitting elements is effected by applying an AC voltage to the first interconnect lines and the second interconnect lines, uniform emission by a plurality of light-emitting elements can be achieved even if the plural light-emitting elements connected to the first interconnect lines are not uniformized in polarity of their one end portions. Thus, there is no need for performing control for uniformizing the polarity of one end portions of the plural light-emitting elements connected to the first interconnect lines, so that the manufacturing process can be prevented from being complicated.

Also, a liquid crystal display device of the present invention comprises:

a light-pervious first substrate;

a light-pervious second substrate;

liquid crystals filled between the first substrate and the second substrate; and light-emitting elements placed on one surface of the first substrate opposite to a liquid-crystal side surface.

It is noted here that herein, for example, the first substrate is one of a TFT (Thin Film Transistor) substrate or a color filter substrate while the second substrate is the other one of the TFT substrate or the color filter substrate. The TFT substrate has thin film transistors (TFTs) as switching elements provided thereon. The color filter substrate has a black matrix provided for intercepting light emitted from the light-emitting elements, or red, green and blue colored layers as well as a black matrix provided thereon.

According to the liquid crystal display device of this invention, since the light-emitting elements are placed on the first substrate, the light-emitting elements are formed directly on one substrate out of two substrates constituting the liquid crystal display device. Therefore, the substrate for placing the light-emitting elements thereon, which has been necessary for conventional backlight devices, is no longer necessary.

Thus, the backlight part constituted by the light-emitting elements can be formed thin, so that a thin-type liquid crystal display device can be realized.

In an embodiment, each of the light-emitting elements includes:

a bar-like first-conductive-type semiconductor core; and a second-conductive-type semiconductor layer formed so as to cover the semiconductor core, wherein the or each light-emitting element is placed on the first substrate so that an axis of the light-emitting element becomes generally parallel to the surface of the first substrate.

According to the liquid crystal display device of this embodiment, since the light-emitting elements are bar-like structure light-emitting elements, light emitted from the light-emitting elements is irradiated over 360-degree directions about the axis of the light-emitting elements. Therefore, in the step for placing the light-emitting elements on the first substrate, there is no need for controlling the rotational direction about the axis. Thus, the arraying of the light-emitting elements becomes easily achievable.

Also, since the light-emitting elements are bar-like structure light-emitting elements, a larger light-emission area per volume of each light-emitting element can be obtained. Therefore, the size of the light-emitting element to obtain a specified light quantity can be made smaller, so that the material cost for the light-emitting elements can be cut down. Thus, the cost for the liquid crystal display device can be cut down.

In an embodiment, light-passing regions through which light emitted from the light-emitting elements passes are provided in the first substrate or the second substrate, and the light-emitting elements are placed at positions overlapping with the light-passing regions as viewed in directions orthogonal to the surface of the first substrate, and each of the light-emitting elements is smaller than each light-passing region.

According to the liquid crystal display device of this embodiment, the light-emitting elements, which are smaller than light-passing regions, are placed at positions overlapping with the light-passing regions. Therefore, light emitted from the light-emitting elements can be utilized with high efficiency. That is, since no light-emitting elements are placed at positions that do not overlap with the light-passing regions, irradiation of light that does not contribute to display can be suppressed, allowing a reduction of power consumption to be achieved.

Also, one light-emitting element can be placed for each one light-passing region, and the light-emitting elements and the light-passing regions can be kept in an identical positional relation. Therefore, light in the backlight part is constant among pixels, free from occurrence of brightness variations. In contrast to this, in conventional backlight devices, the number of light-emitting elements is, in general, small against the number of pixels of the liquid-crystal panel. Therefore, the positional relation between the light-emitting elements and the pixels differs among pixels, causing the intensity of light derived from the light-emitting elements to differ among pixels, with occurrence of brightness variations involved in light of the backlight.

Also, since the light-emitting elements are formed on the same substrate as the first substrate for forming the liquid-crystal panel thereon, the light-emitting elements can be placed with high controllability in accordance with the light-passing regions. That is, alignment between the light-passing regions and the light-emitting elements can be fulfilled with high controllability.

An embodiment further comprises a reflection film for reflecting light, which is emitted from the light-emitting elements, toward the first substrate side.

According to the liquid crystal display device of this embodiment, since the reflection film for reflecting light, which has been emitted from the light-emitting elements, toward the first substrate side is included, light applied from the light-emitting elements toward one side of the first substrate opposite to the liquid crystal side can be reflected efficiently toward the liquid crystals. Thus, the light emitted from the light-emitting elements can be utilized with high efficiency.

In an embodiment, the reflection film is stacked on a transparent protective film stacked on the light-emitting elements.

According to the liquid crystal display device of this embodiment, since the reflection film is stacked on the transparent protective film stacked on the light-emitting elements, adjusting film thickness and configuration of the protective film makes it possible to fulfill light irradiation to the light-passing regions provided on the first substrate or the second substrate without waste.

In an embodiment, thin film transistors as switching elements are provided on a liquid-crystal side surface of the first substrate.

According to the liquid crystal display device of this embodiment, since thin film transistors (TFTs) as switching elements are provided on the liquid-crystal side surface of the first substrate, light emitted from the light-emitting elements goes incident on liquid crystals from the substrate side on which the TFTs are formed.

The point that light is incident from the substrate side on which the TFTs are formed is the same with general liquid crystal display devices. Thus, there can be realized a thin-type liquid crystal display device without largely changing the construction of the liquid crystal display device.

In an embodiment, thin film transistors as switching elements are provided on a liquid-crystal side surface of the second substrate.

According to the liquid crystal display device of this embodiment, since thin film transistors (TFTs) as switching elements are provided on a liquid-crystal side surface of the second substrate, light emitted from the light-emitting elements goes incident on the liquid crystals from one substrate side opposite to the substrate side on which TFTs are formed.

Then, since the light-emitting elements and the TFTs can be formed on different substrates, respectively, the TFTs can be prevented from being damaged in the placement step of the light-emitting elements, or the light-emitting elements can be prevented from being damaged in the formation step of the TFTs.

As apparent from the above description, according to the light-emitting device manufacturing method, the light-emitting device, the lighting device, the backlight and the liquid crystal panel of the invention, the manufacturing cost can be cut down, and characteristic variations are lessened so that the yield can be improved.

Also, according to the light-emitting device manufacturing method of the invention, without manipulating the individual light-emitting elements one by one, a plurality of light-emitting elements can be arrayed at specified positions by one-time process, thus allowing the manufacturing cost to be cut down.

In the display device of the invention, one end portions of the light-emitting elements are electrically connected directly to the first interconnect lines and moreover the other end portions of the light-emitting elements are electrically connected to directly to the second interconnect lines. Thus, there is no need for electrically connecting, with use of wires, the first interconnect lines as well as the second interconnect lines and the light-emitting elements to each other, allowing lower-cost manufacture to be realized.

Also, since one end portions of the light-emitting elements are electrically connected directly to the first interconnect lines and moreover the other end portions of the light-emitting elements are electrically connected directly to the second interconnect lines, bonding pads become also unnecessary, so that distances among the light-emitting elements can be made narrower. Moreover, the light-emitting elements have length to width ratios falling within a range of 5 to 400, and those lengths are within a range of 0.5 µm to 200 µm, hence quite small sizes. Therefore, for the display devices of the invention, the pixel parts can be made very small, making it implementable to fulfill high-definition display.

In the display device manufacturing method of the invention, after the liquid containing a plurality of light-emitting elements is applied onto the first interconnect lines and the second interconnect lines, a voltage is applied to the first interconnect lines and the second interconnect lines, so that one end portions of the light-emitting elements can be placed onto parts of the first interconnect lines within the individual openings, respectively, while the other end portions of the light-emitting elements can be placed onto parts of the second interconnect lines within the individual openings, respectively. Thus, there is no need for placing a plurality of light-emitting elements one by one, and placement of a plurality of light-emitting elements can be achieved at a time.

In the display device driving method of the invention, since light emission by the light-emitting elements is effected by applying an AC voltage to the first interconnect lines and the second interconnect lines, uniform emission by a plurality of light-emitting elements can be achieved even if the plural light-emitting elements connected to the first interconnect lines are not uniformized in polarity of their one end portions. Thus, there is no need for performing control for uniformizing the polarity of one end portions of the plural light-emitting elements connected to the first interconnect lines, so that the manufacturing process can be prevented from being complicated.

According to the liquid crystal display device of the invention, since the light-emitting elements are placed on the first substrate, the backlight part constituted by the light-emitting elements can be formed thin, so that a thin-type liquid crystal display device can be realized.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 99B is a sectional view showing a second step of the light-emitting element manufacturing method;

FIG. 99C is a sectional view showing a third step of the light-emitting element manufacturing method;

FIG. 99D is a sectional view showing a fourth step of the light-emitting element manufacturing method;

FIG. 99E is a sectional view showing a fifth step of the light-emitting element manufacturing method;

FIG. 100 is a plan view showing electrodes of a liquid-crystal display device;

FIG. 101 is a sectional view showing a method of arraying light-emitting elements on the electrodes, as taken along the line A-A of FIG. 4;

FIG. 102 is a plan view showing a state in which the light-emitting elements are arrayed on the electrodes;

FIG. 103 is a sectional view showing a state in which the light-emitting elements are arrayed on the electrodes, as taken along the line B-B of FIG. 6;

FIG. 104 is a sectional view showing a state in which a reflection coating is provided on the light-emitting element;

FIG. 105 is a sectional view showing a comparative example;

FIG. 106 is a simplified sectional view showing a liquid-crystal display device according to a twenty-ninth embodiment of the invention;

FIG. 107 is a simplified sectional view showing a liquid-crystal display device according to a thirtieth embodiment of the invention;

Figure 108:
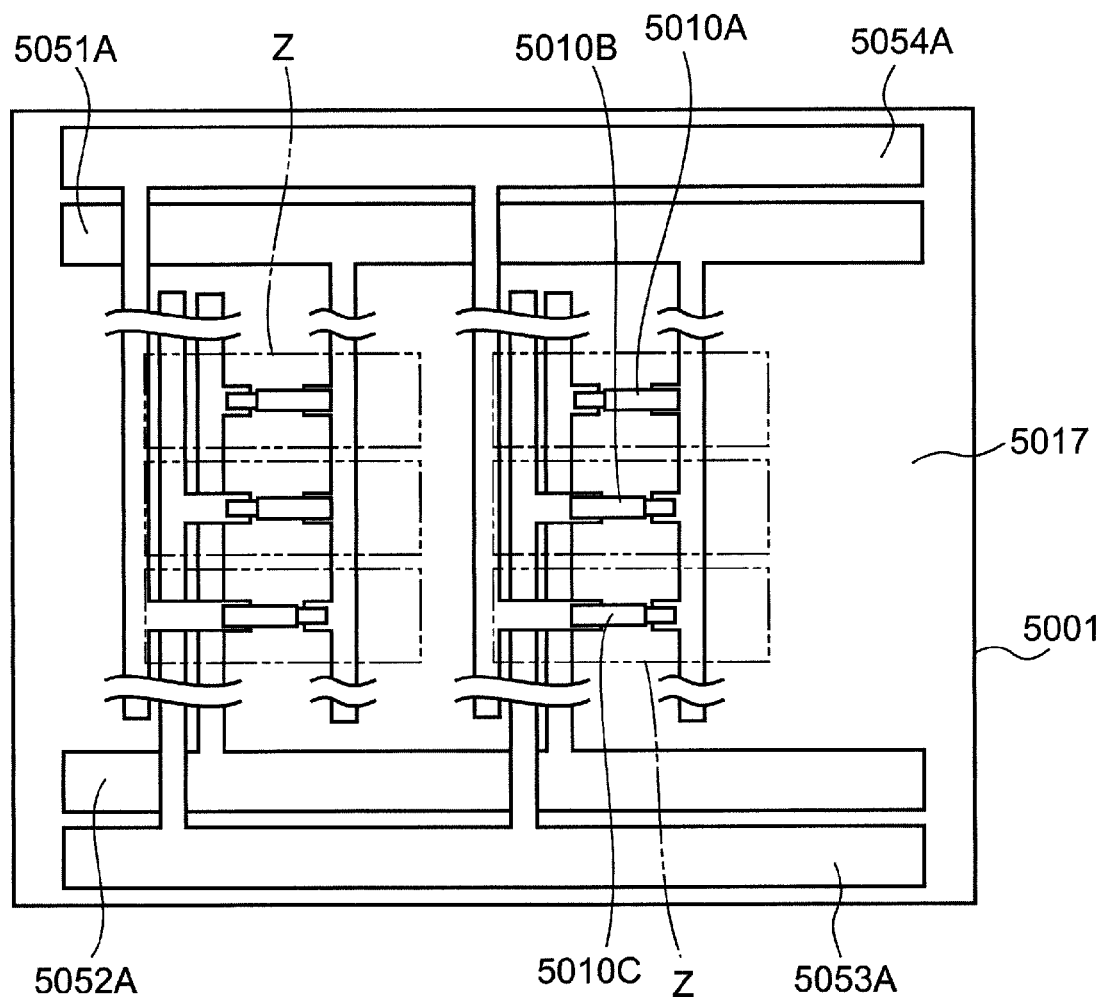
Figure 109:
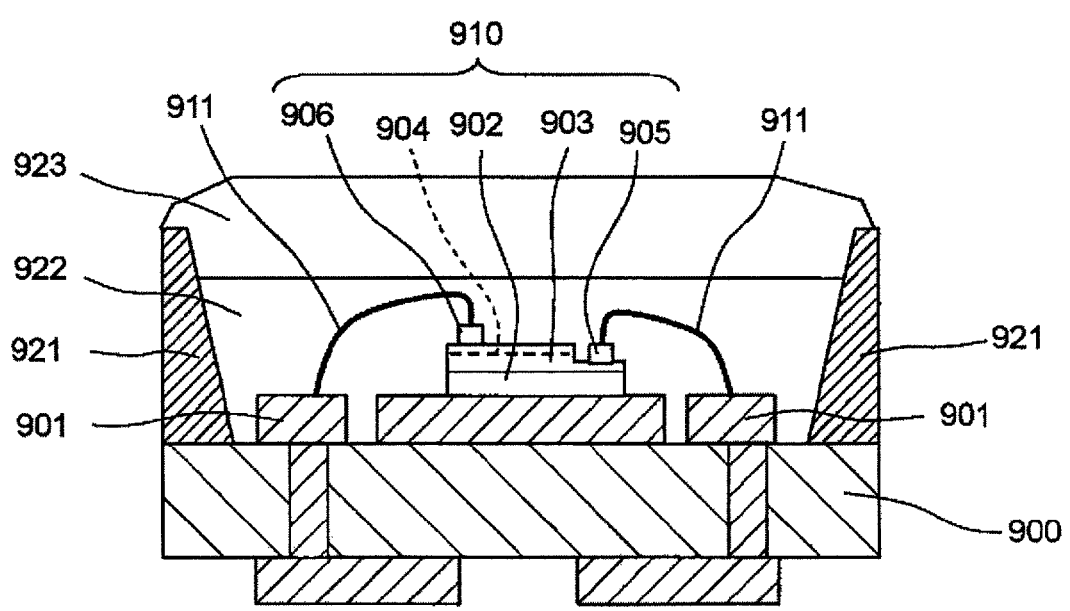
Figure 110:
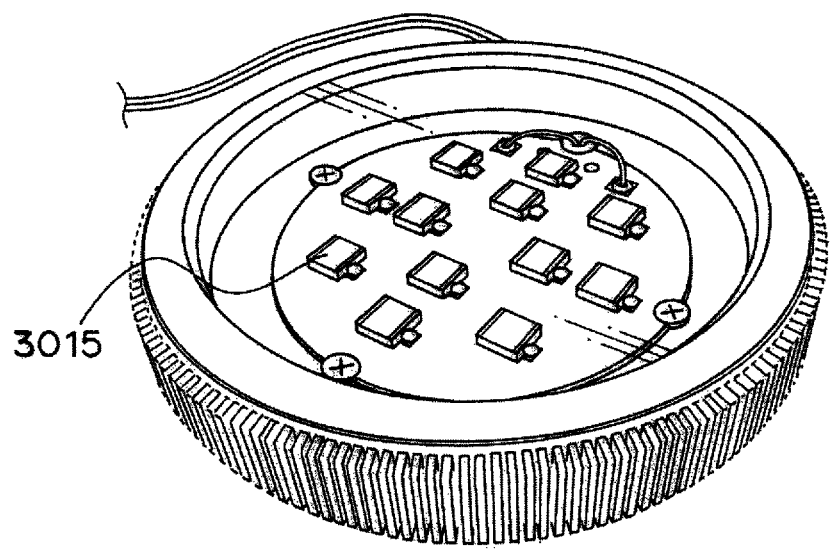

FIG. 108 is a plan view showing a state in which the light-emitting elements are arrayed on the electrodes;

FIG. 109 is a sectional view of a light-emitting device according to a prior art; and FIG. 110 is a perspective view showing a light-emitting device according to a prior art.

DETAILED DESCRIPTION OF THE INVENTION

Hereinbelow, a light-emitting device manufacturing method, a light-emitting device, a lighting device, a backlight, and a liquid-crystal panel according to the present invention will be described in detail by way of embodiments thereof illustrated in the accompanying drawings. In this embodiment, Si-doped n-type GaN and Mg-doped p-type GaN are used for the light-emitting elements, but impurities for doping to GaN are not limited to these.

First Embodiment

For description of the first embodiment of the invention, first, a manufacturing method of a first light-emitting element (shown in FIGS. 1 to 3) will be described in the following chapter (1) as the light-emitting element to be used for the light-emitting device manufacturing method and the light-emitting device, and then a manufacturing method for a second light-emitting element (shown in FIGS. 4 to 17) will be described in chapter (2). Further, a placement step and an interconnection step of light-emitting elements on one identical substrate will be described in chapters (3) to (5), and thereafter a substrate dividing step (shown in FIG. 31) will be described in chapter (6).

(1) First Light-Emitting Element Manufacturing Method

Figure 1:
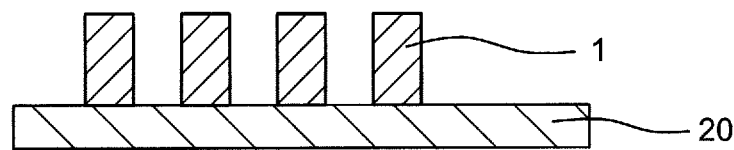
FIG. 1 is a process view of a first light-emitting element manufacturing method to be used for a light-emitting device according to a first embodiment of the present invention.
Figure 2:
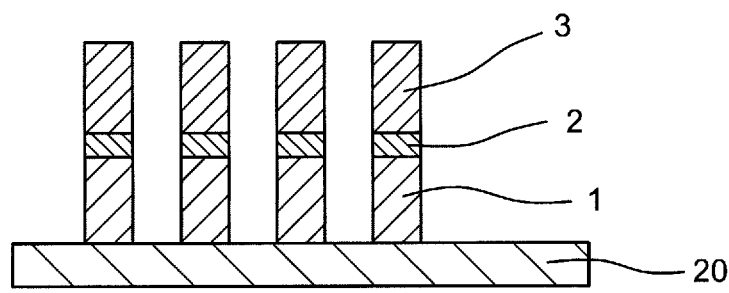
FIG. 2 is a process view subsequent to FIG. 1.
Figure 3:
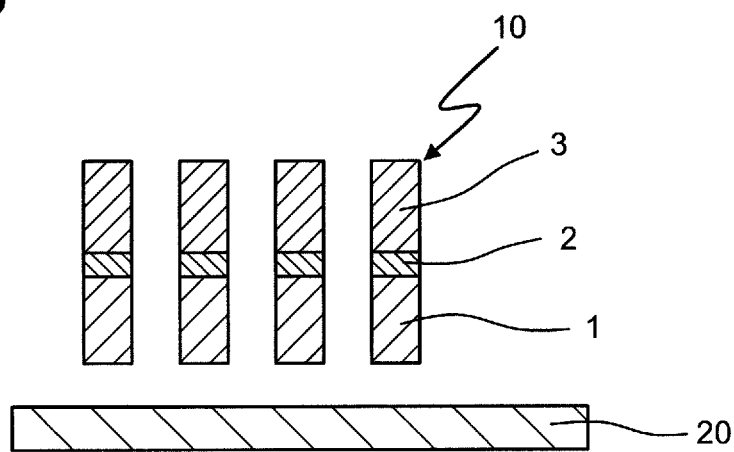
FIG. 3 is a process view subsequent to FIG. 2.

FIGS. 1 to 3 show process views of a first light-emitting element manufacturing method to be used for the light-emitting device according to the first embodiment of the invention. The first light-emitting element manufacturing method will be described below with reference to FIGS. 1 to 3.

First, as shown in FIG. 1, an n-type GaN layer 1 is formed on an n-type GaN substrate 20. A bar-like n-type GaN is crystal grown by using an MOCVD (Metal Organic Chemical Vapor Deposition) apparatus. For growth of this bar-like n-type GaN 1, with a growth temperature set to about 700° C. to 800° C. and with trimethylgallium (TMG) and ammonia ($NH_3$) used as growth gases, silane ($SiH_4$) is fed as an n-type impurity and hydrogen ($H_2$) is fed as a carrier gas, by which a Si-doped n-type GaN layer 1 can be grown. On the other hand, given that GaN is grown at low temperatures (e.g., 600° C. or lower) or high temperatures (e.g., 1000° C. or higher), it would follow that with low temperatures, the formed GaN is grown with an upward bias so as to be tapered, while with high temperatures, the formed GaN is grown with a sideward bias so as to be not bar-like but thin-film shaped.

Next, as shown in FIG. 2, an InGaN quantum well layer 2 is grown on the n-type GaN layer 1. For the quantum well layer 2, with a set temperature of 750° C. according to emission wavelengths, nitrogen ($N_2$) as a carrier gas as well as TMG, $NH_3$ and trimethylindium (TMI) as growth gases are fed, by which the quantum well layer 2 composed of p-type InGaN can be formed on the n-type GaN layer 1. In addition, in this quantum well layer, a p-type AlGaN layer may be interposed as an electron blocking layer between the InGaN layer and the p-type GaN layer. Also, the quantum well layer may be a multiquantum well structure in which a GaN barrier layer and an InGaN quantum well layer are alternately stacked.

Next, a p-type GaN layer 3 is formed on the InGaN quantum well layer 2. This p-type GaN layer 3 can be formed with a set temperature of 800° C. and by using TMG and $NH_3$ as growth gases and using $Cp_2Mg$ for feed of a p-type impurity.

Next, as shown in FIG. 3, a plurality of bar-like structure light-emitting elements 10 each composed of the n-type GaN layer 1, the quantum well layer 2 and the p-type GaN layer 3 are separated from the substrate by applying thereto ultrasonic vibrations in a solution of IPA or the like.

In the first light-emitting element manufacturing method to be used for the light-emitting device of the first embodiment, a plurality of elements are formed on the n-type GaN substrate 20, which is an epitaxial substrate, and a plurality of bar-like structure light-emitting elements 10 separated from on the n-type GaN substrate 20 are used. Thus, the n-type GaN substrate 20 can be reused, making it possible to achieve a cost cut as compared with the case where the substrate is used as it is divided together with the light-emitting elements.

In this embodiment, the bar-like structure light-emitting elements 10 are used as bar-like light-emitting elements. However, without being limited to this, the bar-like light-emitting elements may be those obtained by, for example, growing a plurality of bar-like light-emitting elements with a growth mask or metal seed having a growth hole used on an n-type GaN substrate, and then separating the light-emitting elements from the substrate.

In the first embodiment, bar-like light-emitting elements are used. However, without being limited to this, the light-emitting elements of the invention may be those which have a flat light-emitting surface of circular, elliptical, square, rectangular, polygonal or other shape and which are placed on a mounting surface so that the light-emitting surface becomes parallel to the substrate.

(2) Second Light-Emitting Element Manufacturing Method

FIGS. 4 to 17 are process views sequentially showing a second light-emitting element manufacturing method to be used for the light-emitting device of the first embodiment of the invention.

Figure 4:
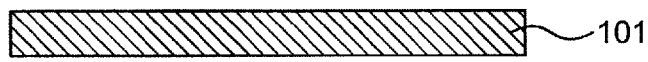
FIG. 4 is a process view of a second light-emitting element manufacturing method to be used for the light-emitting device of the first embodiment of the invention.

In this second embodiment, first, a prepared sapphire substrate 101 is cleaned as shown in FIG. 4.

Figure 5:
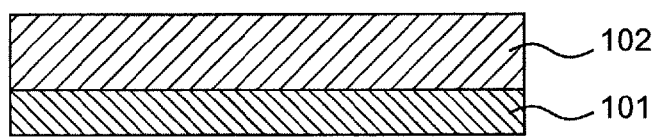
FIG. 5 is a process view subsequent to FIG. 4.

Then, as shown in FIG. 5, an n-type GaN film 102 is formed on the sapphire substrate 101.

Figure 6:
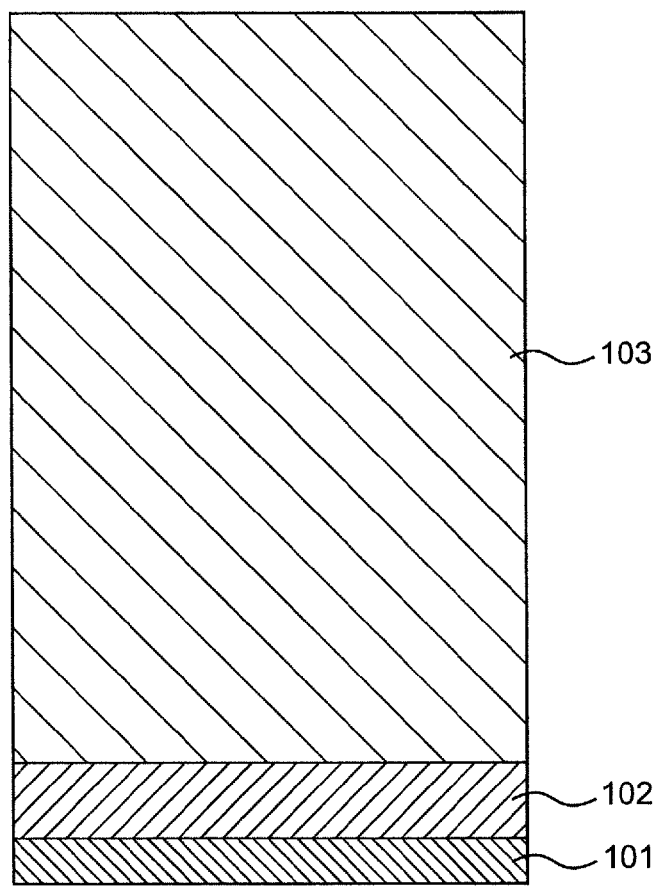
FIG. 6 is a process view subsequent to FIG. 5.

Next, as shown in FIG. 6, a mask layer 103 is formed by deposition on the n-type GaN film 102. This mask layer 103 is made of, for example, SiN or $SiO_2$.

Figure 7:
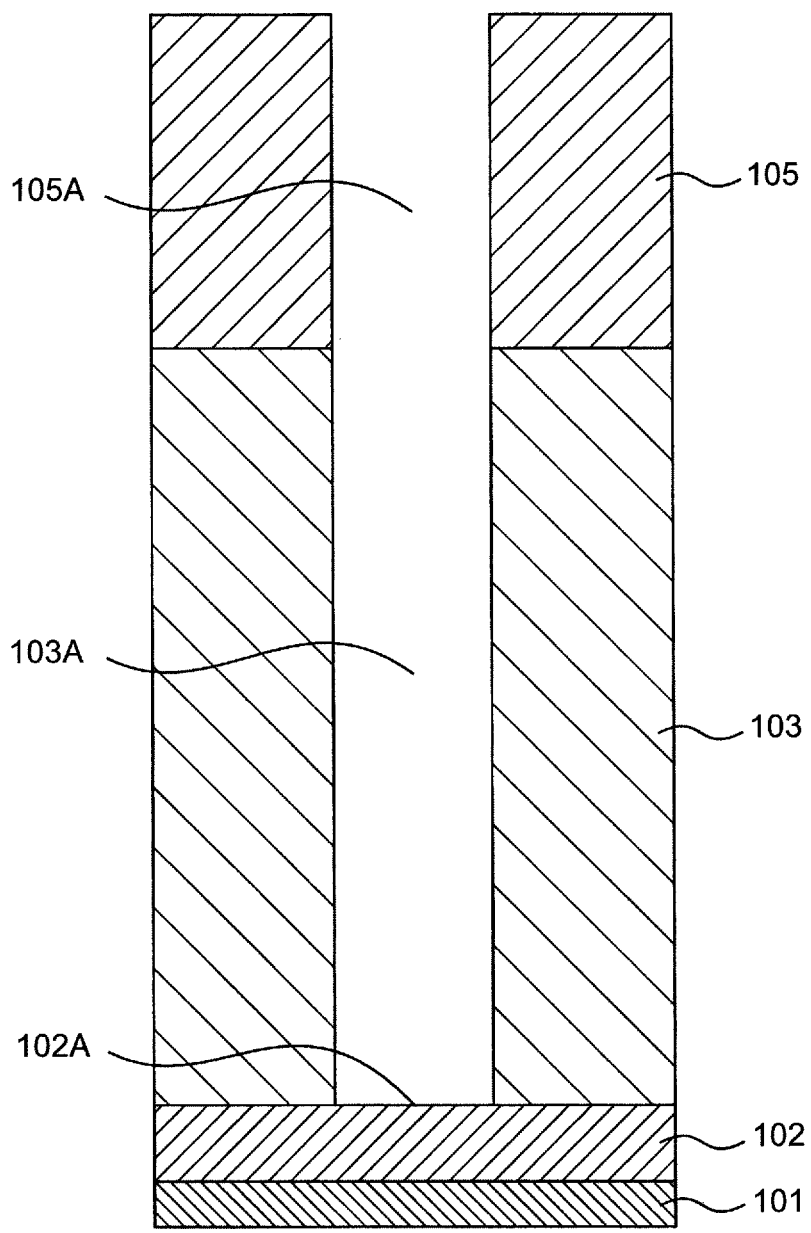
FIG. 7 is a process view subsequent to FIG. 6.

Next, a resist layer 105 is applied on the mask layer 103, followed by exposure to light and development and further execution of dry etching, by which holes 105A, 103A are formed in the resist layer 105 and the mask layer 103, as shown in FIG. 7. By these holes 105A, 103A, a portion 102A of the n-type GaN film 102 is exposed. The mask layer 103 serves as a growth mask, and the hole 103A formed in the mask layer 103 serves as a growth hole.

Figure 8:
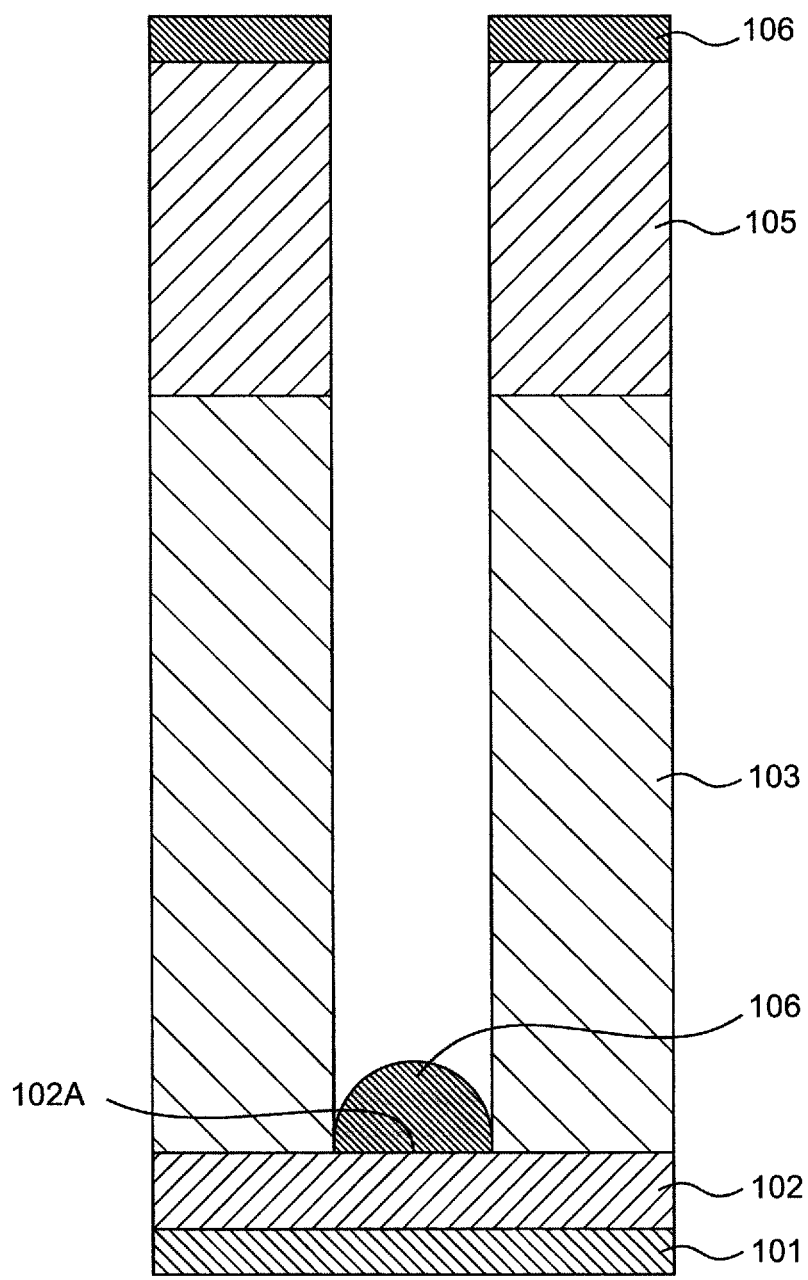
FIG. 8 is a process view subsequent to FIG. 7.

Next, in a catalyst metal formation step, as shown in FIG. 8, a catalyst metal 106 is deposited on the resist layer 105 and on the portion 102A of the n-type GaN film 102 exposed to the hole 103A. As this catalyst metal 106, for example, Ni, Fe or the like may be adopted.

Figure 9:
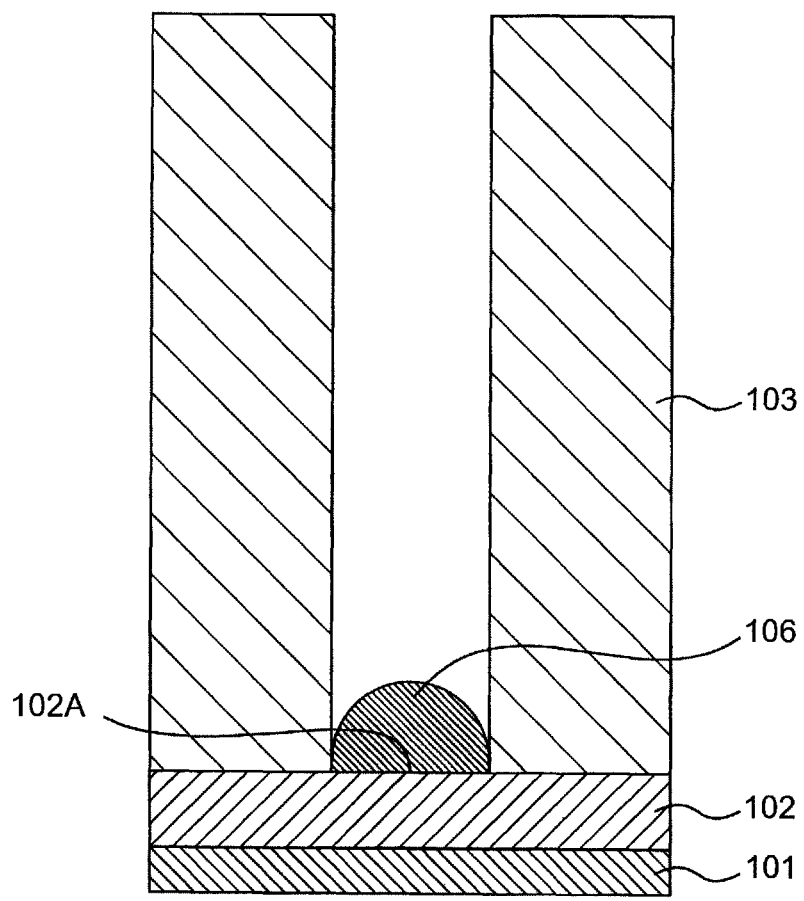
FIG. 9 is a process view subsequent to FIG. 8.

Next, the resist layer 105 and the catalyst metal 106 on the resist layer 105 are removed by lift-off, so that the catalyst metal 106 on the portion 102A of the n-type GaN film 102 is left as shown in FIG. 9, followed by cleaning.

Figure 10:
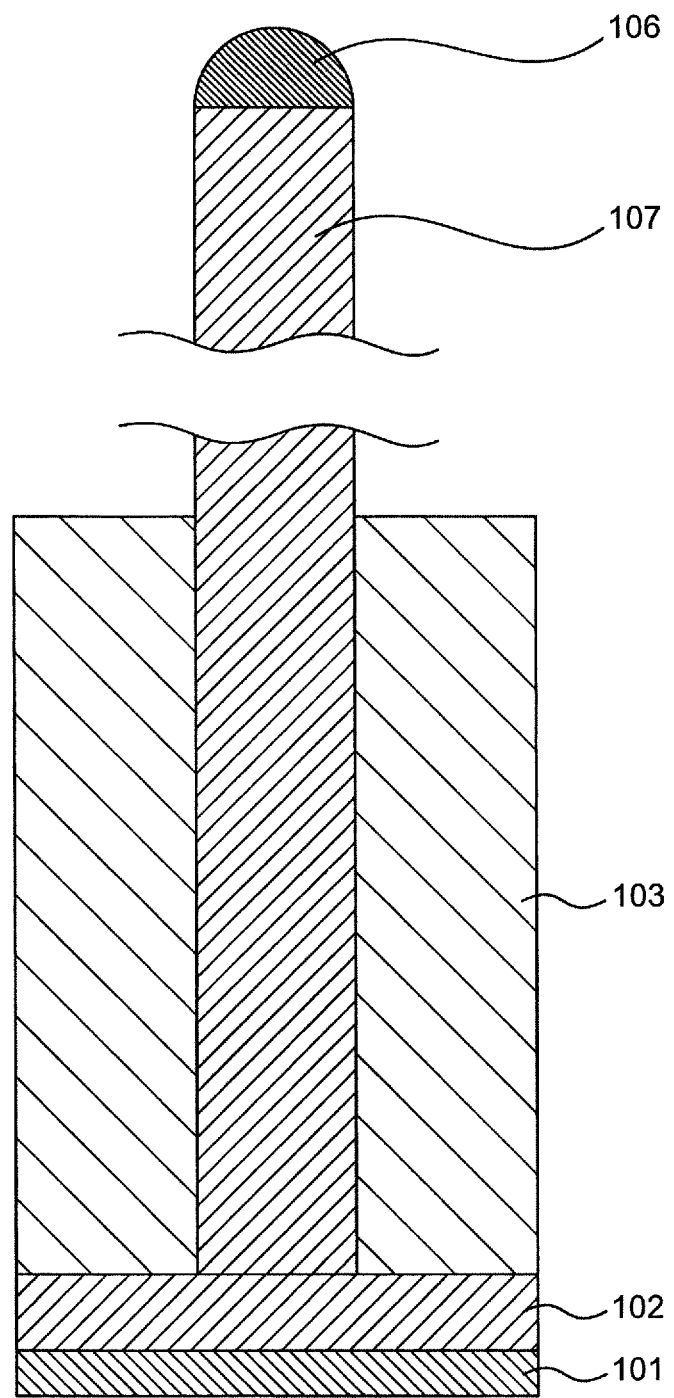
FIG. 10 is a process view subsequent to FIG. 9.

Next, in a semiconductor core formation step, as shown in FIG. 10, n-type GaN is crystal grown by using an MOCVD (Metal Organic Chemical Vapor Deposition) apparatus so that a bar-like semiconductor core 107 having a nearly hexagonal-shaped cross section is formed in the presence of the catalyst metal 106. This bar-like semiconductor core 107 is grown to, for example, a length of 25 μm. With the growth temperature set to about 800° C. and with trimethylgallium (TMG) and ammonia ($NH_3$) used as growth gases, silane ($SiH_4$) is fed for feed of an n-type impurity and hydrogen ($H_2$) is fed as a carrier gas, by which a Si-doped n-type GaN semiconductor core 107 can be grown. In this case, the n-type GaN results in a crystal growth of the hexagonal system, so that making growth in a state that a vertical direction with respect to the sapphire substrate 101 surface is aligned with a c-axis direction allows a hexagonal cylinder-shaped semiconductor core to be obtained. Depending on the growth direction, growth temperature or other growth conditions, there is a tendency that the cross section more likely becomes nearly circular-shaped when the semiconductor core to be grown is as small in diameter as several 10 nm to several 100 nm, while the growth with a nearly hexagonal-shaped cross section becomes easier to fulfill when the diameter is as large as about 0.5 μm to several μm.

The hole 105A of the resist layer 105 and the hole 103A of the mask layer 103 are formed both in plurality, and the catalyst metal 106 is formed at a plurality of portions 102A of the n-type GaN film 102 exposed to the plurality of holes 105A, 103A, by which a plurality of bar-like semiconductor cores 107 are formed.

Figure 11:
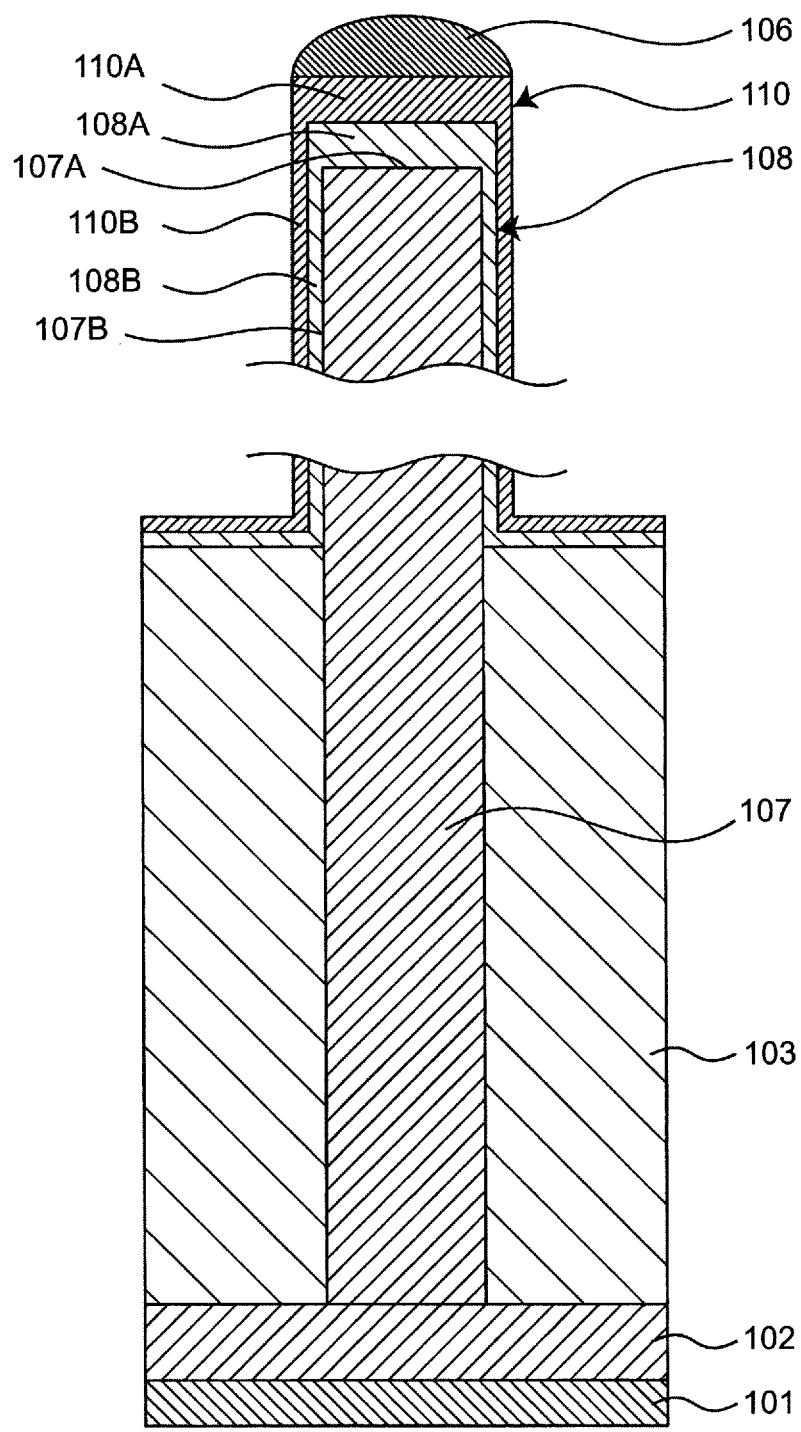
FIG. 11 is a process view subsequent to FIG. 10.

Next, as shown in FIG. 11, a quantum well layer 108 made of p-type InGaN is formed by MOCVD so as to cover the n-type GaN semiconductor cores 107 and the mask layer 103. For this quantum well layer 108, with a set temperature of 750° C. according to emission wavelengths, nitrogen (N$_2$) is fed as a carrier gas while TMG, NH$_3$ and trimethylindium (TMI) are fed as growth gases, by which a quantum well layer 108 made of p-type InGaN can be formed on the n-type GaN semiconductor cores 107 and the mask layer 103. In addition, in this quantum well layer, a p-type AlGaN layer may be interposed as an electron blocking layer between the InGaN layer and the p-type GaN layer. Also, the quantum well layer may be a multiquantum well structure in which a GaN barrier layer and an InGaN quantum well layer are alternately stacked.

Next, in a semiconductor layer formation step, a semiconductor layer 110 made of p-type GaN is formed all over the quantum well layer 108 by MOCVD as shown in FIG. 11. For this semiconductor layer 110, with a set temperature of 900° C., TMG and NH$_3$ are used as growth gases while Cp$_2$Mg is used for feed of p-type impurity, so that a semiconductor layer 110 made of p-type GaN can be formed.

In the growth of the quantum well layer 108 and the semiconductor layer 110 by MOCVD, in which film deposition is done with the catalyst metal 106 added, the growth rate is higher, for example 10 to 100 times higher, in portions between the catalyst metal 106 and an end face 107A of the semiconductor core 107, than in portions where a side face 107B of the semiconductor core 107 is covered. As a concrete example, a growth rate of GaN at places with the catalyst metal 106 added is 50 to 100 μm/hour while the growth rate at places with no catalyst metal added is 1 to 2 μm/hour. Therefore, the quantum well layer 108 and the semiconductor layer 110 are thicker in film thickness at their end portions 108A, 110A than at their side face portions 108B, 110B.

Figure 12:
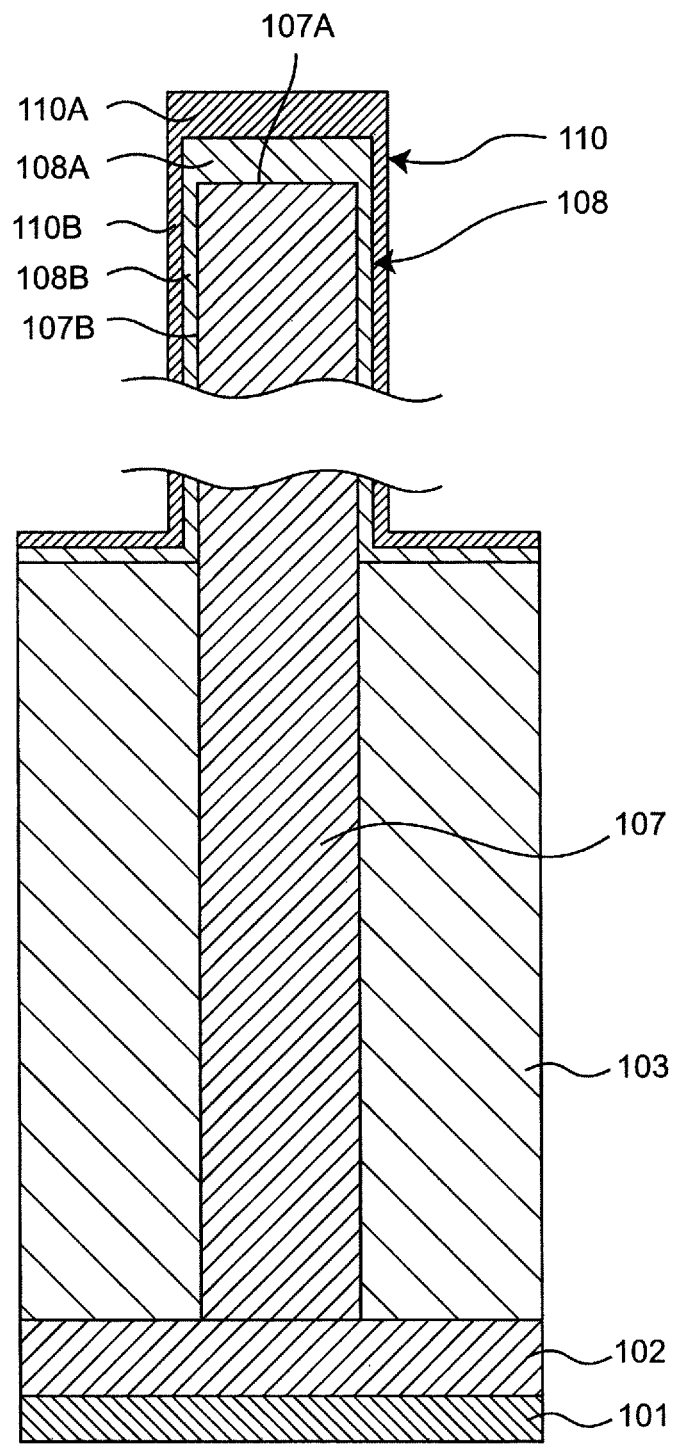
FIG. 12 is a process view subsequent to FIG. 11.

Next, as shown in FIG. 12, in a catalyst metal removal step, the catalyst metal 106 on the semiconductor cores 107 is removed by etching, followed by cleaning, and the semiconductor layer 110 is activated by annealing. In this case, the end portions 108A, 110A of the quantum well layer 108 and the semiconductor layer 110, with which the end face 107A of the semiconductor cores 107 is covered, are thicker in wall thickness than the side face portions 108B, 110B of the quantum well layer 108 and the semiconductor layer 110, with which the side face 107B of the semiconductor cores 107 is covered, so that damage and defects of the metal removal surface are less likely to exert adverse effects on pn junction. Also, the semiconductor cores 107 can be prevented from being exposed from the semiconductor layer 110 during the etching.

Figure 13:
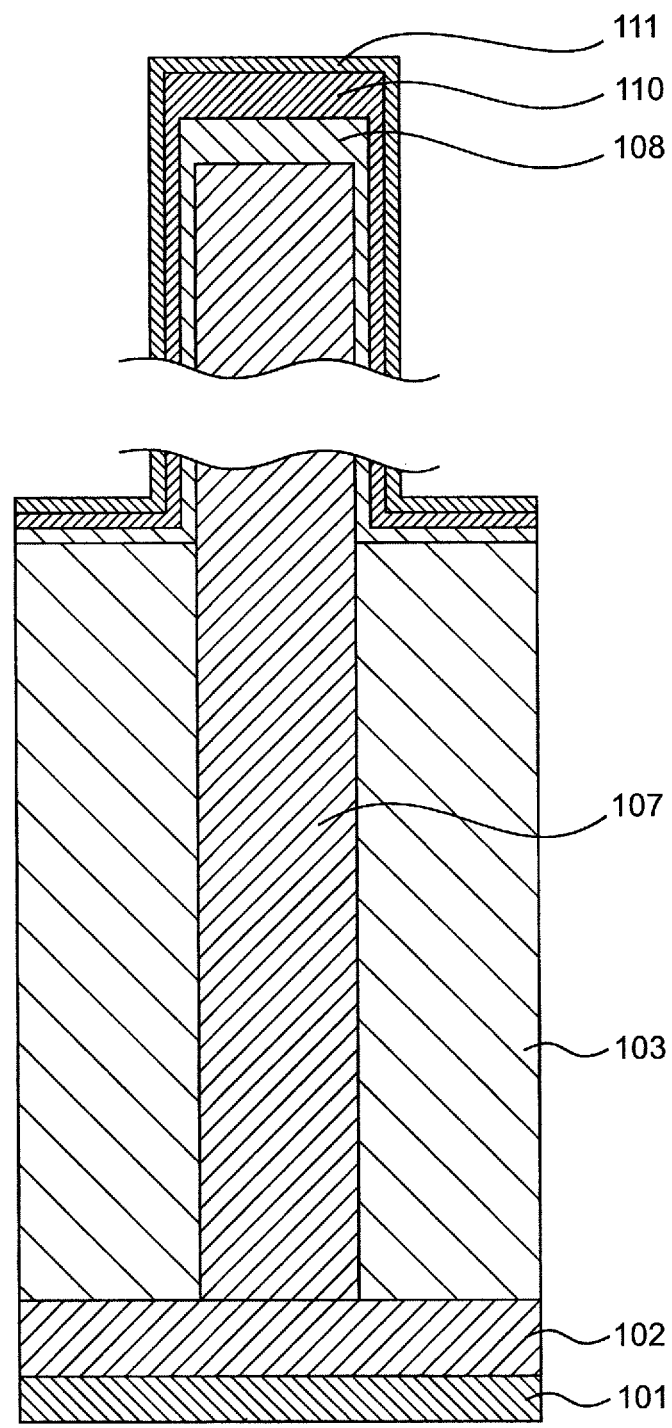
FIG. 13 is a process view subsequent to FIG. 12.

Next, as shown in FIG. 13, an electrically conductive film 111 is formed all over the semiconductor layer 110 made of p-type GaN. As the material of this conductive film 111, polysilicon, ITO (Indium Tin Oxide) or the like may be adopted. The film thickness of the conductive film 111 is set to, e.g., 200 nm. Then, after formation of the conductive film 111, heat treatment is performed at 500° C.-600° C., so that contact resistance between the semiconductor layer 110 made of p-type GaN and the conductive film 111 can be lowered. In addition, without being limited to this, the conductive film 111 may be given by using, for example, a semitransparent stacked metal film of Ag/Ni or Au/Ni having a thickness of 5 nm. For film formation of this stacked metal film, vapor deposition process or sputtering process may be used. Besides, for further lowering of the resistance of the conductive layer, a stacked metal film of Ag/Ni or Au/Ni may be stacked on the conductive film of ITO.

Figure 14:
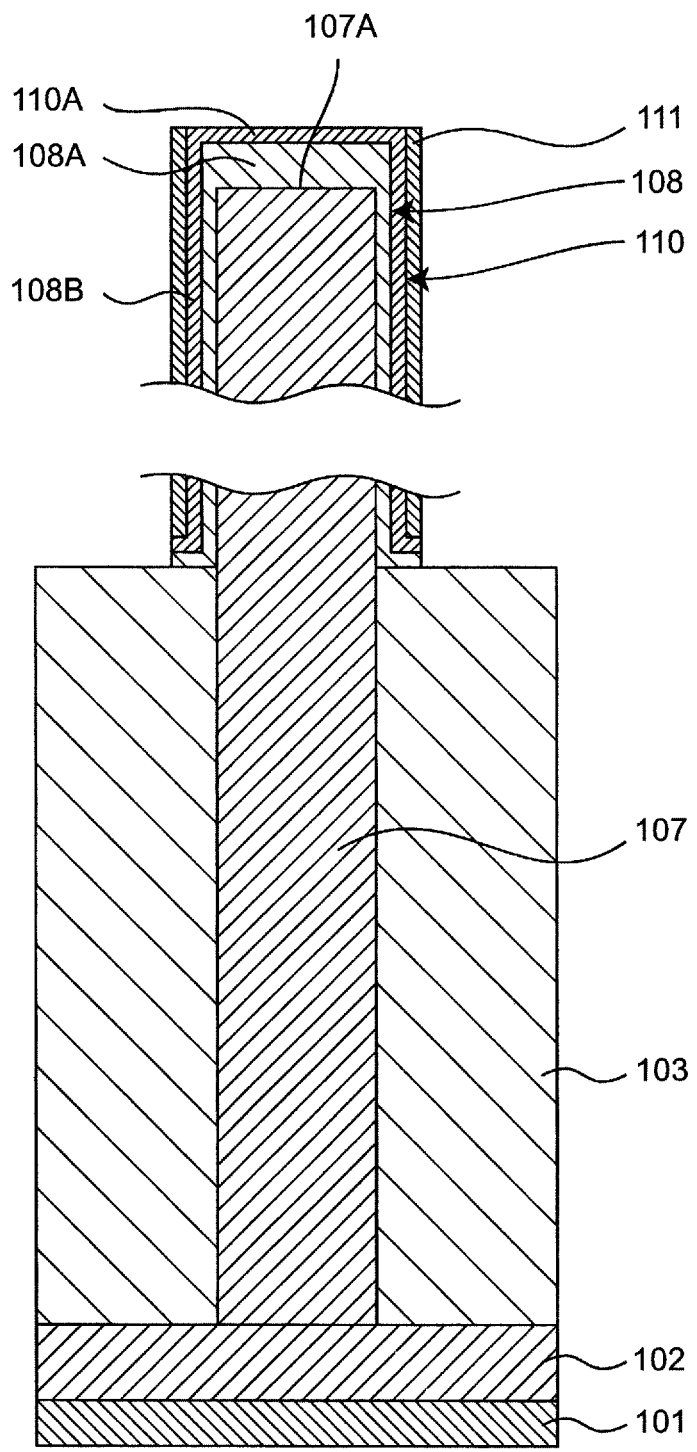
FIG. 14 is a process view subsequent to FIG. 13.

Next, as shown in FIG. 14, portions of the conductive film 111 extending laterally on the semiconductor core 107 and on the mask layer 103 are removed by RIE (Reactive Ion Etching) of dry etching. Also, by the RIE, the end portion 110A of the semiconductor layer 110 covering the end face 107A of the semiconductor core 107 is removed to an extent of a certain thickness. Also by the RIE, portions of the semiconductor layer 110 present in regions so as to extend laterally beyond the conductive film 111 on the mask layer 103 are removed. Further by the RIE, the quantum well layer 108 present in regions so as to extend laterally beyond the conductive film 111 on the mask layer 103 is removed.

As described before, prior to the RIE, the end portion 108A of the quantum well layer 108 is enough thicker in film thickness than its side face portion 108B, and the end portion 110A of the semiconductor layer 110 is enough thicker in film thickness than its side face portion 110B, so that the end portion of the semiconductor core 107 is never exposed after the RIE. Therefore, the quantum well layer 108 and the semiconductor layer 110, with which the end face of the semiconductor core 107 is covered, as well as the quantum well layer 108, the semiconductor layer 110 and the conductive film 111, with which the side face of the semiconductor core 107 is covered, are left by the RIE.

Figure 15:
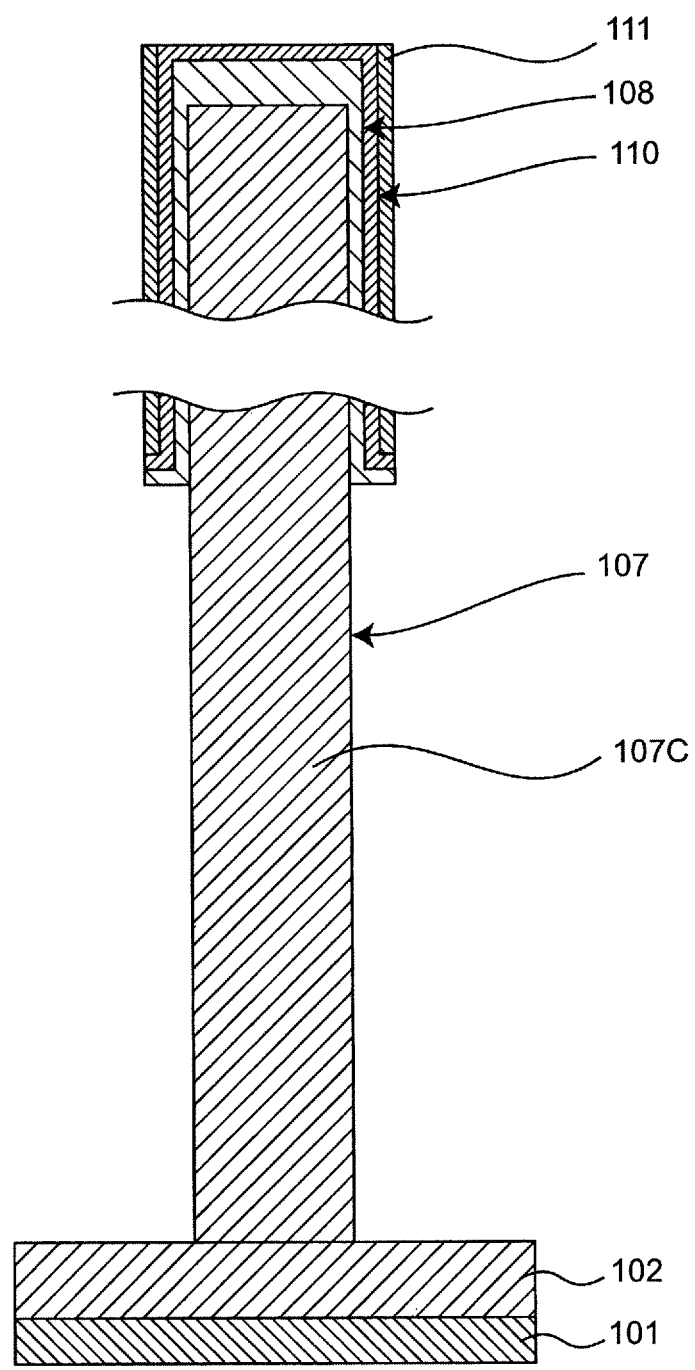
FIG. 15 is a process view subsequent to FIG. 14.

Next, as shown in FIG. 15, the mask layer 103 (shown in FIG. 14) is removed by etching. In a case where this mask layer 103 is formed from oxide silicon (SiO$_2$), use of a solution containing hydrofluoric acid (HF) makes it possible to easily achieve the etching of the mask layer 103 without affecting the semiconductor core 107 and portions of the semiconductor layer 110 and the conductive film 111 covering the semiconductor core 107. Also, dry etching using CF$_4$ makes it possible to easily achieve the etching of the mask layer 103 without affecting the semiconductor core 107 and portions of the semiconductor layer 110 and the conductive film 111 covering the semiconductor core 107. As a result of this, the semiconductor core 107 has an outer peripheral surface of its sapphire substrate 101 side exposure portion 107C is exposed.

Figure 16:
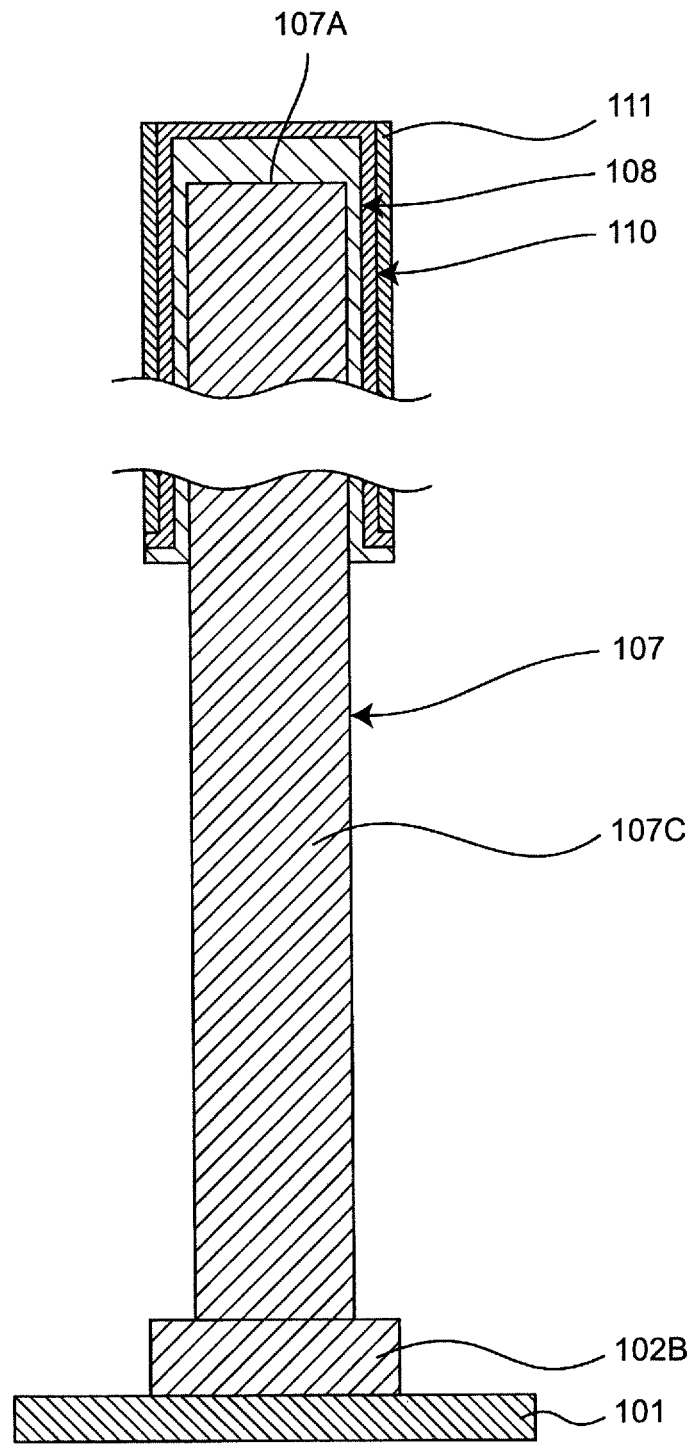
FIG. 16 is a process view subsequent to FIG. 15.

Next, as shown in FIG. 16, the base n-type GaN film 102 is etched by RIE (Reactive Ion Etching), thereby making the sapphire substrate 101 surface exposed. As a result, a step portion 102B made of n-type GaN and adjoining the semiconductor core 107 is formed. In this case, since the semiconductor layer 110 and the quantum well layer 108 on the end face 107A are made thick enough as compared with the thickness of the base n-type GaN film 102, the end face 107A of the semiconductor core 107 can be prevented from being exposed by the RIE.

Thus, a bar-like structure light-emitting element composed of the n-type GaN semiconductor core 107, the p-type InGaN quantum well layer 108, the p-type GaN semiconductor layer 110 and conductive film 111, and the n-type GaN step portion 102B is formed on the sapphire substrate 101.

Figure 17:
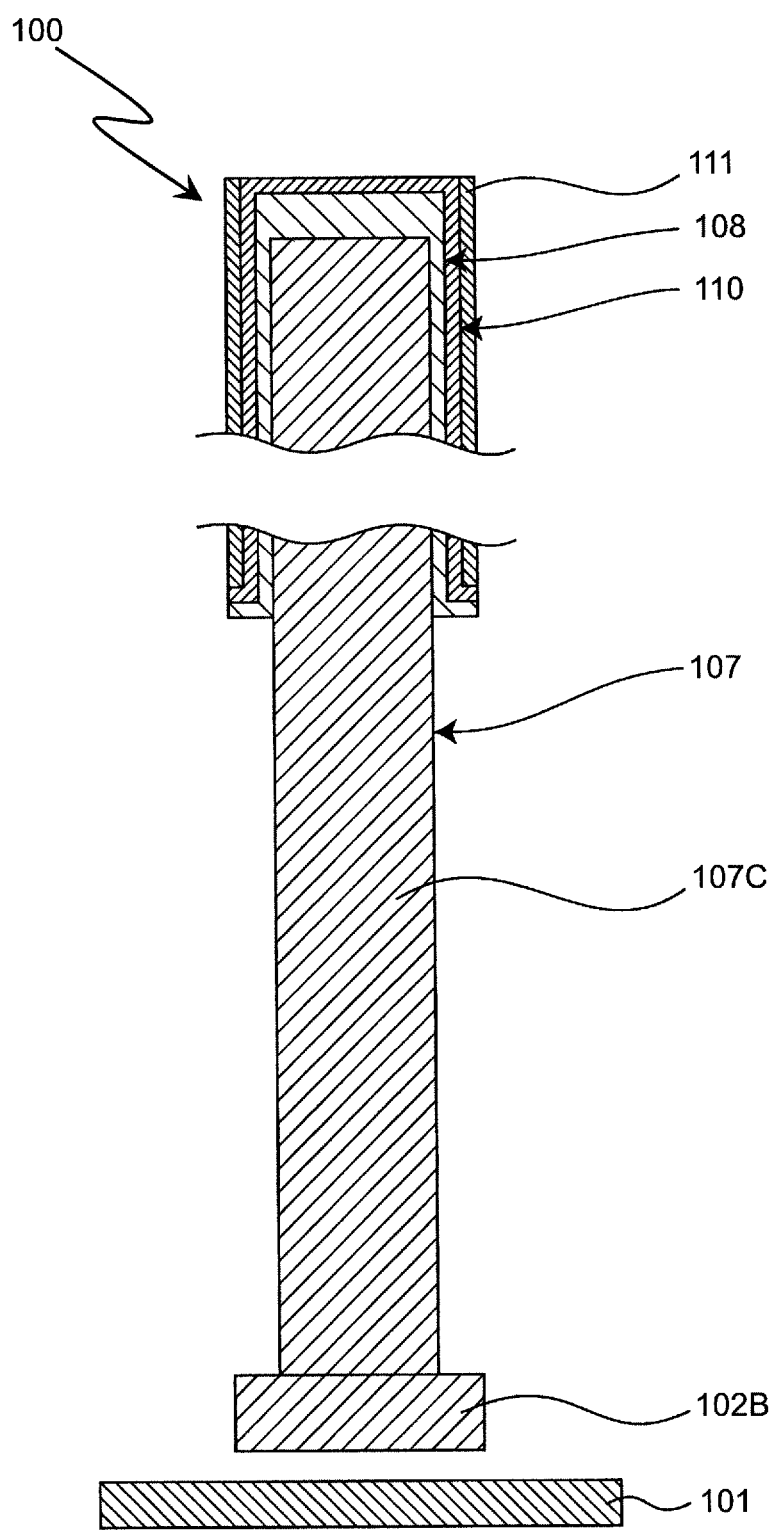
FIG. 17 is a process view subsequent to FIG. 16.

Next, in a cut-off step, the substrate is immersed in an isopropyl alcohol (IPA) solution, and the base substrate (sapphire substrate 101) is vibrated along the substrate plane by using ultrasonic waves (e.g., several 10 kHz). As a result, stress acts on the semiconductor core 107 covered with the quantum well layer 108, the semiconductor layer 110 and the conductive film 111, so as to bend the semiconductor core 107, which is erectly provided on the base substrate, so that the semiconductor core 107 covered with the quantum well layer 108, the semiconductor layer 110 and the conductive film 111 is cut off from the base substrate as shown in FIG. 17.

Thus, a fine bar-like structure light-emitting element 100 cut off from the base substrate can be manufactured.

As shown above, the semiconductor core 107 is cut off from the substrate by using ultrasonic waves. However, without being limited to this, the semiconductor core 107 may be cut off from the substrate by mechanically bending the semiconductor core with use of a cutting tool. In this case, a plurality of fine bar-like structure light-emitting elements provided on the substrate can be cut off in short time with a simple method.

Further, in the bar-like structure light-emitting element 100, since the semiconductor layer 110 is crystal grown radially outward from the outer peripheral surface of the semiconductor core 107 so that the radial growth distance is short while defects escape outward, the semiconductor core 107 can be covered with a semiconductor layer 110 of less crystal defects. Thus, a bar-like structure light-emitting element successful in characteristics can be realized.

According to this light-emitting element manufacturing method, a fine bar-like structure light-emitting element 100 cut off from the base substrate can be manufactured. Also, the sapphire substrate 101 can be reused. Further, the bar-like structure light-emitting element 100 allows the quantity of use of the semiconductor to be reduced so that the device using the light-emitting element can be reduced in both thickness and weight while the light-emitting area is broadened by virtue of emission of light from the entire periphery of the semiconductor core 107 covered with the semiconductor layer 110. Thus, a light-emitting device, a backlight, a lighting device, a display device and the like of high luminous efficacy and power-saving property can be realized. Also, although the base n-type GaN film 102 is etched to form the step portion 102B by RIE (Reactive Ion Etching) as shown in FIG. 16, yet it is also possible that with the etching of the base n-type GaN film 102 omitted, the semiconductor core 107 is cut off from the base n-type GaN film 102 having no step portion 102B so that a bar-like structure light-emitting element having no step portion 102B is manufactured.

In this case, since the bar-like structure light-emitting element 100 is set to have a diameter of 1 µm and a length of 25 µm, the light-emission area per bar-like structure light-emitting element 100, i.e. area of the quantum well layer 108, approximately equals $(25 \times \pi \times (0.5)^2$ µm$^2$–(outer-peripheral area of exposure portion 107C).

Since the bar-like structure light-emitting element 100 has a tubular light-emitting surface (quantum well layer 108) concentrically surrounding the bar-like semiconductor core 107, the light-emitting surface area per bar-like structure light-emitting element 100 is increased as compared with light-emitting elements equal in volume and having a flat light-emitting surface, so that the number of light-emitting elements to obtain a specified brightness can be cut down, allowing a cost cut to be achieved.

Also, since the bar-like structure light-emitting element 100 has the p-type bar-like semiconductor core 107 and the n-type tubular semiconductor layer 110 covering the outer periphery of the semiconductor core 107 and since one end side of the semiconductor core 107 is exposed, it becomes possible that one electrode is connected to one-end-side exposure portion 107C of the semiconductor core 107 while another electrode is connected to the other-end-side conductive film 111 of the semiconductor core 107, allowing the connections to be achieved with electrodes apart from each other at both ends. Thus, the electrode connected to the conductive film 111 and the exposure portion 107C of the semiconductor core 107 can be prevented from short-circuiting each other, thus allowing the interconnections to be easily achieved.

In addition, the exposure portion 107C of the semiconductor core 107 and its coverage portion covered with the semiconductor layer 110 are not limited to hexagonal cross-sectional shapes. Their cross-sectional shapes may be other polygonal or circular-shaped ones, and moreover the exposure portion and the coverage portion of the semiconductor core may be different in cross-sectional shape from each other.

According to the second light-emitting element manufacturing method of the first embodiment, since the p-type semiconductor layer 110 is formed not only on the end face 107A of the n-type semiconductor core 107 but also on its side face 107B, it becomes possible to increase the area of pn conjunction, increase the light-emission area and improve the luminous efficacy. Also, since the n-type semiconductor core 107 is formed by using the catalyst metal 106, the growth rate of the n-type semiconductor core 107 can be enhanced. Therefore, the semiconductor core 107 can be elongated in shorter time as compared with the conventional counterpart, the light-emission area having a proportional relation to the length of the n-type semiconductor core 107 can be further increased. Besides, since the end face 107A and the side face of the n-type semiconductor core 107 are covered with the p-type semiconductor layer 110, electrodes for the p-type semiconductor layer 110 can be prevented from short-circuiting with the n-type semiconductor core 107.

Also according to the second light-emitting element manufacturing method of the first embodiment, since the p-type quantum well layer 108 and the p-type semiconductor layer 110 are formed with the catalyst metal 106 remaining left, the formation of the n-type semiconductor core 107 and the formation of the p-type quantum well layer 108 and the p-type semiconductor layer 110 can be fulfilled in succession within one identical manufacturing device. Therefore, a process reduction and a manufacturing time cut can be achieved. Moreover, since there is no need for bringing the semiconductor core 107 out of the manufacturing device after the formation of the n-type semiconductor core 107, the surface of the n-type semiconductor core 107 can be prevented from sticking of contaminations, allowing the device characteristics to be improved. Besides, since the formation of the n-type semiconductor core 107 and the formation of the p-type quantum well layer 108 and the p-type semiconductor layer 110 can be fulfilled in succession, it becomes possible to avoid large temperature changes, growth stops and the like, allowing the crystallinity to be improved and device characteristics to be improved. Moreover, the etching for removing the catalyst metal 106 immediately after the formation of the n-type semiconductor core 107 is not performed, so that damage on the surface of the n-type semiconductor core 107 (i.e., interface with the p-type semiconductor layer 110) can be eliminated, allowing device characteristics to be improved.

Also according to the second light-emitting element manufacturing method of the first embodiment, since the n-type semiconductor core 107 and the p-type semiconductor layer 110 are formed in succession with the catalyst metal 106 added on the sapphire substrate 101, the growth rate becomes far higher (e.g., 10 to 100 times higher) at portions in contact with the catalyst metal 106 than at portions out of contact with the catalyst metal 106. Therefore, a light-emitting element having a high aspect ratio of dimensions can be manufactured. In this second embodiment, the bar-like structure light-emitting element 100 is set to have a diameter of 1 μm and a length of 25 μm, as an example. Further, since the n-type semiconductor core 107 and the p-type semiconductor layer 110 can be stacked in succession under the catalyst metal 106, defects of pn junction portions can be lessened.

Also according to the second light-emitting element manufacturing method of the first embodiment, since the mask layer 103 is removed so that the sapphire substrate 101 side exposure portion 107C of the semiconductor core 107 is exposed, the quadrilateral quantity of the semiconductor layer 110 can be lessened. Besides, the bar-like structure light-emitting element 100 is enabled to make an easy contact with the semiconductor core 107 by virtue of the n-type GaN step portion 102B adjoining the semiconductor core 107. Further, the bar-like structure light-emitting element 100 can improve the luminous efficacy by virtue of the quantum well layer 108.

In the second light-emitting element manufacturing method, the n-type GaN film 102 is formed on the sapphire substrate 101. However, it is also allowable that the step for forming the n-type GaN film 102 on the sapphire substrate 101 is omitted and the mask layer 103 is formed directly on the sapphire substrate 101. Besides, although the catalyst metal 106 on the semiconductor core 107 is removed by etching in the catalyst metal removal step, yet it is also allowable that with this catalyst metal removal step omitted, the conductive film 111 may be formed with the catalyst metal 106 remaining left. Also, although the conductive film 111, the p-type GaN semiconductor layer 110 and the quantum well layer 108 are etched by RIE as shown in FIG. 14 in this embodiment, yet it is also allowable that with the etching step by RIE omitted, the mask layer 103 is removed by collective lift-off for every layer in the succeeding step for removing the mask layer 103.

Also, although the semiconductor core 107 is crystal grown by using an MOCVD apparatus in the second light-emitting element manufacturing method, the semiconductor core may also be formed by using other crystal growth apparatuses such as MBE (Molecular Beam Epitaxial) apparatus. Besides, although the semiconductor core is crystal grown on the substrate by using a growth mask having a growth hole, it is also allowable that with a metal seed placed on the substrate, the semiconductor core is crystal grown from the metal seed.

Also, the semiconductor core 107 covered with the semiconductor layer 110 is cut off from the sapphire substrate 101 by using ultrasonic waves in the second light-emitting element manufacturing method. However, without being limited to this, the semiconductor core may be cut off from the substrate by mechanically bending the semiconductor core with use of a cutting tool. In this case, a plurality of fine bar-like structure light-emitting elements provided on the substrate can be cut off in short time with a simple method.

(3) Placement Step for Light-Emitting Elements

Figure 18:
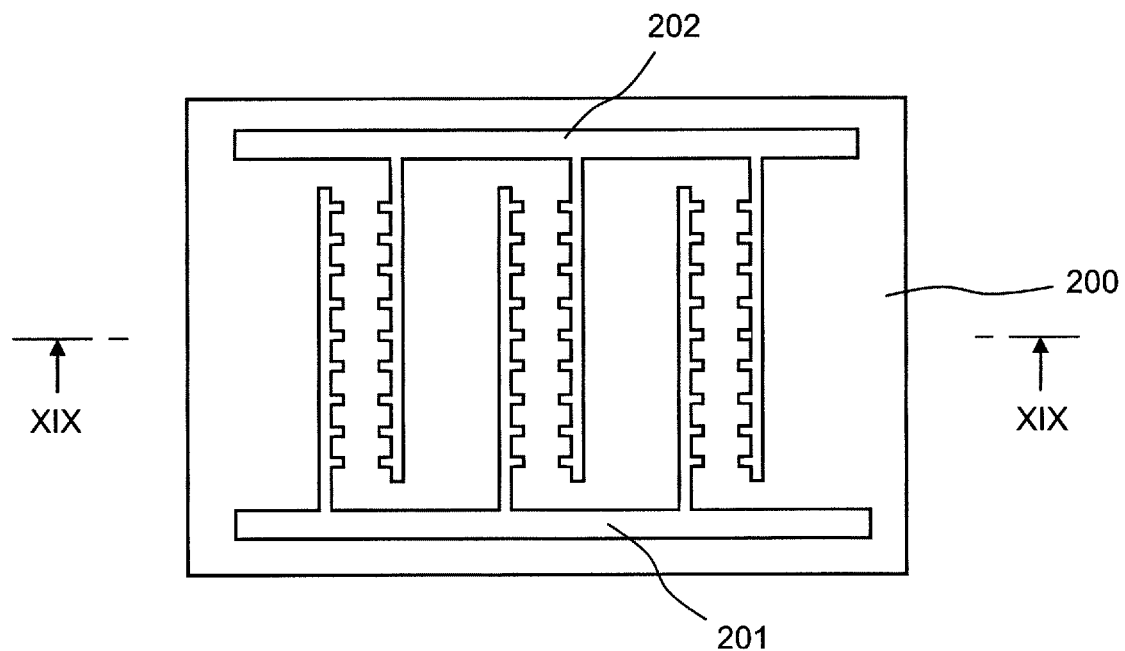
FIG. 18 is a plan view of an insulative substrate to be used for the light-emitting device of the first embodiment of the invention.

FIG. 18 is a plan view of an insulative substrate to be used for the light-emitting device manufacturing method of the first embodiment of the invention. Either the bar-like structure light-emitting element 10 shown in FIG. 3 or the bar-like structure light-emitting element 100 shown in FIG. 17 is used as the bar-like structure light-emitting element to be used in this light-emitting device, but other bar-like light-emitting elements may also be used.

With the light-emitting device of this first embodiment, as shown in FIG. 18, first in a substrate formation step, an insulative substrate 200 on which metal electrodes 201, 202 have been formed as an example of first, second electrodes and an interconnect pattern on its mounting surface is formed. The insulative substrate 200 is a substrate in which a silicon oxide film is formed on a surface of such a dielectric as glass, ceramic, aluminum oxide or resin or such a semiconductor as silicon so that the substrate surface has an insulative property. With use of a glass substrate, it is desirable that a base insulating film such as silicon oxide film or silicon nitride film is formed on the surface.

The metal electrodes 201, 202 are formed each into a desired electrode configuration by using printing techniques. In addition, the formation of the metal electrodes 201, 202 may also be fulfilled by uniformly stacking a metal film and a photoconductor film and by performing exposure of a desired electrode pattern and etching process.

Although omitted in FIG. 18, pads are formed in the metal electrodes 201, 202 so that voltages can be given thereto from the external.

Next, in an array step, bar-like structure light-emitting elements are arrayed at places (array areas) where the metal electrodes 201, 202 are opposed to each other. Although the array areas for arraying the bar-like structure light-emitting elements are provided by 9×3 in number for an easier viewing of the figure in FIG. 18, yet actually the array areas are provided by an arbitrary number of 100 or more.

The substrate formation step, an application (coating) step and the array step constitute the placement step for placing a plurality of light-emitting elements on a substrate.

Figure 19:
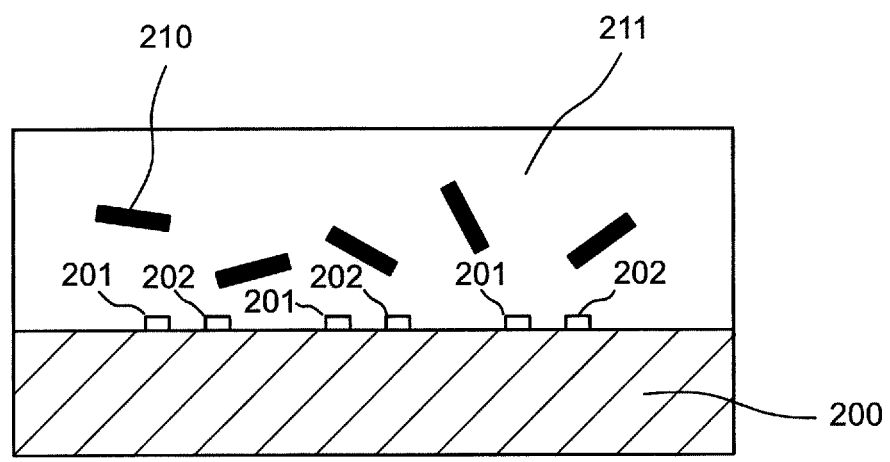
FIG. 19 is a schematic sectional view taken along the line XIX-XIX of FIG. 18.

FIG. 19 is a schematic sectional view taken along the line XIX-XIX of FIG. 18.

First, in the application step, as shown in FIG. 19, isopropyl alcohol (IPA) 211 containing bar-like structure light-emitting elements 210 is applied so as to thinly coat the insulative substrate 200. Usable instead of IPA 211 are ethylene glycol, propylene glycol, methanol, ethanol, acetone or their mixtures. Otherwise, the IPA 211 may be replaced with liquids made of other organic matters, water, or the like.

However, in event of flow of a large current between the metal electrodes 201, 202 through the liquid, a desired voltage could no longer be applied to between the metal electrodes 201, 202. In such a case, an insulating film of about 10 nm to 30 nm may appropriately be provided to coat the entire surface of the insulative substrate 200 so that the metal electrodes 201, 202 are covered therewith.

The thickness of coating of the IPA 211 containing the bar-like structure light-emitting elements 210 is such a thickness that the bar-like structure light-emitting elements 210 are allowed to move in the liquid so that the bar-like structure light-emitting elements 210 can be arrayed in the succeeding step for arraying the bar-like structure light-emitting elements 210. Therefore, the thickness of coating of the IPA 211, larger than a thickness of each bar-like structure light-emitting element 210, is several μm to several mm as an example. Excessively thin thicknesses of coating would make it difficult for the bar-like structure light-emitting elements 210 to move, while excessively thick thicknesses of coating would elongate the time for drying the liquid. Also, the quantity of bar-like structure light-emitting elements 210 is preferably within a range of $1\times10^4$ pcs/cm$^3$ to $1\times10^7$ pcs/cm$^3$ against the quantity of IPA.

For fulfillment of the coating of IPA 211 containing the bar-like structure light-emitting elements 210, it is also allowable that a frame is formed on outer peripheries of the metal electrodes for arraying the bar-like structure light-emitting elements 210 and then the IPA 211 containing the bar-like structure light-emitting elements 210 is filled to within the frame until a desired thickness is attained. However, in a case where the IPA 211 containing the bar-like structure light-emitting elements 210 has viscosity, it is possible to attain a desired thickness of coating without needing the frame.

IPA, or ethylene glycol, propylene glycol, . . . , or their mixtures, or liquids made of other organic matters, or water or other liquids are desirably as low in viscosity as possible in terms of the array step of the bar-like structure light-emitting elements 210, and also desirably as easily vaporizable by heating as possible.

Next, a voltage is given to between the metal electrodes 201, 202. In this first embodiment, the voltage is appropriately set to 1 V. Voltages of 0.1 to 10 V may be applied as the voltage for the metal electrodes 201, 202 while voltages of 0.1 V or lower worsen the array of the bar-like structure light-emitting elements 210 and voltages of 10 V or higher cause the insulation between the metal electrodes to begin to matter. Thus, voltages of 1 to 5 V are preferable, and a voltage of about 1 V is more preferable.

Figure 20:
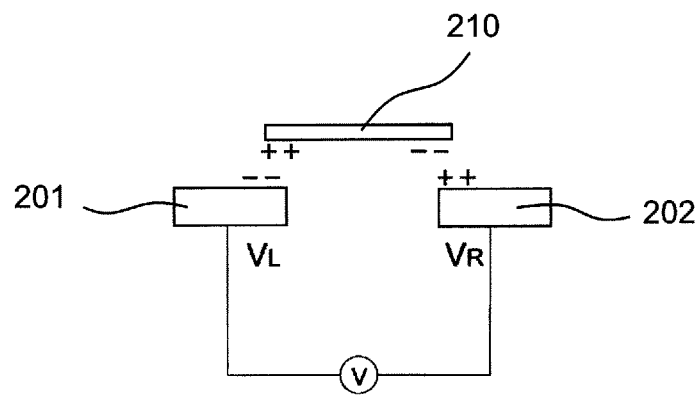
FIG. 20 is a view for explaining a principle in which the bar-like structure light-emitting elements are arrayed.

FIG. 20 shows a principle in which the bar-like structure light-emitting elements 210 are arrayed on the metal electrodes 201, 202. As shown in FIG. 20, with a voltage VL applied to the metal electrode 201 and with a voltage VR (VL<VR) applied to the metal electrode 202, negative charge is induced to the metal electrode 201 while positive charge is induced to the metal electrode 202. Approach of a bar-like structure light-emitting element 210 there causes positive charge to be induced on one side of the bar-like structure light-emitting element 210 closer to the metal electrode 201 while negative charge is induced on the other side closer to the metal electrode 202. Induction of electric charge to the bar-like structure light-emitting element 210 is due to electrostatic induction, i.e., electric charge is induced to surfaces of the bar-like structure light-emitting elements 210 placed in an electric field until their internal electric field comes to zero. As a result, attractive force due to electrostatic force acts between the individual electrodes and the bar-like structure light-emitting elements 210, so that the bar-like structure light-emitting elements 210 are set along lines of electric force generated between the metal electrodes 201, 202 while the bar-like structure light-emitting elements 210 are arrayed regularly in certain directions at generally equal intervals by repulsive force due to the electric charge because of equality among levels of the electric charge induced to the individual bar-like structure light-emitting elements 210. However, for example, with the bar-like structure light-emitting elements 100 shown in FIG. 17, the semiconductor cores 107 covered with the semiconductor layer 110 are not constant but random in terms of their exposure portion side orientation.

As described above, electric charge is generated on the bar-like structure light-emitting elements 210 by an external electric field generated between the metal electrodes 201, 202 by the bar-like structure light-emitting elements 210, so that the bar-like structure light-emitting elements 210 are attracted to the metal electrodes 201, 202 by attractive force of the electric charge. Therefore, the bar-like structure light-emitting elements 210 need to be sized so as to be movable in the liquid. Thus, the size of each bar-like structure light-emitting element 210 varies depending on the coating amount (thickness) of the liquid. The bar-like structure light-emitting element 210 has to be nanometer-order sized for less coating amounts of the liquid, while the size may be micrometer-order sized for more coating amounts of the liquid.

In a case where the bar-like structure light-emitting elements 210 are not electrically neutral but positively or negatively charged, the bar-like structure light-emitting elements 210 cannot be stably arrayed only by giving an electrostatic potential difference (DC) to between the metal electrodes 201, 202. For example, when the bar-like structure light-emitting elements 210 are positively charged as a net result, the attractive force to the metal electrode 202, to which positive charge is induced, is relatively weakened. Thus, the array of the bar-like structure light-emitting elements 210 becomes asymmetrical.

Figure 21:
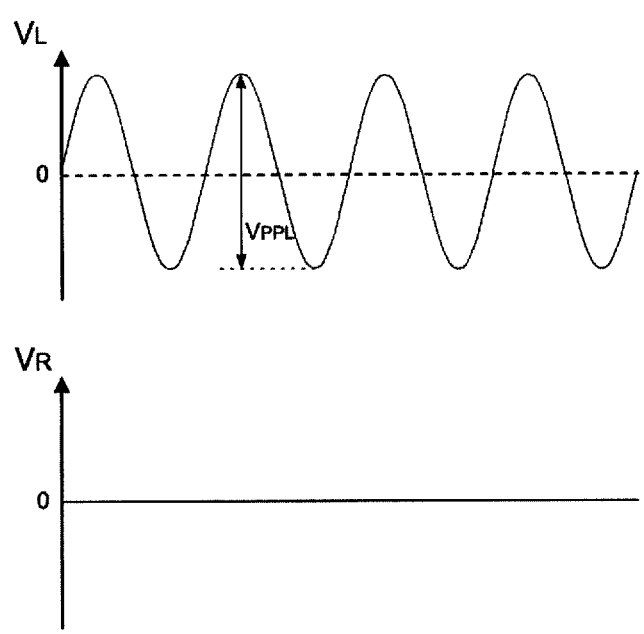
FIG. 21 is a view for explaining a voltage given to electrodes when the bar-like structure light-emitting elements are arrayed.

In such a case, as shown in FIG. 21, it is preferable that an AC voltage is applied between the metal electrodes 201, 202. In FIG. 21, a reference voltage is applied to the metal electrode 202 while an AC voltage having an amplitude of VPPL/2 is applied to the metal electrode 201. Thus, even when the bar-like structure light-emitting elements 210 have been electrically charged, the bar-like structure light-emitting elements 210 can be kept as they are symmetrically arrayed. In addition, the frequency of the AC voltage given to the metal electrode 202 in this case is preferably set to 10 Hz to 1 MHz and, more preferably, to 50 Hz to 1 kHz, which allows the most stable array to be obtained. Further, the AC voltage applied between the metal electrodes 201, 202 is not limited to sinusoidal waves and may be one which periodically varies, such as rectangular waves, chopping waves and sawtooth waves. It has been found that VPPL is preferably set to about 1 V.

Next, the bar-like structure light-emitting elements 210 are arrayed on the metal electrodes 201, 202, and thereafter the insulative substrate 200 is heated so as to be dried with the liquid evaporated. Thus, the bar-like structure light-emitting elements 210 are fixed so as to be arrayed along the lines of electric force between the metal electrodes 201, 202.

Figure 22:
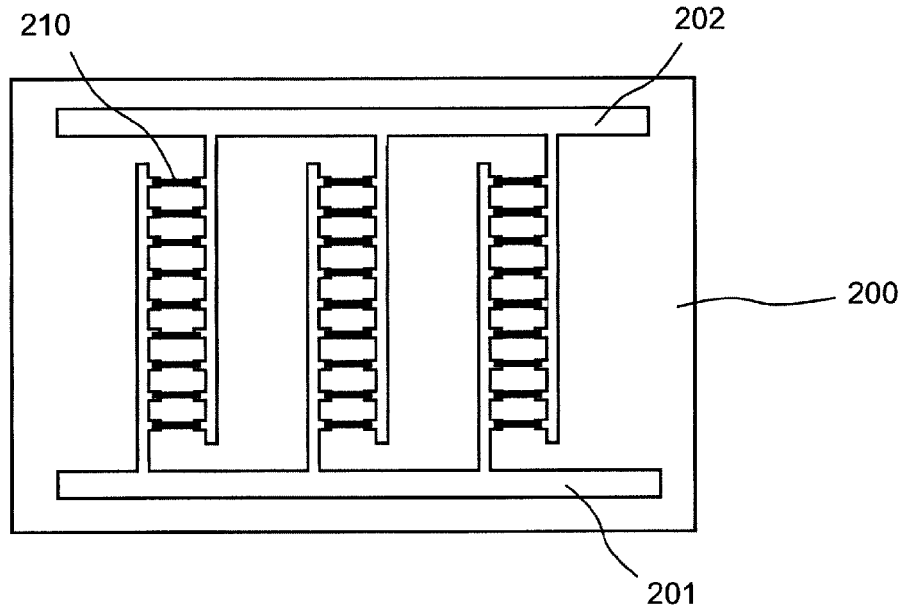
FIG. 22 is a plan view of the insulative substrate on which the bar-like structure light-emitting elements are arrayed.

FIG. 22 is a plan view of the insulative substrate 200 on which the bar-like structure light-emitting elements 210 are placed. Although FIG. 22 depicts the bar-like structure light-emitting elements 210 as smaller in number for an easier view, but actually 100 or more pieces of bar-like structure light-emitting elements 210 are placed on one insulative substrate 200.

Use of the insulative substrate 200, on which the bar-like structure light-emitting elements 210 are placed, as shown in FIG. 22 for a backlight of liquid crystal display devices or the like makes it possible to realize a backlight which allows reductions in thickness and weight to be achieved and which has high luminous efficacy and power-saving property. Also, when the insulative substrate 200 on which the bar-like structure light-emitting elements 210 are placed is used as a lighting device, there can be realized a lighting device which allows reductions in thickness and weight to be achieved and which has high luminous efficacy and power-saving property.

The pn polarities of the bar-like structure light-emitting elements 210 are not uniformized to one side but randomly arrayed. Therefore, in driving operation, the bar-like structure light-emitting elements 210 are driven with an AC voltage, so that bar-like structure light-emitting elements 210 of different polarities emit light alternately.

Also according to the light-emitting device manufacturing method, the insulative substrate 200 is formed with array areas each formed thereon in a unit of two metal electrodes 201, 202, to which independent voltages are given, respectively, and a liquid containing a plurality of bar-like structure light-emitting elements 210 is applied onto the insulative substrate 200. Thereafter, independent voltages are applied to the two metal electrodes 201, 202, respectively, so that fine bar-like structure light-emitting elements 210 are arrayed in positions defined by the two metal electrodes 201, 202. Thus, the bar-like structure light-emitting elements 210 can be placed easily on the specified insulative substrate 200.

Accordingly, without the need for placing light-emitting diodes one by one to specified positions on the substrate as in conventional cases, a multiplicity of fine light-emitting diodes can be placed at specified positions with high accuracy.

By this light-emitting device manufacturing method, there can be manufactured a light-emitting device which involves less brightness variations and which allows longer life and higher efficacy to be achieved by dispersing light emission while suppressing temperature increases during emission.

Also according to the light-emitting device manufacturing method, the quantity of use of the semiconductor can be lessened. Further, each bar-like structure light-emitting element 210 becomes wider in light-emission area by virtue of light release from entire side faces of the semiconductor core covered with the semiconductor layer. Thus, a light-emitting device which has high luminous efficacy and power-saving property can be realized.

Also, in the light-emitting device, a plurality of light-emitting elements are placed so as to be generally evenly dispersed on the mounting surface of the insulative substrate 200, by which lateral outflow of heat generated in the light-emitting elements due to their light emission is efficiently fulfilled. Thus, temperature increases during emission are further suppressed, so that further longer life and higher efficacy can be achieved.

Also, by the placement that the bar-like structure light-emitting elements 210 are placed on the mounting surface of the insulative substrate 200 so that longitudinal directions of a plurality of bar-like structure light-emitting elements 210 become parallel to the mounting surface of the insulative substrate 200, a ratio of the axial (longitudinal) length to the radial length can be made larger, so that lateral outflow of heat to the insulative substrate 200 is fulfilled more efficiently than when the light-emitting surface is square-shaped under a condition of an equal light-emitting surface area. Thus, temperature increases during emission are further suppressed, so that further longer life and higher efficacy can be achieved. Besides, since this light-emitting device manufacturing method utilizes the polarization of an object due to application of voltages between electrodes, there is an advantage for polarization of both ends of each bar-like structure light-emitting element, showing compatibility with the bar-like structure light-emitting elements.

Also, the bar-like structure light-emitting elements 210 are light-emitting diodes, including ones having an anode connected to the metal electrode 201 (first electrode) and a cathode connected to the metal electrode 202 (second electrode) as well as ones having a cathode connected to the metal electrode 201 (first electrode) and an anode connected to the metal electrode 202 (second electrode), those two types being mixedly placed on the insulative substrate 200. Then, in this light-emitting device, an AC voltage is applied between the metal electrode 201 (first electrode) and the metal electrode 202 (second electrode) by an AC power supply to drive a plurality of light-emitting diodes, by which the need for placement of a multiplicity of light-emitting diodes with their anode and cathode uniformly oriented is eliminated, allowing the placement step to be simplified.

Also, since at least the metal electrode 201 (first electrode) and the metal electrode 202 (second electrode) are used as electrodes for driving a plurality of bar-like structure light-emitting elements 210, the interconnection step can be simplified, allowing a cost cut to be achieved.

Although bar-like structure light-emitting elements are used in the light-emitting device manufacturing method shown in FIGS. 18 to 22, yet the light-emitting elements are not limited to these and may be light-emitting elements which have a flat light-emitting surface of circular, elliptical, square, rectangular, polygonal or other shape and which are placed on a mounting surface so that the light-emitting surface becomes parallel to the substrate. However, since this light-emitting device manufacturing method utilizes the polarization of an object due to application of voltages between electrodes, bar-like light-emitting elements advantageous for polarization are desirable.

(4) Interconnection Step

Figure 23:
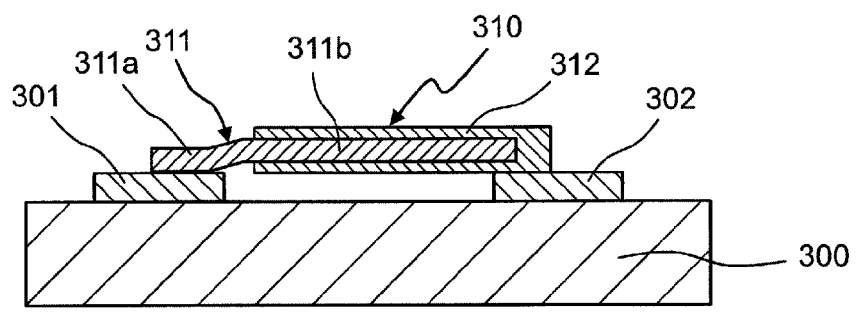
FIG. 23 is a process view of another light-emitting device manufacturing method according to the first embodiment of the invention.
Figure 24:
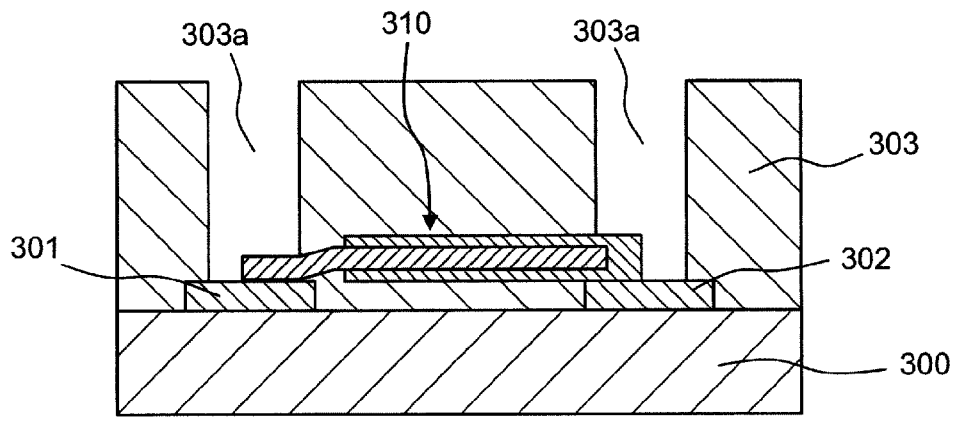
FIG. 24 is a process view subsequent to FIG. 23.
Figure 25:
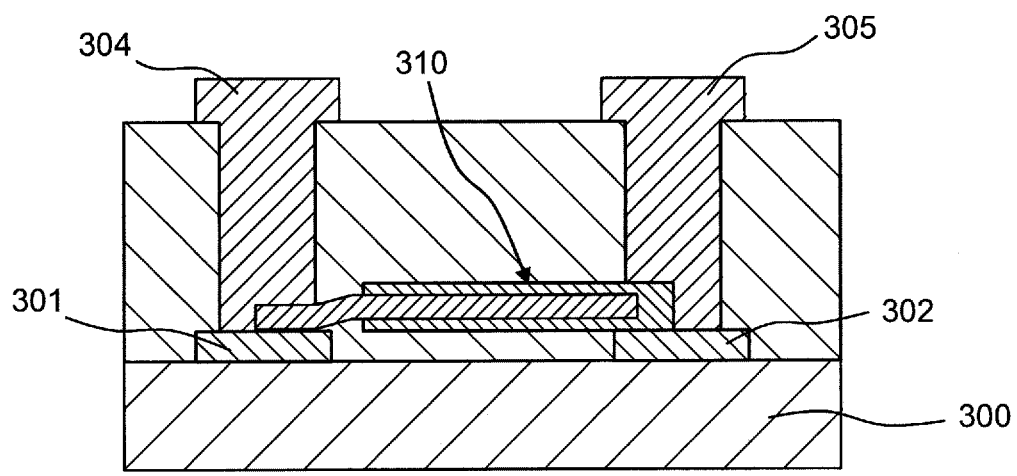
FIG. 25 is a process view subsequent to FIG. 24.

FIGS. 23 to 25 are process views of another light-emitting device manufacturing method according to the first embodiment of the invention. In this light-emitting device manufacturing method, 100 or more bar-like structure light-emitting elements are placed on a mounting surface of one substrate. The bar-like structure light-emitting element to be used in this light-emitting device manufacturing method has only to be one which has a first-conductive-type bar-like semiconductor core, and a second-conductive-type tubular semiconductor layer covering an outer periphery of the semiconductor core, and in which one end side of the semiconductor core of the bar-like light-emitting element is exposed.

In this light-emitting device manufacturing method, as shown in FIG. 23, first in a substrate formation step, an insulative substrate 300 on which metal electrodes 301, 302 have been formed as an example of first, second electrodes and an interconnect pattern on its mounting surface is formed.

Next, in a placement step, 100 or more bar-like structure light-emitting elements 310 are placed on the insulative substrate 300 so that their longitudinal directions become parallel to the mounting surface of the insulative substrate 300. In this placement step, by a method similar to the light-emitting device manufacturing method of the first embodiment, the bar-like structure light-emitting elements 310 contained in a liquid are arrayed on the metal electrodes 301, 302, and thereafter the insulative substrate 300 is heated so as to be dried with the liquid evaporated, so that the bar-like structure light-emitting elements 310 are arrayed and fixed at equal intervals along lines of electric force between the metal electrodes 301, 302.

Each of the bar-like structure light-emitting elements 310 has a bar-like n-type GaN semiconductor core 311, and a p-type GaN semiconductor layer 312 which covers a coverage portion 311b of the semiconductor core 311 other than its exposure portion 311a, where one end side portion of the semiconductor core 311 is not covered by the semiconductor layer 312 but left as the exposure portion 311a. The one end side exposure portion 311a of each bar-like structure light-emitting element 310 is connected to the metal electrode 301 while the other end side semiconductor layer 312 of the bar-like structure light-emitting element 310 is connected to the metal electrode 302.

Next, in an interconnection step, as shown in FIG. 24, an interlayer insulator 303 is formed on the insulative substrate 300, and the interlayer insulator 303 is patterned to form contact holes 303a on the metal electrode 301 and the metal electrode 302, respectively.

Next, as shown in FIG. 25, metal lines 304, 305 are formed so as to bury the two contact holes 303a.

In this way, it becomes practicable that 100 or more bar-like structure light-emitting elements 310 placed on the mounting surface of the insulative substrate 300 are collectively placed and moreover the metal lines 304, 305 are collectively connected to a plurality of bar-like structure light-emitting elements 310. Also, although FIGS. 23 to 25 depict a state that a central portion of a bar-like structure light-emitting element 310 is floating from the insulative substrate 300, yet actually the bar-like structure light-emitting element 310 has its central portion sagged and brought into contact on the insulative substrate 300 due to stiction which is generated when droplets at gaps between the insulative substrate 300 surface and the bar-like structure light-emitting elements 310 are shrunk by evaporation during the drying process of the IPA solution in the placement method for bar-like structure light-emitting elements shown in FIGS. 18 to 22. In addition, even if the bar-like structure light-emitting elements 310 are not brought into contact on the insulative substrate 300, the bar-like structure light-emitting elements 310 come into contact with the insulative substrate 300 via the interlayer insulator 303.

Also, a metal portion for supporting a bar-like structure light-emitting element 310 may be provided between the central portion of the bar-like structure light-emitting element 310 and the insulative substrate 300, so that the central portion of the bar-like structure light-emitting element 310 is brought into contact with the insulative substrate 300 via the metal portion.

According to this light-emitting device manufacturing method, without the need for placing light-emitting diodes one by one to specified positions on the substrate as in conventional cases, a multiplicity of fine light-emitting diodes can be placed at specified positions with high accuracy. Thus, there can be manufactured a light-emitting device which involves less brightness variations and which allows longer life and higher efficacy to be achieved by dispersing light emission while suppressing temperature increases during emission.

In this light-emitting device, a plurality of bar-like structure light-emitting elements 310 are placed so as to be generally evenly dispersed on the mounting surface of the insulative substrate 300, by which substrate-side directed lateral outflow of heat generated in the light-emitting elements due to their light emission is efficiently fulfilled. Thus, temperature increases during emission are further suppressed, so that further longer life and higher efficacy can be achieved.

Also, by the placement that the bar-like structure light-emitting elements 310 are placed on the mounting surface of the insulative substrate 300 so that longitudinal directions of a plurality of bar-like structure light-emitting elements 310 become parallel to the mounting surface of the insulative substrate 300, a ratio of the axial (longitudinal) length to the radial length can be made larger, so that lateral outflow of heat to the insulative substrate 300 side is fulfilled more efficiently than when the light-emitting surface is square-shaped under a condition of an equal light-emitting surface area of the light-emitting element. Thus, temperature increases during emission are further suppressed, so that further longer life and higher efficacy can be achieved.

Also, the plurality of bar-like structure light-emitting elements 310 are light-emitting diodes each with an exposure portion 311a serving as an anode and a coverage portion 311b serving as a cathode, the light-emitting diodes including ones having the anode connected to the metal electrode 301 (first electrode) and the cathode connected to the metal electrode 302 (second electrode) as well as ones having the cathode connected to the metal electrode 301 (first electrode) and the anode connected to the metal electrode 302 (second electrode), those two types being mixedly placed on the insulative substrate 300. Then, in this light-emitting device, an AC voltage is applied between the metal electrode 301 (first electrode) and the metal electrode 302 (second electrode) by an AC power supply to drive a plurality of light-emitting diodes, by which the need for placement of a multiplicity of light-emitting diodes with their anode and cathode uniformly oriented is eliminated, allowing the placement step to be simplified.

(5) Other Light-Emitting Device Manufacturing Method

FIGS. 26 to 30 are process views of another light-emitting device manufacturing method according to the first embodiment of the invention. It is noted that FIGS. 26 to 30 depict only part of the light-emitting device, whereas 100 or more bar-like structure light-emitting elements are to be placed on the mounting surface of one substrate in this light-emitting device manufacturing method. The bar-like structure light-emitting element to be used in this light-emitting device manufacturing method has only to be one which has a first-conductive-type bar-like semiconductor core, and a second-conductive-type tubular semiconductor layer covering an outer periphery of the semiconductor core, and in which one end side of the semiconductor core of the bar-like light-emitting element is exposed.

Figure 26:
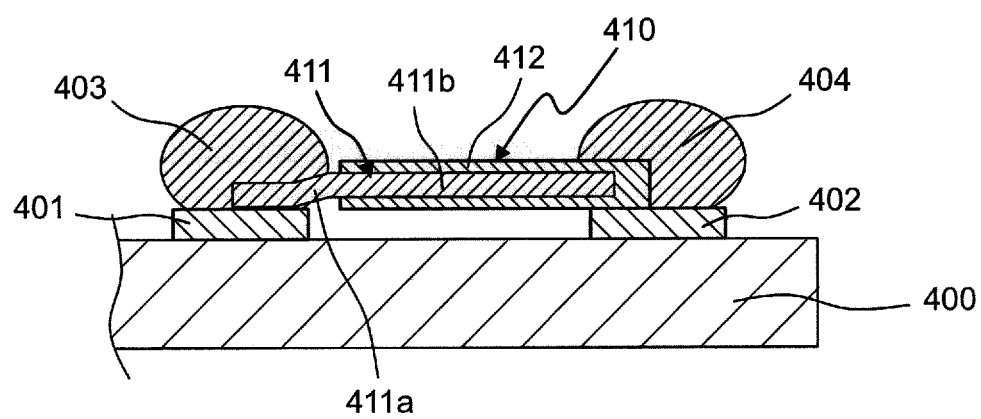
FIG. 26 is a process view of another light-emitting device manufacturing method according to the first embodiment of the invention.
Figure 27:
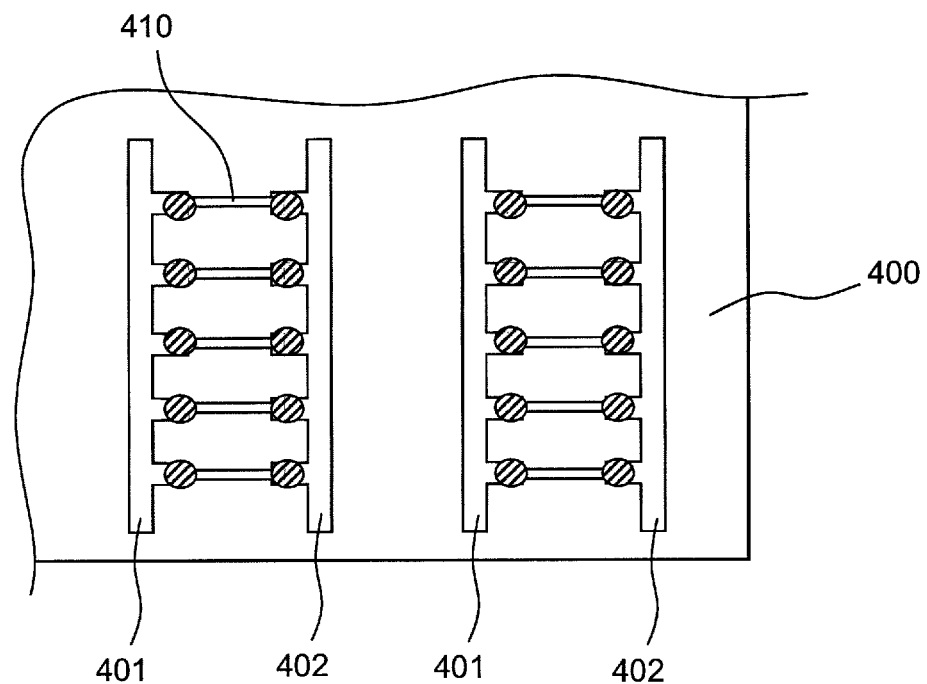
FIG. 27 is a process view subsequent to FIG. 26.

In this light-emitting device manufacturing method, as shown in the sectional view of FIG. 26 and the plan view of FIG. 27, first in a substrate formation step, an insulative substrate 400 on which metal electrodes 401, 402 have been formed as an example of first, second electrodes and an interconnect pattern on its mounting surface is formed.

Next, in a placement step, a plurality of bar-like structure light-emitting elements 410 are placed on the insulative substrate 400 so that their longitudinal directions become parallel to the mounting surface of the insulative substrate 400. In this placement step, by a method similar to the light-emitting device manufacturing method shown in FIGS. 18 to 22, the bar-like structure light-emitting elements 410 contained in a liquid are arrayed on the metal electrodes 401, 402, and thereafter the insulative substrate 400 is heated so as to be dried with the liquid evaporated, so that the bar-like structure light-emitting elements 410 are placed at equal intervals along lines of electric force between the metal electrodes 401, 402.

Each of the bar-like structure light-emitting elements 410 has a bar-like n-type GaN semiconductor core 411, and a p-type GaN semiconductor layer 412 which covers a coverage portion 411b of the semiconductor core 411 other than its exposure portion 411a, where one end side portion of the semiconductor core 411 is not covered by the semiconductor layer 412 but left as the exposure portion 411a. The one end side exposure portion 411a of each bar-like structure light-emitting element 410 is connected to the metal electrode 401 with an adhesive portion 403 made of conductive adhesive or other metal ink while the other end side semiconductor layer 412 of the bar-like structure light-emitting element 410 is connected to the metal electrode 402 with an adhesive portion 404 made of conductive adhesive or other metal ink. In this case, the metal ink is applied to specified places on the insulative substrate 400 by an ink jet method or the like.

Figure 28:
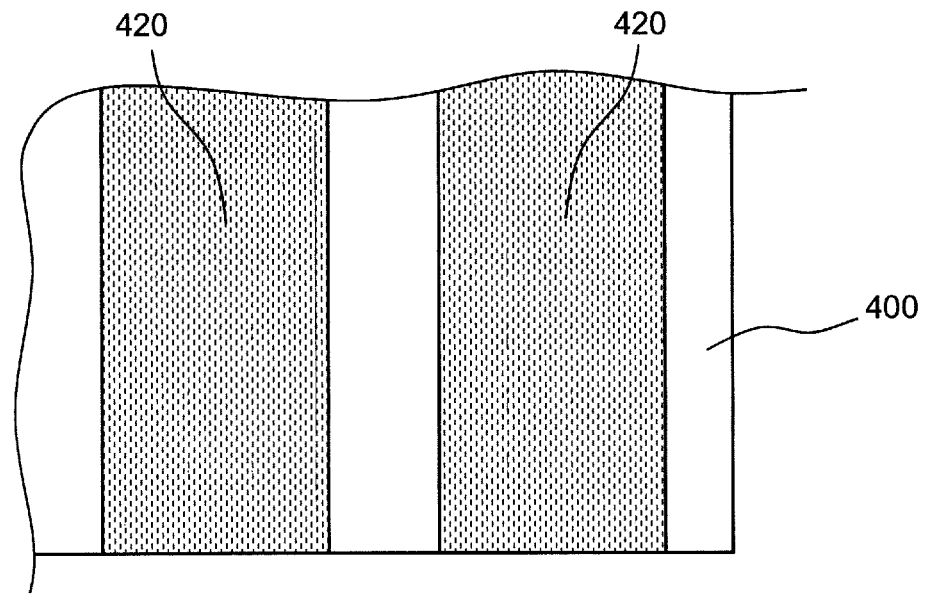
FIG. 28 is a process view subsequent to FIG. 27.
Figure 29:
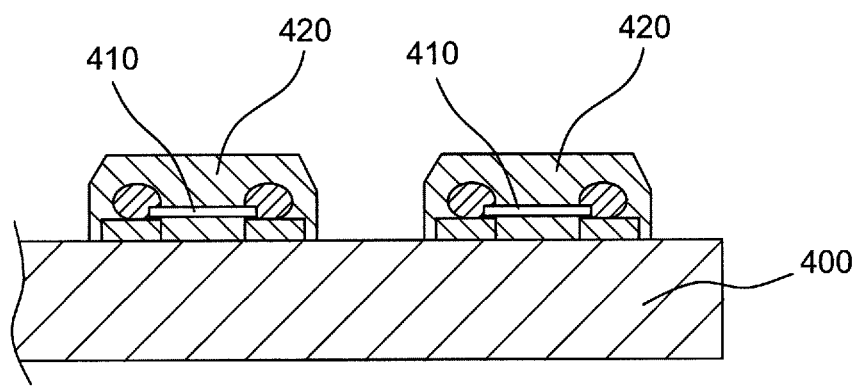
FIG. 29 is a process view subsequent to FIG. 28.

Next, as shown in the plan view of FIG. 28 and the sectional view of FIG. 29, a phosphor 420 is applied selectively to areas on the insulative substrate 400 where a plurality of bar-like structure light-emitting elements 410 are placed (phosphor application step). In this case, the phosphor is applied to specified areas on the insulative substrate 400 by an ink jet method or the like. Alternatively, a transparent resin containing a phosphor may also be applied selectively to areas on the insulative substrate 400 where a plurality of bar-like structure light-emitting elements 410 are placed.

Figure 30:
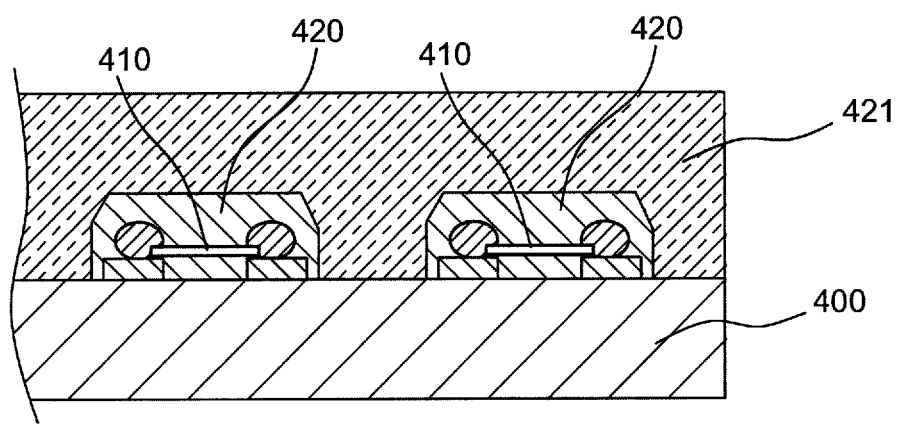
FIG. 30 is a process view subsequent to FIG. 29.

Next, as shown in FIG. 30, after the application of the phosphor 420, a protective film 421 made of transparent resin is formed on the insulative substrate 400.

In this way, a plurality of bar-like structure light-emitting elements 410 can collectively be placed on the mounting surface of the insulative substrate 400, and moreover metal lines can collectively be connected to a plurality of bar-like structure light-emitting elements 410.

Next, the phosphor application step for applying the phosphor 420 onto the insulative substrate 400 and the protective-film application step for applying the protective film 421 onto the insulative substrate 400 subsequent to the phosphor application step are executed at a time with one insulative substrate 400 on which a plurality of bar-like structure light-emitting elements 410 have been placed. Thus, the manufacturing cost can be largely cut down as compared with cases where it has conventionally been done package by package.

(6) Substrate Dividing Step

Next, a substrate dividing step in the light-emitting device manufacturing method of the first embodiment of the invention will be described with reference to FIG. 31. Although the insulative substrate 400 formed by the steps shown in FIGS. 26 to 30 is used in this substrate dividing step, yet the insulative substrate 200 formed by the steps shown in FIGS. 18 to 22 or the insulative substrate 300 formed by the steps shown in FIGS. 23 to 25 may also be used.

Figure 31:
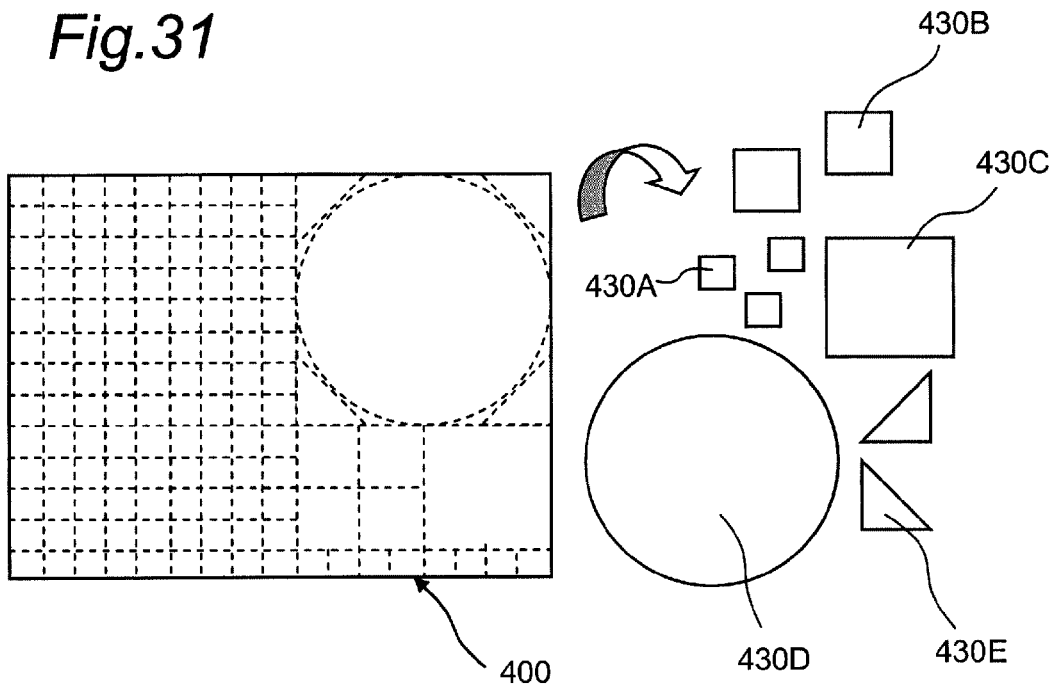
FIG. 31 is a view for explaining a substrate dividing step of the light-emitting device manufacturing method according to the first embodiment of the invention.

As shown in the plan view of FIG. 31, in the substrate dividing step, the insulative substrate 400 is divided into a plurality of divisional substrates 430A, 430B, 430C, 430D, 430E of different shapes. In this case, the plurality of divisional substrates 430A, 430B, 430C, 430D, 430E are light-emitting devices, respectively, of this invention, and the insulative substrate 400 is divided so as to include 100 or more bar-like structure light-emitting elements 410. The divisional substrate 430A is square-shaped, the divisional substrate 430B is formed into a square shape larger than that of the divisional substrate 430A, the divisional substrate 430C is formed into a square shape larger than that of the divisional substrate 430B, the divisional substrate 430D is circular-shaped, and the divisional substrate 430E is right-triangle shaped.

In the substrate dividing step, the insulative substrate 400 is divided into the plurality of divisional substrates 430A, 430B, 430C, 430D, 430E of different shapes, by which light-emitting devices ready for various modes can be provided with simplicity.

In addition, an interconnect pattern formed for interconnecting a plurality of bar-like structure light-emitting elements 410 on the insulative substrate 400 is not formed in substrate cutting areas for the substrate dividing step. As a result of this, no electroconductive interconnect rubbish is scattered in cutting process so that failures due to short-circuits by electroconductive interconnect rubbish or the like can be prevented.

Otherwise, an interconnect pattern that does not affect electrical connections even if cut in the substrate dividing step is formed in cutting areas of the insulative substrate 400. In this case, an interconnect pattern can be formed so as to continuously stretch over adjacent divisional substrates, making it more easily achievable to form the interconnect pattern, and moreover cutting, even if involved in the substrate division, does not cause any problems in circuit operation.

Also, by the placement that no bar-like structure light-emitting elements 410 are placed in cutting areas of the insulative substrate 400 for the substrate dividing step, there are no bar-like structure light-emitting elements 410 that are broken by cutting, so that effective use of the bar-like structure light-emitting elements 410 can be made.

In this light-emitting device manufacturing method, although FIGS. 26, 29 and 30 depict a state that a central portion of a bar-like structure light-emitting element 410 is floating from the insulative substrate 400, yet actually the bar-like structure light-emitting element 410 has its central portion sagged and brought into contact on the insulative substrate 400 due to stiction which is generated when droplets at gaps between the insulative substrate 400 surface and the bar-like structure light-emitting elements 410 are shrunk by evaporation during the drying process of the IPA solution in the placement method for bar-like structure light-emitting elements in the first embodiment. In addition, even if the bar-like structure light-emitting elements 410 are not brought into contact on the insulative substrate 400, the bar-like structure light-emitting elements 410 come into contact with the insulative substrate 400 via the phosphor.

Also, a metal portion for supporting a bar-like structure light-emitting element 410 may be provided between the central portion of the bar-like structure light-emitting element 410 and the insulative substrate 400, so that the central portion of the bar-like structure light-emitting element 410 is brought into contact with the insulative substrate 400 via the metal portion.

According to the light-emitting device manufacturing method constituted as described above, a plurality of bar-like structure light-emitting elements 410 placed on one identical insulative substrate 400 are collectively interconnected, and thereafter the insulative substrate 400 is divided into a plurality of divisional substrates 430A, 430B, 430C, 430D, 430E, by which a plurality of light-emitting devices in each of which a plurality of bar-like structure light-emitting elements 410 have been placed on the divisional substrates 430A, 430B, 430C, 430D, 430E are formed. Thus, the interconnection step is simplified, allowing the manufacturing cost to be cut down, and moreover characteristic variations are lessened so that the yield can be improved.

Also, by the placement that a plurality of bar-like structure light-emitting elements 410 are collectively placed on one insulative substrate 400 in the placement step, in addition to the simplification of the interconnection step, the manufacturing cost can be further cut down.

Also, by the placement of 100 or more bar-like structure light-emitting elements 410 on each of the divisional substrates 430A, 430B, 430C, 430D, 430E, an overall brightness variation resulting from assembling of a plurality of light-emitting elements having brightness variations can be reduced to $\frac{1}{10}$ or less that of one light-emitting element.

Also, the bar-like structure light-emitting elements 410 are light-emitting diodes each with an exposure portion 411a serving as an anode and a coverage portion 411b serving as a cathode, the light-emitting diodes including ones having the anode connected to the metal electrode 401 (first electrode) and the cathode connected to the metal electrode 402 (second electrode) as well as ones having the cathode connected to the metal electrode 401 (first electrode) and the anode connected to the metal electrode 402 (second electrode), those two types being mixedly placed on the insulative substrate 400. Then, in this light-emitting device, an AC voltage is applied between the metal electrode 401 (first electrode) and the metal electrode 402 (second electrode) by an AC power supply to drive a plurality of light-emitting diodes, by which the need for placement of a multiplicity of light-emitting diodes with their anode and cathode uniformly oriented is eliminated, allowing the placement step to be simplified.

Also in this light-emitting device manufacturing method, after the placement step for placing a plurality of bar-like structure light-emitting elements 410 onto the insulative substrate 400, in the substrate dividing step, the insulative substrate 400 is divided into a plurality of divisional substrates 430 each having 100 or more bar-like structure light-emitting elements 410 placed thereon, so that the numbers of substrates flowing through the individual steps are lessened, allowing a large cost cut to be achieved.

Also according to the light-emitting device manufacturing method, without the need for placing light-emitting elements one by one to specified positions on the substrate as in conventional cases, a multiplicity of fine light-emitting elements can be placed at specified positions with high accuracy. Thus, there can be manufactured a light-emitting device which involves less brightness variations and which allows longer life and higher efficacy to be achieved by dispersing light emission while suppressing temperature increases during emission.

In this light-emitting device, a plurality of bar-like structure light-emitting elements 410 are placed so as to be generally evenly dispersed on the mounting surface of the insulative substrate 400, by which substrate-side directed lateral outflow of heat generated in the light-emitting elements 410 due to their light emission is efficiently fulfilled. Thus, temperature increases during emission are further suppressed, so that further longer life and higher efficacy can be achieved.

Also, after the placement of a plurality of bar-like structure light-emitting elements 410 on the insulative substrate 400, the phosphor 420 is applied selectively to areas on the insulative substrate 400 where the plurality of bar-like structure light-emitting elements 410 are placed. Thus, the quantity of use of the phosphor that occupies a large proportion of the material cost can be cut down, allowing a cost cut to be achieved.

Second Embodiment

Figure 32:
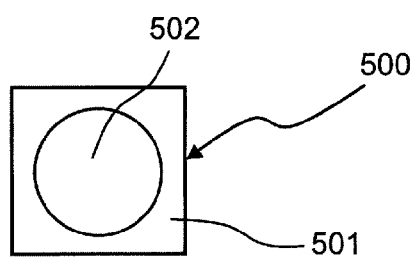
FIG. 32 is a plan view of a light-emitting device to be used for a lighting device according to a second embodiment of the invention.
Figure 33:
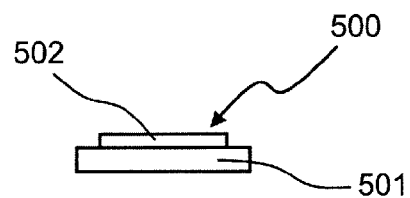
FIG. 33 is a side view of the light-emitting device.

FIG. 32 is a plan view of a light-emitting device to be used for a lighting device according to a second embodiment of the invention. FIG. 33 is a side view of the light-emitting device.

In the light-emitting device 500 to be used for the lighting device of this second embodiment, as shown in FIGS. 32 and 33, a circular-shaped insulative substrate 502 having 100 or more bar-like structure light-emitting elements (not shown) placed thereon is mounted on a square-shaped heat sink plate 501. In this case, the circular-shaped insulative substrate 502 is a divisional substrate which is manufactured by using the light-emitting device manufacturing method of the first embodiment and on which 100 or more bar-like structure light-emitting elements are placed.

Figure 34:
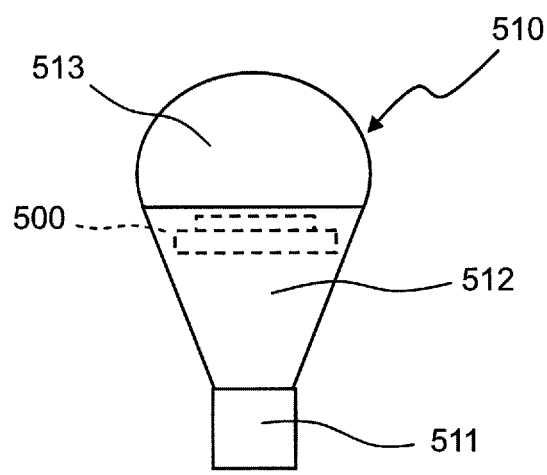
FIG. 34 is a side view of an LED lamp as an example of the lighting device using the light-emitting device.

FIG. 34 is a side view of an LED lamp 510 as an example of the lighting device using the light-emitting device 500 shown in FIGS. 32 and 33. The LED lamp 510, as shown in FIG. 34, includes a ferrule 511 as a power-supply connecting portion for fitting to an external socket to make connection to a commercial power supply, a conical-shaped heat radiating part 512 which has one end connected to the ferrule 511 and which increases in diameter toward the other end, and a light-transmitting part 513 which covers the other end side of the heat radiating part 512. In the heat radiating part 512, the light-emitting device 500 is placed with the insulative substrate 502 facing the light-transmitting part 513 side. This light-emitting device 500 is provided by using one manufactured by the light-emitting device manufacturing method of the first embodiment.

According to the lighting device constructed as described above, by the use of the light-emitting device 500, the manufacturing cost can be cut down, and characteristic variations are lessened so that the yield can be improved.

Also, by the use of the light-emitting device 500 shown in FIGS. 32 and 33, there can be manufactured a lighting device which involves less brightness variations and which allows longer life and higher efficacy to be achieved.

Also, since the insulative substrate 502, on which a plurality of bar-like structure light-emitting elements are placed, is fitted on the heat sink plate 501, an enhanced heat-releasing effect can be achieved.

Third Embodiment

Figure 35:
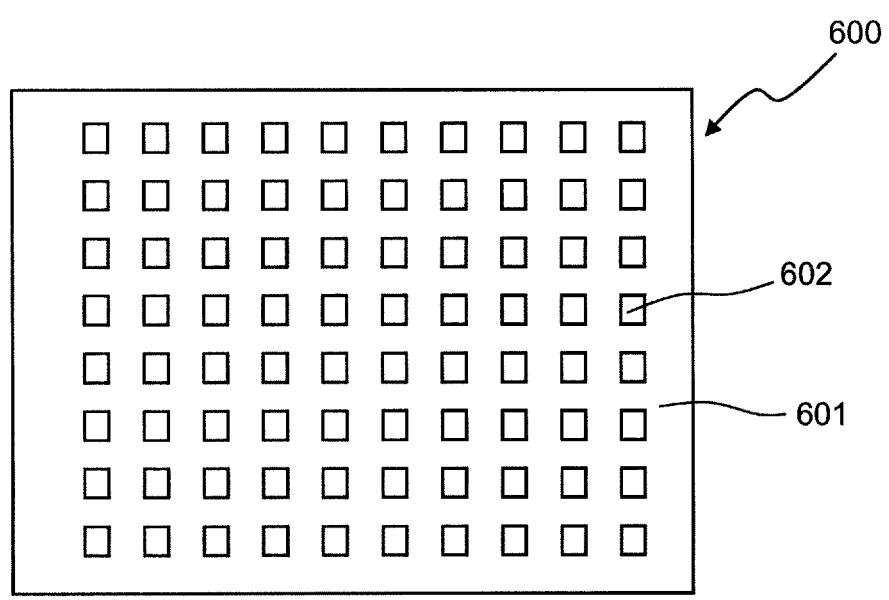
FIG. 35 is a plan view of a backlight using a light-emitting device according to a third embodiment of the invention.

FIG. 35 is a plan view of a backlight using a light-emitting device according to a third embodiment of the invention.

In the backlight 600 of this third embodiment, as shown in FIG. 35, on a rectangular-shaped support substrate 601 as an example of the heat sink plate, a plurality of light-emitting devices 602 are mounted in a lattice shape with specified intervals from one another. In this case, each of the light-emitting devices 602 is a divisional substrate which is manufactured by using the light-emitting device manufacturing method of the first embodiment and on which 100 or more bar-like structure light-emitting elements are placed.

According to the backlight 600 constructed as described above, by the use of the light-emitting devices 602, the manufacturing cost can be cut down, and characteristic variations are lessened so that the yield can be improved.

Also, by the use of the light-emitting devices 602, there can be realized a backlight which involves less brightness variations and which allows longer life and higher efficacy to be achieved.

Also, by fitting of the light-emitting devices 602 on the support substrate 601, the heat-releasing effect is further enhanced.

Fourth Embodiment

Figure 36:
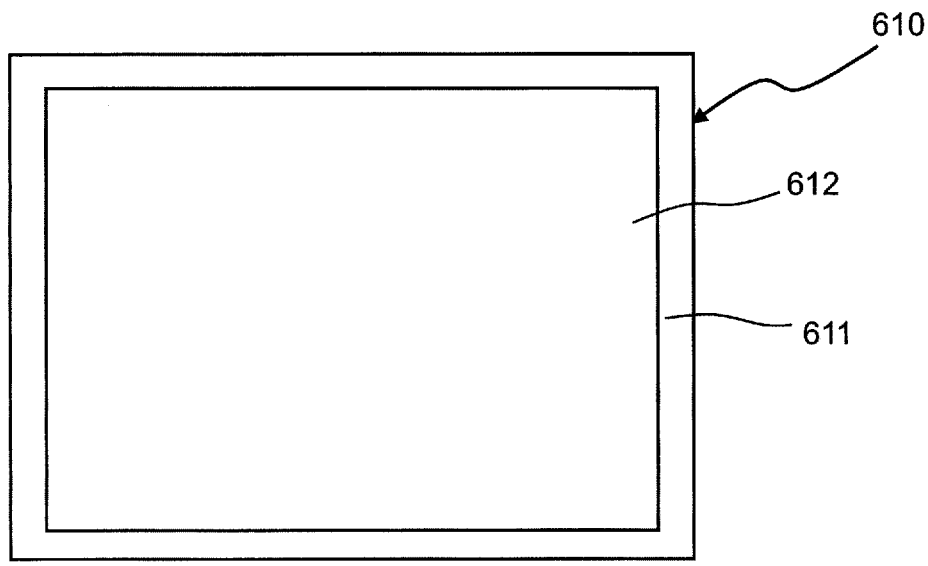
FIG. 36 is a plan view of a backlight using a light-emitting device according to a fourth embodiment of the invention.

FIG. 36 is a plan view of a backlight using a light-emitting device according to a fourth embodiment of the invention.

In the backlight 610 of this fourth embodiment, as shown in FIG. 36, one large light-emitting device 612 is mounted on a rectangular-shaped support substrate 611 as an example of the heat sink plate. This light-emitting device 612 is provided by using one manufactured by the light-emitting device manufacturing method of the first embodiment.

According to the backlight 610 constructed as described above, by the use of the light-emitting device 612, the manufacturing cost can be cut down, and characteristic variations are lessened so that the yield can be improved.

Also, by fitting of the light-emitting device 612 on the support substrate 611, the heat-releasing effect is further enhanced.

Fifth Embodiment

Figure 37:
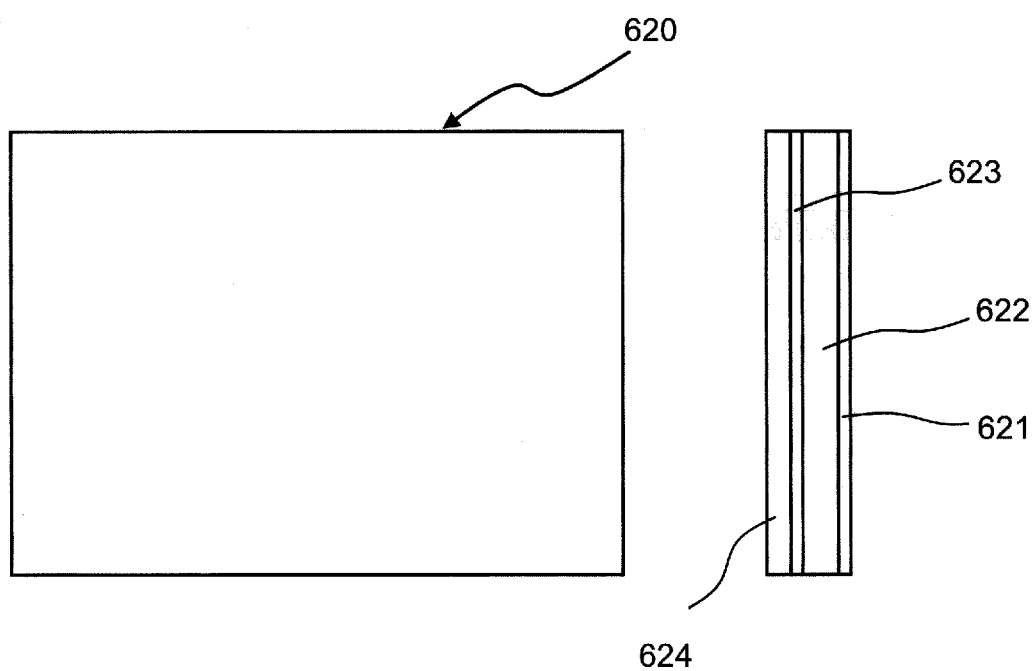
FIG. 37 is a plan view and a side view of a liquid-crystal panel using a light-emitting device according to a fifth embodiment of the invention.

FIG. 37 is a plan view and a side view of a liquid-crystal panel using a light-emitting device according to a fifth embodiment of the invention.

In the liquid-crystal panel 620 of this fifth embodiment, as shown in FIG. 37, on one surface of a rectangular-shaped transparent substrate 622 as an example of the heat sink plate, metal electrodes (not shown) as an example of first, second electrodes and an interconnect pattern are formed, and a plurality of light-emitting elements (not shown) connected to the metal electrodes are placed. A light-emitting portion 621, which is composed of the metal electrodes and the light-emitting elementes, and the transparent substrate 622 constitute one large light-emitting device. Also, on the other surface of the transparent substrate 622, unshown pixel electrodes and TFTs (Thin Film Transistors) are formed in a matrix shape. Then, a liquid-crystal sealing plate 624 is placed on the other side of the transparent substrate 622 with a specified gap, and liquid crystals 623 are sealed between the liquid-crystal sealing plate 624 and the transparent substrate 622.

In ordinary liquid-crystal panels, it has been the case that a liquid-crystal driving substrate and a backlight are separated from each other and, due to light-quantity unevenness, heat generation, or other problems of the backlight, using a light guide tube or heat-radiating element leads to a cost increase or a thickness increase of the liquid-crystal panel. In contrast to this, according to the liquid-crystal panel 620 of the above-described construction, since a light quantity obtained from one conventional light-emitting element is covered by a plurality of light-emitting elements, there is no problem as to light quantity unevenness or heat generation, necessitating neither a light guide tube nor a heat-radiating element. Thus, the light-emitting device, which is a divisional substrate divided into a liquid-crystal panel size, is placed on one side opposite to the liquid-crystal side and used directly as a liquid crystal substrate, so that a low-cost, thin-type liquid-crystal panel can be obtained.

As shown above, according to the liquid-crystal panel 620 constructed as described above, by the use of the light-emitting device composed of the light-emitting portion 621 and the transparent substrate 622, the manufacturing cost can be cut down, and characteristic variations are lessened so that the yield can be improved. Besides, by the use of the transparent substrate 622 in which a liquid-crystal panel substrate and a backlight substrate are integrated into one unit, both component cost and manufacturing cost can be cut down, and moreover a further thinner-type liquid-crystal panel can be realized.

Furthermore, the invention may be applied to a liquid-crystal panel which includes a transparent substrate, a plurality of light-emitting elements placed on one surface of the transparent substrate and connected to interconnect lines formed on the one surface of the transparent substrate, and a color filter formed on the other surface of the transparent substrate.

Figure 44:
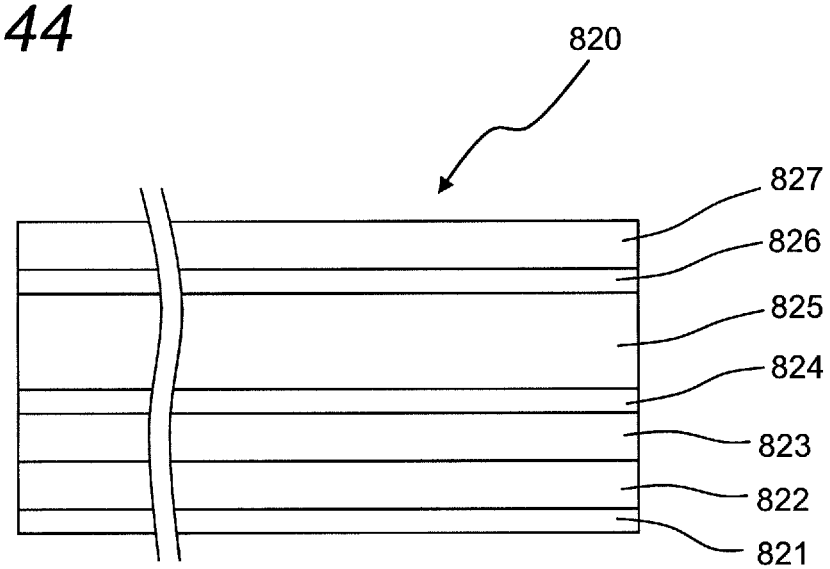
FIG. 44 is a side view of a liquid-crystal panel using a light-emitting device according to another embodiment of the invention.

As such a construction example as shown above, a liquid-crystal panel 820 is shown in FIG. 44. As shown in the side view of FIG. 44, on one surface of a rectangular-shaped transparent substrate 822 as an example of the heat sink plate, metal electrodes (not shown) as an example of first, second electrodes and an interconnect pattern are formed, and a plurality of light-emitting elements (not shown) connected to the metal electrodes are placed. A light-emitting portion 821, which is composed of the metal electrodes and the light-emitting elementes, and the transparent substrate 822 constitute one large light-emitting device. Also, on the other surface of the transparent substrate 822, a color filter 823 is formed, and a protective film 824 is formed on the color filter 823. Then, a glass substrate 827 is placed on the other side of the transparent substrate 822 with a specified gap, and liquid crystals 825 are sealed between the glass substrate 827 and the transparent substrate 822. On a surface of the glass substrate 827 opposite to the liquid crystals 825, unshown pixel electrodes and TFTs 826 are formed in a matrix shape.

In this liquid-crystal panel, by the use of the transparent substrate in which the color filter and the backlight are integrated into one unit, both component cost and manufacturing cost can be cut down, and moreover a further thinner-type liquid-crystal panel can be realized.

In the foregoing first to fifth embodiments, light-emitting devices, light-emitting device manufacturing methods, lighting devices, backlights and liquid-crystal panels, in which light-emitting diodes are used as light-emitting elements, have been described. However, the light-emitting elements of this invention are not limited to light-emitting diodes, and the invention may also be applied to light-emitting devices, light-emitting device manufacturing methods, lighting devices, backlights and liquid-crystal panels, which employ such light-emitting elements as semiconductor lasers, organic ELs (Electro Luminescences), and inorganic ELs (intrinsic ELs).

Also, in the first, second light-emitting element manufacturing methods of the first embodiment, a semiconductor whose base material is GaN is used for the semiconductor core and the semiconductor layer. However, the invention may also be applied to light-emitting elements using semiconductors whose base materials are GaAs, AlGaAs, GaAsP, InGaN, AlGaN, GaP, ZnSe, AlGaInP or the like. Further, although the n-type semiconductor core and the p-type semiconductor layer have been assumed above, yet the invention may also be applied to bar-like structure light-emitting elements of inverted conductive types.

Also, the second light-emitting element manufacturing method of the first embodiment has been described on a bar-like structure light-emitting element having a bar-like semiconductor core with a hexagonal cross section. However, without being limited to this, the invention may also be applied to a bar-like structure light-emitting element having a bar-like semiconductor core with a circular- or elliptical-shaped cross section or another polygonal-shaped cross section.

Also in the second light-emitting element manufacturing method of the first embodiment, the bar-like structure light-emitting element is set to a micrometer-order size, i.e. a diameter of 1 μm and a length of 10 μm to 30 μm. However, out of the diameter and the length, at least the diameter of the element may be on a nanometer-order size less than 1 μm. The semiconductor core of the bar-like structure light-emitting element is, preferably, within a range of 500 nm to 100 μm, in which case variations in diameter of the semiconductor core can be suppressed as compared with bar-like structure light-emitting elements having a diameter of several 10's nm to several 100's nm, so that variations in light-emission area or light-emitting characteristics can be reduced so that the yield can be improved.

In addition, a lower-limit light-emission area of the bar-like structure light-emitting element may be defined as $3.14 \times 10^{-3}$ μm$^2$ (in area resulting when a tubular light-emitting surface is formed on an outer periphery of a 1 nm-dia., 1 μm-long bar-like semiconductor core). Alternatively, on condition that the light-emitting element is square plate-shaped, then its one side line is 56 nm long. The light-emitting element, whichever shape it has, can hardly be sized smaller than the above-mentioned one. Further, the upper-limit number of light-emitting elements to be placed on the mounting surface of one identical substrate may appropriately be defined as 100,000, 000 (one hundred million), while more than this quantities of light-emitting elements can hardly be placed with the yield maintained.

Also in the second light-emitting element manufacturing method of the first embodiment, the semiconductor core or the cap layer is crystal grown by using an MOCVD apparatus.

However, the semiconductor core or the cap layer may also be formed by using other crystal growth apparatuses such as MBE (Molecular Beam Epitaxial) apparatus.

Also in the light-emitting device manufacturing method of the first embodiment, bar-like light-emitting elements are placed on the substrate and connected between electrodes by utilizing polarization of the bar-like light-emitting elements due to application of voltages to between the electrodes. However, without being limited to this, other methods may also be used as a placement method for placing a plurality of light-emitting elements on one identical substrate or a interconnecting method for collectively interconnecting part or all of the plurality of light-emitting elements placed on the substrate.

Figure 38:
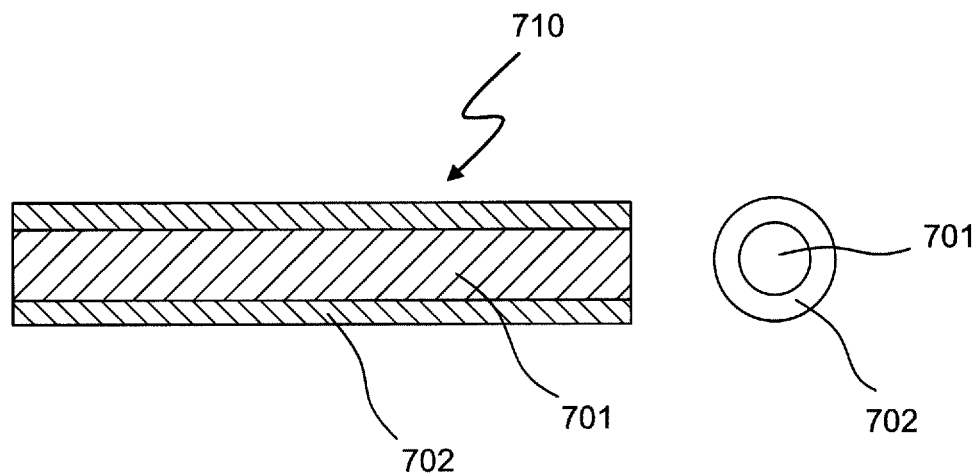
FIG. 38 is a side view and an end face view of a bar-like structure light-emitting element to be used for the light-emitting device manufacturing method according to another embodiment of the invention.

For example, FIG. 38 is a side view and an end face view of a bar-like structure light-emitting element to be used for the light-emitting device manufacturing method according to another embodiment of the invention. FIGS. 39 to 43 are views showing individual steps in the light-emitting device manufacturing method. It is noted that FIGS. 39 to 43 depict only part of the light-emitting device, and 100 or more bar-like structure light-emitting elements are to be placed on the mounting surface of one identical substrate in this light-emitting device manufacturing method.

The bar-like structure light-emitting element 710, as shown in FIG. 38, has a bar-like n-type GaN semiconductor core 701 having a generally circular-shaped cross section, and a cylindrical-shaped p-type GaN semiconductor layer 702 covering an outer periphery of the semiconductor core 701. Out of the semiconductor core 701, only both-side end faces exposed. In this case, a quantum well layer may be additionally provided between the semiconductor core 701 and the semiconductor layer 702.

Figure 39:
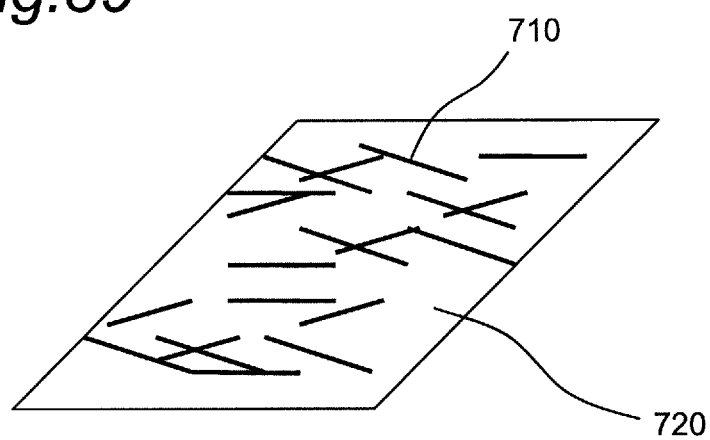
FIG. 39 is a view showing a step for applying a solution containing the bar-like structure light-emitting elements onto an insulative substrate in the light-emitting device manufacturing method.

First, a solution containing such bar-like structure light-emitting elements 710 as shown above is applied onto an insulative substrate 720 as shown in FIG. 39.

Figure 40:
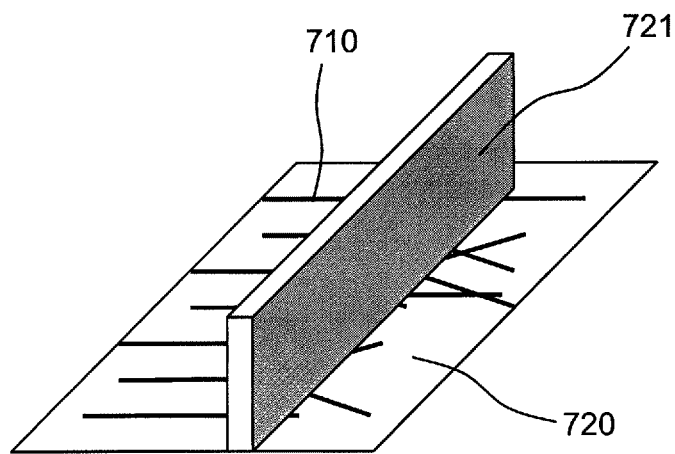
FIG. 40 is a view showing a step for rubbing process of the solution applied onto the insulative substrate.

Next, as shown in FIG. 40, a rubbing process that the solution (mostly bar-like structure light-emitting elements 710) applied onto the insulative substrate 720 is rubbed against the substrate side is performed with a rubbing motion 721, by which a plurality of bar-like structure light-emitting elements 710 are arrayed so that longitudinal directions of the bar-like structure light-emitting elements 710 are oriented toward one identical direction.

Figure 41:
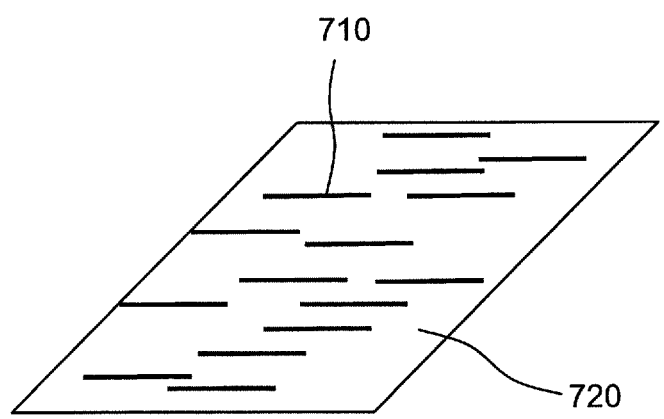
FIG. 41 is a view showing a step for drying the rubbing-processed insulative substrate.

Next, as shown in FIG. 41, the insulative substrate 720 subjected to the rubbing process is dried.

Figure 42:
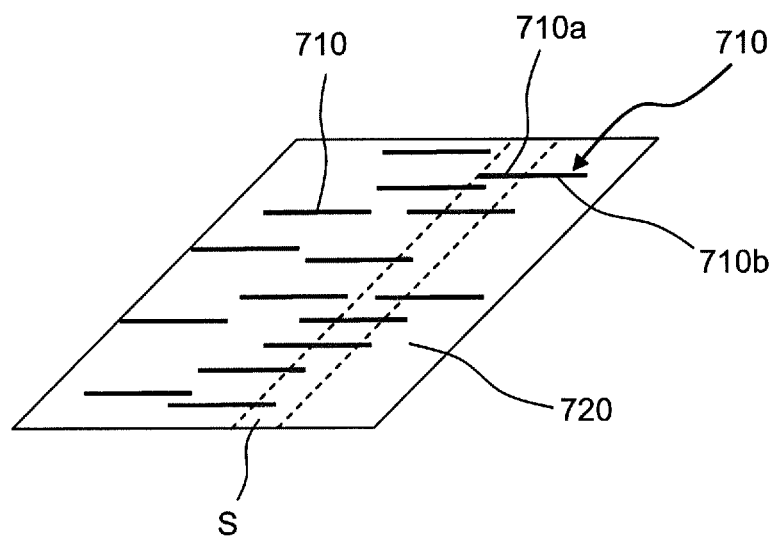
FIG. 42 is a view showing a step for exposing part of a p-type semiconductor by etching a linear area of the insulative substrate, on which the bar-like structure light-emitting elements are arrayed, perpendicular to a longitudinal direction of the bar-like structure light-emitting elements.

Next, as shown in FIG. 42, a linear area S perpendicular to the longitudinal directions of the bar-like structure light-emitting elements 710 of the insulative substrate 720, on which a plurality of bar-like structure light-emitting elements 710 have been placed, is etched, so that part of the semiconductor cores 701 of the bar-like structure light-emitting elements 710, which are overlapped with the linear areas S, are exposed. As a result, part of the bar-like structure light-emitting elements 710 each have an exposure portion 710a, where the n-type semiconductor core 701 is exposed, and a coverage portion 710b covered with the p-type semiconductor layer 702.

Figure 43:
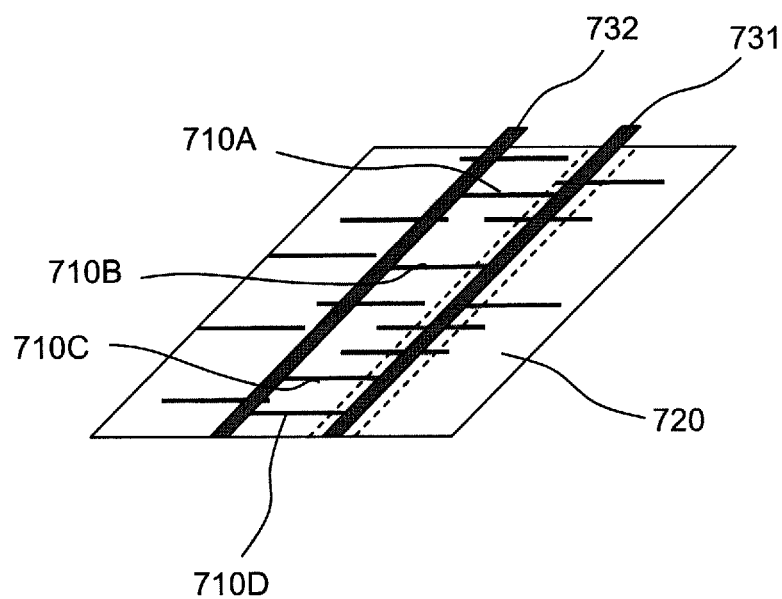
FIG. 43 is a view showing a step for forming metal interconnecting lines on the insulative substrate.

Then, as shown in FIG. 43, a metal line 731 is formed at the linear area S of the insulative substrate 720, and moreover a metal line 732 is formed generally parallel to the metal line 731 with a specified distance thereto.

As a result, the metal line 731 is connected to the n-type semiconductor cores 701 of some of the plurality of bar-like structure light-emitting elements 710, while the metal line 732 is connected to the p-type GaN semiconductor layers 702 of some of the plurality of bar-like structure light-emitting elements 710. Then, in FIG. 43 as an example, the metal line 731 is connected to the n-type semiconductor cores 701 of four bar-like structure light-emitting elements 710A-710D, while the metal line 732 is connected to the p-type semiconductor layers 702. Therefore, a voltage is applied to between the metal line 731 and the metal line 732 so that a current flows from the p-type semiconductor layer 702 side to the n-type semiconductor core 701 side, thereby causing the four bar-like structure light-emitting elements 710A-710D to emit light.

Then, in the substrate dividing step, the insulative substrate 720 is divided into a plurality of divisional substrates. Thus, a plurality of light-emitting devices, in which a plurality of bar-like structure light-emitting elements 710 have been placed on the divisional substrates, are formed.

In this way, out of a plurality of light-emitting elements, bar-like structure light-emitting elements 710 which, even if cut in the substrate dividing step, have no influence on a desired light emission quantity, are placed in cutting areas of the insulative substrate 720. Thus, even if bar-like structure light-emitting elements 710 that have been broken by cutting do not emit light, uncut other plural bar-like structure light-emitting elements 710 fulfill light emission. This eliminates the need for considering that the bar-like structure light-emitting elements 710 are kept from being placed in cutting areas of the insulative substrate 720 in the placement step, so that the placement step can be simplified. It is noted that the 'desired light emission quantity' is one of specifications required for light-emitting devices.

Although the present invention has been described above by way of concrete embodiments, yet the invention is not limited to the foregoing embodiments and may be carried out with various changes and modifications without departing the scope of the invention.

Hereinbelow, further embodiments of the invention will be described in detail. In the following sixth to twenty-fourth embodiments and their modifications, the term 'element-containing liquid' refers to a substance having a liquid and a plurality of light-emitting elements positioned in the liquid. Also, the term 'specified position (place)' refers to a predetermined position (place).

Sixth Embodiment

First, a, substrate preparation step is executed. In this substrate preparation step, an insulative substrate 1050 as a first substrate shown in FIG. 45, which is a plan view, is prepared.

Figure 45:
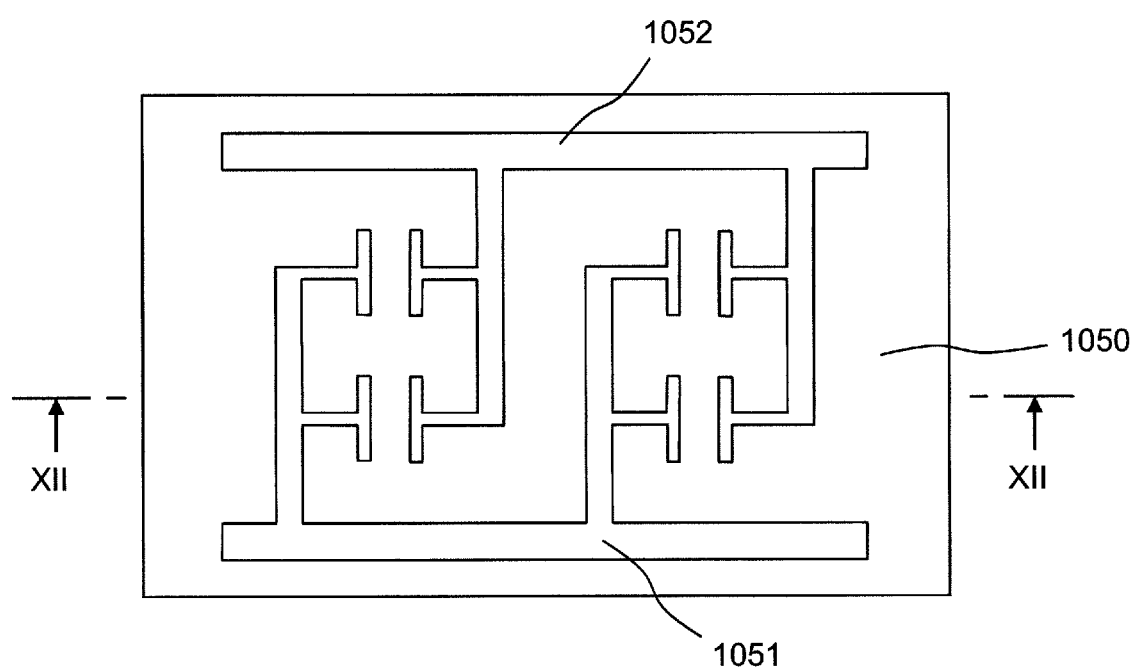
FIG. 45 is a plan view of a first substrate to be used for a light-emitting device manufacturing method according to a sixth embodiment.

As shown in FIG. 45, the insulative substrate 1050 has, on its top surface, a metallic first electrode 1051 and a metallic second electrode 1052. The insulative substrate 1050 is a substrate in which a silicon oxide film is formed on a surface of such a dielectric as glass, ceramic, aluminum oxide or resin or such a semiconductor as silicon so that the substrate surface has an insulative property. With use of a glass substrate, it is desirable that a base insulating film such as silicon oxide film or silicon nitride film is formed on the surface.

The first and second electrodes 1051, 1052 are formed each into a desired electrode configuration by using printing techniques. In addition, the formation of the first and second electrodes 1051, 1052 may also be fulfilled, for example, by uniformly stacking a metal film and a photoconductor film and by performing exposure of a desired electrode pattern and etching process.

Although omitted in FIG. 45, pads are formed in the first and second electrodes 1051, 1052 so that voltages can be set from the external. Bar-like structure light-emitting elements are arrayed in portions (array areas) where those first and second electrodes 1051, 1052 are opposed to each other. Although the array areas for arraying the bar-like structure light-emitting elements are arrayed by 2×2 areas in FIG. 45, yet any arbitrary number of areas may be arrayed.

Figure 46:
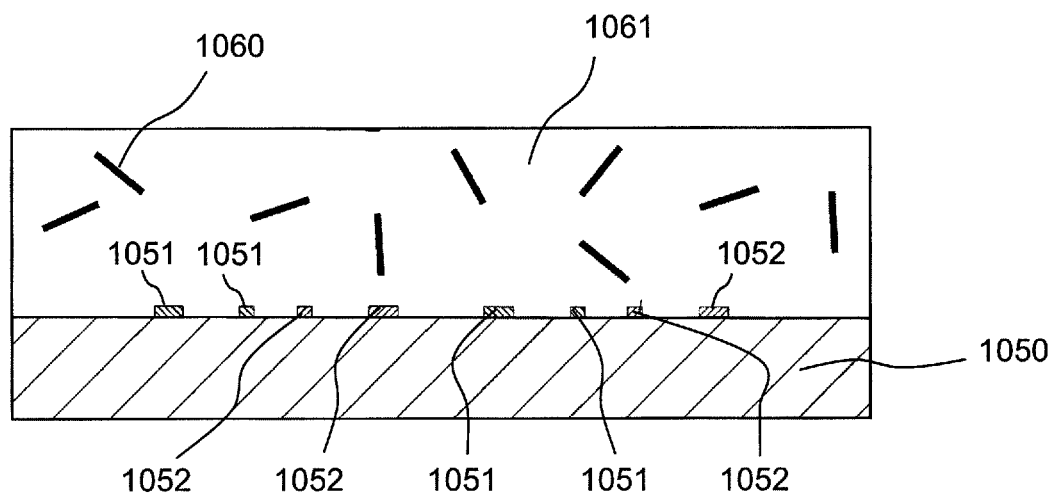
FIG. 46 is a schematic sectional view taken along the line XII-XII of FIG. 45.

FIG. 46 is a schematic sectional view taken along the line XII-XII of FIG. 45.

Next, an element feeding step is executed. In the element feeding step, as shown in FIG. 46, an element-containing liquid having isopropyl alcohol (IPA) 1061 as an example of the liquid and bar-like structure light-emitting elements 1060 as an example of the light-emitting elements positioned in the IPA 1061 is thinly applied on the insulative substrate 1050. As the liquid, usable instead of the IPA 1061 are ethylene glycol, propylene glycol, methanol, ethanol, acetone or their mixtures. Otherwise, usable as the liquid is one made of organic matters other than the IPA 1061, water, or the like.

However, in event of flow of a large current between the first and second electrodes 1051, 1052 through the liquid, a desired voltage could no longer be applied to between the first and second electrodes 1051, 1052. In such a case, an insulating film of about 10 nm to 300 nm may appropriately be provided to coat the entire surface of the insulative substrate 1050 so that the first and second electrodes 1051, 1052 are covered therewith.

The thickness of coating of the IPA 1061 containing the bar-like structure light-emitting elements 1060 is such a thickness that the bar-like structure light-emitting elements 1060 are allowed to move in the liquid so that the bar-like structure light-emitting elements 1060 can be arrayed in the succeeding step for arraying the bar-like structure light-emitting elements 1060. Therefore, the thickness of coating of the IPA 1061, larger than a thickness of each bar-like structure light-emitting element 1060, is several μm to several mm as an example. Excessively thin thicknesses of coating would make it difficult for the bar-like structure light-emitting elements 1060 to move, while excessively thick thicknesses of coating would elongate the time for drying the liquid. Also, the quantity of bar-like structure light-emitting elements 1060 is preferably within a range of $1 \times 10^4$ pcs/cm$^3$ to $1 \times 10^7$ pcs/cm$^3$ against the quantity of IPA.

For fulfillment of the coating of IPA 1061 containing the bar-like structure light-emitting elements 1060, it is also allowable that a frame is formed on outer peripheries of the metal electrodes for arraying the bar-like structure light-emitting elements 1060 and then the IPA 1061 containing the bar-like structure light-emitting elements 1060 is filled to within the frame until a desired thickness is attained. However, in a case where the IPA 1061 containing the bar-like structure light-emitting elements 1060 has viscosity, it is possible to attain a desired thickness of coating without needing the frame.

Next, an element array step is executed. In this element array step, an AC voltage is applied between the first electrode 1051 and the second electrode 1052. In this sixth embodiment, it has found that the voltage is set to an AC voltage of 1 V, 5 KHz. The AC voltage applied to the first, second electrodes 1051, 1052 may be 0.1-10 V, but voltages of 0.1 V or lower would cause the array of the bar-like structure light-emitting elements 1060 to be worsened and voltages of 10 V or higher would cause the elements to be aggregated between the first and second electrodes. Therefore, the voltage is preferably set to 0.5-5V, and more preferably to about 1 V. As to the AC frequency, those of 1 Hz to 10 MHz may be used, but frequencies of 1 Hz or lower would cause large array variations to be involved and frequencies of 10 MHz or higher would make it difficult to apply a desired voltage to the electrodes. Therefore, the frequencies are preferably set to 10 Hz to 1 MHz, and more preferably 100 Hz to 1 KHz. Further, the AC voltage applied between the first, second electrodes 1051, 1052 is not limited to sinusoidal waves and may be one which periodically varies, such as rectangular waves, chopping waves and sawtooth waves.

Figure 47:
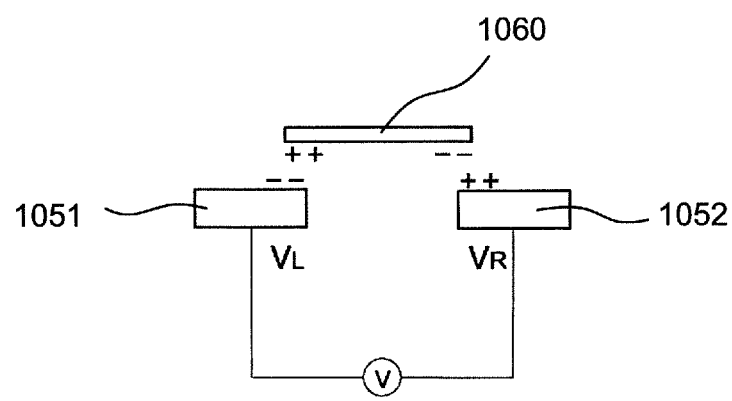
FIG. 47 is a view showing a principle in which the bar-like structure light-emitting elements are arrayed on first, second electrodes.

FIG. 47 shows a principle in which the bar-like structure light-emitting elements 1060 are arrayed on the first, second electrodes 1051, 1052. As shown in FIG. 47, with a voltage VL applied to the first electrode 1051 and with a voltage VR (VL<VR) applied to the second electrode 1052, negative charge is induced to the first electrode 1051 while positive charge is induced to the second electrode 1052. Approach of a bar-like structure light-emitting element 1060 there causes positive charge to be induced on one side of the bar-like structure light-emitting element 1060 closer to the first electrode 1051 while negative charge is induced on the other side closer to the second electrode 1052. Induction of electric charge to the bar-like structure light-emitting element 1060 is due to electrostatic induction, i.e., electric charge is induced to surfaces of the bar-like structure light-emitting elements 1060 placed in an electric field until their internal electric field comes to zero. As a result, attractive force due to electrostatic force acts between the individual electrodes and the bar-like structure light-emitting elements 1060, so that the bar-like structure light-emitting elements 1060 are set along lines of electric force generated between the first, second electrodes 1051, 1052.

Figure 48:
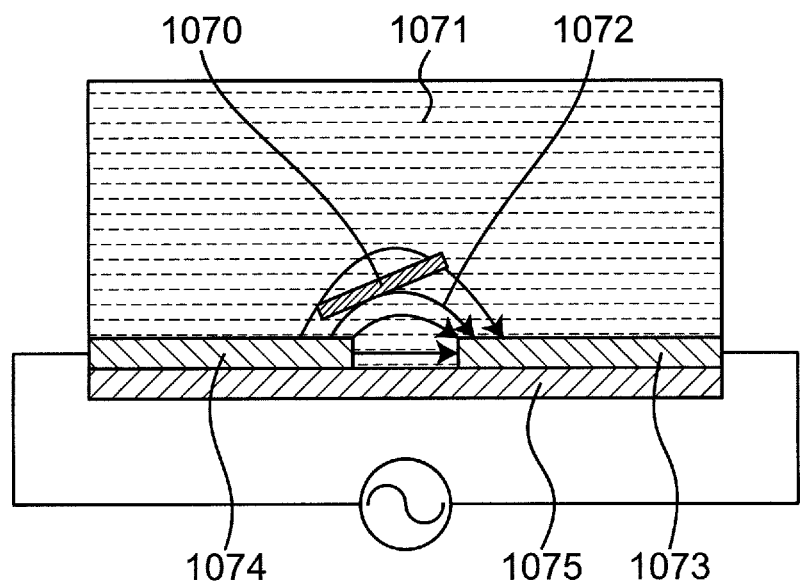
FIG. 48 is a view showing a case in which lines of electric force are nonuniform.

Also, in a case where lines of electric force are nonuniform as in FIG. 48, the bar-like light-emitting elements 1060 are pulled up toward the electrodes by dielectrophoresis. By both or either one of electrostatic force and dielectrophoretic force, the bar-like light-emitting elements approach the electrodes. Further, the bar-like structure light-emitting elements 1060 are arrayed regularly in certain directions at generally equal intervals by repulsive force due to the electric charge because of equality among levels of the electric charge induced to the individual bar-like structure light-emitting elements 1060. In addition, in FIG. 48, reference sign 1070 denotes a minute light-emitting element, 1071 denotes the liquid, 1072 denotes a nonuniform electric field, 1073 denotes a second electrode, 1074 denotes a first electrode, and 1075 denotes a first substrate.

Figure 49:
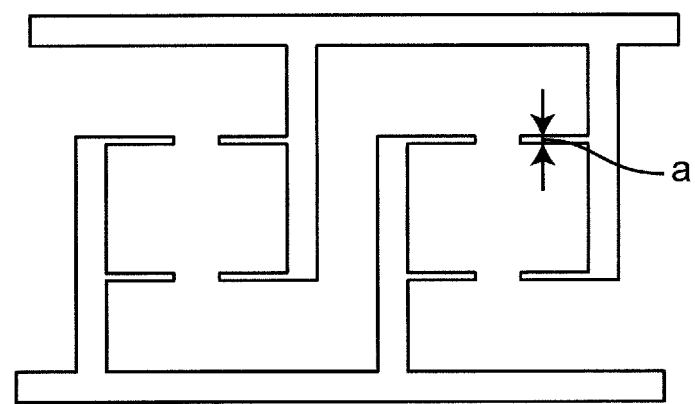
FIG. 49 is a view showing an electrode having a width of 0.5 μm-10 μm usable for the invention.

With use of electrodes each having a width of 0.5 μm to 10 μm as in FIG. 49, one bar-like light-emitting element can be arrayed between every pair of the electrodes. Further, in FIG. 49, reference character 'a' corresponds to the width of each electrode, where the value of 'a' falls within a range of 0.5 μm to 10 μm.

As shown above, since the bar-like structure light-emitting elements 1060 are attracted to the first, second electrodes 1051, 1052 by an external electric field generated between the first, second electrodes 1051, 1052 by the bar-like structure light-emitting elements 1060, each of the bar-like structure light-emitting elements 1060 needs to be sized movable in the liquid. Thus, the coating amount (thickness) of the liquid needs to be larger than the diameter of each bar-like light-emitting element.

Figure 50:
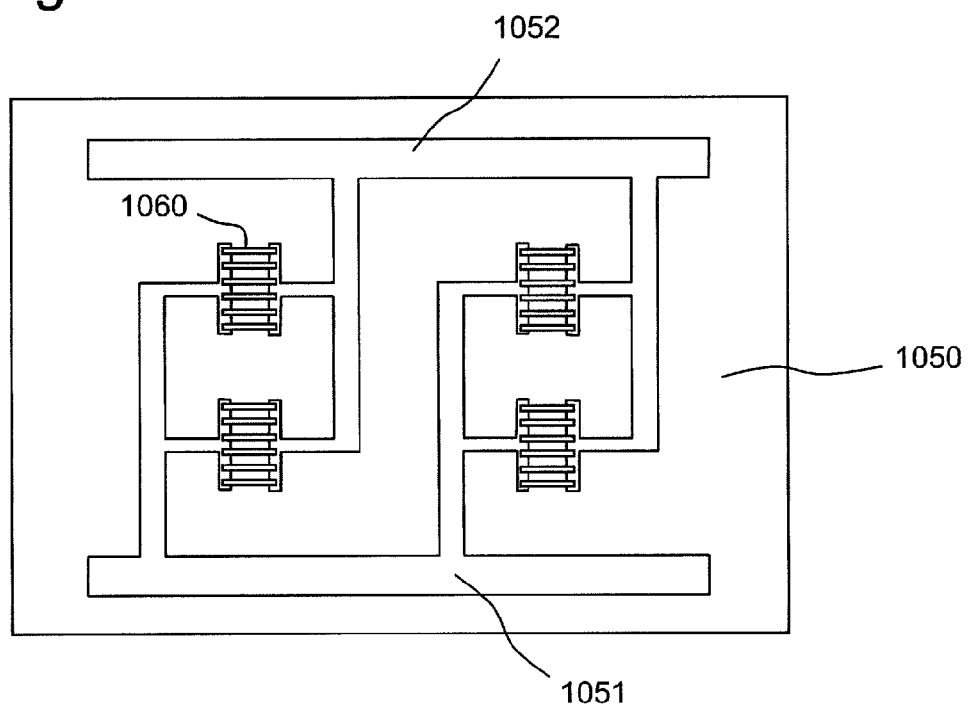
FIG. 50 is a plan view of an insulative substrate on which bar-like structure light-emitting elements are arrayed.

FIG. 50 is a plan view of the insulative substrate 1050, on which the bar-like structure light-emitting elements 1060 are arrayed. Use of the insulative substrate 1050, on which the bar-like structure light-emitting elements 1060 are arrayed, for a backlight of liquid crystal display devices or the like makes it possible to realize a backlight which allows reductions in thickness and weight to be achieved and which has high luminous efficacy and power-saving property. Also, when the insulative substrate 1050 on which the bar-like structure light-emitting elements 1060 are arrayed is used as a light-emitting device, there can be realized a light-emitting device which allows reductions in thickness and weight to be achieved and which has high luminous efficacy and power-saving property.

Figure 51:
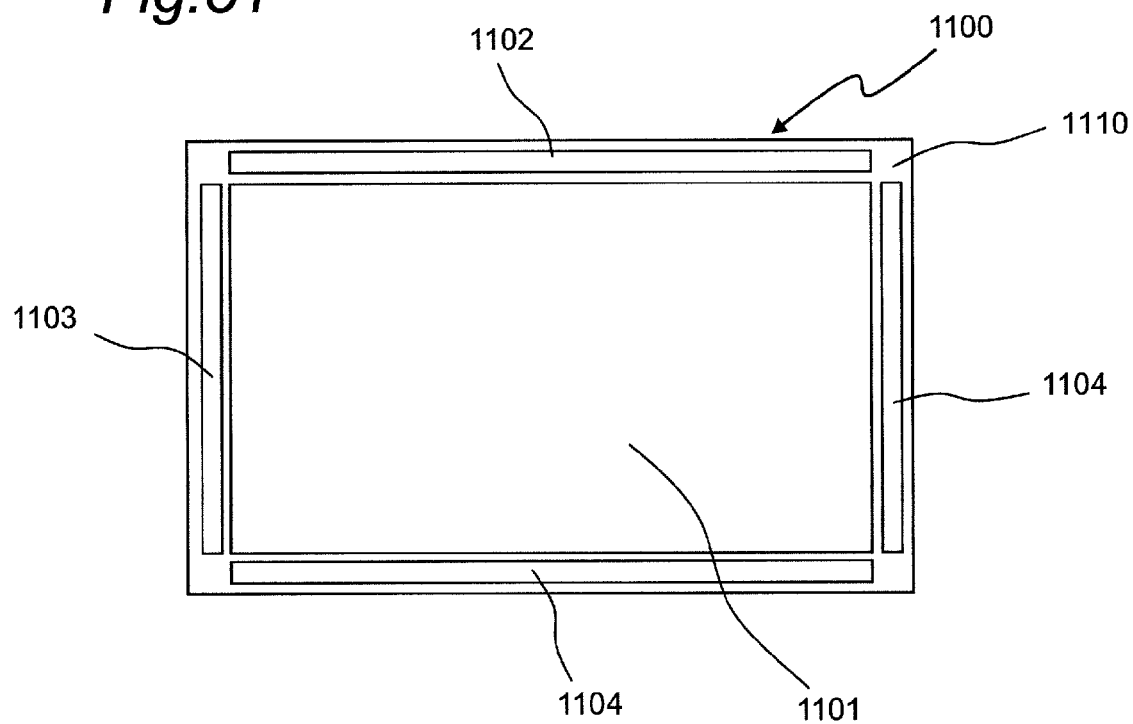
FIG. 51 is a plan view of a display device using an insulative substrate on which bar-like structure light-emitting elements are arrayed.

FIG. 51 is a plan view of a display device using the insulative substrate 1050 on which the bar-like structure light-emitting elements 1060 are arrayed. As shown in FIG. 51, the display device 1100 includes a display section 1101, a logic circuit section 1102, a logic circuit section 1103, a logic circuit section 1104, and a logic circuit section 1105 on an insulative substrate 1110. In the display section 1101, bar-like structure light-emitting elements 1060 are arrayed in pixels placed in a matrix shape.

According to the light-emitting device manufacturing method of the sixth embodiment, without manipulating the individual light-emitting elements one by one, a plurality of light-emitting elements can be arrayed at specified positions by one-time process, thus allowing the manufacturing cost to be cut down.

Seventh Embodiment

Figure 52:
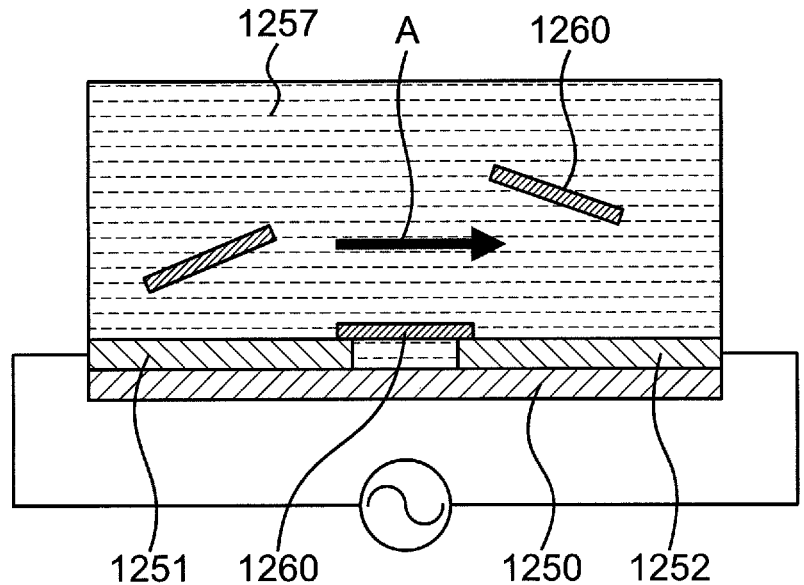
FIG. 52 is a schematic view for explaining a light-emitting device manufacturing method according to a seventh embodiment.

FIG. 52 is a schematic view for explaining a light-emitting device manufacturing method according to a seventh embodiment. In FIG. 52, arrow A indicates a flow of a liquid 1257.

The seventh embodiment differs from the sixth embodiment only in that in the element array step, an element-containing liquid containing light-emitting elements 1260 is fluidized relative to a first substrate 1250.

A method for fluidizing the element-containing liquid containing the light-emitting elements 1260 relative to the first substrate 1250 may be, for example, pressurizing the element-containing liquid, or inclining the first substrate 1250, spraying air to the element-containing liquid, or the like, where any method will do if it imparts a velocity component to the element-containing liquid.

According to the light-emitting device manufacturing method of the seventh embodiment, since the light-emitting elements 1260 move on the flow of the liquid in proximity to the surface of the first substrate 1250, the light-emitting elements 1260 are allowed to approach, in shorter time, a specified place defined by the first electrode 1251 and the second electrode 1252. Thus, arraying time for the light-emitting elements 1260 can be shortened.

Eighth Embodiment

Figure 53:
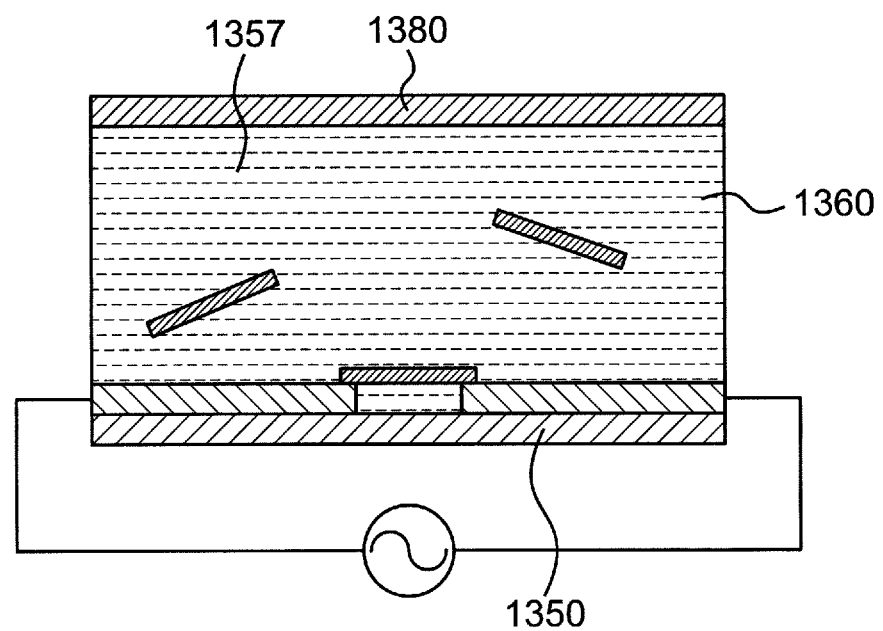
FIG. 53 is a schematic view for explaining a light-emitting device manufacturing method according to an eighth embodiment.

FIG. 53 is a schematic view for explaining a light-emitting device manufacturing method according to an eighth embodiment.

The eighth embodiment differs from the sixth embodiment in that after the substrate preparation step, second substrate placement step for placing a second substrate 1380 in generally parallel to a first substrate 1350 is executed and subsequently, in an element feeding step, the light-emitting element-containing liquid is filled into a gap between the first substrate 1350 and the second substrate 1380.

According to the light-emitting device manufacturing method of the eighth embodiment, since evaporation of the liquid can be prevented by the first substrate 1350 and the second substrate 1380, which are placed generally parallel to each other, light-emitting elements 1360 can be arrayed at specified places with high accuracy and high yield.

Ninth Embodiment

Figure 54:
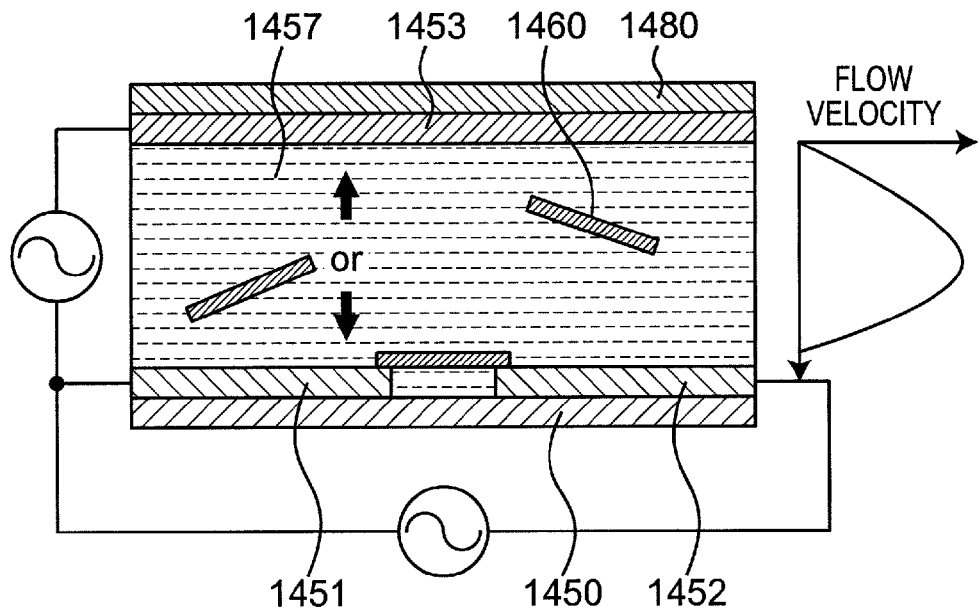
FIG. 54 is a schematic view for explaining a light-emitting device manufacturing method according to a ninth embodiment.

FIG. 54 is a schematic view for explaining a light-emitting device manufacturing method according to a ninth embodiment.

The ninth embodiment differs from the eighth embodiment in that a second substrate 1480 has a third electrode 1453 opposed to first and second electrodes 1451, 1452 of a first substrate 1450 and moreover in at least one of the element feeding step and the element array step, a voltage is applied to between at least either one of the first electrode 1451 or the second electrode 1452 and the third electrode 1453.

Light-emitting elements 1460, for their array at specified places, need to be located in proximity to the first substrate 1450. In this case, usually, the light-emitting elements 1460 are dropped by gravity so as to be arrayed at specified positions. According to the ninth embodiment, since the light-emitting elements 1460 can be moved toward the first substrate 1450 with application of a voltage, the light-emitting elements 1460 can be moved promptly to vicinities of the first substrate 1450, so that the arraying of the light-emitting elements 1460 can be fulfilled promptly.

Also, light-emitting elements 1460 that have not been arrayed at specified places need to be collected for reuse or prevention of interconnect failures. In this case, such light-emitting elements 1460 floating in the liquid, by being moved to intermediate places between the first substrate 1450 and the second substrate 1480, can be discharged promptly from on the first substrate 1450. That is, according to a flow velocity graph of FIG. 54, the liquid flow velocity is higher around intermediate places between the first substrate 1450 and the second substrate 1480. Therefore, the light-emitting elements 1460 that have not been arrayed are moved to the intermediate positions with an AC voltage applied to between the first electrode 1451 and the third electrode 1453, by which the floating light-emitting elements 1460 can be collected efficiently.

Figure 55:
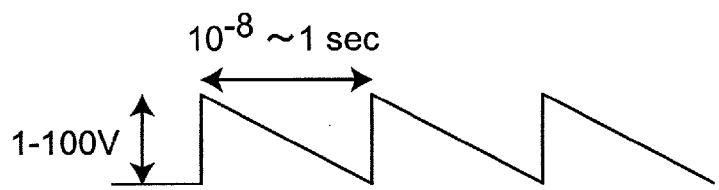
FIG. 55 is a view showing an example of a voltage to be applied to a third electrode in the ninth embodiment.
Figure 56:
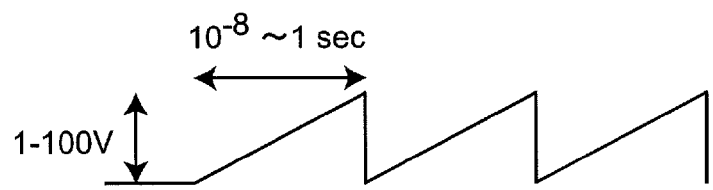
FIG. 56 is a view showing an example of the voltage to be applied to the third electrode in the ninth embodiment.

FIGS. 55 and 56 are views showing examples of voltages to be applied to the third electrode 1453. More specifically, FIG. 55 shows a voltage for the third electrode (move toward the lower electrode side), which is in particular a voltage to be applied to the third electrode 1453 when the light-emitting elements 1460 floating in the liquid are moved toward the first electrode 1451 (lower electrode) side. Also, FIG. 56 shows a voltage for the third electrode (move toward the upper electrode side), which is in particular a voltage to be applied to the third electrode 1453 when the light-emitting elements 1460 floating in the liquid are moved toward the third electrode 1453 (upper electrode) side.

According to the light-emitting device manufacturing method of the ninth embodiment, asymmetric voltages such as shown in FIGS. 55 and 56 are applied to between the first electrode (lower electrode) 1451 and the third electrode (upper electrode) 1453, so that the light-emitting elements 1460 can be moved toward the first electrode 1451 or the third electrode 1453. Thus, the arraying time can be shortened and moreover light-emitting elements 1460 that have not been arrayed can promptly be collected or treated in other ways.

Tenth Embodiment

Figure 57:
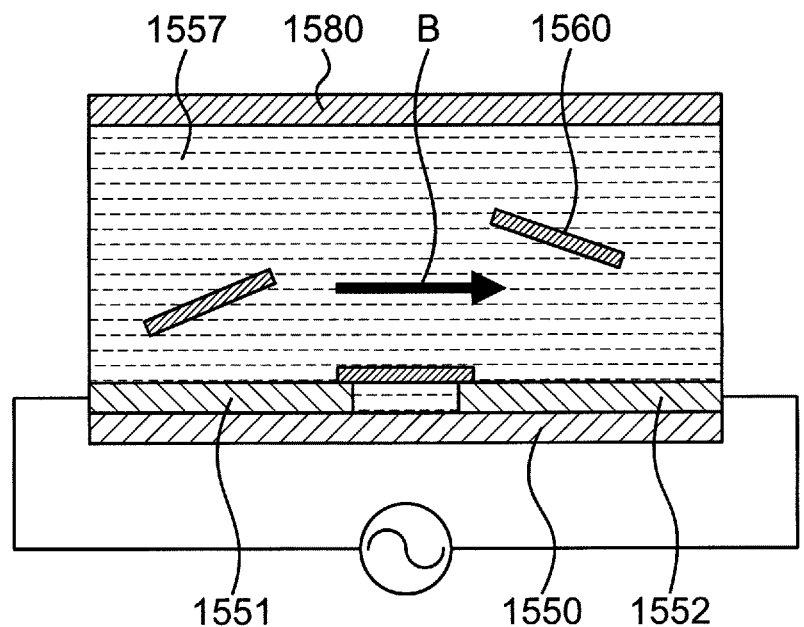
FIG. 57 is a schematic view for explaining a light-emitting device manufacturing method according to a tenth embodiment.

FIG. 57 is a schematic view for explaining a light-emitting device manufacturing method according to a tenth embodiment.

The tenth embodiment differs from the eighth embodiment in that in the element array step, the element-containing liquid, which is a liquid containing light-emitting elements, flows between the first substrate and the second substrate from a first electrode 1551 side to a second electrode 1552 side as indicated by arrow B in FIG. 57.

According to the light-emitting device manufacturing method of the tenth embodiment, a flow passage of the element-containing liquid can be defined by a first substrate 1550 and a second substrate 1580, so that evaporation of the liquid can be prevented and moreover occurrence of convection due to cooling caused by vaporization can be prevented. Thus, the light-emitting elements 1560 can be arrayed at specified places with high accuracy and high yield.

Also according to the light-emitting device manufacturing method of the tenth embodiment, since the light-emitting elements 1560 move on the flow of the liquid in proximity to the surface of the first substrate 1550, the light-emitting elements 1560 more easily approach specified places defined by the first electrode 1551 and the second electrode 1552, so that the arraying time can be shortened.

Also according to the light-emitting device manufacturing method of the tenth embodiment, the gap between the first substrate 1550 and the second substrate 1580 is kept constant at any place on the first substrate 1550. As a result of this, the flow velocity of the liquid can be kept constant at any place wherever it is on the first substrate 1550, so that the light-emitting elements 1560 can be arrayed at specified places with high yield.

Also according to the light-emitting device manufacturing method of the tenth embodiment, since the flow velocity of the liquid can be easily changed by adjusting the quantity of the liquid injected into the flow passage defined by the first, second substrates 1550, 1580. Thus, the light-emitting elements can be arrayed at specified places with high yield.

Eleventh Embodiment

Figure 58:
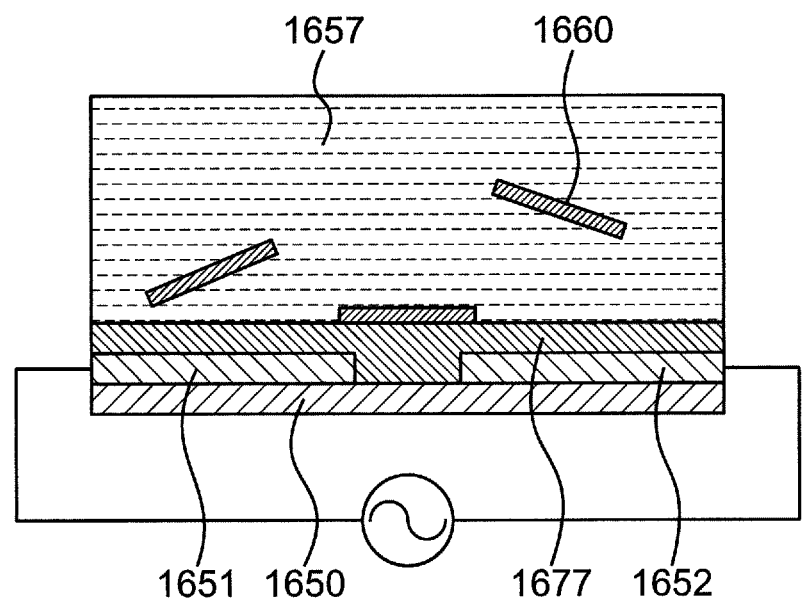
FIG. 58 is a schematic view for explaining a light-emitting device manufacturing method according to an eleventh embodiment.

FIG. 58 is a schematic view for explaining a light-emitting device manufacturing method according to an eleventh embodiment.

The eleventh embodiment differs from the sixth embodiment in that surfaces of first and second electrodes 1651, 1652 are covered with an insulating film 1677.

According to the light-emitting device manufacturing method of the eleventh embodiment, since no electric current flows through the first and second electrodes 1651, 1652, voltage drops can be made very small, so that the array yield can be improved. As a first substrate 1650 becomes larger in scale so that the number of light-emitting elements to be arrayed becomes larger in number, interconnect lengths of the first, second electrodes 1651, 1652 become longer, causing voltage drops to become noticeable, and posing a possibility that the arraying is no longer done at ends of the interconnect lines.

Also according to the light-emitting device manufacturing method of the eleventh embodiment, since no electric current flows between the first electrode and the second electrode, dissolution of the electrodes by an electrochemical effect can be prevented, so that worsening of the array yield due to disconnections or liquid contaminations can be prevented. With the metal electrodes 1651, 1652 in contact with an electrolyte, application of a voltage to between the electrodes 1651, 1652 may cause the metal to dissolve into the electrolyte.

Twelfth Embodiment

Figure 59:
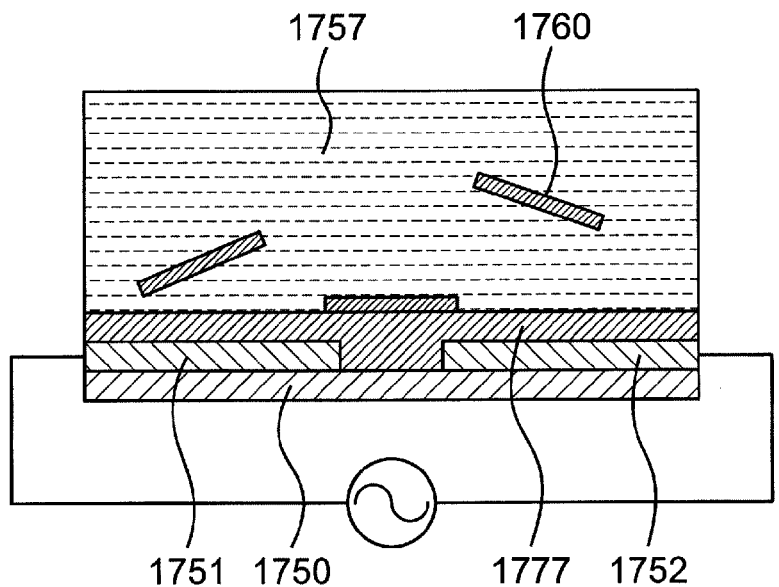
FIG. 59 is a schematic view for explaining a light-emitting device manufacturing method according to a twelfth embodiment.

FIG. 59 is a schematic view for explaining a light-emitting device manufacturing method according to a twelfth embodiment.

The twelfth embodiment differs from the sixth embodiment in that a surface 1777 of a first substrate 1750 is made from the same material as surfaces of the light-emitting elements 1760, while the sixth embodiment has no limitations in the material of the surface of the first substrate 1150.

According to the light-emitting device manufacturing method of the twelfth embodiment, light-emitting elements 1760 sticking to the surface 1777 of the first substrate 1750 can be reduced, so that the array yield can be improved. As to the reason of this, the light-emitting elements 1760 and the surface 1777 of the first substrate 1750, when being of the same material, become equal in zeta-potential to each other so as to repel each other, so that the light-emitting elements 1760 can be prevented from sticking to the surface 1777 of the first substrate 1750.

Thirteenth Embodiment

The thirteenth embodiment differs from the sixth embodiment in that the liquid contains a surface active agent.

Mixing of the surface active agent makes it possible to prevent aggregations of the light-emitting device. When some materials different from the material of the light-emitting elements are sticking to the surfaces of the light-emitting elements due to contaminations or other reasons, their zeta-potential lowers or changes in positive or negative sign, making aggregations more likely to occur. Further, when the light-emitting element surface and the substrate or electrode surface are different in material from each other, their zeta-potential differs, making aggregations more likely to occur in some cases. Aggregations can be suppressed by mixing a surface active agent into the liquid.

Thus, according to the light-emitting device manufacturing method of the thirteenth embodiment, aggregations among the light-emitting elements or between the light-emitting elements and the insulating film or the substrates or the electrodes can be prevented.

Fourteenth Embodiment

The fourteenth embodiment differs from the sixth embodiment in that the longest portion of each light-emitting element is not more than 50 µm long, while the sixth embodiment has no laminations in the size of the longest portion of the light-emitting element.

In a case where the light-emitting elements are operated one by one so as to be packaged, the cost abruptly increases when the size of the light-emitting element is 100 µm or less.

One reason of this is that the required alignment accuracy becomes higher for array of minute objects. Another reason is that the number (array number) of light-emitting elements to obtain a certain light quantity becomes larger. Still another reason is that minute light-emitting elements are weak in strength so as to be difficult to handle.

According to the present invention, even light-emitting elements having a maximum size of 50 µm or less can be easily placed at specified places irrespectively of the number of light-emitting elements. Further, the invention method is suited for arraying of rather minute objects.

Arraying a multiplicity of minute-sized light-emitting elements makes it possible to reduce brightness variations in plane lighting or the like, hence usefulness of the invention.

Fifteenth Embodiment

Figure 60:
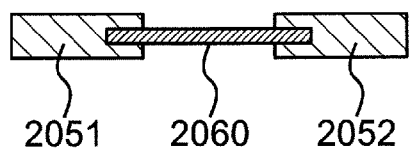
FIG. 60 is a schematic view for explaining a light-emitting device manufacturing method according to a fifteenth embodiment.
Figure 61:
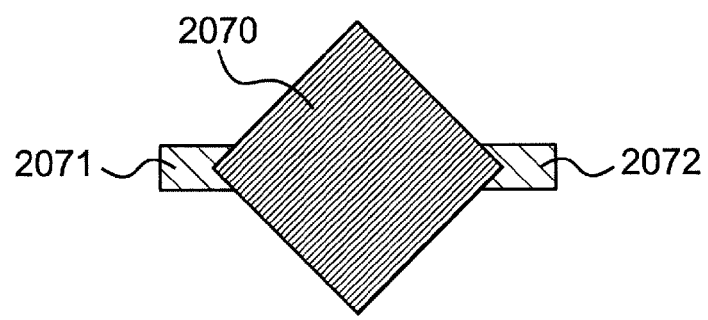
FIG. 61 is a schematic view for explaining a problem in a case where the light-emitting element is not a bar-like light-emitting element.
Figure 62:
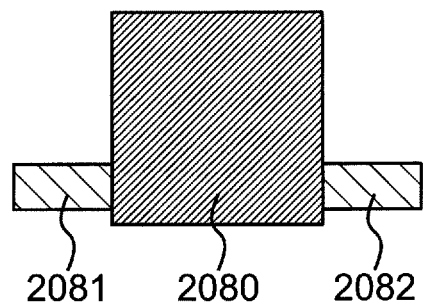
FIG. 62 is a schematic view for explaining a problem in a case where the light-emitting element is not a bar-like light-emitting element.

FIGS. 60, 61, 62 are schematic views for explaining a light-emitting device manufacturing method according to a fifteenth embodiment.

The fifteenth embodiment differs from the sixth embodiment in that a light-emitting element 2060 has a bar-like shape while the sixth embodiment has no laminations in the shape of light-emitting elements.

When the light-emitting element 2060 is bar-like shaped as shown in the bird's-eye view of FIG. 60, one end of the light-emitting element 2060 can be fixed on a first electrode 2051 while the other end of the light-emitting element 2060 can be fixed on a second electrode 2052. Therefore, an excellent alignment accuracy can be achieved. In the case of the bar-like light-emitting element 2060, because positive and negative charge is induced to both ends of the bar-like light-emitting element 2060, there arises moment for efficiently uniformizing the orientation of fine light-emitting substances by polarization. Thus, the array positions containing orientation can be determined with high accuracy, so that the light-emitting elements can be arrayed actually with high accuracy.

In a case where a square-shaped light-emitting element is a thin-type light-emitting element, the light-emitting element 2070, in some cases, may be arrayed obliquely between a first electrode 2071 and a second electrode 2072 as shown in the bird's-eye view of FIG. 61. In other cases, a light-emitting element 2080 may be arrayed so as to be misaligned between a first electrode 2081 and a second electrode 2082 as shown in the bird's-eye view of FIG. 62. Thus, with the light-emitting elements other than bar-like shaped, a worsened alignment accuracy may result.

Sixteenth Embodiment

Figure 63:
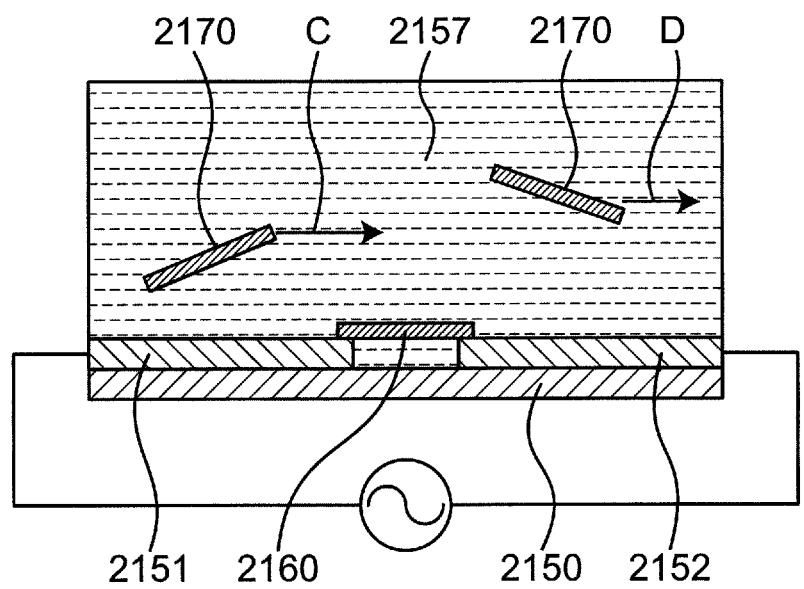
FIG. 63 is a schematic view for explaining a light-emitting device manufacturing method according to a sixteenth embodiment.

FIG. 63 is a schematic view for explaining a light-emitting device dmanufacturing method according to a sixteenth embodiment. In FIG. 63, arrows C, D denote discharge directions of a light-emitting element 2170.

The sixteenth embodiment differs from the sixth embodiment in including an element discharge step for discharging light-emitting elements 2170 that have not been arrayed at specified places out of a plurality of light-emitting elements 2160 in an element-containing liquid.

In the sixteenth embodiment, the element discharge step is executed after, in the element array step, the light-emitting elements 2160 are arrayed at places where a first electrode 2151 and a second electrode 2152 are opposed to each other in a first substrate 2150.

Then, in the element discharge step, a liquid containing no bar-like light-emitting elements is put into flow so that light-emitting elements that have not been arrayed at specified places are discharged from on the first substrate 2150.

According to the light-emitting device manufacturing method of the sixteenth embodiment, light-emitting elements 2170 that have not been arrayed at specified places can be collected and moreover arrayed on another first substrate, thus allowing the manufacturing cost of the light-emitting device to be cut down.

Also according to the light-emitting device manufacturing method of the sixteenth embodiment, light-emitting elements 2170 that have not been arrayed at specified places can be prevented from aggregating and causing interconnect failures after drying process or the like.

Seventeenth Embodiment

Figure 64:
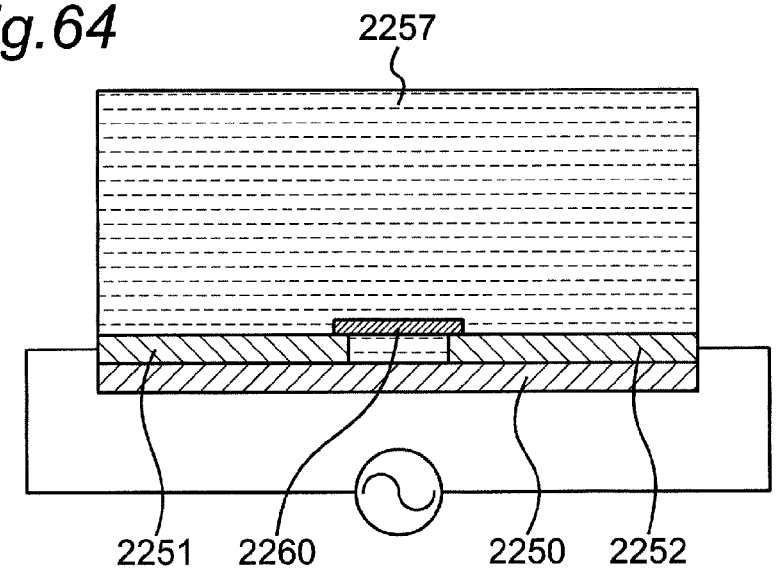
FIG. 64 is a schematic view for explaining a light-emitting device manufacturing method according to a seventeenth embodiment.

FIG. 64 is a schematic view for explaining a light-emitting device manufacturing method according to a seventeenth embodiment.

The seventeenth embodiment differs from the sixth embodiment in including an element fixing step subsequent to the element array step.

More specifically, in the seventeenth embodiment, light-emitting elements 2260 are arrayed at places where a first electrode 2251 and a second electrode 2252 are opposed to each other in a first substrate 2250 in the element array step.

Thereafter, in the element fixing step, a voltage higher than the voltage applied between the first electrode 2251 and the second electrode 2252 in the element array step is applied between the first electrode 2251 and the second electrode 2252 in the first substrate 2250. Thus, the light-emitting elements 2260 there have been arrayed at predetermined positions are fixed to those predetermined positions.

According to the light-emitting device manufacturing method of the seventeenth embodiment, since the light-emitting elements 2260 can be fixed to specified positions, an excellent alignment accuracy can be achieved.

Also according to the light-emitting device manufacturing method of the seventeenth embodiment, since the light-emitting elements 2260 are not moved even with the flow velocity of a liquid 2257 increased and since the light-emitting elements 2260 are never moved in removal of the liquid 2257, an outstandingly excellent alignment accuracy can be achieved.

Eighteenth Embodiment

Figure 65:
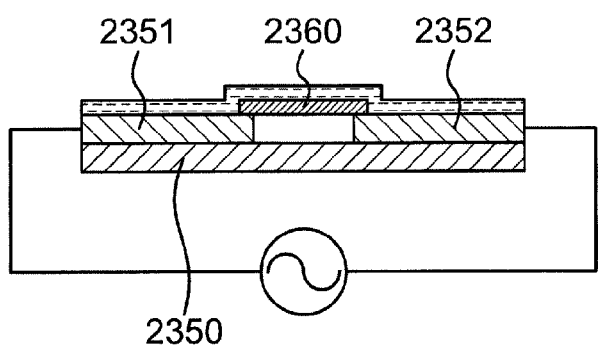
FIG. 65 is a schematic view for explaining a light-emitting device manufacturing method according to an eighteenth embodiment.
Figure 66:
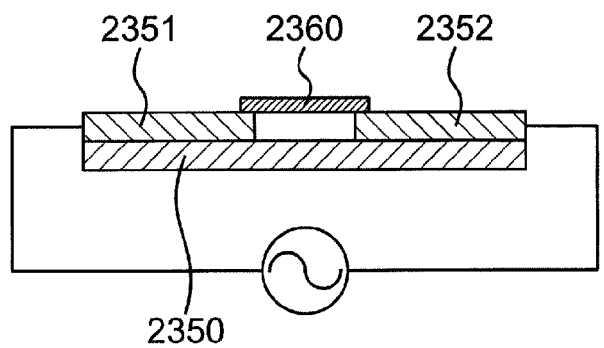
FIG. 66 is a schematic view for explaining a light-emitting device manufacturing method according to the eighteenth embodiment.

FIGS. 65 and 66 are schematic views for explaining a light-emitting device manufacturing method according to an eighteenth embodiment.

The eighteenth embodiment differs from the sixth embodiment in that after the element array step, a substrate drying step for drying the surface of the first substrate is included.

More specifically, in the eighteenth embodiment, in the element array step, light-emitting elements 2360 are arrayed at places where a first electrode 2351 and a second electrode 2352 are opposed to each other in a first substrate 2350.

Then, after removal of the liquid as shown in FIG. 65 in the substrate drying step, the wet surface is dried in the first substrate 2350 as shown in FIG. 66. The drying may be done at room temperature or at about 50 to 200° C.

According to the light-emitting device manufacturing method of the eighteenth embodiment, the light-emitting elements 2360 can be fixed between the electrodes by the substrate drying step.

Also according to the light-emitting device manufacturing method of the eighteenth embodiment, by the substrate drying step, a protective film can be formed on the surface of the first substrate 2350 so that the light-emitting elements 2360 can be protected.

Nineteenth Embodiment

Figure 67:
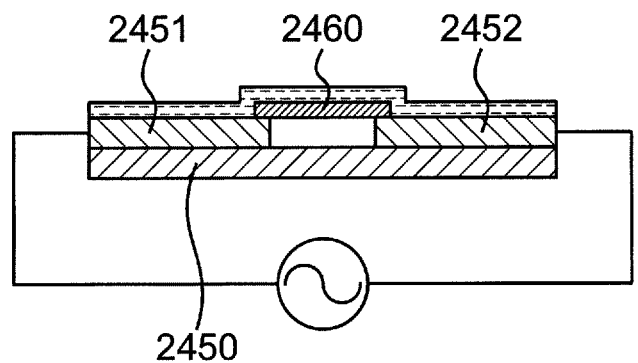
FIG. 67 is a schematic view for explaining a light-emitting device manufacturing method according to a nineteenth embodiment.
Figure 68:
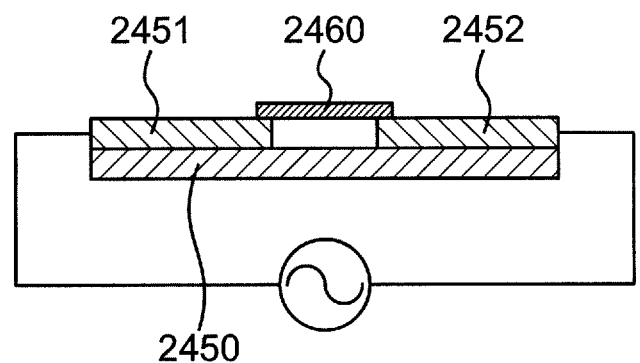
FIG. 68 is a schematic view for explaining a light-emitting device manufacturing method according to the nineteenth embodiment.

FIGS. 67 and 68 are schematic views for explaining a light-emitting device manufacturing method according to a nineteenth embodiment.

The nineteenth embodiment differs from the eighteenth embodiment in that surface tension of the element-containing liquid is not more than 50 mN/m while the eighteenth embodiment has no laminations in the surface tension of the element-containing liquid.

More specifically, in the nineteenth embodiment, light-emitting elements 2460 are arrayed at places where a first electrode 2451 and a second electrode 2452 of a first substrate 2450 are opposed to each other, in the element array step.

Then, after removal of the liquid as shown in FIG. 67 in the substrate drying step, the wet surface is dried in the first substrate 2450 as shown in FIG. 68. The drying may be done at room temperature or at about 50 to 200° C.

When the surface of the first substrate 2450 is dried in a state of being wetted by the liquid of large surface tension, it may occur that the liquid surface comes into contact with the light-emitting elements during the drying, causing the light-emitting elements 2460 to move with a result of occurrence of misalignment. Using a liquid of smaller surface tension (50 mN/m or less, more preferably 30 mN/m or less) makes it possible to prevent the misalignment.

Twentieth Embodiment

Figure 69:
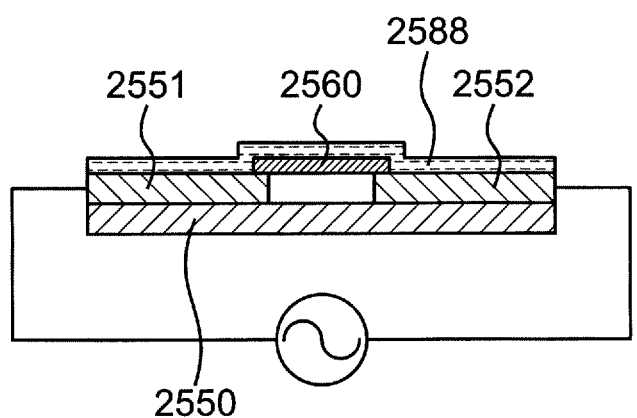
FIG. 69 is a schematic view for explaining a light-emitting device manufacturing method according to a twentieth embodiment.
Figure 70:
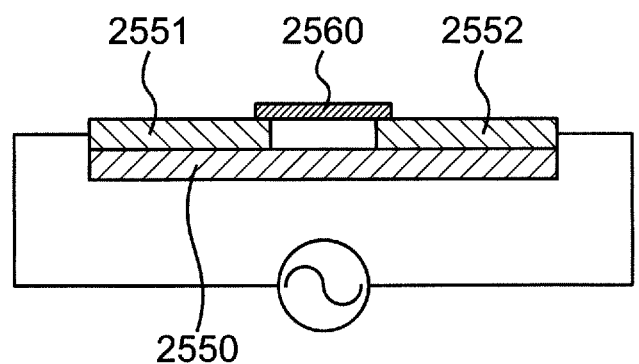
FIG. 70 is a schematic view for explaining a light-emitting device manufacturing method according to the twentieth embodiment.

FIGS. 69 and 70 are schematic views for explaining a light-emitting device manufacturing method according to a twentieth embodiment.

The twentieth embodiment differs from the eighteenth embodiment in that the twentieth embodiment includes, after the element feeding step and before the substrate drying step, a liquid replacement step for replacing a first liquid with a second liquid smaller in surface tension than the first liquid.

It is noted here that the first liquid refers to a liquid that has surrounded light-emitting elements 2560 during arraying process of the light-emitting elements 2560 in the element array step. Therefore, the term liquid used in the sixth to nineteenth embodiments refers to the first liquid in all cases.

In the twentieth embodiment, after the light-emitting elements 2560 are arrayed, in the element array step, at places where a first electrode 2551 and a second electrode 2552 of a first substrate 2550 are opposed to each other, the liquid replacement step is executed.

In this liquid replacement step, the second liquid is kept flowing so that the first liquid is replaced with a second liquid 2588 smaller in surface tension than the first liquid. Then, after removal of the second liquid 2588 as shown in FIG. 69, the surface of the first substrate 2550 is dried in the substrate drying step, as shown in FIG. 70, so that the second liquid 2588 is completely removed.

According to the light-emitting device manufacturing method of the twentieth embodiment, a liquid (arbitrary liquid) of larger surface tension may be used during the arraying of the light-emitting elements 2560, while a liquid of smaller surface tension may be used during the drying. Therefore, a large effect of electrostatic induction or dielectrophoresis can be generated during the arraying and moreover a liquid involving no aggregation of the light-emitting elements can be used. Thus, the arraying of the light-emitting elements 2560 can be efficiently achieved and moreover a liquid of smaller surface tension can be used for the drying, so that misalignment of the light-emitting elements 2560 can be prevented.

Twenty-First Embodiment

Figure 71:
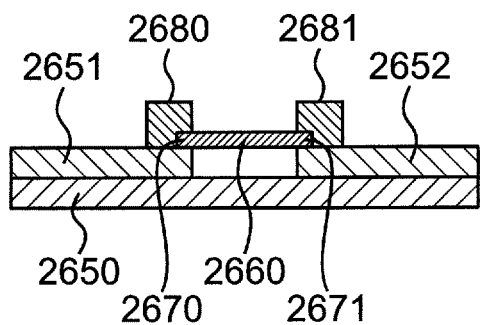
FIG. 71 is a schematic view for explaining a light-emitting device manufacturing method according to a twenty-first embodiment.
Figure 72:
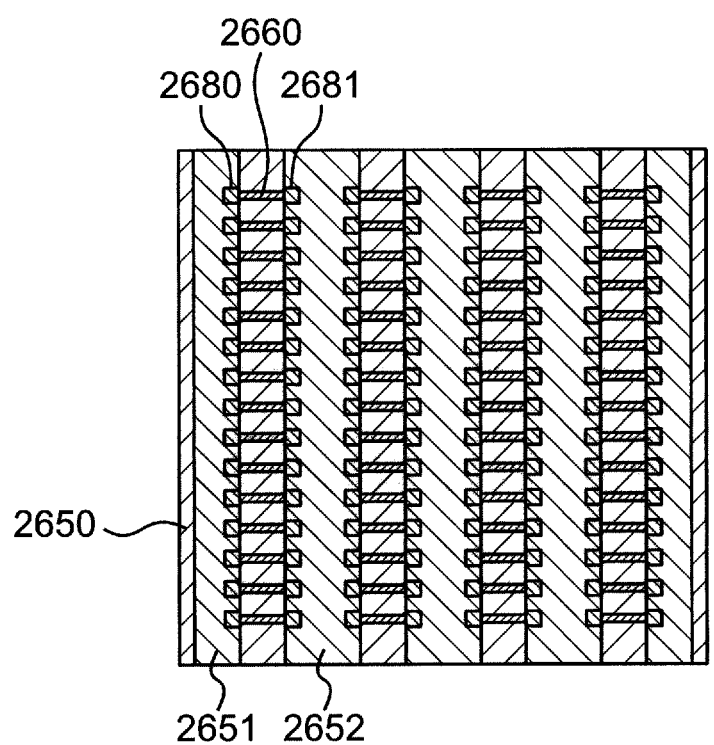
FIG. 72 is a schematic view for explaining the light-emitting device manufacturing method according to the twenty-first embodiment.

FIGS. 71 and 72 are schematic views for explaining a light-emitting device manufacturing method according to a twenty-first embodiment. In FIGS. 71 and 72, reference sign 2650 denotes a first substrate.

The twenty-first embodiment differs from the sixth embodiment in that the twenty-first embodiment includes an element connecting step.

In the twenty-first embodiment, a light-emitting element 2660 has a first region 2670 and a second region 2671 on its surface, and emits light when voltages are applied to the first region 2670 and the second region 2671.

Also as shown in the sectional view of FIG. 71 and the bird's-eye view of FIG. 72, in the element connecting step, the first region 2670 and a first electrode 2651 are connected to each other by an electrical conductor 2680, while the second region 2671 and a second electrode 2652 are connected to each other by an electrical conductor 2681.

According to the light-emitting device manufacturing method of the twenty-first embodiment, the light-emitting element 2660 and the first electrode 2651 are connected to each other by the electrical conductor 2680, while the light-emitting element 2660 and the second electrode 2652 are connected to each other by the electrical conductor 2681. Therefore, a successful electrical connection between the first, second electrodes 2651, 2652 and the minute light-emitting element 2660 can be achieved. Thus, for light emission of the light-emitting device with a voltage applied to between the first electrode 2651 and the second electrode 2652, occurrence of a state (open state) in which a voltage is no longer applied to the light-emitting element 2660 can securely be prevented.

Twenty-Second Embodiment

Figure 73:
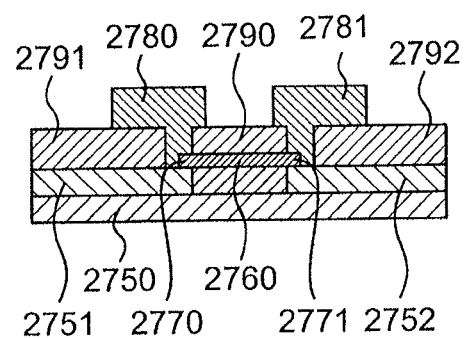
FIG. 73 is a schematic view for explaining a light-emitting device manufacturing method according to a twenty-second embodiment.
Figure 74:
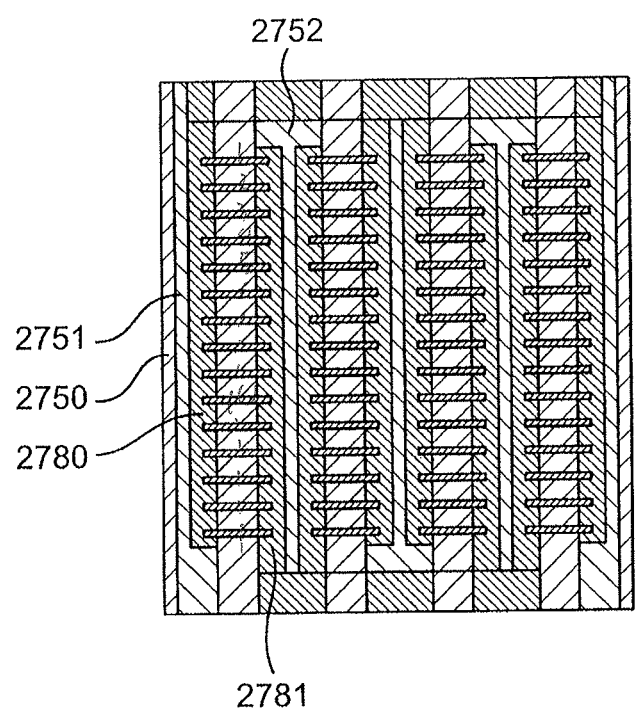
FIG. 74 is a schematic view for explaining the light-emitting device manufacturing method according to the twenty-second embodiment.

FIGS. 73 and 74 are schematic views for explaining a light-emitting device manufacturing method according to a twenty-second embodiment.

In FIGS. 73 and 74, the reason why the third electrode is not present is that there is a case, as a modification, where a second substrate placed generally parallel to a first substrate 2750 and a third electrode positioned on the second substrate are present. Also in FIG. 73, reference signs 2790, 2791 and 2792 denote interlayer films. Those interlayer films are omitted in the bird's-eye view of FIG. 74 for an easier understanding.

The twenty-second embodiment differs from the sixth embodiment in including an additional electrode formation step.

In the twenty-second embodiment, a light-emitting element 2760 has a first region 2770 and a second region 2771 on its surface, and emits light when voltages are applied to the first region 2770 and the second region 2771.

As shown in the bird's-eye view of FIG. 74, in this embodiment, the light-emitting elements 2760 are arrayed in a matrix shape.

In the additional electrode formation step, as shown in the sectional view of FIG. 73 and the bird's-eye view of FIG. 74, a fourth electrode 2780 electrically connected to every first region 2770 of every light-emitting element 2760 is formed, and moreover a fifth electrode 2781 electrically connected to every second region 2771 of every bar-like light-emitting element 2760 is formed.

According to the light-emitting device manufacturing method of the twenty-second embodiment, applying voltages to the fourth electrode 2780 and the fifth electrode 2781 causes a voltage to be applied to the light-emitting element 2760, making it possible to apply a voltage to the light-emitting element 2760 without using a first electrode 2751 and a second electrode 2752. Therefore, an interconnecting/wiring structure (fourth electrode 2780 and fifth electrode 2781) other than the electrode structure (first electrode 2751 and second electrode 2752) involved in arraying of the light-emitting elements 2760 can be used for voltage application to the light-emitting elements 2760. Thus, the degree of freedom for voltage application can be increased, making it easier to fulfill the voltage application.

Twenty-Third Embodiment

Figure 75:
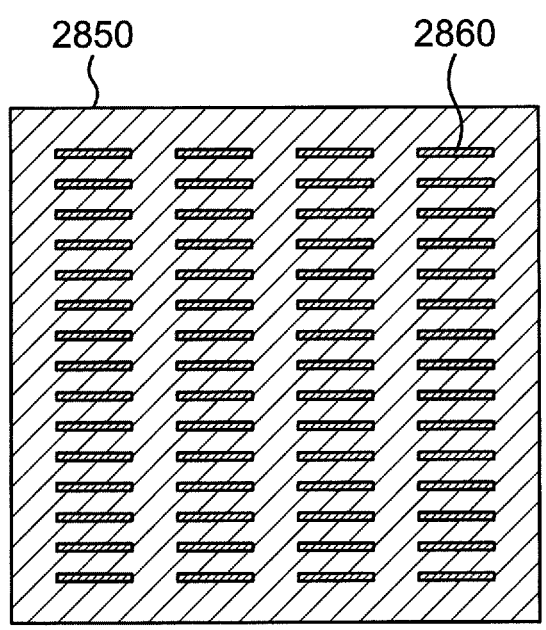
FIG. 75 is a schematic view for explaining a light-emitting device manufacturing method according to a twenty-third embodiment.
Figure 76:
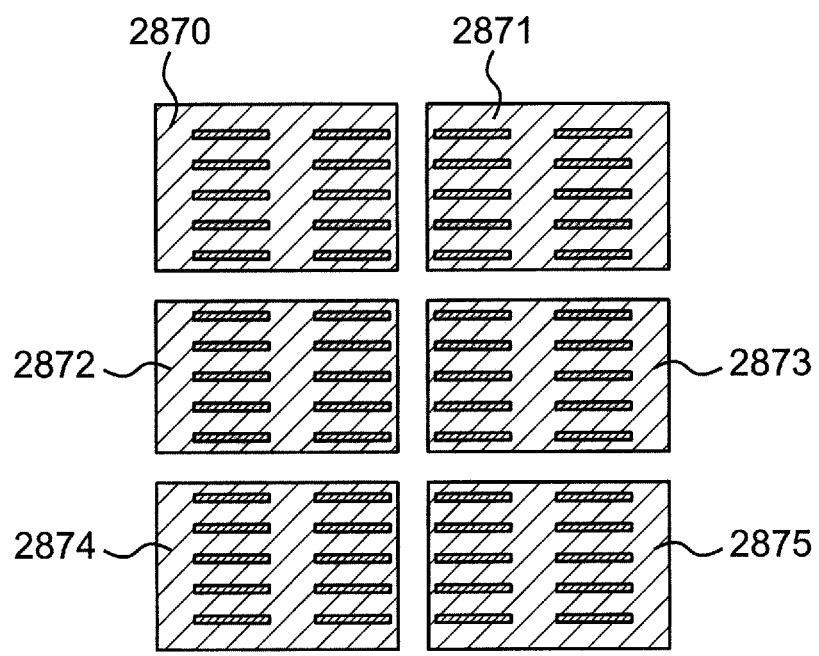
FIG. 76 is a schematic view for explaining the light-emitting device manufacturing method according to the twenty-third embodiment.

FIGS. 75 and 76 are schematic views for explaining a light-emitting device manufacturing method according to a twenty-third embodiment.

The twenty-third embodiment differs from the sixth embodiment in that after the element array step, a substrate dividing step is included.

In the twenty-third embodiment, as shown in FIG. 75, in the element array step, a multiplicity of light-emitting elements (e.g., bar-like light-emitting elements or bar-like minute light-emitting elements) 2860 are arrayed into a matrix shape on a large first substrate 2850. Then, in the substrate dividing step, as shown in FIG. 76, the first substrate 2850 is divided so as to form a plurality of first substrates 2870-2875 in which a plurality of light-emitting elements 2860 are arrayed in a matrix shape. In addition, the number of substrate division is not limited to 6 and may be any arbitrary one only if it is a natural number of 2 or more.

According to the light-emitting device manufacturing method of the twenty-third embodiment, by one-time arraying of the light-emitting elements 2860, a plurality of first substrates 2870-2875 in each of which a plurality of light-emitting elements 2860 are arrayed at specified places can be formed. Thus, the manufacturing cost can be cut down.

Twenty-Fourth Embodiment

Figure 77:
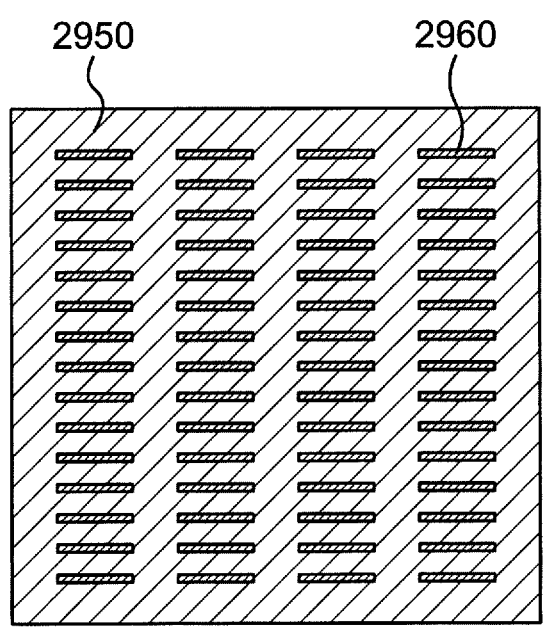
FIG. 77 is a schematic view for explaining a light-emitting device manufacturing method according to a twenty-fourth embodiment.

FIG. 77 is a schematic view for explaining a light-emitting device manufacturing method according to a twenty-fourth embodiment.

The twenty-fourth embodiment differs from the sixth embodiment in that in the element array step, 1000 or more light-emitting elements (e.g., bar-like light-emitting elements or bar-like minute light-emitting elements) 2960 are arrayed on a substrate 2950, while the sixth embodiment has no laminations in the number of light-emitting elements to be arrayed on the substrate in the element array step.

A quantity of light emitted by one light-emitting element 2960 is smaller than a quantity of light of the whole light-emitting device. According to the light-emitting device manufacturing method of the twenty-fourth embodiment, since the number of light-emitting elements 2960 to be arrayed is 1000 or more, the light-emitting device, even with any broken light-emitting elements 2960 included, is decided as a non-defective article. Therefore, since the light-emitting device is treated as a non-defective article even with defective light-emitting elements included, the need for inspection of the light-emitting elements 2960 is eliminated, allowing the manufacturing cost to be cut down.

For example, with conventional light-emitting elements having a percent defective of 1%, when those light-emitting elements are packaged and 10 packages are used to form a light-emitting device, it follows that defective light-emitting elements are included at a rate of about 1 defective light-emitting element out of every 10 light-emitting devices, resulting in a 90% light quantity in comparison to that of non-defective articles. Assuming that the light quantity of 90% is defective, the yield of the light-emitting device is 90% and so there arises a need for inspection of the light-emitting elements.

Meanwhile, with use of 1000 light-emitting elements having a percent defective of 1%, although about 10 defective light-emitting elements are included, yet the light quantity becomes 99% of that of the case where all the light-emitting elements are non-defective articles, so that the light-emitting device is decided as a non-defective article, eliminating the need for the inspection of the light-emitting elements. Thus, the cost for inspection of the light-emitting elements is unnecessary, allowing the manufacturing cost to be cut down.

In each of the foregoing embodiments, the same functional effects as in the other embodiments are omitted in description, and functional effects unique to the individual embodiments only are described.

Naturally, embodiments having two or more aspects of the constitutions of the invention according to the above-described sixth to twenty-fourth embodiments constitute yet further embodiments of the invention.

Also, bar-like structure light-emitting elements may be used as the light-emitting elements as described above. The bar-like light-emitting elements can be formed by, for example, growing a plurality of bar-like light-emitting elements with use of a growth mask or metal seed having a growth hole on an n-type GaN substrate, and thereafter making those light-emitting elements cut off.

Figure 78A:
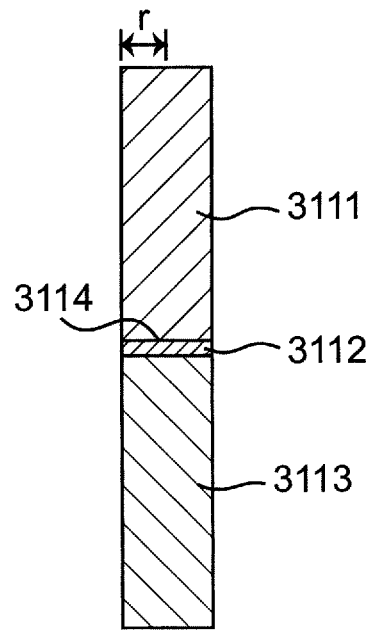
FIG. 78A is a schematic view showing a bar-like light-emitting element having a vertical stack structure.
Figure 78B:
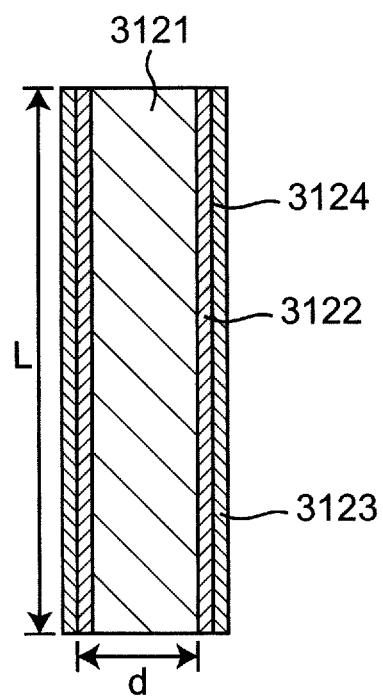
FIG. 78B is a schematic view showing a bar-like light-emitting element having a core-shell-shell structure.

FIGS. 78A and 78B are views showing bar-like light-emitting elements usable in the light-emitting device manufacturing method of the invention, and schematic sectional views including a center axis of each bar-like light-emitting element.

FIG. 78A shows a bar-like light-emitting element having a vertical stack structure. This bar-like light-emitting element is so structured that a bar-like p-type semiconductor layer 3111, a quantum well layer 3112, and a bar-like n-type semiconductor layer 3113 are vertically stacked one on another. A light-emission area 3114 of this bar-like light-emitting element, given a radius r (see FIG. 78A) of an end face of the bar-like light-emitting element, can be expressed as $\pi r^2$. The reason why the result is not $2 \times \pi r^2$ is that a thickness of the quantum well layer 3112 in an extending direction of the bar-like light-emitting elements is so thin that the quantum well layer 3112 can accurately be grasped as a two-dimensional plane more approximately than as a three-dimensional one.

Meanwhile, FIG. 78B shows a bar-like light-emitting element having a core-shell-shell structure. This bar-like light-emitting element has a first-conductive-type, n-type first semiconductor layer 3121 having a columnar shape (bar-like shape), a tubular-shaped quantum well layer 3122 placed so as to cover an outer peripheral surface of the first semiconductor layer 3121, and a tubular-shaped second-conductive-type, p-type second semiconductor layer 3123 placed so as to cover an outer peripheral surface of the quantum well layer 3122.

In other words, this bar-like light-emitting element has a core-shell-shell structure in which n-type semiconductor-quantum well-p-type semiconductor are formed coaxially. A light-emission area 3124 of this bar-like light-emitting element can be expressed as $\pi dL$, where d is the diameter of the outer peripheral surface of the quantum well layer 3122 and L is the length of the bar-like light-emitting element.

Therefore, in the case where the bar-like light-emitting element having the core-shell-shell structure shown in FIG. 78B is used as a light-emitting element, since a light-emitting layer can be formed generally all over the side face of each bar-like light-emitting element, the light-emission area per bar-like light-emitting element can be increased.

In this example, the first conductive type is n type while the second conductive type is p type, and the bar-like light-emitting element has a core-shell-shell structure in which n-type semiconductor-quantum well-p-type semiconductor are formed coaxially. However, it is of course allowable for this invention that the first conductive type is p type while the second conductive type is n type, and the bar-like light-emitting element may have a core-shell-shell structure in which p-type semiconductor-quantum well-n-type semiconductor are formed coaxially.

Figure 79A:
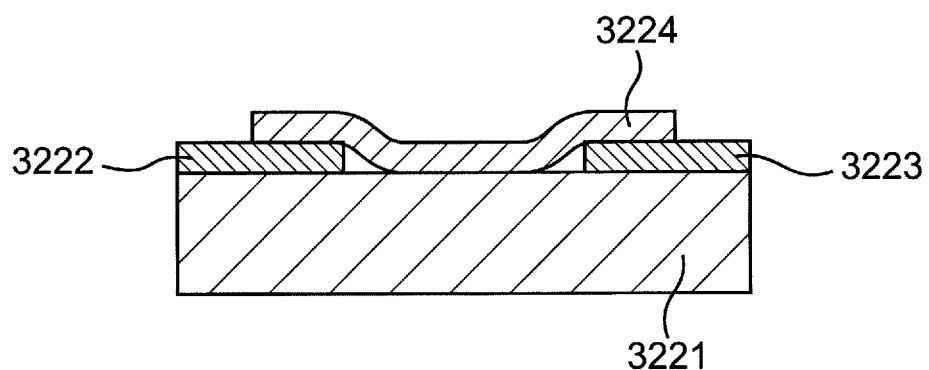
FIG. 79A is a schematic view showing an example of a light-emitting device in which the bar-like light-emitting element has a diameter of less than 500 nm.
Figure 79B:
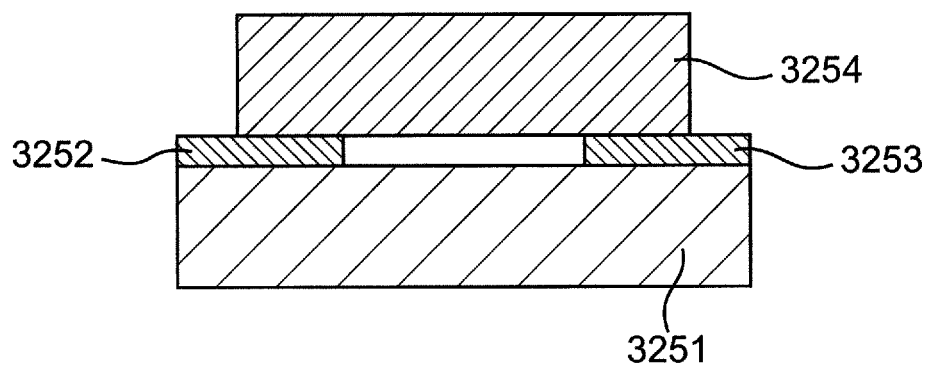
FIG. 79B is a schematic view showing a light-emitting device in which the bar-like light-emitting element has a diameter of larger than 500 nm.

FIGS. 79A and 79B are schematic views representing a relationship between a diameter of the bar-like light-emitting element and a curve of the bar-like light-emitting element.

More specifically, FIG. 79A is a schematic view showing an example of a light-emitting device in which the diameter of the bar-like light-emitting element is less than 500 nm.

This light-emitting device has a substrate 3221, a first electrode 3222 and a second electrode 3223 formed on the substrate 3221, and a bar-like light-emitting element 3224. One end portion of the bar-like light-emitting element 3224 is connected on the first electrode 3222 while the other end portion of the bar-like light-emitting element 3224 is connected on the second electrode 3223. In the case where the diameter of the bar-like light-emitting element 3224 is less than 500 nm, the bar-like light-emitting element 3224 becomes quite curving-prone, with occurrence of stress accompanying the curve of the bar-like light-emitting element 3224 as shown in FIG. 79A. Then, due to this stress, luminous efficacy of the bar-like light-emitting element 3224 declines.

Meanwhile, FIG. 79B is a schematic view showing a light-emitting device in which the diameter of the bar-like light-emitting element is larger than 500 nm.

This light-emitting device has a substrate 3251, a first electrode 3252 and a second electrode 3253 formed on the substrate 3251, and a bar-like light-emitting element 3254. One end portion of the bar-like light-emitting element 3254 is connected on the first electrode 3252 while the other end portion of the bar-like light-emitting element 3254 is connected on the second electrode 3253. In the case where the diameter of the bar-like light-emitting element 3254 is not less than 500 nm, the bar-like light-emitting element 3254 is never curved as shown in FIG. 79B. Thus, there occur no declines of light emission quantity accompanying curves of the bar-like light-emitting element 3254 so that a light emission quantity as it is expected can be extracted from each bar-like light-emitting element 3254.

Figure 80:
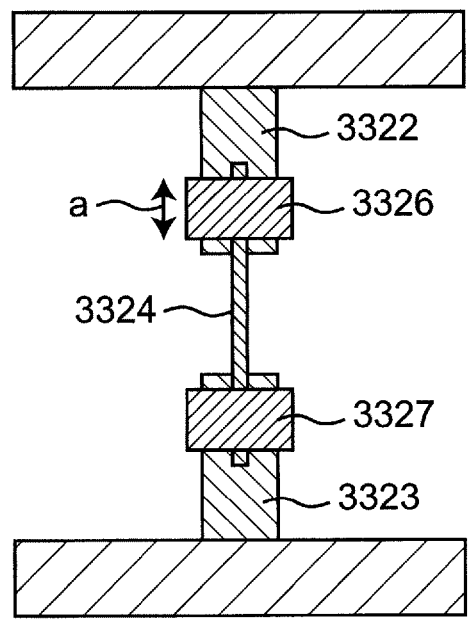
FIG. 80 is a view showing a structure of a light-emitting device which can be manufactured by the invention.

FIG. 80 is a schematic view showing a structure of a light-emitting device which can be manufactured by the invention.

This light-emitting device has a first electrode 3322, a second electrode 3323, and a bar-like light-emitting element 3324. The bar-like light-emitting element 3324 has a core-shell-shell structure in which n-type semiconductor-quantum well-p-type semiconductor, or p-type semiconductor-quantum well-n-type semiconductor, are formed coaxially, and the diameter of the bar-like light-emitting element is not less than 500 nm.

One end portion of the bar-like light-emitting element 3324 is connected on the first electrode 3322 by a contact 3326 having a size 'a' in an extending direction of the bar-like light-emitting element 3324 (a=1.5 μm in this embodiment). The other end portion of the bar-like light-emitting element 3324 is connected on the second electrode 3323 by a contact 3327 having a size of 1.5 μm in the extending direction of the bar-like light-emitting element 3324. It is noted that the size of each contact region in the extending direction of the bar-like light-emitting element is not limited to 1.5 μm and may of course be longer or shorter than this.

As to the light-emission area of one bar-like light-emitting element 3324 having the core-shell-shell structure, given a length L (μm) and a diameter D (μm) of the bar-like light-emitting element and with 1.5 (μm) contacts provided at both ends of the bar-like light-emitting element as shown in FIG. 80, where the contact portions do not emit light, on an assumption that the outer peripheral surface of the quantum well layer can be approximately identified with the outer peripheral surface of the bar-like light-emitting element, the following equation can be derived from an approximation that d≈D:

$$\text{light-emission area}=(L-3)\times\pi D\ (\mu m^2).$$

Figure 81:
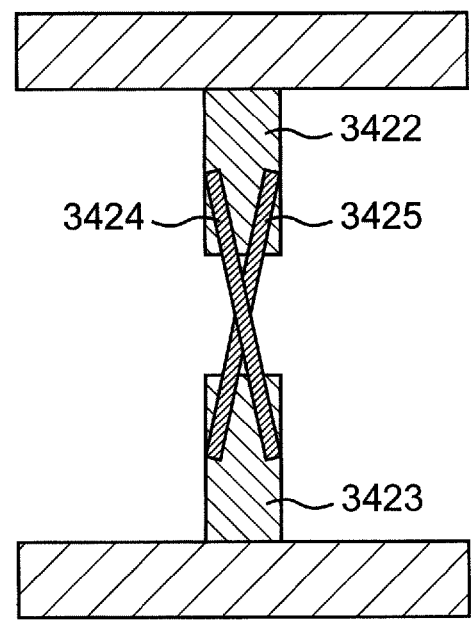
FIG. 81 is a view for explaining a mechanism in which crossing of bar-like light-emitting elements occurs.

Also, it is desirable that one bar-like light-emitting element is arrayed for every interposition between electrodes. With two or more bar-like light-emitting elements 3424, 3425 arrayed between a pair of electrodes 3422, 3423 as shown in FIG. 81, there frequently occur crossings of the bar-like light-emitting elements 3424, 3425, making a cause of failure as shown in FIG. 81.

Figure 82A:
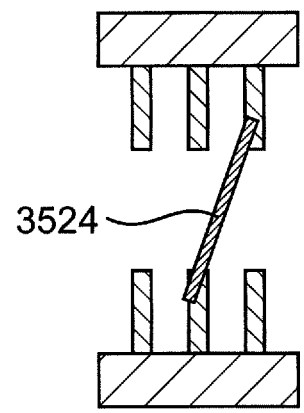
FIG. 82A is a schematic view showing a defective structure due to a bar-like light-emitting element.
Figure 82B:
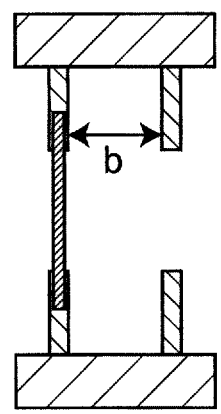
FIG. 82B is a schematic view depicting a structure that can prevent the defective structure shown in FIG. 82A.

FIG. 82A is a schematic view showing a defective structure due to a bar-like light-emitting element. FIG. 82B is a schematic view depicting a structure that can prevent the defective structure.

More specifically, FIG. 82A is a schematic view showing a defective structure in which a bar-like light-emitting element 3524 is not arrayed between mutually opposing electrodes, and in which one end portion of the bar-like light-emitting element 3524 is connected to one electrode while the other end portion of the bar-like light-emitting element 3524 is connected to an electrode which is adjacent to another electrode opposed to the one electrode so as to be next to the another electrode in a direction vertical to the opposing direction of the two opposing electrodes. With occurrence of this defective structure, it is no longer possible to array a specified number of bar-like light-emitting elements so that a specified light quantity can no longer be obtained.

This defective structure can be avoided by a setting that a distance 'b' between electrodes neighboring in a direction vertical to the opposing direction is not less than 0.5×length of the bar-like light-emitting element as shown in FIG. 82B. In this case, due to a restraint of length, junction between electrodes that cross each other in the opposing direction becomes hard to fulfill.

Figure 83A:
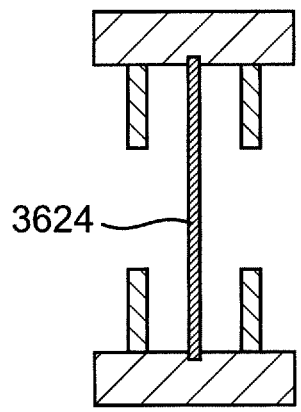
FIG. 83A is a schematic view showing a defective structure due to a bar-like light-emitting element.
Figure 83B:
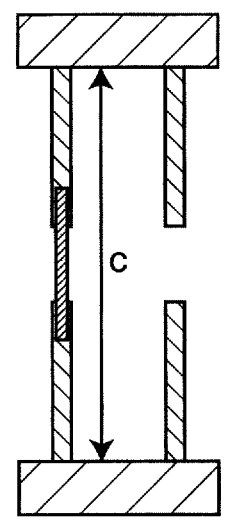
FIG. 83B is a schematic view depicting a structure that can prevent the defective structure shown in FIG. 83A.

FIG. 83A is a schematic view showing another defective structure due to a bar-like light-emitting element. FIG. 83B is a schematic view depicting a structure that can prevent the defective structure.

More specifically, FIG. 83A is a schematic view showing a defective structure in which one end portion of a bar-like light-emitting element 3624 is connected to a recess portion formed between electrodes mutually neighboring in a direction vertical to the opposing direction of an electrode pair intended for array, while one end portion of the bar-like light-emitting element 3624 is connected to a recess portion opposed to the recess portion in the opposing direction. Also, although not shown, another defective structure of this type other than the above one is that one end portion of a bar-like light-emitting element is connected to a recess portion while the other end portion of the bar-like light-emitting element is connected to a specified position of an electrode. These defective structures inhibit light emission at originally designed light-emission positions, causing brightness variations of light emission.

This defective structure can be avoided by a setting that a distance c' between bottoms of recess portions formed between electrodes neighboring in a direction vertical to the opposing direction of an electrode pair intended for array is not less than 1.5×length of the bar-like light-emitting element as shown in FIG. 83B. In this case, due to a restraint of length, connection of the bar-like light-emitting element to the recess portion becomes hard to fulfill.

Figure 84A:
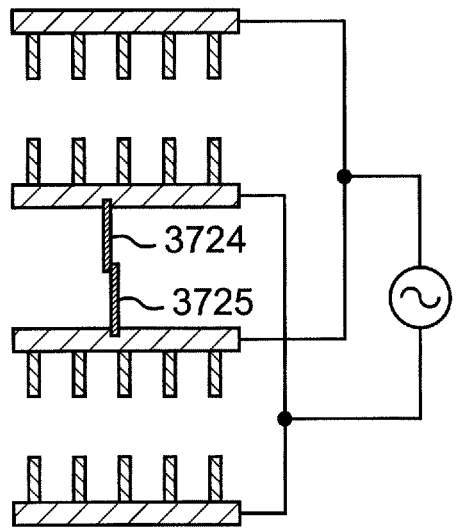
FIG. 84A is a schematic view showing a defective structure due to a bar-like light-emitting element.
Figure 84B:
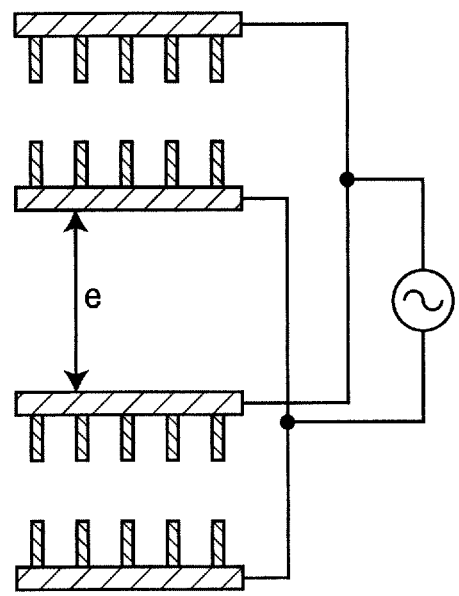
FIG. 84B is a schematic view depicting a structure that can prevent the defective structure shown in FIG. 84A.

FIG. 84A is a schematic view showing another defective structure due to a bar-like light-emitting element. FIG. 84B is a schematic view depicting a structure that can prevent the defective structure.

More specifically, FIG. 84A is a schematic view showing a defective structure in which bar-like light-emitting elements 3724, 3725 are arrayed between different rows of electrode pairs. With occurrence of this defective structure, it becomes impracticable to achieve a specified light emission quantity and a specified uniformity of light emission density.

This defective structure can be avoided by a setting that a distance 'e' between different rows of neighboring electrode pairs is set to not less than 2.5×length of each bar-like light-emitting element as shown in FIG. 84B. It seldom occurs that three or more bar-like light-emitting elements are arrayed in series.

On these bases, given a length L (μm) of each bar-like light-emitting element, a substrate area S occupied by one bar-like light-emitting element is expressed as:

$$S \approx 0.5 \times L(1.5 \times L + 2.5 \times L) = 0.5L \times 4L \; (\mu m^2)$$

Therefore, from this basis, the light-emission area per substrate area is:

$$(L-3) \times \pi D / (0.5L \times 4L) \; (\mu m^2)$$

In this case, use of substrate areas of $2.0 \times 10^5$ ($\mu m^2$) or more per lumen (light-emission unit) causes cost increases. Therefore, it is desirable that light emission of 1 lumen is fulfilled by a substrate area of $2.0 \times 10^5$ ($\mu m^2$) or less. Besides, since the bar-like light-emitting element normally has a luminance of $70 \times 10^{-6}$ (lm) per light-emission area ($\mu m^2$), it follows that $$70 \times 10^{-6} \times (L-3) \times \Pi \times D / (0.5L \times 4L) \geq 1/(2.0 \times 10^5) \quad \text{(Eq. 1)}$$
$$= 5.0 \times 10^{-6}$$

Figure 85:
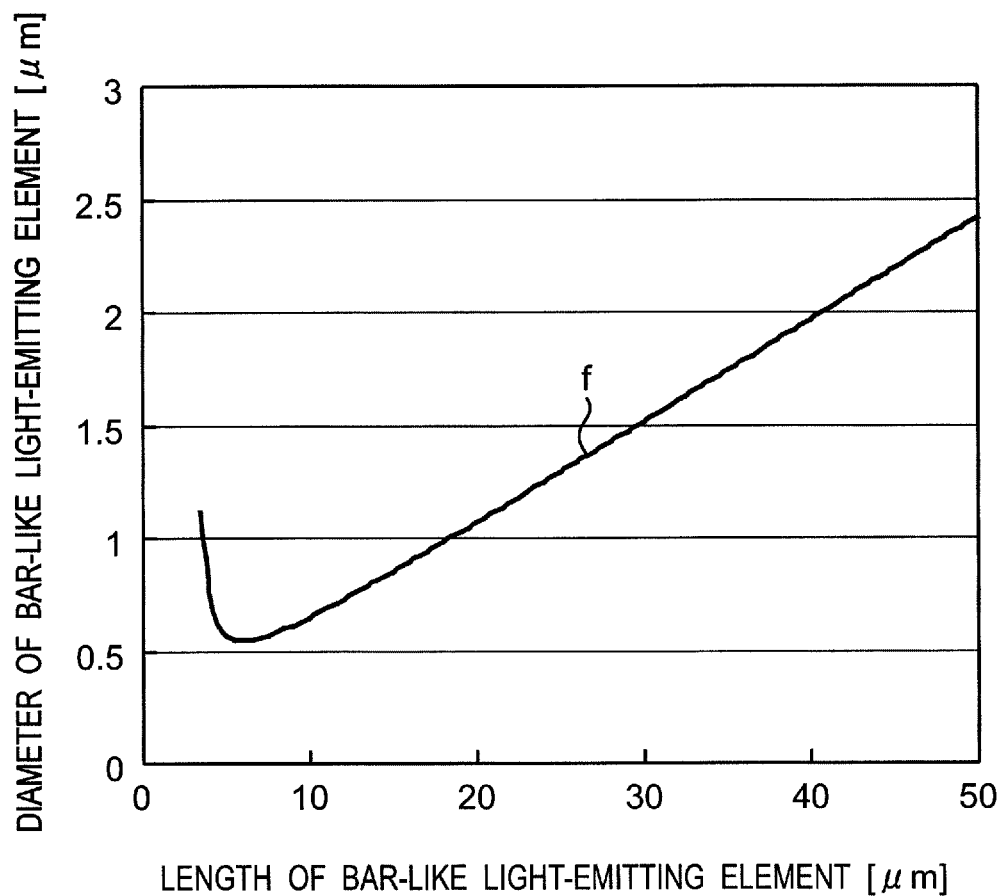
FIG. 85 is a chart showing a relationship between effective diameter and length of a bar-like light-emitting element.

FIG. 85 is a chart showing a relationship between effective diameter and length of a bar-like light-emitting element, representing a locus of $70 \times 10^6 \times (L-3) \times \pi \times D / (0.5L \times 4L) = 5.0 \times 10^{-6}$ on a DL two-dimensional plane.

To set the cost on the production base, it is necessary that the foregoing equation (1) is satisfied as described above, so that the diameter of the bar-like light-emitting element needs to be larger than a curve f in FIG. 85. Therefore, since the line f has a minimum of the diameter D larger than 0.5 (μm) (500 (nm)) as shown in FIG. 85, the diameter of each bar-like light-emitting element needs to be not less than 500 nm. Setting the diameter D to 1 (μm) or more makes it possible to increase the light emission per substrate area, allowing a further cost merit to be obtained.

A detailed description of bar-like light-emitting elements that are usable for light-emitting device manufacturing methods of the invention have been given hereinabove. However, in this invention, it is needless to say that light-emitting elements other than bar-like light-emitting elements may also be used as the light-emitting elements. Concretely, it is allowable in this invention to use light-emitting elements which have a flat light-emitting surface of circular, elliptical, square, rectangular, polygonal or other shape and which are placed on a mounting surface so that the light-emitting surface becomes parallel to the substrate.

Twenty-Fifth Embodiment

Figure 86:
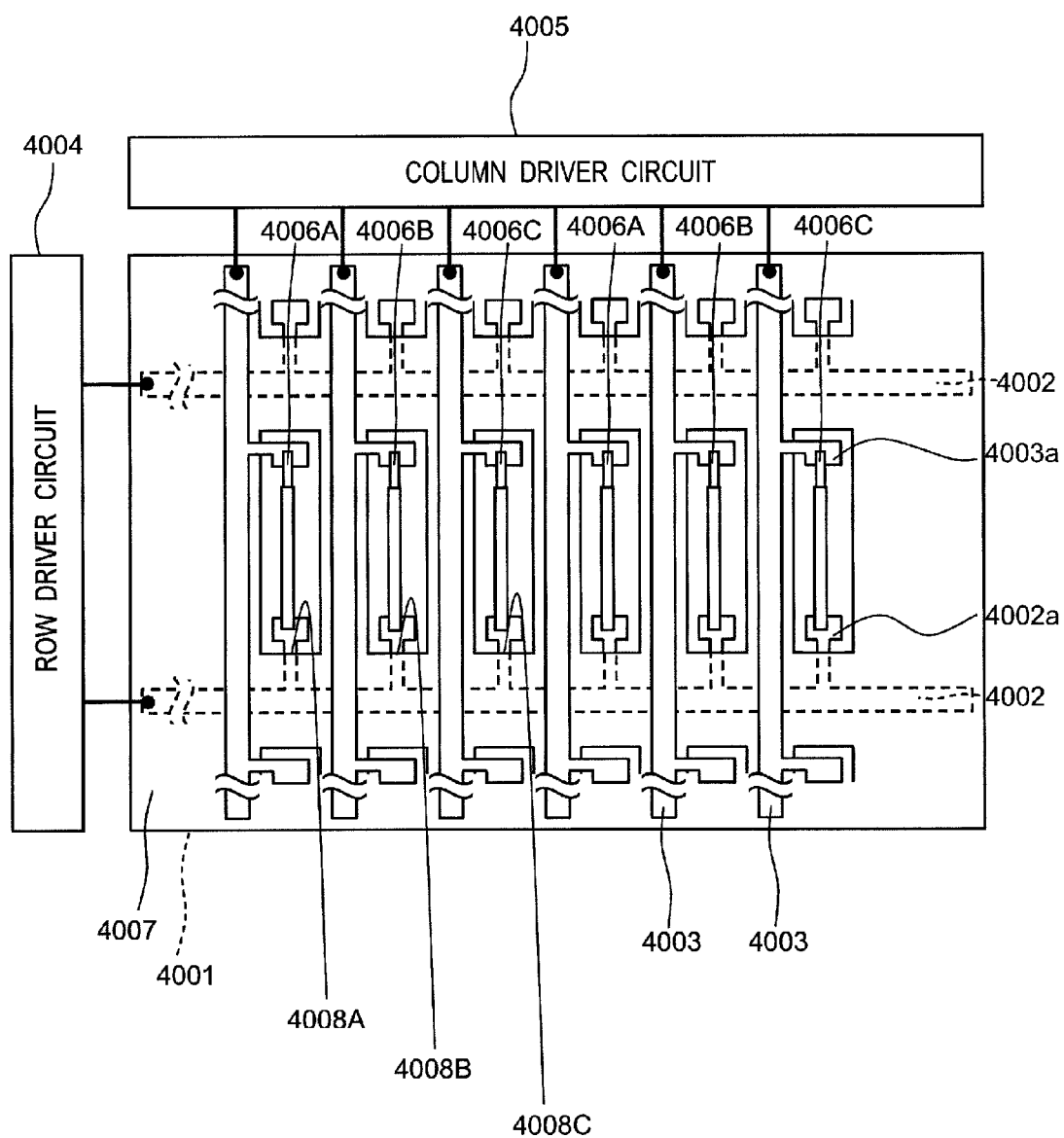
FIG. 86 is an outlined block diagram of a display device according to a twenty-fifth embodiment of the invention.

FIG. 86 is an outlined block diagram of a display device according to a twenty-fifth embodiment of the invention.

The display device includes an insulative flexible board 4001, a plurality of row lines 4002, 4002, formed on the insulative flexible board 4001 and extending along a lateral direction of the insulative flexible board 4001, a plurality of column lines 4003, 4003, formed on the insulative flexible board 4001 and extending along a longitudinal direction of the insulative flexible board 4001, a row driver circuit 4004 connected to the plurality of row lines 4002, 400, . . . , a column driver circuit 4005 connected to the plurality of column lines 4003, 4003, . . . , and bar-like red LED elements 4006A, bar-like green LED elements 4006B and bar-like blue LED elements 4006C placed in a matrix array on the insulative flexible board 4001. Although the bar-like red LED elements 4006A, the bar-like green LED elements 4006B and the bar-like blue LED elements 4006C are depicted each only two in number in FIG. 86, yet there are provided three or more each actually. It is noted that the insulative flexible board 4001 is an example of the substrate. Also, the row lines 4002 are an example of the first interconnect lines, and the column lines 4003 are an example of the second interconnect lines. Then, the bar-like red LED elements 4006A are an example of the red light-emitting elements, the bar-like green LED elements 4006B are an example of the green light-emitting elements, and the bar-like blue LED elements 4006C are an example of the blue light-emitting elements.

As the insulative flexible board 4001, for example, a flexible ceramic board or a flexible glass board or the like may be used. Also, instead of the insulative flexible board 4001, a rigid board made of an insulator such as glass, ceramic, aluminum oxide or resin may be used. Otherwise, a substrate board in which a silicon oxide film is formed on a silicon or other semiconductor surface and which has an insulative surface may also be used. With use of a glass board, it is desirable that a base insulating film such as silicon oxide film or silicon nitride film is formed on the surface.

The individual row lines 4002 are mostly covered with an insulating film 4007, and the individual column lines 4003 are mostly formed on the insulating film 4007. The insulating film 4007 has bar-like red LED element-use openings 4008A, bar-like green LED element-use openings 4008B, and bar-like blue LED element-use openings 4008C. Bar-like red LED elements 4006A are placed in the bar-like red LED element-use openings 4008A, bar-like green LED elements 4006B are placed in the bar-like green LED element-use openings 4008B, and bar-like blue LED elements 4006C are placed in the bar-like blue LED element-use openings 4008C, respectively. That is, the bar-like red LED element-use openings 4008A are formed in red pixel parts, the bar-like green LED element-use openings 4008B are formed in green pixel parts, and the bar-like blue LED element-use openings 4008C are formed in blue pixel parts, respectively. It is noted that the bar-like red LED element-use openings 4008A are an example of the red light-emitting element-use openings, the bar-like green LED element-use openings 4008B are an example of the green light-emitting element-use openings, and the bar-like blue LED element-use openings 4008C are an example of the blue light-emitting element-use openings.

The individual row lines 4002 are mostly covered with the insulating film 4007, and terminal portions 4002a of the individual row lines 4002 are put in the bar-like red LED element-use openings 4008A, the bar-like green LED element-use openings 4008B, and the bar-like blue LED element-use openings 4008C.

The individual column lines 4003 are mostly formed on the insulating film 4007, and terminal portions 4003a of the column lines 4003 are put in the bar-like red LED element-use openings 4008A, the bar-like green LED element-use openings 4008B, and the bar-like blue LED element-use openings 4008C.

The row driver circuit 4004 and the column driver circuit 4005 give a flow of electric current corresponding to data desired for display between the row lines 4002 and the column lines 4003 so that pixel parts corresponding to those row lines 4002 and column lines 4003 are driven.

With respect to the bar-like red LED elements 4006A, the bar-like green LED elements 4006B and the bar-like blue LED elements 4006C, their one end portions are electrically connected directly to terminal portions 4002a of one of the plurality of row lines 4002, 4002, while the other end portions are electrically connected directly to terminal portions 4003a of one of the plurality of column lines 4003, 4003, . . . . As a result of this, the row driver circuit 4004 and the column driver circuit 4005 are enabled to give a flow of electric current via the plurality of row lines 4002, 4002, . . . and column lines 4003, 4003, . . . to the bar-like red LED elements 4006A, the bar-like green LED elements 4006E and the bar-like blue LED elements 4006C. Then, with a flow of electric current given to the bar-like red LED elements 4006A, the bar-like green LED elements 4006B and the bar-like blue LED elements 4006C, it follows that the bar-like red LED elements 4006A emit red light, the bar-like green LED elements 4006B emit green light, and the bar-like blue LED elements 4006C emit blue light. In addition, although not shown in FIG. 86, an electrically conductive adhesive 4010 (FIGS. 91I, 91J, 91K) is applied on the terminal portions 4002a, 4003a.

Figure 87:
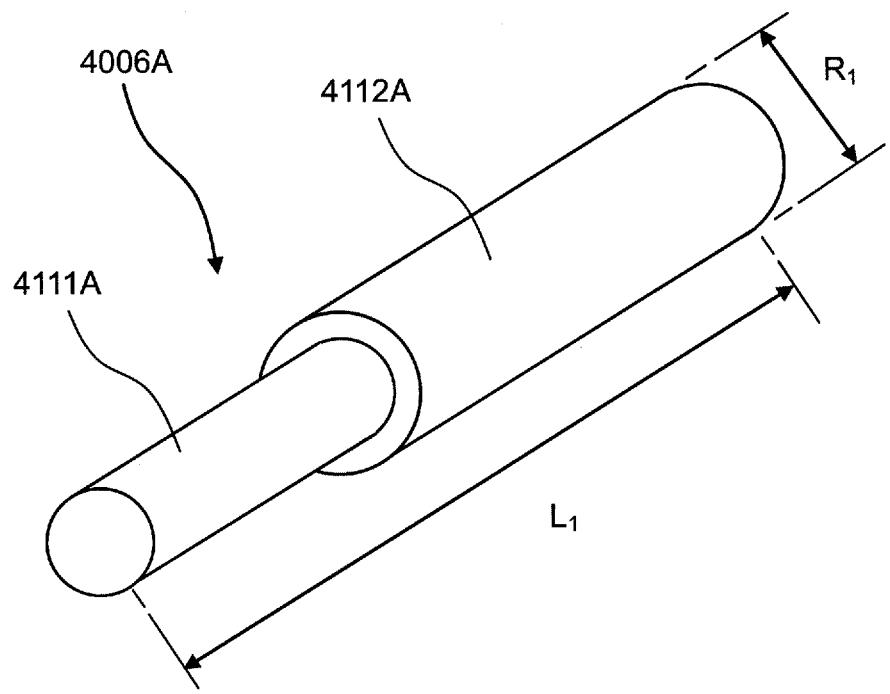
FIG. 87 is an outlined perspective view of a bar-like red LED element of the twenty-fifth embodiment of the invention.

FIG. 87 is an outlined perspective view of the bar-like red LED element 4006A. It is noted that FIG. 87 depicts a state before the bar-like red LED element 4006A is mounted on the insulative flexible board 4001.

Each of the bar-like red LED elements 4006A includes a bar-like n-type GaAs (gallium arsenic) semiconductor core 4111A having a generally circular-shaped cross section, and a p-type GaAs semiconductor shell 4112A formed so as to coaxially cover part of an outer peripheral surface of the semiconductor core 4111A. Then, the bar-like red LED element 4006A has a ratio of length $L_1$ to width $R_1$ falling within a range of 5 to 400, where the length $L_1$ is within a range of 0.5 µm to 200 µm. It is noted that the semiconductor core 4111A is an example of the first-conductive-type semiconductor, and the semiconductor shell 4112A is an example of the second-conductive-type semiconductor.

One-end-side outer peripheral surface and end face of the semiconductor core 4111A are covered with the semiconductor shell 4112A, while the other-end-side outer peripheral surface and end face of the semiconductor core 4111A are exposed.

The semiconductor shell 4112A has a bottomed cylindrical shape, and a center axis of the semiconductor shell 4112A is coincident with a center axis of the semiconductor shell 4112A side end portion of the semiconductor core 4111A.

Figure 88:
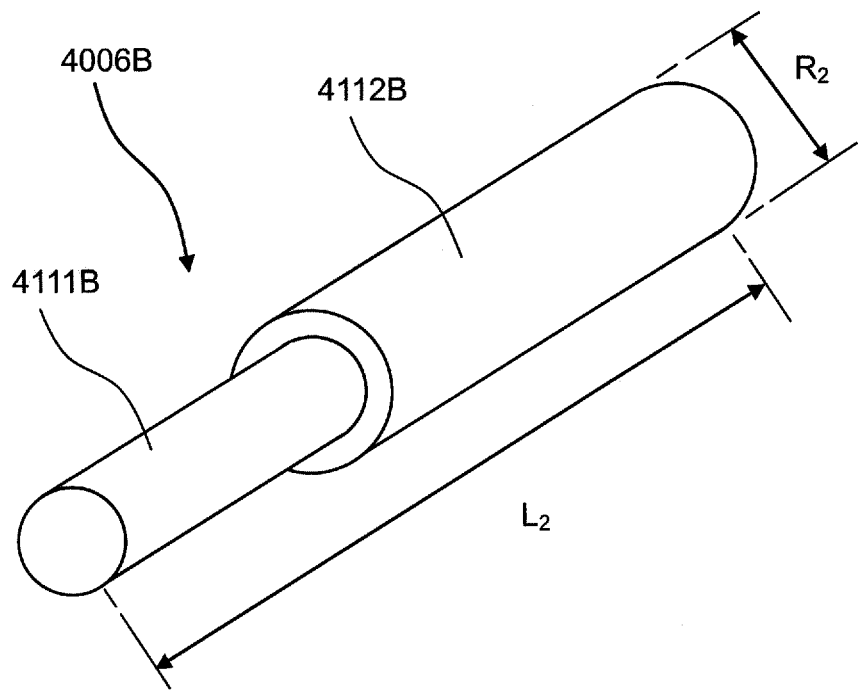
FIG. 88 is an outlined perspective view of a bar-like green LED element of the twenty-fifth embodiment of the invention.

FIG. 88 is an outlined perspective view of the bar-like green LED element 4006B. It is noted that FIG. 88 depicts a state before the bar-like green LED element 4006B is mounted on the insulative flexible board 4001.

Each of the bar-like green LED elements 4006B includes a bar-like n-type GaP (gallium phosphide) semiconductor core 4111B having a generally circular-shaped cross section, and a p-type GaP semiconductor shell 4112B formed so as to coaxially cover part of an outer peripheral surface of the semiconductor core 4111B. Then, the bar-like green LED element 4006B has a ratio of length $L_2$ to width $R_2$ falling within a range of 5 to 400, where the length $L_2$ is within a range of 0.5 µm to 200 µm. It is noted that the semiconductor core 4111B is an example of the first-conductive-type semiconductor, and the semiconductor shell 4112B is an example of the second-conductive-type semiconductor.

One-end-side outer peripheral surface and end face of the semiconductor core 4111B are covered with the semiconductor shell 4112B, while the other-end-side outer peripheral surface and end face of the semiconductor core 4111B are exposed.

The semiconductor shell 4112B has a bottomed cylindrical shape, and a center axis of the semiconductor shell 4112B is coincident with a center axis of the semiconductor shell 4112E side end portion of the semiconductor core 4111B.

Figure 89:
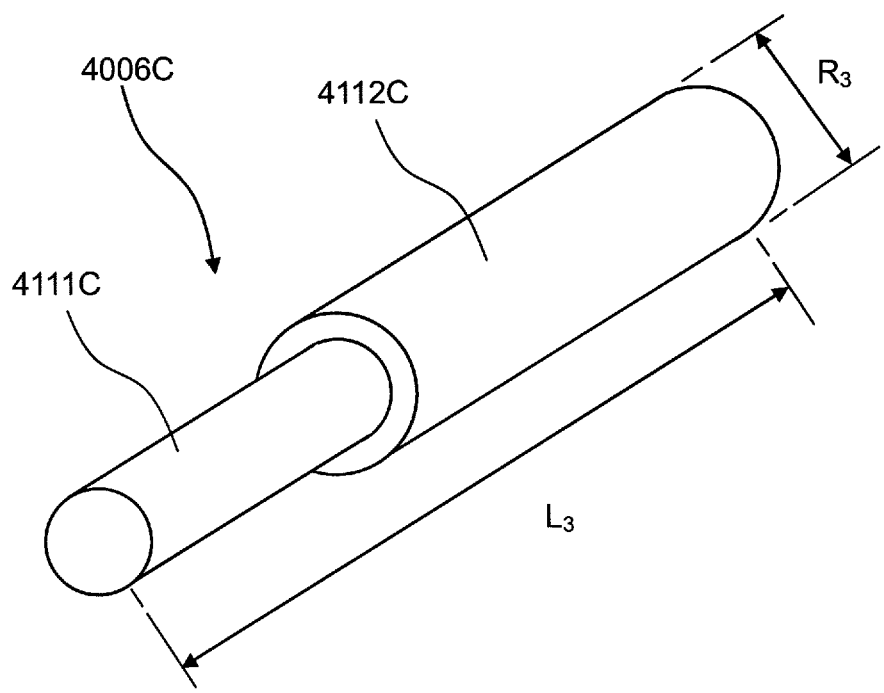
FIG. 89 is an outlined perspective view of a bar-like blue LED element of the twenty-fifth embodiment of the invention.

FIG. 89 is an outlined perspective view of the bar-like blue LED element 4006C. It is noted that FIG. 89 depicts a state before the bar-like blue LED elements 4006C is mounted on the insulative flexible board 4001.

Each of the bar-like blue LED elements 4006C includes a bar-like n-type GaN (gallium nitride) semiconductor core 4111C having a generally circular-shaped cross section, and a p-type GaN semiconductor shell 4112C formed so as to coaxially cover part of an outer peripheral surface of the semiconductor core 4111C. Then, the bar-like blue LED element 4006C has a ratio of length $L_3$ to width $R_3$ falling within a range of 5 to 400, where the length $L_3$ is within a range of 0.5 µm to 200 µm. It is noted that the semiconductor core 4111C is an example of the first-conductive-type semiconductor, and the semiconductor shell 4112C is an example of the second-conductive-type semiconductor.

One-end-side outer peripheral surface and end face of the semiconductor core 4111C are covered with the semiconductor shell 4112C, while the other-end-side outer peripheral surface and end face of the semiconductor core 4111C are exposed.

The semiconductor shell 4112C has a bottomed cylindrical shape, and a center axis of the semiconductor shell 4112C is coincident with a center axis of the semiconductor shell 4112C side end portion of the semiconductor core 4111C.

According to the display device of the above-described construction, the bar-like red LED elements 4006A, the bar-like green LED elements 4006B and the bar-like blue LED elements 4006C are electrically connected directly to terminal portions 4002a of one of the plurality of row lines 4002, 4002, . . . while the other end portions are electrically connected directly to terminal portions 4003a of one of the plurality of column lines 4003, 4003, . . . . Therefore, wires that have been needed for the display device of the prior art (JP 2002-353517 A) are unnecessary. As a consequence, material costs and manufacturing steps can be cut down so that the display device can be manufactured with lower cost, as compared with the prior-art display device.

Also, since the unnecessariness of wires makes bonding pads also unnecessary, distances among the bar-like red LED elements 4006A, the bar-like green LED elements 4006B and the bar-like blue LED elements 4006C can be shortened. Moreover, the bar-like red LED elements 4006A, the bar-like green LED elements 4006B and the bar-like blue LED elements 4006C have ratios of their lengths $L_1$, $L_2$, $L_3$ to widths $R_1$, $R_2$, $R_3$, respectively, falling within a range of 5 to 400, and those lengths $L_1$, $L_2$, $L_3$ are within a range of 0.5 µm to 200 µm, hence quite small sizes. Therefore, the pixel parts of the display device can be made very small, making it implementable to fulfill high-definition display.

Since the ratios of lengths $L_1$, $L_2$, $L_3$ to widths $R_1$, $R_2$, $R_3$, respectively, are within a range of 5 to 400 and those lengths $L_1$, $L_2$, $L_3$ are not more than 200 µm, the bar-like red LED elements 4006A, the bar-like green LED elements 4006B and the bar-like blue LED elements 4006C can be easily placed between the row lines 4002 and the column lines 4003 by applying voltages to between the row lines 4002 and the column lines 4003.

In cases where the ratios of lengths $L_1$, $L_2$, $L_3$ to widths $R_1$, $R_2$, $R_3$, respectively, are less than 5 or more than 400, or where those lengths are more than 200 µm, it is difficult to place the bar-like red LED elements 4006A, the bar-like green LED elements 4006B and the bar-like blue LED elements 4006C between the row lines 4002 and the column lines 4003 even with execution of the voltage application.

Since the lengths $L_1$, $L_2$, $L_3$ of the bar-like red LED elements 4006A, the bar-like green LED elements 4006B and the bar-like blue LED elements 4006C are set to 5 µm or more, the emission intensity can be enhanced so that a desired emission intensity can be obtained.

In cases where the lengths $L_1$, $L_2$, $L_3$ of the bar-like red LED elements 4006A, the bar-like green LED elements 4006B and the bar-like blue LED elements 4006C, respectively, are less than 5 µm, resulting emission intensity is so low that a desired emission intensity cannot be obtained.

Moreover, setting the ratios of lengths $L_1$, $L_2$, $L_3$ to widths $R_1$, $R_2$, $R_3$, respectively, to 5 or more allows distances between the terminal portions 4002a of the row lines 4002 and the terminal portions 4003a of the column lines 4003 to be set to longer ones, it follows that, for example, an exposure device for the row lines 4002 and the column lines 4003 may be one of low specifications and short-circuits of the terminal portions 4002a to the terminal portions 4003a are less likely to occur. Therefore, without increasing material costs of the bar-like red LED elements 4006A, the bar-like green LED elements 4006B and the bar-like blue LED elements 4006C, the equipment cost can be cut down, the yield can be improved, and the total manufacturing cost can be cut down.

Also, since the semiconductor cores 4111A, 4111B, 4111C are partly covered coaxially by the semiconductor shells 4112A, 4112B, 4112C, respectively, light-emission areas of the bar-like red LED elements 4006A, the bar-like green LED elements 4006B and the bar-like blue LED elements 4006C, respectively, become wider. Therefore, brightness of the LED liquid crystal display device can be enhanced.

Also, since the bar-like red LED elements 4006A, the bar-like green LED elements 4006B and the bar-like blue LED elements 4006C are placed on the insulative flexible board 4001, full-color display can be implemented without using any phosphor.

Also, with the display device of this twenty-fifth embodiment used for a backlight of liquid-crystal display devices or the like, there can be realized a backlight which allows reductions in thickness and weight to be achieved and which has high luminous efficacy and power-saving property.

Also, with the display device of this twenty-fifth embodiment used for a backlight of a liquid-crystal display device, the color filter of the liquid-crystal display device may be eliminated, allowing the manufacturing cost to be cut down, and moreover color purity and brightness of the liquid-crystal display device can be enhanced.

Also, with the display device of this twenty-fifth embodiment used as a lighting device, there can be realized a lighting device which allows reductions in thickness and weight to be achieved and which has high luminous efficacy and power-saving property. In this case, emitted light of the light-emitting elements mounted on the insulative flexible board 4001 may be uniformized to a single color.

Also, since the insulative flexible board 4001 is used in the display device, the degree of freedom for placement of the insulative flexible board 4001 can be enhanced.

Now, a manufacturing method for the bar-like blue LED elements 4006C is explained below.

FIGS. 90A to 90E are process views showing a manufacturing method for the bar-like blue LED elements 4006C. In this twenty-fifth embodiment, Si (silicon)-doped n-type GaN and Mg (magnesium)-doped p-type GaN are used, but impurities for doping to GaN are not limited to these.

Figure 90A:
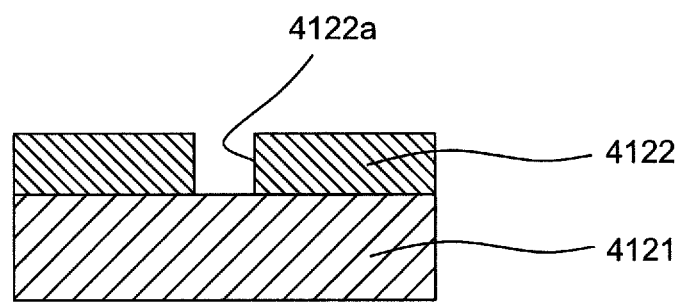
FIG. 90A is a process view of a bar-like blue LED element manufacturing method according to the twenty-fifth embodiment of the invention.

First, as shown in FIG. 90A, a mask 4122 having a plurality of growth holes 4122a (only one is shown in FIG. 90A) is formed on an n-type GaN substrate 4121. As the material for this mask 4122, a material, such as $SiO_2$ (silicon oxide) or $Si_3N_4$ (silicon nitride), that can selectively be etched for the semiconductor core 4111C and the semiconductor shell 4112C may be used. For formation of the growth holes 4122a, known lithography process and dry etching process to be used for normal semiconductor processes may be used.

Figure 90B:
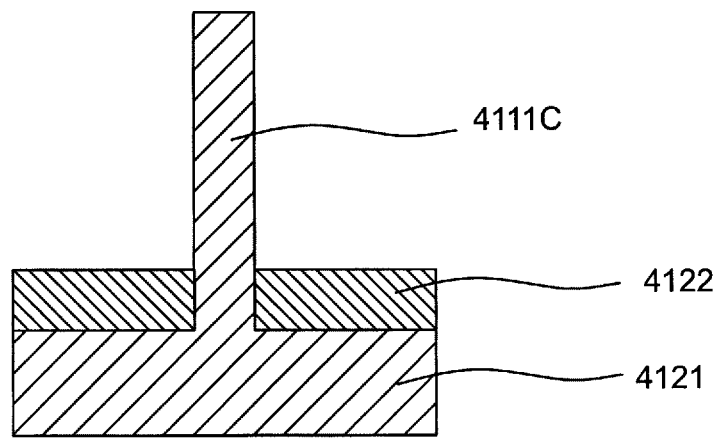
FIG. 90B is a process view of the bar-like blue LED element manufacturing method subsequent to FIG. 90A.

Next, as shown in FIG. 90B, in a semiconductor core 4111C formation step, n-type GaN is crystal grown by using an MOCVD (Metal Organic Chemical Vapor Deposition) apparatus so that a plurality of bar-like semiconductor cores 4111C (only one is shown in FIG. 90B) are formed on the substrate 4121 exposed by the growth holes 4122a of the mask 4122. In this case, with a growth temperature set to about 950° C. and with TMG (trimethylgallium) and $NH_3$ (ammonia) used as growth gases, $SiH_4$ (silane) is fed as an n-type impurity and $H_2$ (hydrogen) is fed as a carrier gas, by which a Si-doped n-type GaN semiconductor core 4111C can be grown. In this case, the diameter of the grown semiconductor core 4111C can be determined by a diameter of each growth hole 4122a of the mask 4122. Also, the n-type GaN, showing hexagonal system crystal growth, is grown while a vertical direction to the substrate 4121 surface is set as a c-axis direction, so that a hexagonal cylinder-shaped semiconductor core 4111C results. Although depending on growth conditions such as growth direction and growth temperature, the cross section tends to become a nearly circular shape when the diameter of the semiconductor core 4111C to be grown is as small as about several tens nm to several hundreds nm, and growth with a nearly hexagonal cross section tends to become more easily achievable when the diameter increases to as large as about 0.5 µm to several µm.

Figure 90C:
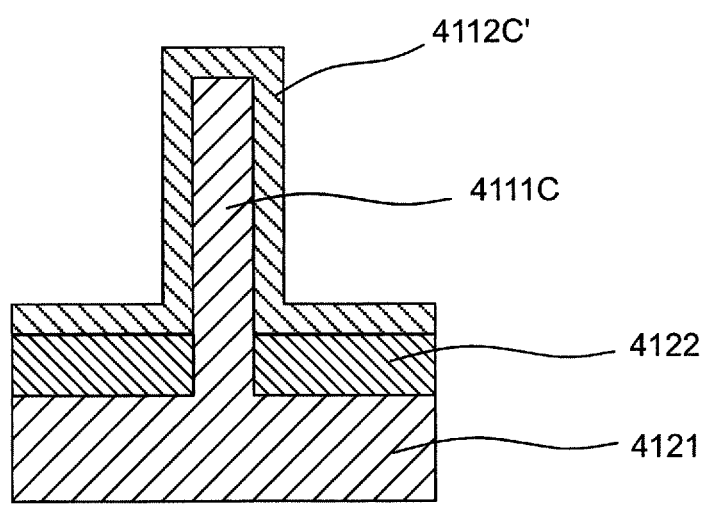
FIG. 90C is a process view of the bar-like blue LED element manufacturing method subsequent to FIG. 90B.

Next, in a semiconductor layer formation step, a semiconductor layer 4112C' made of p-type GaN is formed all over the surface of the substrate 4121 so as to cover the bar-like semiconductor core 4111C as shown in FIG. 90C. With a formation temperature set to about 960° C., TMG and $NH_3$ are used as growth gases while $Cp_2Mg$ (biscyclopentadienyl magnesium) is used for feed of p-type impurity, so that magnesium (Mg)-doped p-type GaN can be grown.

Figure 90D:
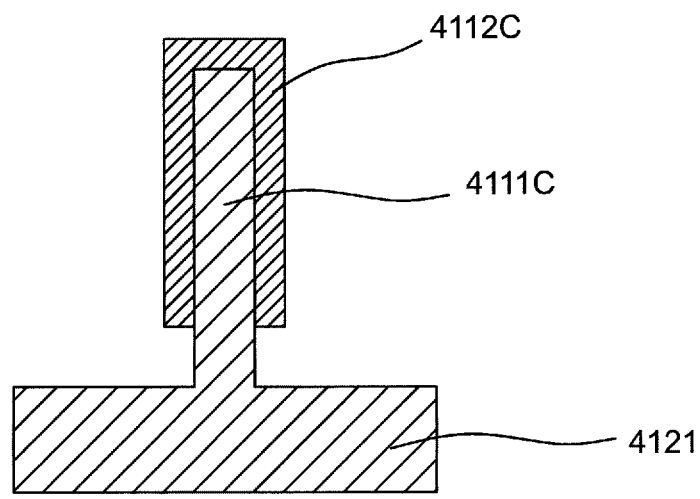
FIG. 90D is a process view of the bar-like blue LED element manufacturing method subsequent to FIG. 90C.

Next, in an exposure step, part of the semiconductor layer 4112C' is removed together with the mask 4122 by lift-off so that a semiconductor shell 4112C covering part of the semiconductor core 4111C is formed as shown in FIG. 90D while an outer peripheral surface of a substrate 4121 side end portion of the bar-like semiconductor core 4111C is exposed. In this state, the other side end portion of the semiconductor core 4111C opposite to the substrate 4121 side is covered with the semiconductor shell 4112C. With the mask 4122 formed of $SiO_2$ or $Si_3N_4$, use of a solution containing HF (hydrofluoric acid) makes it possible to easily achieve etching of the mask 4122 without affecting the semiconductor core 4111C and the semiconductor layer part covering the semiconductor core 4111C (a part to form the semiconductor shell 4112C), so that part of the semiconductor layer 4112C' covering the outer peripheral surface of the substrate 4121 side end portion of the semiconductor core 4111C can be removed together with the mask 4122 by lift-off. Although lift-off is used in the exposure step of this twenty-fifth embodiment, the outer peripheral surface of the substrate 4121 side end portion of the semiconductor core 4111C may also be exposed by etching. In the case of dry etching, using $CF_4$ or $XeF_2$ makes it possible to achieve etching of the mask 4122 without affecting the semiconductor core 4111C and the semiconductor layer part covering the semiconductor core 4111C (a part to form the semiconductor shell 4112C), so that part of the semiconductor layer 4112C' covering the outer peripheral surface of the substrate 4121 side end portion of the semiconductor core 4111C can be removed together with the mask 4122.

Figure 90E:
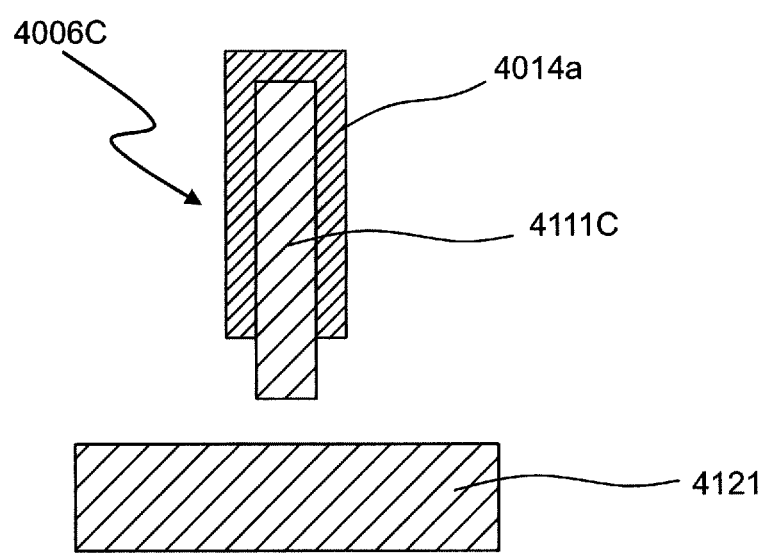
FIG. 90E is a process view of the bar-like blue LED element manufacturing method subsequent to FIG. 90D.

Next, in a cut-off step, the substrate 4121 is immersed in an IPA (isopropyl alcohol) solution, and the substrate 4121 is vibrated along the substrate plane by using ultrasonic waves (e.g., several 10 kHz). As a result, stress acts on the semiconductor core 4111C, which is partly covered with the semiconductor shell 4112C, so as to bend a near-substrate 4121 side foot portion of the semiconductor core 4111C, which is erectly provided on the substrate 4121, so that the semiconductor core 4111C partly covered with the semiconductor shell 4112C is cut off from the substrate 4121 as shown in FIG. 90E.

Thus, a fine bar-like blue LED elements 4006C cut off from the substrate 4121 can be manufactured in plurality at one time.

The bar-like red LED element 4006A and the bar-like green LED element 4006B can also be manufactured in plurality at one time in the same way as the bar-like blue LED element 4006C.

For the display device of this twenty-fifth embodiment, the above-manufactured bar-like red LED elements 4006A and the bar-like green LED elements 4006B are also manufactured by using the bar-like blue LED elements 4006C.

Now, the display device manufacturing method is explained below.

Figure 91A:
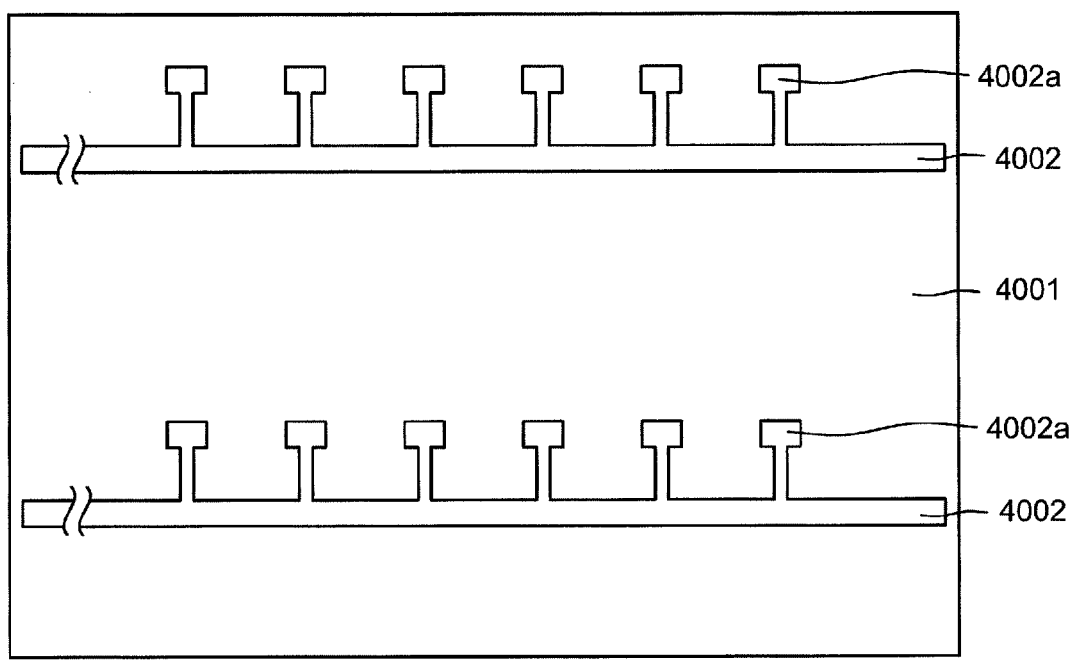
FIG. 91A is a process view of a display device manufacturing method according to the twenty-fifth embodiment of the invention.

First, as shown in FIG. 91A, on the insulative flexible board 4001, a plurality of row lines 4002, 4002, . . . are arrayed with specified intervals provided longitudinally of the substrate. In this case, the row lines 4002 are formed into a desired configuration by using printing techniques. In addition, the formation of the row lines 4002 may also be fulfilled by uniformly stacking a metal film and a photoconductor film and by performing exposure of a desired electrode pattern and etching process.

Figure 91B:
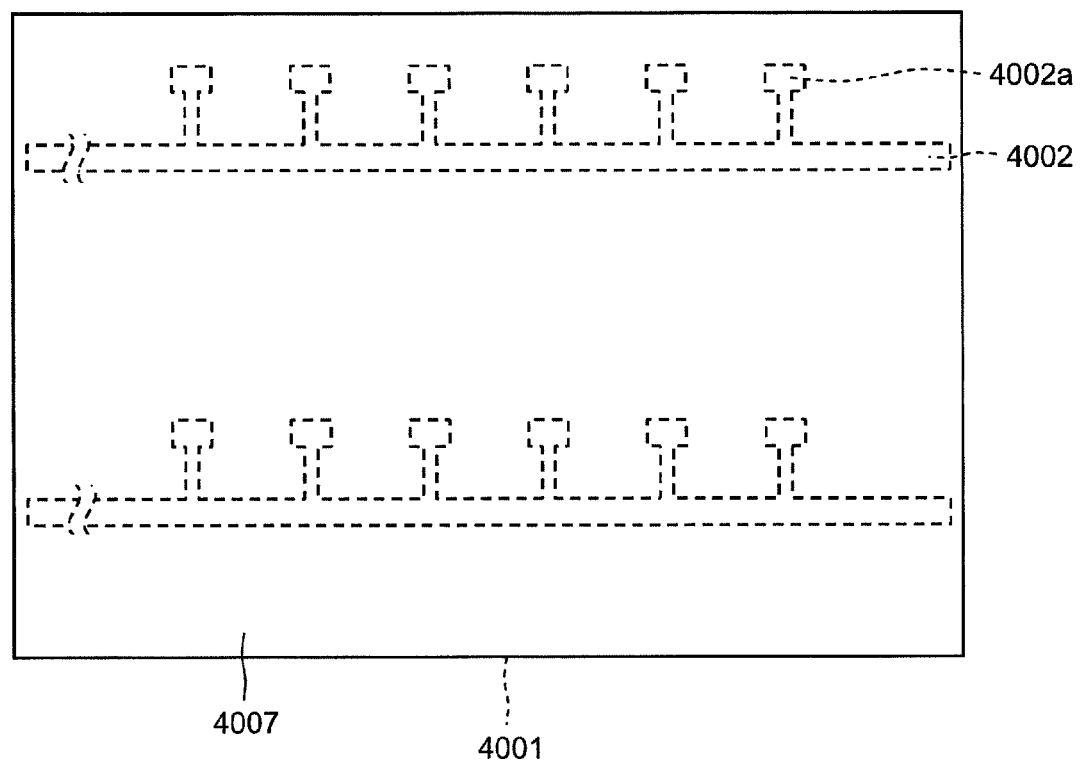
FIG. 91B is a process view of the display device manufacturing method subsequent to FIG. 91A.

Next, as shown in FIG. 91B, an insulating film 4007 is formed all over the surface of the insulative flexible board 4001 so that all of the plurality of row lines 4002, 4002, . . . are covered with the insulating film 4007.

Figure 91C:
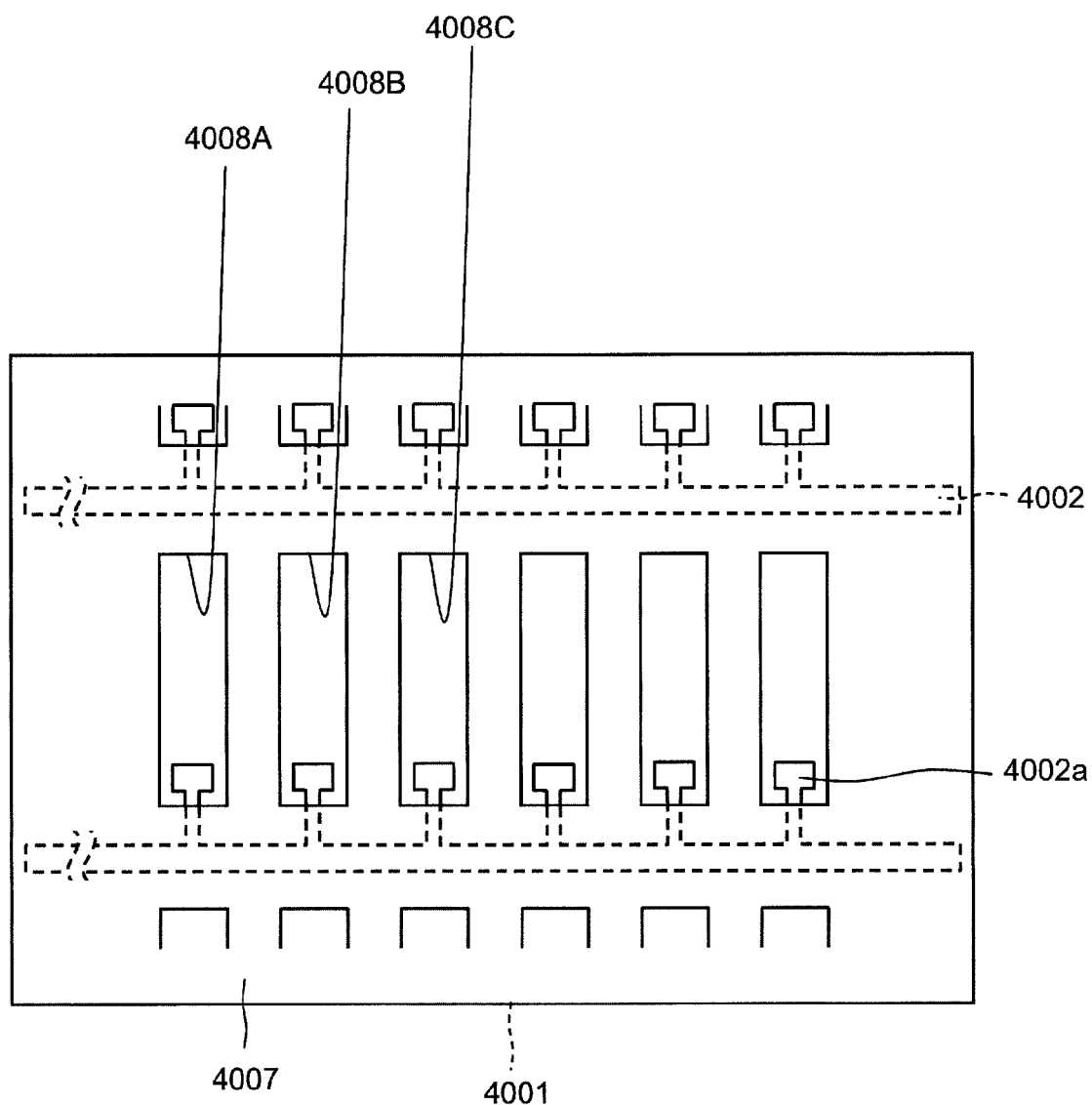
FIG. 91C is a process view of the display device manufacturing method subsequent to FIG. 91B.

Next, the insulating film 4007 is partly removed, so that bar-like red LED element-use openings 4008A for placement of the bar-like red LED elements 4006A, bar-like green LED element-use openings 4008B for placement of the bar-like green LED elements 4006B, and bar-like blue LED element-use openings 4008C for placement of the bar-like blue LED elements 4006C are formed as shown in FIG. 91C. As a result of this, terminal portions 4002a of the row lines 4002 are exposed from within the bar-like red LED element-use openings 4008A, from within the bar-like green LED element-use openings 4008B and from within the bar-like blue LED element-use openings 4008C.

Figure 91D:
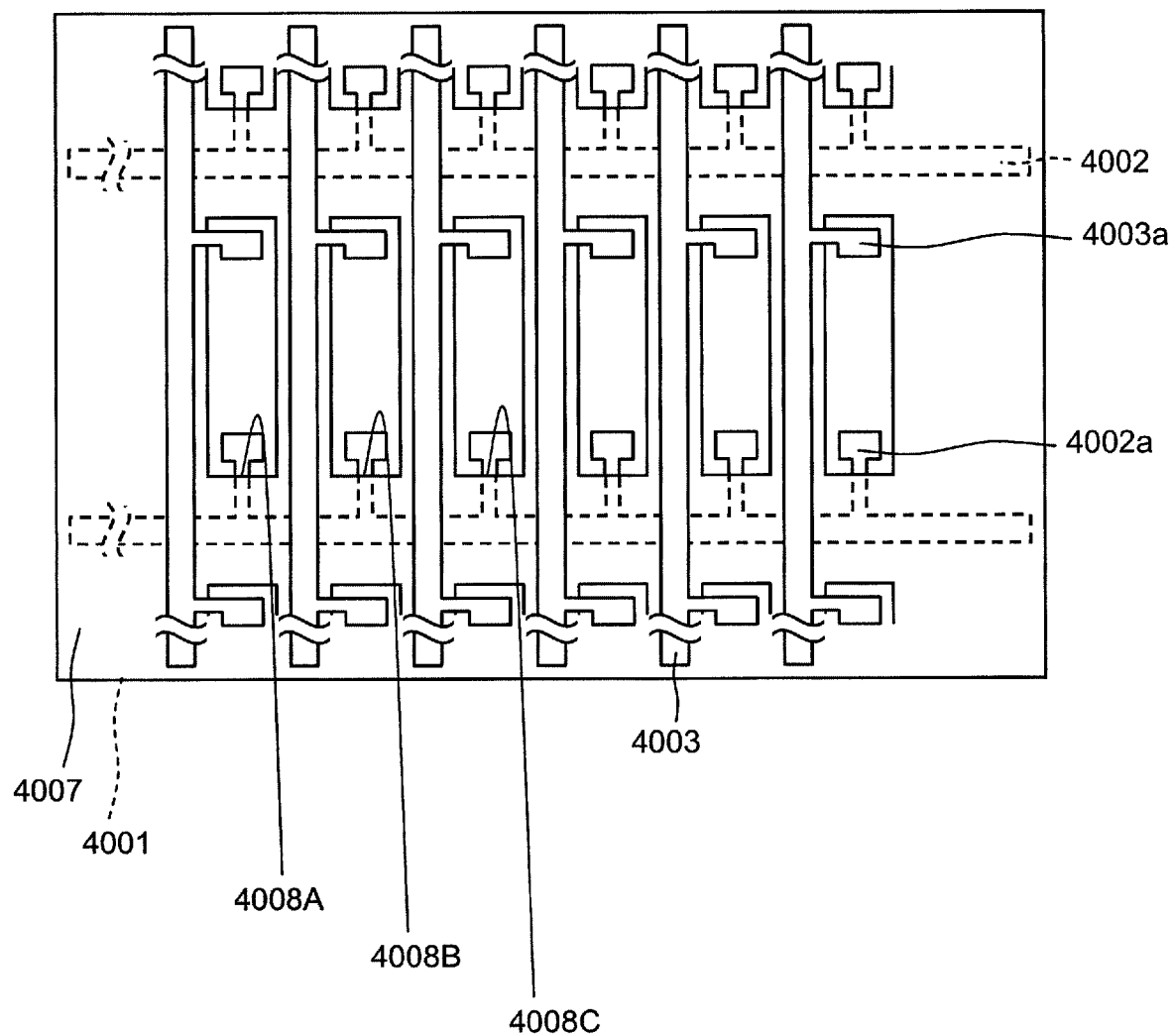
FIG. 91D is a process view of the display device manufacturing method subsequent to FIG. 91C.

Next, as shown in FIG. 91D, on the insulating film 4007, a plurality of column lines 4003, 4003, are arrayed with specified intervals provided laterally of the substrate, and terminal portions 4003a of the column lines 4003 are put into the bar-like red LED element-use openings 4008A, the bar-like green LED element-use openings 4008B and the bar-like blue LED element-use openings 4008C. In this case, the column lines 4003 are formed into a desired configuration by using printing techniques. In addition, the formation of the column lines 4003 may also be fulfilled by uniformly stacking a metal film and a photoconductor film and by performing exposure of a desired electrode pattern and etching process.

Figure 91E:
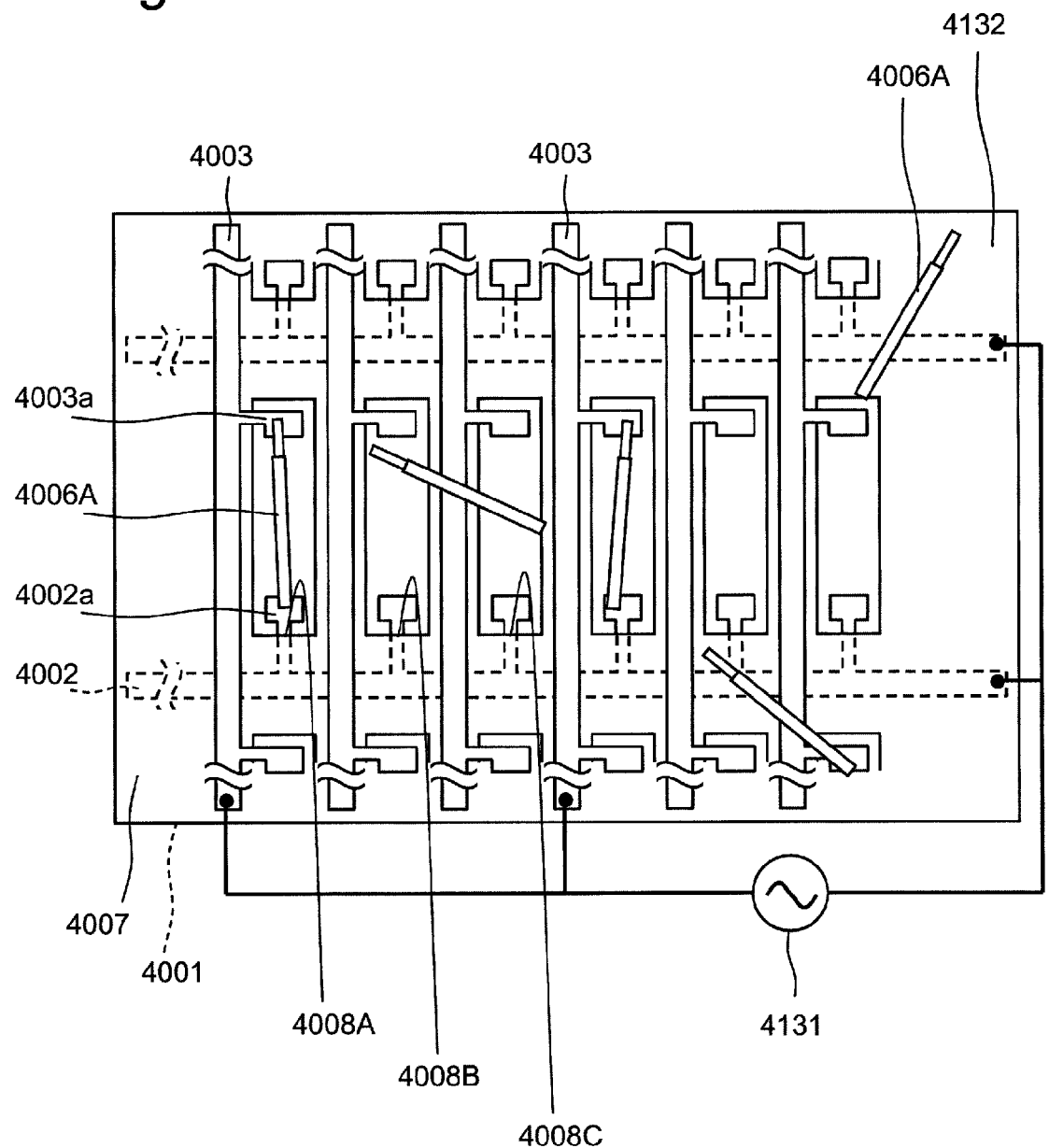
FIG. 91E is a process view of the display device manufacturing method subsequent to FIG. 91D.
Figure 91F:
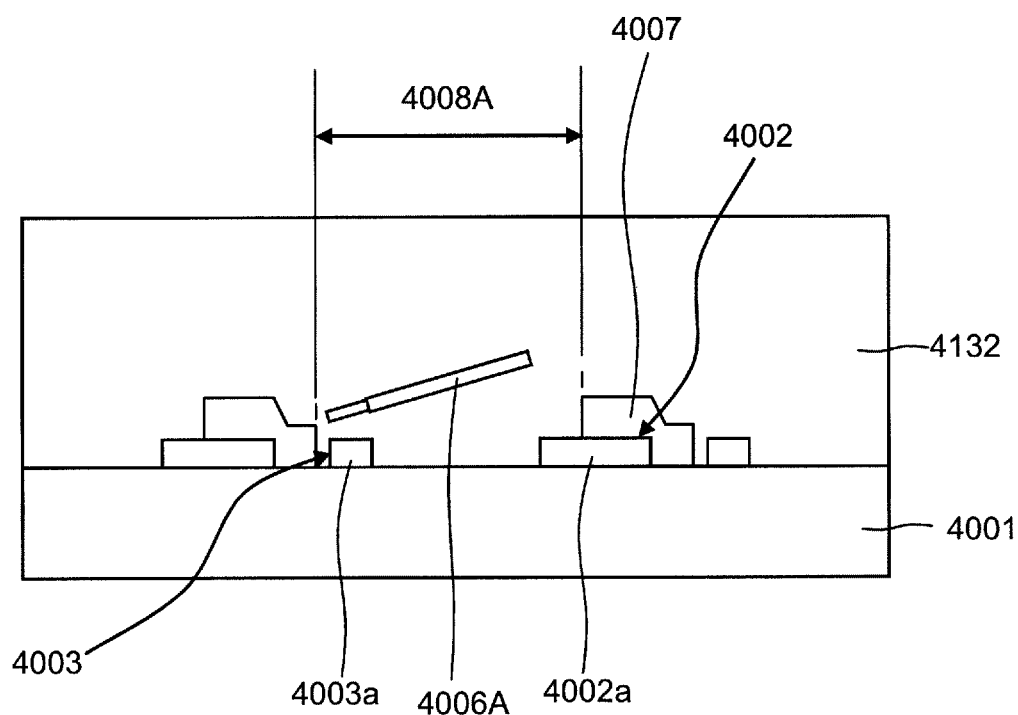
FIG. 91F is a process view of the display device manufacturing method subsequent to FIG. 91D.

Next, as shown in FIGS. 91E and 91F, an AC power supply 4131 is connected to all of the plurality of row lines 4002, 4002, as well as to the column lines 4003 having their terminal portions 4003a put in the bar-like red LED element-use openings 4008A.

Next, in an application step, an IPA solution 4132 containing a plurality of bar-like red LED elements 4006A is thinly applied on the insulative flexible board 4001. Other than the IPA solution 4132, also usable are ethylene glycol, propylene glycol, methanol, ethanol, acetone or their mixtures. Otherwise, usable are liquids made of organic matters instead of the IPA solution 4132, water, or the like. It is noted that the IPA solution 4132 is an example of the liquid.

However, in event of flow of a large current between the terminal portions 4002a of the row lines 4002 and the terminal portions 4003a of the column lines 4003 through the liquid, a desired voltage could no longer be applied to between the terminal portions 4002a of the row lines 4002 and the terminal portions 4003a of the column lines 4003. In such a case, an insulating film of about 10 nm to 30 nm may appropriately be provided to coat the entire surface of the insulative flexible board 4001 so that the row lines 4002 and the terminal portions 4003a of the column lines 4003 are covered therewith.

The thickness of coating of the IPA solution 4132 containing the plurality of bar-like red LED elements 4006A is such a thickness that the bar-like red LED elements 4006A are allowed to move in the liquid so that the bar-like red LED elements 4006A can be arrayed in the succeeding step for arraying the bar-like red LED elements 4006A. Therefore, the thickness of coating of the IPA solution 4132, larger than a thickness (width $R_1$) of each bar-like red LED element 4006A, is several μm to several mm as an example. Excessively thin thicknesses of coating would make it difficult for the bar-like red LED elements 4006A to move, while excessively thick thicknesses of coating would elongate the time for drying the liquid. Also, the quantity of bar-like red LED elements 4006A is preferably within a range of $1 \times 10^4$ pcs/$cm^3$ to $1 \times 10^7$ pcs/$cm^3$ against the quantity of the IPA solution 4132.

For fulfillment of the coating of IPA solution 4132 containing the bar-like red LED elements 4006A, it is also allowable that a frame is formed on outer peripheries of the metal electrodes for arraying the bar-like red LED elements 4006A and then the IPA solution 4132 containing the bar-like red LED elements 4006A is filled to within the frame until a desired thickness is attained. However, in a case where the IPA solution 4132 containing the bar-like red LED elements 4006A has viscosity, it is possible to attain a desired thickness of coating without needing the frame.

IPA, or ethylene glycol, propylene glycol, . . . , or their mixtures, or liquids made of other organic matters, or water or other liquids are desirably as low in viscosity as possible in terms of the array step of the bar-like red LED elements 4006A, and also desirably as easily vaporizable by heating as possible.

Next, a reference voltage is applied to the terminal portions 4002a of the row lines 4002 while an AC voltage having a specified amplitude is applied to the terminal portions 4003a of the column lines 4003. As a result of this, the bar-like red LED elements 4006A are put into the bar-like red LED element-use openings 4008A. In this process, one end portions of the bar-like red LED elements 4006A are placed on the terminal portions 4002a of the row lines 4002 while the other end portions of the bar-like red LED elements 4006A are placed on the terminal portions 4003a of the column lines 4003.

The frequency of the AC voltage is preferably set to 10 Hz to 1 MHz and, more preferably, to 50 Hz to 1 kHz, which allows the most stable array to be obtained. Further, the AC voltage is not limited to sinusoidal waves and may be one which periodically varies, such as rectangular waves, chopping waves and sawtooth waves. It has been found that the amplitude is preferably set to about 0.5 V. Besides, a DC power supply may be used instead of the AC power supply 4131.

Figure 91G:
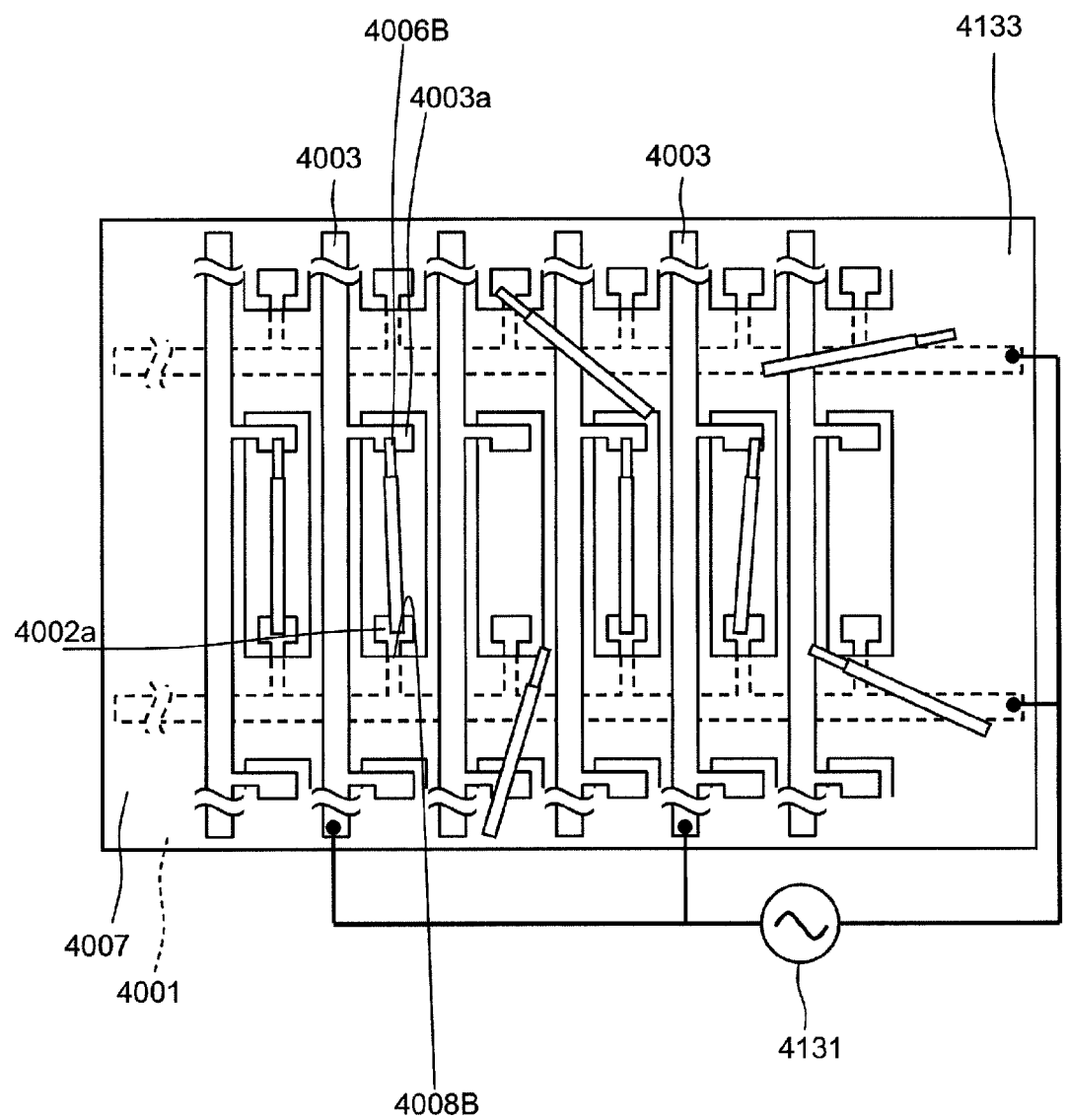
FIG. 91G is a process view of the display device manufacturing method subsequent to FIG. 91F.

Next, as shown in FIG. 91G, the AC power supply 4131 is connected to all of the plurality of row lines 4002, 4002, . . . and column lines 4003 having their terminal portions 4003a put in the bar-like green LED element-use openings 4008B.

Next, in an application step, an IPA solution 4133 containing bar-like green LED elements 4006B is thinly applied on the insulative flexible board 4001. Solutions usable instead of the IPA solution 4133 are similar to those for the bar-like red LED elements 4006A. The coating thickness of the IPA solution 4133 also is the same with the bar-like red LED elements 4006A. That is, the application of the IPA solution 4133 containing the bar-like green LED elements 4006B can be fulfilled in the same way as in the application of the IPA solution 4132 containing the bar-like red LED elements 4006A. It is noted that the IPA solution 4133 is an example of the liquid.

Next, as in the arraying of the bar-like red LED elements 4006A, a reference voltage is applied to the terminal portions 4002a of the row lines 4002 while an AC voltage having a specified amplitude is applied to the terminal portions 4003a of the column lines 4003. As a result of this, the bar-like green LED elements 4006B are put into the bar-like green LED element-use openings 4008B. In this process, one end portions of the bar-like green LED elements 4006B are placed on the terminal portions 4002a of the row lines 4002 while the other end portions of the bar-like green LED elements 4006B are placed on the terminal portions 4003a of the column lines 4003.

Figure 91H:
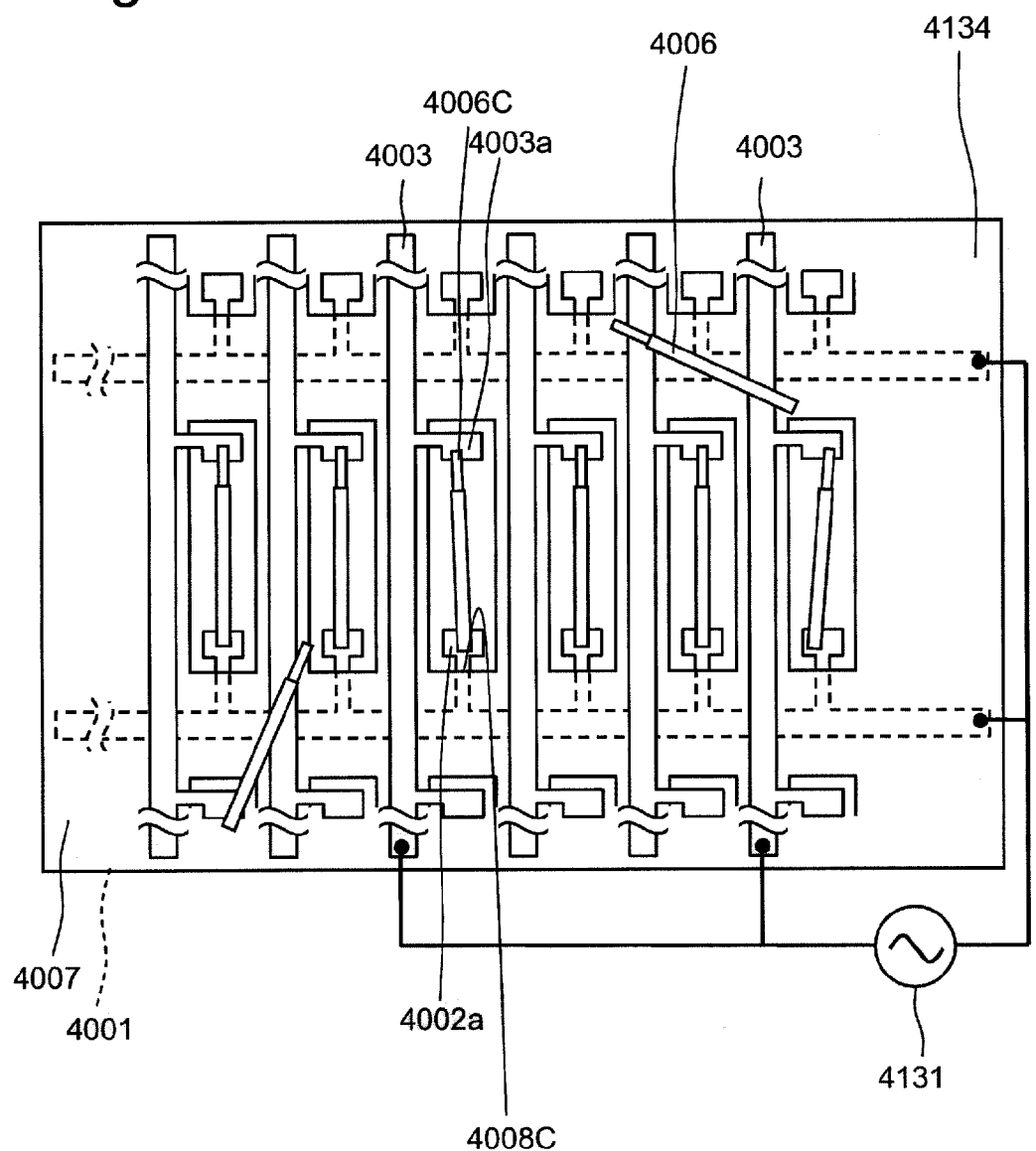
FIG. 91H is a process view of the display device manufacturing method subsequent to FIG. 91G.

Next, as shown in FIG. 91H, the AC power supply 4131 is connected to all of the plurality of row lines 4002, 4002, . . . and column lines 4003 having their terminal portions 4003a put in the bar-like blue LED element-use openings 4008C.

Next, in an application step, an IPA solution 4134 containing bar-like blue LED elements 4006C is thinly applied on the insulative flexible board 4001. Solutions usable instead of the IPA solution 4134 are similar to those for the bar-like red LED elements 4006A. The coating thickness of the IPA solution 4134 also is the same with the bar-like red LED elements 4006A. That is, the application of the IPA solution 4134 containing the bar-like blue LED elements 4006C can be fulfilled in the same way as in the application of the IPA solution 4132 containing the bar-like red LED elements 4006A. It is noted that the IPA solution 4134 is an example of the liquid.

Next, as in the arraying of the bar-like red LED elements 4006A, a reference voltage is applied to the terminal portions 4002a of the row lines 4002 while an AC voltage having a specified amplitude is applied to the terminal portions 4003a of the column lines 4003. As a result of this, the bar-like blue LED elements 4006C are put into the bar-like blue LED element-use openings 4008C. In this process, one end portions of the bar-like blue LED elements 4006C are placed on the terminal portions 4002a of the row lines 4002 while the other end portions of the bar-like blue LED elements 4006C are placed on the terminal portions 4003a of the column lines 4003.

Figure 91I:
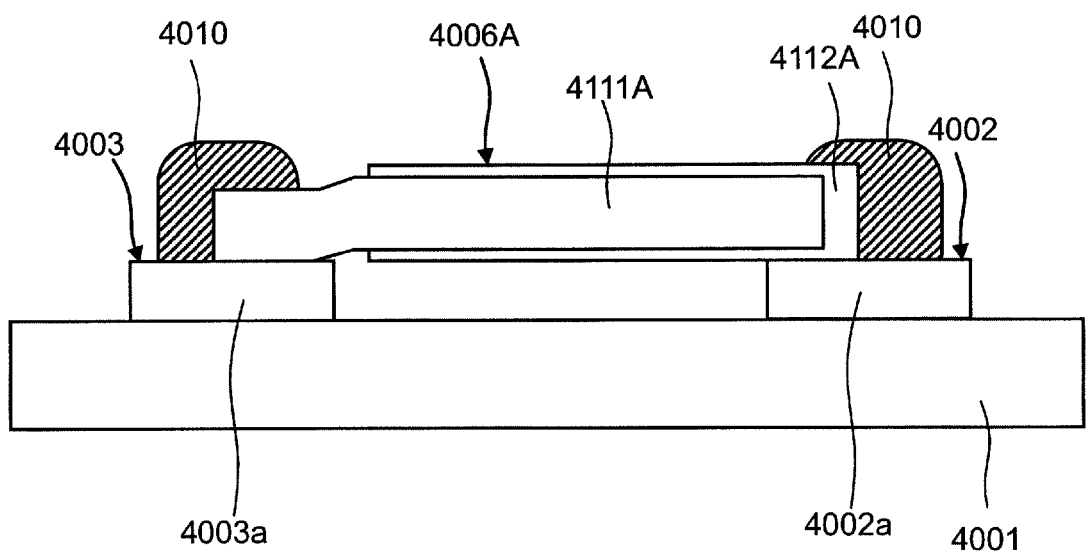
FIG. 91I is a process view of the display device manufacturing method subsequent to FIG. 91H.
Figure 91J:
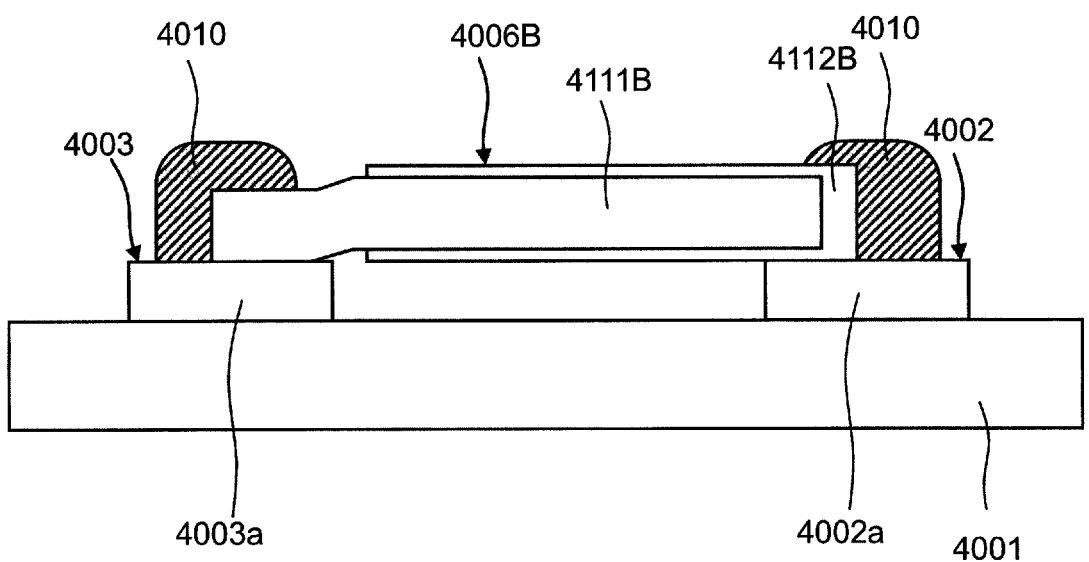
FIG. 91J is a process view of the display device manufacturing method subsequent to FIG. 91H.
Figure 91K:
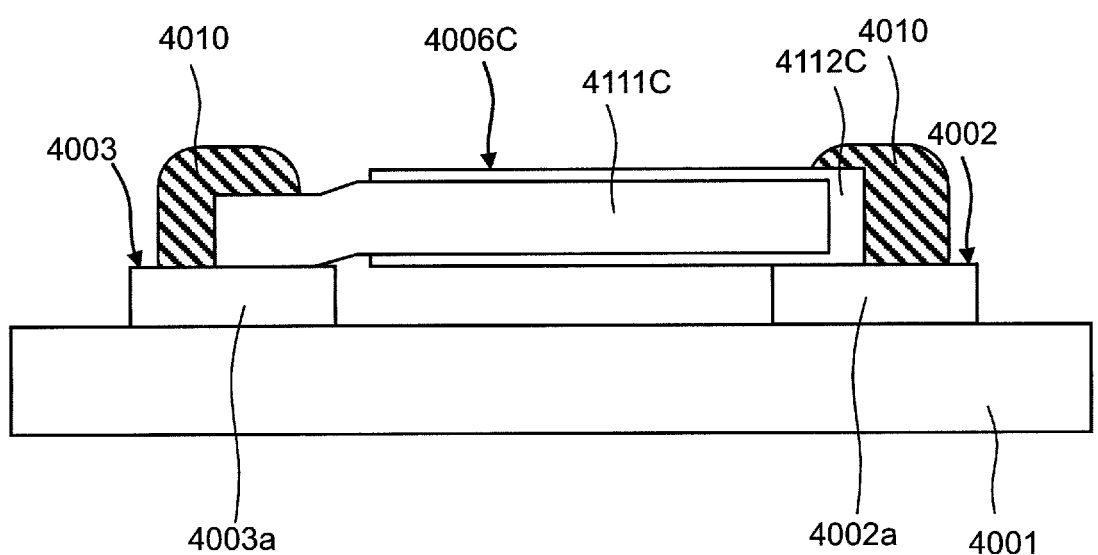
FIG. 91K is a process view of the display device manufacturing method subsequent to FIG. 91H.

Next, as shown in FIGS. 91I to 91K, an electrically conductive adhesive 4010 is applied onto the terminal portions 4002a, 4003a of the row lines 4002 and the column lines 4003 by, for example, ink jet process, and the conductive adhesive 4010 is dried and cured. As a result of this, one end portions of the bar-like red LED elements 4006A, the bar-like green LED elements 4006B and the bar-like blue LED elements 4006C are fixed to the terminal portions 4002a of the row lines 4002, thus coming to a conducting state with the terminal portions 4002a of the row lines 4002. Also, the other end portions of the bar-like red LED elements 4006A, the bar-like green LED elements 4006B and the bar-like blue LED elements 4006C are fixed to the terminal portions 4003a of the column lines 4003, thus coming to a conducting state with the terminal portions 4003a of the column lines 4003. That is, one end portions of the bar-like red LED elements 4006A, the bar-like green LED elements 4006B and the bar-like blue LED elements 4006C are physically and electrically connected directly to the terminal portions 4002a of the row lines 4002, while the other end portions of the bar-like red LED elements 4006A, the bar-like green LED elements 4006B and the bar-like blue LED elements 4006C are physically and electrically connected directly to the terminal portions 4003a of the column lines 4003.

Next, as shown in FIG. 86, a plurality of row lines 4002, 4002, . . . are connected to the row driver circuit 4004, and moreover a plurality of column lines 4003, 4003, . . . are connected to the column driver circuit 4005.

As shown above, after the IPA solution 4132 containing the plurality of bar-like red LED elements 4006A is thinly applied, the reference voltage is applied to the terminal portions 4002a of the row lines 4002 while the AC voltage having a specified amplitude is applied to the terminal portions 4003a of the column lines 4003, by which the arraying of a plurality of bar-like red LED elements 4006A to the red pixel parts can be achieved at one time. Therefore, the work for placing and arraying the plurality of bar-like red LED elements 4006A one by one is no longer necessary, and a wire bonding step is also unnecessary. Thus, the manufacturing process can be simplified and the manufacturing cost can be cut down.

Also, the arraying of the plurality of bar-like green LED elements 4006B as well as bar-like blue LED elements 4006C is also fulfilled in the same way as the arraying of the plurality of bar-like red LED elements 4006A, so that the manufacturing process can be further simplified and the manufacturing cost can be further cut down.

Also, the arraying of the plurality of bar-like red LED elements 4006A, bar-like green LED elements 4006B and bar-like blue LED elements 4006C is completed only by performing three times the application of AC voltage with the AC power supply 4131. Thus, the number of steps for the manufacturing process can be cut down.

The bar-like red LED elements 4006A, the bar-like green LED elements 4006B and the bar-like blue LED elements 4006C are quite small in size. Only by applying a desired voltage to between the terminal portions 4002a of the row lines 4002 and the terminal portions 4003a of the column lines 4003, it can be easily achieved that the bar-like red LED elements 4006A are put into the bar-like red LED element-use openings 4008A, the bar-like green LED elements 4006B are put into the bar-like green LED element-use openings 4008B, and the bar-like blue LED elements 4006C are put into the bar-like blue LED element-use openings 4008C. Therefore, the arraying of the plurality of bar-like red LED elements 4006A, bar-like green LED elements 4006B and bar-like blue LED elements 4006C is easy to fulfill.

In this twenty-fifth embodiment, the arraying is executed in an order of the bar-like red LED elements 4006A to the bar-like green LED elements 4006B to the bar-like blue LED elements 4006C. However, the arraying may be done, for example, in an order of the bar-like green LED elements 4006B to the bar-like red LED elements 4006A to the bar-like blue LED elements 4006C, or an order of the bar-like blue LED elements 4006C to the bar-like green LED elements 4006B to the bar-like red LED elements 4006A.

In the twenty-fifth embodiment, after the arraying of the bar-like red LED elements 4006A, bar-like green LED elements 4006B and bar-like blue LED elements 4006C is completed, the conductive adhesive 4010 is applied into the bar-like red LED element-use openings 4008A, the bar-like green LED element-use openings 4008B and the bar-like blue LED element-use openings 4008C. However, the arraying and the application may be done, for example, in an order of arraying of the bar-like red LED elements 4006A, application of the conductive adhesive 4010 into the bar-like red LED element-use openings 4008A, arraying of the bar-like green LED elements 4006B, application of the conductive adhesive 4010 into the bar-like green LED element-use openings 4008B, arraying of the bar-like blue LED elements 4006C, and application of the conductive adhesive 4010 into the bar-like blue LED element-use openings 4008C, sequentially in this order.

In the twenty-fifth embodiment, three kinds of bar-like LED elements, i.e. the bar-like red LED elements 4006A, the bar-like green LED elements 4006B and the bar-like blue LED elements 4006C, are mounted on the insulative flexible board 4001. However, one kind of bar-like LED elements may be mounted. For example, on the insulative flexible board 4001, a plurality of bar-like blue LED elements 4006C only may be arrayed, or a plurality of bar-like LED elements for emitting light of colors other than red, green and blue may be arrayed.

Furthermore, four or more kinds of bar-like LED elements may be mounted on the insulative flexible board 4001. On the insulative flexible board 4001, for example, four kinds of bar-like LED elements, i.e. the bar-like red LED elements 4006A, the bar-like green LED elements 4006B, the bar-like blue LED elements 4006C, and bar-like yellow LED elements, may be mounted.

Twenty-Sixth Embodiment

Figure 92:
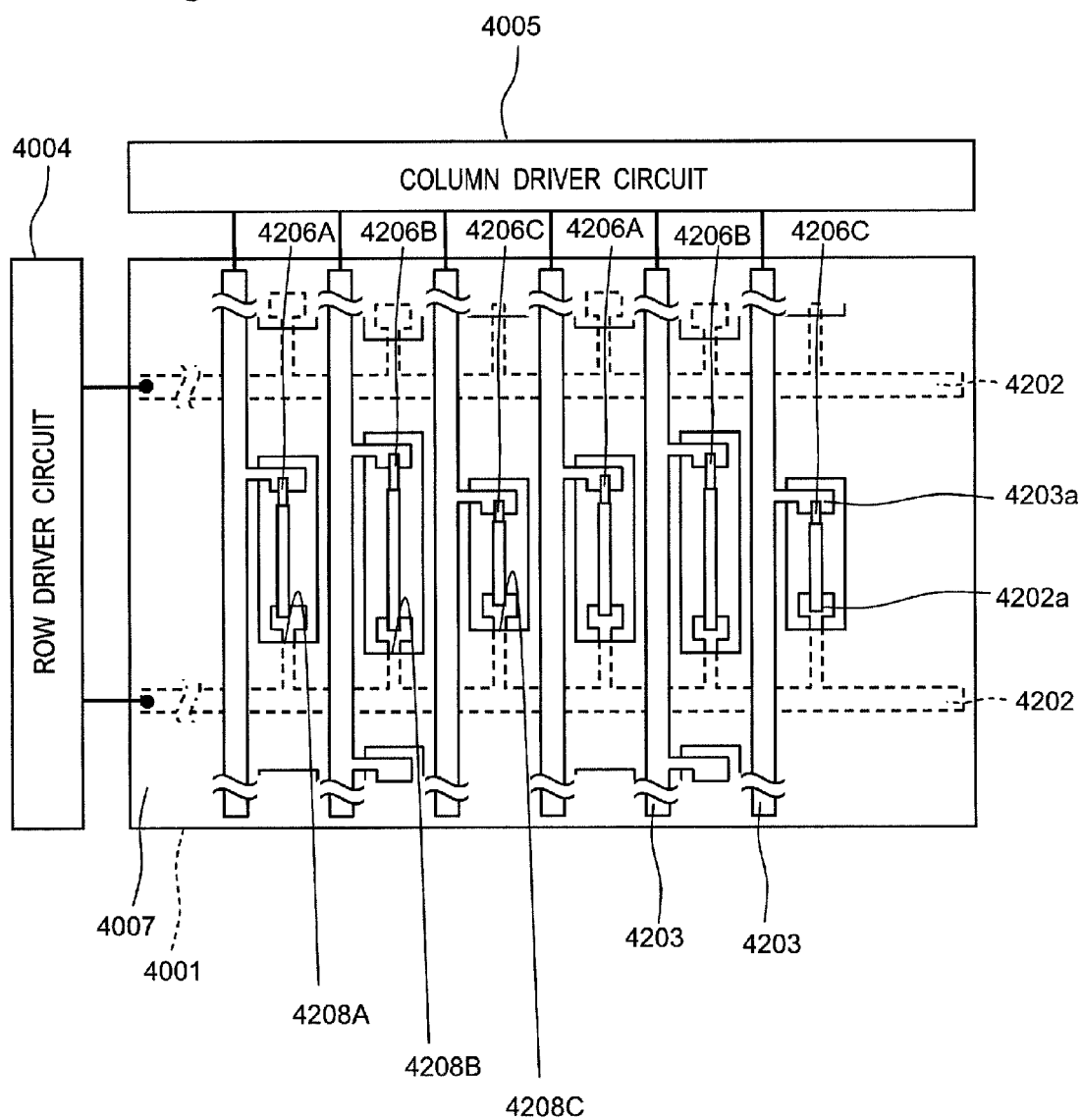
FIG. 92 is an outlined block diagram of a display device according to a twenty-sixth embodiment of the invention.

FIG. 92 is an outlined block diagram of a display device according to a twenty-sixth embodiment of the invention. In FIG. 92, component members of the same configurations and designations as in FIG. 86 are denoted by the same reference signs as in FIG. 86 and their description is omitted. In addition, the conductive adhesive 4010 on the terminal portions 4202a, 4203a is omitted in FIG. 92 as in FIG. 86.

The display device includes an insulating film 4207 in which a plurality of bar-like red LED element-use openings 4208A, 4208A, . . . , bar-like green LED element-use openings 4208B, 4208B, . . . , and bar-like blue LED element-use openings 4208C, 4208C, . . . , are formed.

Bar-like red LED elements 4206A are placed in the bar-like red LED element-use openings 4208A, bar-like green LED elements 4206B are placed in the bar-like green LED element-use openings 4208B, and bar-like blue LED elements 4206C are placed in the bar-like blue LED element-use openings 4208C. With respect to the bar-like red LED elements 4206A, the bar-like green LED elements 4206B and the bar-like blue LED elements 4206C, their one end portions are electrically connected directly to terminal portions 4202a of one of the plurality of row lines 4202, 4202, . . . while the other end portions are electrically connected directly to terminal portions 4203a of one of the plurality of column lines 4203, 4203, . . . . As a result of this, the row driver circuit 4004 and the column driver circuit 4005 are enabled to give a flow of electric current via the row lines 4202 and the column lines 4203 to the bar-like red LED elements 4206A, the bar-like green LED elements 4206B and the bar-like blue LED elements 4206C. Then, with a flow of electric current given to the bar-like red LED elements 4206A, the bar-like green LED elements 4206B and the bar-like blue LED elements 4206C, it follows that the bar-like red LED elements 4206A emit red light, the bar-like green LED elements 4206B emit green light, and the bar-like blue LED elements 4206C emit blue light.

Also with respect to the bar-like red LED elements 4206A, the bar-like green LED elements 4206B and the bar-like blue LED elements 4206C, although their length to width ratios are each within a range of 5 to 400, the lengths being each within a range of 0.5 µm to 200 µm, as in the twenty-fifth embodiment, yet this embodiment differs from the twenty-fifth embodiment in that individual light-emission areas of the bar-like red LED elements 4206A, the bar-like green LED elements 4206B and the bar-like blue LED elements 4206C are adjusted.

More specifically, individual light-emission areas of the bar-like red LED elements 4206A, the bar-like green LED elements 4206B and the bar-like blue LED elements 4206C are adjusted by growth time or the like in manufacturing process so that when a flow of an equal current is given to the bar-like red LED elements 4206A, the bar-like green LED elements 4206B and the bar-like blue LED elements 4206C, mixing of red emitted light of the bar-like red LED elements 4206A, green emitted light of the bar-like green LED elements 4206B, and blue emitted light of the bar-like blue LED elements 4206C allows white light to be obtained. In this case, since there is a relationship of emission intensity among the bar-like blue LED elements 4206C, the bar-like red LED elements 4206A, and the bar-like green LED elements 4206B, their emission intensities decreasing in this order, the manufacture of the bar-like red LED elements 4206A, the bar-like green LED elements 4206B and the bar-like blue LED elements 4206C is controlled so that the light-emission area of the bar-like red LED elements 4206A becomes larger than the light-emission area of the bar-like blue LED elements 4206C, and that the light-emission area of the bar-like green LED elements 4206B becomes larger than the light-emission area of the bar-like red LED elements 4206A.

In addition, the row lines 4202, the column lines 4203, and the insulating film 4207 differ from the row lines 4002, the column lines 4003, and the insulating film 4007 of the twenty-fifth embodiment only in their configurations.

According to the display device of this construction, when a flow of an equal current is given to the bar-like red LED elements 4206A, the bar-like green LED elements 4206B and the bar-like blue LED elements 4206C, mixing of red emitted light of the bar-like red LED elements 4206A, green emitted light of the bar-like green LED elements 4206B, and blue emitted light of the bar-like blue LED elements 4206C allows white light to be obtained.

Thus, since the control for obtaining white light is simple, the row driver circuit 4004 and the column driver circuit 4005 can be simplified in construction.

Also, since white light can be obtained even without giving a flow of excessive current to the bar-like green LED elements 4206B that are the lowest in emission intensity among the bar-like red LED elements 4206A, the bar-like green LED elements 4206B and the bar-like blue LED elements 4206C, it becomes possible to prevent the bar-like green LED elements 4206B from shortening in life.

Twenty-Seventh Embodiment

Figure 93:
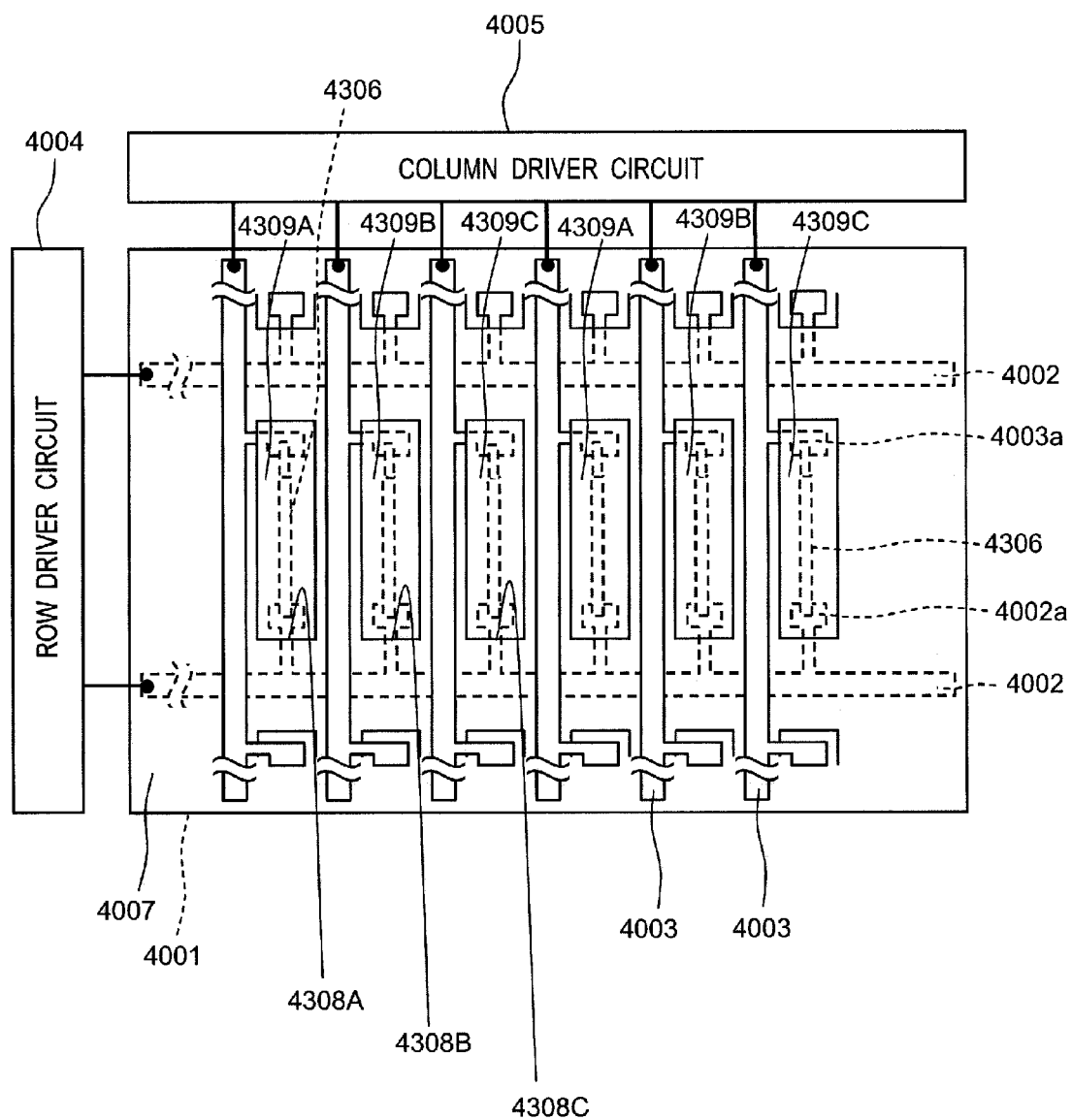
FIG. 93 is an outlined block diagram of a display device according to a twenty-seventh embodiment of the invention.

FIG. 93 is an outlined block diagram of a display device according to a twenty-seventh embodiment of the invention. In FIG. 93, component members of the same configurations and designations as in FIG. 86 are denoted by the same reference signs as in FIG. 86 and their description is omitted. In addition, the conductive adhesive 4010 on the terminal portions 4202a, 4203a is omitted in FIG. 93 as in FIG. 86.

The display device includes a plurality of bar-like LED elements 4306, 4306, . . . for emitting ultraviolet light. The bar-like LED elements 4306 are placed in a plurality of red phosphor-use openings 4308A, 4308A, . . . , green phosphor-use openings 4308B, 4308B, . . . , and blue phosphor-use openings 4308C, 4308C, . . . , respectively. In addition, the bar-like LED elements 4306 are an example of the light-emitting elements.

With respect to the plurality of bar-like LED elements 4306, 4306, . . . , their one end portions are electrically connected directly to terminal portions 4002a of one of the plurality of row lines 4002, 4002, . . . while the other end portions are electrically connected directly to terminal portions 4003a of one of the plurality of column lines 4003, 4003, . . . . As a result of this, the row driver circuit 4004 and the column driver circuit 4005 are enabled to give a flow of electric current via the row lines 4002 and the column lines 4003 to the bar-like LED elements 4306.

Also, as in the twenty-fifth embodiment, the bar-like LED elements 4306 each have a length to width ratio falling within a range of 5 to 400, and their lengths are within a range of 0.5 μm to 200 μm.

A red phosphor 4309A for, upon receiving ultraviolet light from the bar-like LED element 4306, emitting red light is placed in the red phosphor-use opening 4308A. This red phosphor 4309A is so formed as to cover the bar-like LED element 4306 placed in the red phosphor-use opening 4308A.

A green phosphor 4308B for, upon receiving ultraviolet light from the bar-like LED element 4306, emitting green light is placed in the green phosphor-use opening 4308B. This green phosphor 4309B is so formed as to cover the bar-like LED element 4306 placed in the green phosphor-use opening 4308B.

A blue phosphor 4309C for, upon receiving ultraviolet light from the bar-like LED element 4306, emitting blue light is placed in the blue phosphor-use opening 4308C. This blue phosphor 4309C is so formed as to cover the bar-like LED element 4306 placed in the blue phosphor-use opening 4308C.

Figure 94:
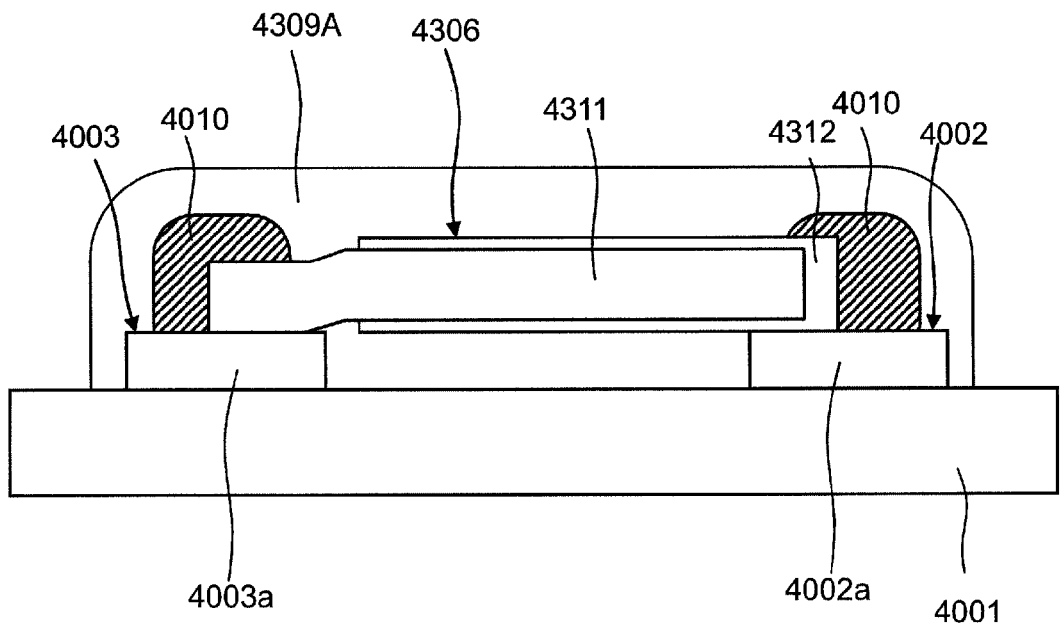
FIG. 94 is a schematic sectional view of main part of the display device of the twenty-seventh embodiment.
Figure 95:
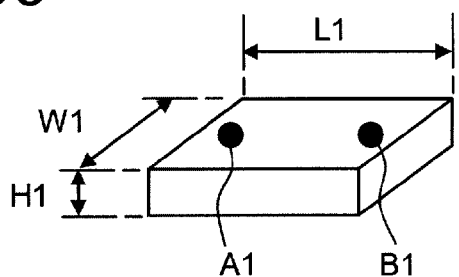
FIG. 95 is a view for explaining one functional effect of the display device of the invention.
Figure 96:
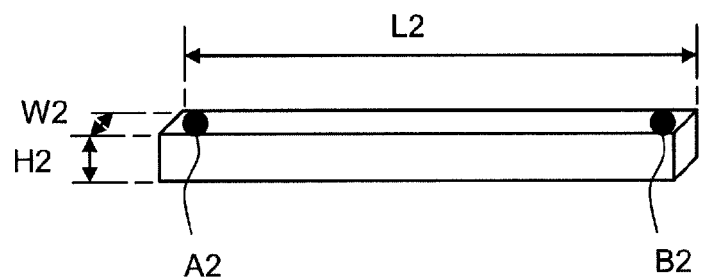
FIG. 96 is a view for explaining one functional effect of the display device of the invention.

FIG. 94 is a schematic sectional view of main part of the display device.

Each of the bar-like LED elements 4306 includes a bar-like n-type InGaN (indium gallium nitride) semiconductor core 4311 having a generally circular-shaped cross section, and a p-type InGaN semiconductor shell 4312 formed so as to coaxially cover part of an outer peripheral surface of the semiconductor core 4311. It is noted that the semiconductor core 4311 is an example of the first-conductive-type semiconductor, and the semiconductor shell 4312 is an example of the second-conductive-type semiconductor.

One-end-side outer peripheral surface and end face of the semiconductor core 4311 are covered with the semiconductor shell 4312, while the other-end-side outer peripheral surface and end face of the semiconductor core 4311 are exposed.

The semiconductor shell 4312 has a bottomed cylindrical shape, and a center axis of the semiconductor shell 4312 is coincident with a center axis of the semiconductor shell 4312 side end portion of the semiconductor core 4311.

Also, one end portions of the bar-like LED elements 4306 are fixed to the terminal portions 4002a of the row lines 4002 with the conductive adhesive 4010, while the other end portions of the bar-like LED elements 4306 are fixed to the terminal portions 4003a of the column lines 4003 with the conductive adhesive 4010. By this fixation, a one-side end-portion center axis of the bar-like LED element 4306 on the side on which the semiconductor core 4311 is exposed is positioned closer to the insulative flexible board 4001 than a one-side end-portion center axis of the bar-like LED element 4306 on the side on which the semiconductor core 4311 is not exposed.

In addition, the red phosphor-use openings 4308A, the green phosphor-use openings 4308B and the blue phosphor-use openings 4308C in FIG. 93 are similar in configuration to and different in designation from the bar-like red LED element-use openings 4008A, the bar-like green LED element-use openings 4008B and the bar-like blue LED element-use openings 4008C of the twenty-fifth embodiment.

Now, a manufacturing method for the display device described above is explained below.

First, by the same method as in the twenty-fifth embodiment, on the insulative flexible board 4001, a plurality of row lines 4002, 4002, . . . , a plurality of column lines 4003, 4003, . . . and an insulating film 4007 are formed, and thereafter a plurality of bar-like LED elements 4306 are arrayed and fixed. As a result of this, one end portions of the bar-like LED elements 4306 are electrically connected directly to terminal portions 4002a of the row lines 4002, while the other end portions of the bar-like LED elements 4306 are electrically connected directly to terminal portions 4003a of the column lines 4003.

Next, a red phosphor 4309A is formed in the red phosphor-use openings 4308A by ink jet process or the like so that ultraviolet light by the bar-like LED elements 4306 in the red phosphor-use openings 4308A goes incident on the red phosphor 4309A.

Next, a green phosphor 4309B is formed in the green phosphor-use openings 4308B by ink jet process or the like so that ultraviolet light by the bar-like LED elements 4306 in the green phosphor-use openings 4308B goes incident on the green phosphor 4309B.

Next, a blue phosphor 4309C is formed in the blue phosphor-use openings 4308C by ink jet process or the like so that ultraviolet light by the bar-like LED elements 4306 in the blue phosphor-use openings 4308C goes incident on the blue phosphor 4309C.

After the IPA solution containing a plurality of bar-like LED elements 4306 is thinly applied as shown above as in the twenty-fifth embodiment, a reference voltage is applied to the terminal portions 4002a of the row lines 4002 while an AC voltage having a specified amplitude is applied to the terminal portions 4003a of the column lines 4003. By doing so, the arraying of a plurality of bar-like LED elements 4306 can be achieved at one time. Therefore, the work for arraying the plurality of bar-like LED elements 4306 one by one is no longer necessary, and a wire bonding step is also unnecessary. Thus, the manufacturing process can be simplified and the manufacturing cost can be cut down.

Further, by the formation of the red phosphor 4309A, the green phosphor 4309B and the blue phosphor 4309C, full-color display can be implemented only with light-emitting elements for emitting ultraviolet light.

In the twenty-seventh embodiment, the red phosphor, the green phosphor, and the blue phosphor are formed in this order. However, those may be formed in an order of, for example, green phosphor to red phosphor to blue phosphor, or an order of blue phosphor to green phosphor to red phosphor, or the like. That is, the formation order for the red phosphor, the green phosphor, and the blue phosphor is not limited to the twenty-seventh embodiment.

Also in the twenty-seventh embodiment, light-emission areas of the individual bar-like LED elements may be adjusted so that when a flow of an equal current is given to a plurality of bar-like LED elements, mixing of red emitted light by the red phosphor, green emitted light by the green phosphor, and blue emitted light by the blue phosphor allows white light to be obtained, as in the twenty-sixth embodiment.

In the foregoing twenty-fifth to twenty-seventh embodiments, it is also possible that an AC voltage is applied to the row lines and the column lines to fulfill light emission of bar-like red LED elements and the like. Even if exposure-side end portions of the semiconductor cores are not uniform, uniform light emission of the bar-like red LED elements and the like can be achieved.

In the twenty-fifth to twenty-seventh embodiments, display devices using LED elements as an example of light-emitting elements, as well as manufacturing methods therefor, have been described. However, the invention may be applied to display devices, as well as manufacturing methods therefor, in which semiconductor lasers, organic ELs (Electro Luminescences), inorganic ELs (intrinsic ELs), or the like are used as light-emitting elements.

In the twenty-fifth to twenty-seventh embodiments, semiconductors whose base materials are GaAs, GaP, GaN or InGaN are used for the semiconductor core and the semiconductor shell. However, semiconductors whose base materials are AlGaAs, GaAsP, InGaN, AlGaN, ZnSe, AlGaInP or the like may also be used.

Although the semiconductor core is set to n-type and the semiconductor shell is set to p-type in the twenty-fifth to twenty-seventh embodiments, yet it is also allowable that the semiconductor core is set to p-type and the semiconductor shell is set to n-type. Also, although light-emitting elements having a generally cylindrical-shaped semiconductor core have been described, yet the semiconductor core without being limited to this may be formed into a bar-like shape having an elliptical cross section or a bar-like shape having a triangular or hexagonal or other polygonal cross section.

Although the semiconductor shell covers one end face of the semiconductor core in the twenty-fifth to twenty-seventh embodiments, yet it is also allowable that the semiconductor shell does not cover one end face of the semiconductor core, i.e., axial both end faces of the semiconductor core are exposed.

In the twenty-fifth to twenty-seventh embodiments, there is a step gap between the exposure-side end-portion peripheral surface of the semiconductor core and the peripheral surface of the semiconductor shell. However, it is also allowable that the exposure-side end-portion peripheral surface of the semiconductor core adjoins the peripheral surface of the semiconductor shell without any step gap. That is, the exposure-side end-portion peripheral surface of the semiconductor core may be generally flush with the peripheral surface of the semiconductor shell.

In the twenty-fifth to twenty-seventh embodiments, it is also allowable that that a quantum well layer is interposed between the semiconductor core and the semiconductor shell.

In the twenty-fifth to twenty-seventh embodiments, the column lines are formed so as to extend in directions orthogonal to extending directions of the row lines. However, the column lines may also be formed so as to extend in directions crossing at acute angles or obtuse angles with the extending directions of the row lines.

As described hereinabove, the twenty-fifth to twenty-seventh embodiments, as well as their modifications, of the invention have been explained. However, without being limited to the twenty-fifth to twenty-seventh embodiments as well as their modifications, various changes and modifications may be made in embodiment of the invention without departing the scope of the invention. For example, one embodiment of the invention may be provided by an appropriate combination among constitutions of the twenty-fifth to twenty-seventh embodiments as well as their modifications.

Twenty-Eighth Embodiment

Figure 97:
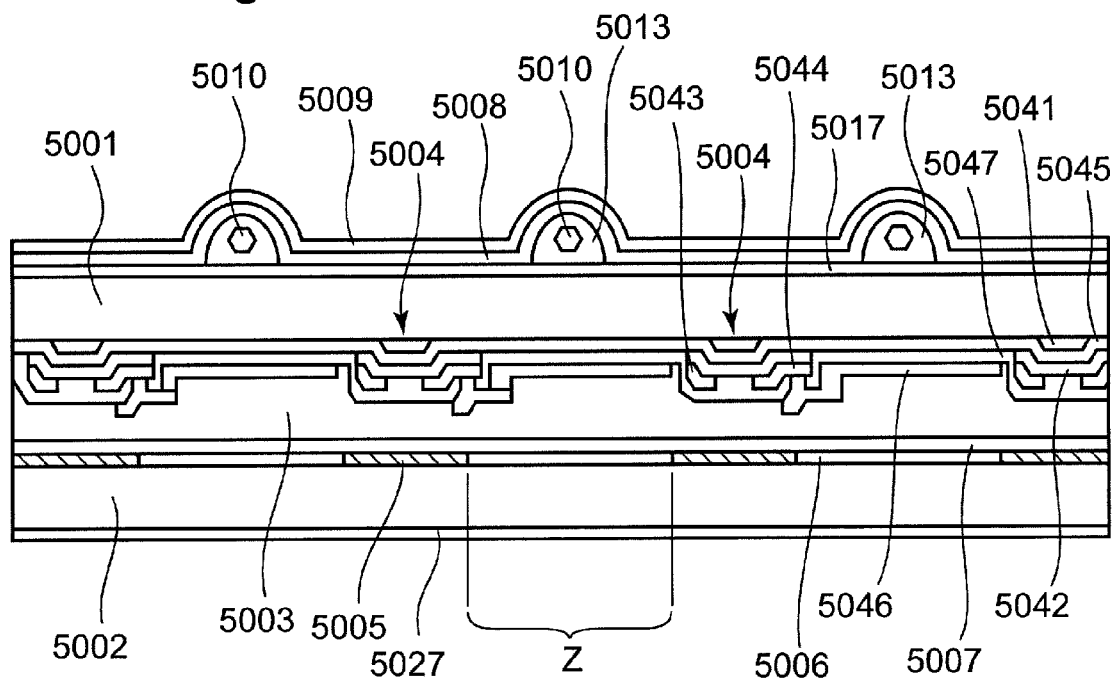
FIG. 97 is a simplified sectional view showing a liquid-crystal display device according to a twenty-eighth embodiment of the invention.

FIG. 97 is a sectional view of an LCD (Liquid-Crystal Display) device according to a twenty-eighth embodiment of the invention. As shown in FIG. 97, this LCD device has a light-pervious first substrate 5001, and a light-pervious second substrate 5002. The first substrate 5001 and the second substrate 5002 are placed in parallel and opposition to each other, and liquid crystals 5003 are filled between the two substrates 5001, 5002. The first substrate 5001, the second substrate 5002 and the liquid crystals 5003 constitute a liquid-crystal panel.

Thin film transistors (hereinafter, referred to as TFTs) 5004 as switching elements are provided on a liquid crystal 5003 side (lower side) surface of the first substrate 5001. That is, the first substrate 5001 is a TFT substrate.

Each of the TFTs 5004 has a gate electrode 5041, a semiconductor film 5042 (made from amorphous silicon etc.), a source electrode 5043 and a drain electrode 5044 which are placed in this order as listed from the first substrate 5001 side. A gate insulator 5045 made from silicon nitride or the like is provided between the gate electrode 5041 and the semiconductor film 5042. The source electrode 5043 and the drain electrode 5044 are formed on both sides, respectively, of the semiconductor film 5042 under the gate electrode 5041 so as to be apart from each other. The drain electrode 5044 is connected to a pixel electrode 5046 via a contact hole.

The TFTs 5004 are on/off controlled by a scan signal voltage fed from the gate electrode 5041. Also, a pixel display signal voltage fed from the source electrode 5043 is fed to the pixel electrode 5046 via the drain electrode 5044.

The TFTs 5004 are covered with an insulating film 5047 formed on the lower side of the gate insulator 5045. This insulating film 5047, which is made from photoconductive resin, is placed between the source electrode 5043 and the pixel electrode 5046 so as to insulate those electrodes from each other. The pixel electrode 5046 is formed in a matrix array for each pixel area. The pixel electrode 5046 is formed from a transparent electrical conductor such as ITO (indium-tin oxide). An unshown orientation film is formed on the lower side of the pixel electrode 5046, so that the liquid crystals 5003 are orientationally restricted to a specified orientation by the orientation film.

On one side (upper side) surface of the first substrate 5001 on the side opposite to the liquid crystal 5003 side, light-emitting elements 5010 are placed via a first polarization film 5017. A transparent protective film 5008 is stacked on the light-emitting elements 5010, and a reflection film 5009 is stacked on the protective film 5008.

The reflection film 5009 reflects light emitted from the light-emitting elements 5010 toward the first substrate 5001 side. By this reflection film 5009, light applied from the light-emitting elements 5010 toward one side of the first substrate 5001 opposite to the liquid crystal 5003 side can be reflected efficiently toward the liquid crystals 5003. Thus, the light emitted from the light-emitting elements 5010 can be utilized with high efficiency.

The light-emitting elements 5010 are, for example, blue LED light-emitting elements, and these light-emitting elements 5010 are overlaid with a phosphor 5013 that emits yellow fluorescence, thereby constituting a white backlight part. The protective film 5008 is formed from resin as an example, and the reflection film 5009 is formed from aluminum as an example.

The light-emitting elements 5010 are bar-like structure light-emitting elements, and placed on the first substrate 5001 so that an axis of each light-emitting element 5010 becomes generally parallel to the upper surface of the first substrate 5001.

Figure 98:
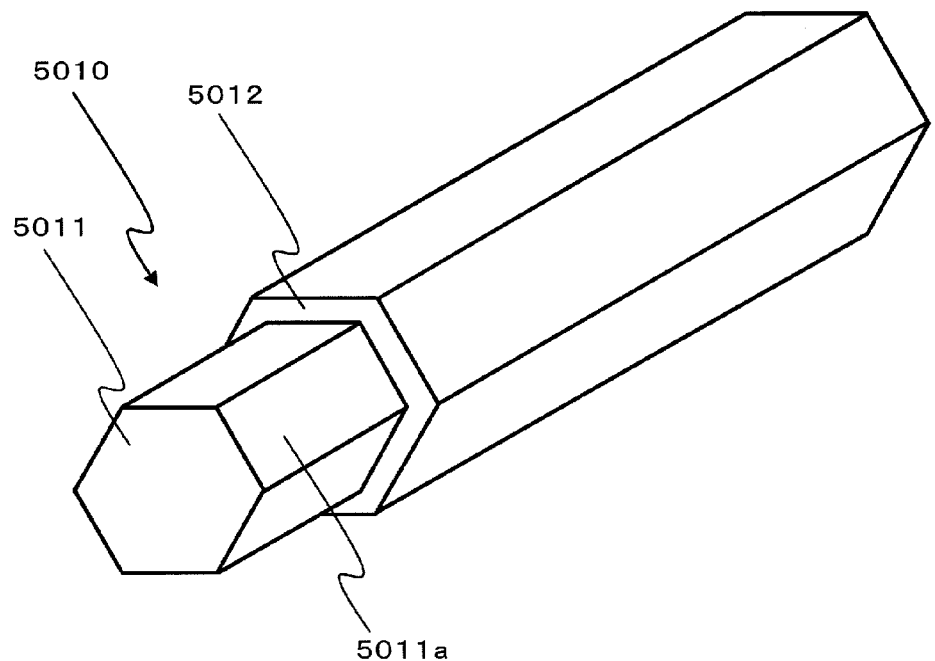
FIG. 98 is a perspective view of a light-emitting element.

As shown in FIG. 98, the light-emitting element 5010 has a bar-like first-conductive-type semiconductor core 5011, and a second-conductive-type semiconductor layer 5012 formed so as to cover the semiconductor core 5011. The semiconductor core 5011 is made of n-type GaN and formed into a bar-like shape having a hexagonal cross section. The semiconductor layer 5012 is made of p-type GaN. The semiconductor core 5011 has an exposure portion 5011*a* formed so that a one-end-side outer peripheral surface is exposed there. The other-end-side end face of the semiconductor core 5011 is covered with the semiconductor layer 5012.

An n-side electrode (second electrode 5052 in FIG. 103) is connected to the exposure portion 5011*a* of the semiconductor core 5011 while a p-side electrode (first electrode 5051 in FIG. 103) is connected to the semiconductor layer 5012. Given a flow of electric current from the p-side electrode to the n-side electrode to cause recombination of electrons and holes at a pn junction between the outer peripheral surface of the semiconductor core 5011 and the inner peripheral surface of the semiconductor layer 5012, light is emitted from the pn junction. In this light-emitting element 5010, since light is emitted from the entire periphery of the semiconductor core 5011 covered with the semiconductor layer 5012, the light-emission area becomes wider, so that the luminous efficacy becomes higher.

It is noted here that the light-emitting element 5010 refers to a device or element which has a micrometer-order size, e.g. a diameter of 1 μm and a length of 10 μm to 30 μm, or such a nanometer-order size that at least its diameter, out of its diameter or length, is less than 1 μm.

Light emitted from each light-emitting element 5010 is irradiated over 360-degree directions about the axis of the light-emitting element 5010. Therefore, in the step for placing the light-emitting elements 5010 on the first substrate 5001, there is no need for controlling the rotational direction about the axis. Thus, the arraying of the light-emitting elements 5010 becomes easily achievable.

Also, since the light-emitting element 5010 is a bar-like structure light-emitting element, a larger light-emission area per volume of the light-emitting element 5010 can be obtained. Therefore, the size of the light-emitting element 5010 to obtain a specified light quantity can be made smaller, so that the material cost for the light-emitting element 5010 can be cut down. Thus, the cost for the LCD device can be cut down.

Now, a manufacturing method for the light-emitting element 5010 is explained below. In this embodiment, Si-doped n-type GaN and Mg-doped p-type GaN are used, but impurities for doping to GaN are not limited to these.

Figure 99A:
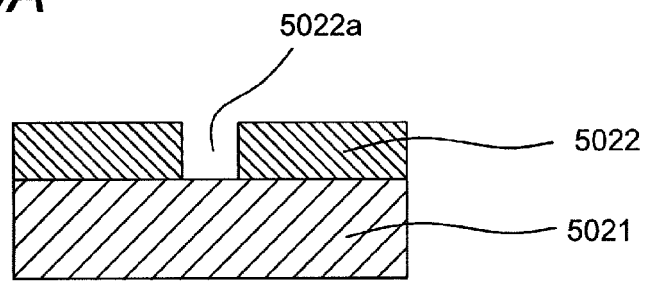
FIG. 99A is a sectional view showing a first step of a light-emitting element manufacturing method.

First, as shown in FIG. 99A, a mask 5022 having growth holes 5022*a* is formed on an n-type GaN substrate 5021. For the mask 5022, a material, such as silicon oxide ($SiO_2$) or silicon nitride ($Si_3N_4$), that can selectively be etched for the semiconductor core and the semiconductor layer may be used. For formation of the growth holes 5022*a*, known lithography process and dry etching process to be used for normal semiconductor processes may be used. In this case, the diameter of the grown semiconductor core depends on the size of the growth holes 5022*a* of the mask 5022.

Figure 99B:
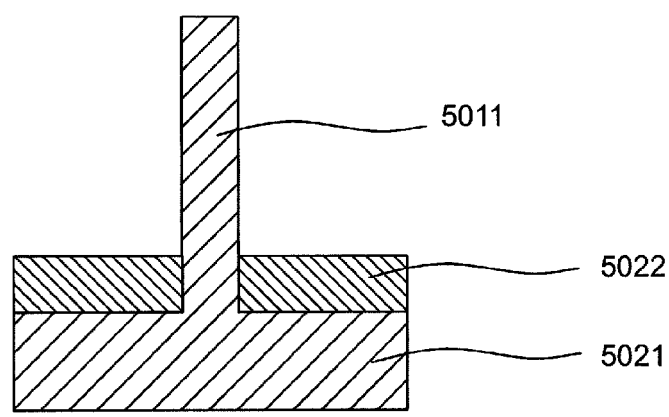

Subsequently, as shown in FIG. 99B, in a semiconductor core formation step, n-type GaN is crystal grown by using an MOCVD (Metal Organic Chemical Vapor Deposition) apparatus so that bar-like semiconductor cores 5011 are formed on the substrate 5021 exposed by the growth holes 5022*a* of the mask 5022. With a growth temperature set to about 950° C. and with trimethylgallium (TMG) and ammonia ($NH_3$) used as growth gases, silane ($SiH_4$) is fed as an n-type impurity and hydrogen ($H_2$) is fed as a carrier gas, by which a Si-doped n-type GaN semiconductor core can be grown. In this case, the n-type GaN, showing hexagonal system crystal growth, is grown while a vertical direction to the substrate 5021 surface is set as an axis direction, so that a hexagonal cylinder-shaped semiconductor core can be obtained.

Figure 99C:
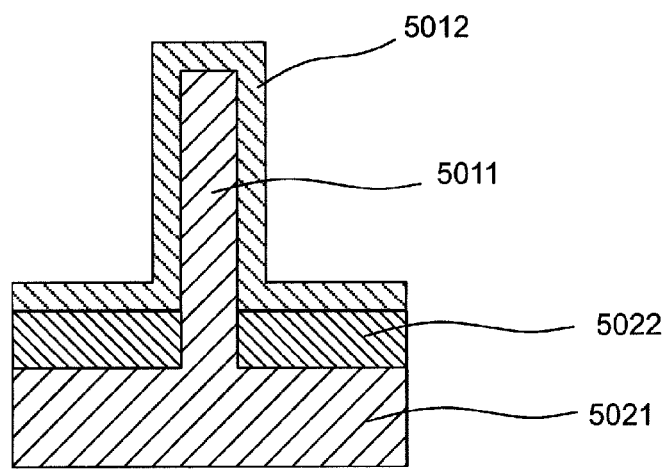

Subsequently, in a semiconductor layer formation step, a semiconductor layer 5012 made of p-type GaN is formed all over the mask 5022 so as to cover the bar-like semiconductor core 5011 as shown in FIG. 99C. With a formation temperature set to about 960° C., trimethylgallium (TMG) and ammonia ($NH_3$) are used as growth gases while biscyclopentadienyl magnesium ($Cp_2Mg$) is used for feed of p-type impurity, so that magnesium (Mg)-doped p-type GaN can be grown.

Figure 99D:
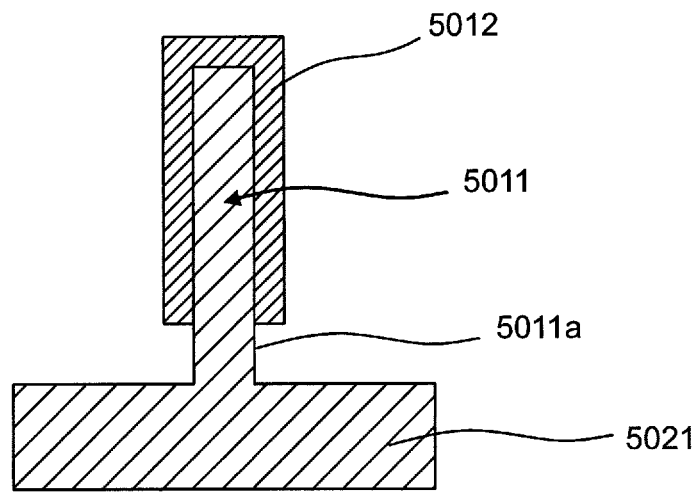

Subsequently, in an exposure step, regions other than parts of the semiconductor layer 5012 covering the semiconductor core 5011 as well as the mask 5022 are removed by lift-off as shown in FIG. 99D, so that a substrate-side outer peripheral surface of the bar-like semiconductor core 5011 is exposed toward the substrate 5021 side, thereby forming an exposure portion 5011*a*. In this state, the other-side end portion of the semiconductor core 5011 opposite to the substrate 5021 side is covered with the semiconductor layer 5012.

With the mask 5022 formed of silicon oxide ($SiO_2$) or silicon nitride ($Si_3N_4$), use of a solution containing hydrofluoric acid (HF) makes it possible to easily achieve etching of the mask 5022 without affecting the semiconductor core 5011 and the semiconductor layer 5012 part covering the semiconductor core 5011, so that regions other than part of the semiconductor layer 5012 covering the semiconductor core 5011 can be removed together with the mask 5022 by lift-off. Although lift-off is used in the exposure step of this embodiment, part of the semiconductor core 5011 may also be exposed by etching. In the case of dry etching, using $CF_4$ or $XeF_2$ makes it possible to easily achieve etching of the mask 5022 without affecting the semiconductor core 5011 and the semiconductor layer 5012 part covering the semiconductor core 5011, so that regions other than part of the semiconductor layer 5012 covering the semiconductor core can be removed together with the mask 5022.

Figure 99E:
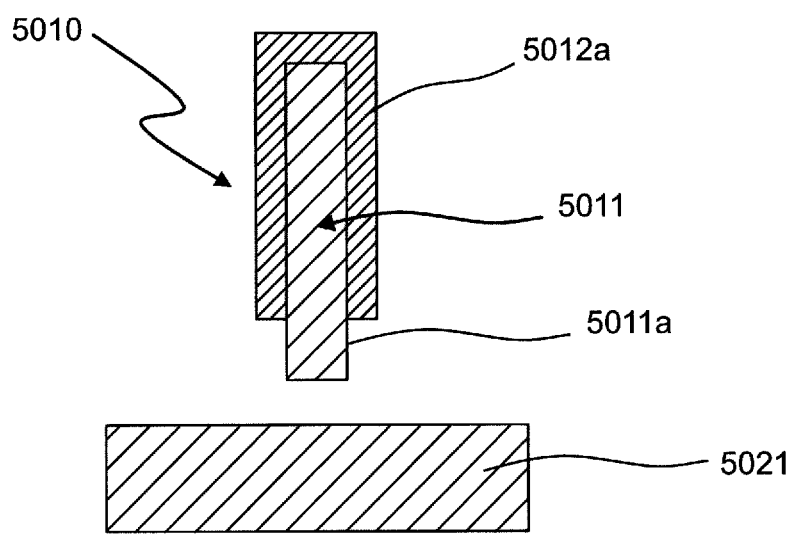

Subsequently, in a cut-off step, the substrate is immersed in an isopropyl alcohol (IPA) solution, and the substrate 5021 is vibrated along the substrate plane by using ultrasonic waves (e.g., several 10 kHz). As a result, stress acts on the semiconductor core 5011, which is covered with the semiconductor layer 5012, so as to bend a near-substrate 5021 side foot portion of the semiconductor core 5011, which is erectly provided on the substrate 5021, so that the semiconductor core 5011 covered with the semiconductor layer 5012 is cut, off from the substrate 5021 as shown in FIG. 99E.

Thus, a fine bar-like structure light-emitting element 5010 cut off from the substrate 5021 can be manufactured. For example, a light-emitting element 5010 having a diameter of 1 μm and a length of 10 μm can be manufactured.

As shown in FIG. 97, a black matrix 5005 and a colored layer 5006 are provided on a liquid crystal 5003 side (upper side) surface of the second substrate 5002. That is, the second substrate 5002 is a color filter substrate.

The black matrix 5005 intercepts light emitted from the light-emitting elements 5010. Regions of the first substrate 5001 where the TFTs 5004 are formed are shielded from light by the black matrix 5005.

The colored layer 5006 is colored to any one of red, green and blue colors. For each pixel, a colored layer 5006 of any one of red, green and blue colors is formed. In this embodiment, red, green and blue colored layers 5006 are repeatedly arrayed horizontally in succession.

A counter electrode 5007 common to the pixels is formed on the colored layer 5006. This counter electrode 5007 is formed also from transparent electrical conductor such as ITO. Further, an unshown orientation film is formed on the upper side of the counter electrode 5007, so that the liquid crystals 5003 are orientationally restricted to a specified orientation by the orientation film. A second polarization film 5027 is provided on the lower-side surface of the second substrate 5002.

Light-passing regions Z through which light emitted from the light-emitting elements 5010 passes are provided in the second substrate 5002. These light-passing regions Z correspond to regions except the black matrix 5005, i.e., regions of the colored layer 5006. Then, light emitted from the light-emitting elements 5010 is emitted outside from the second polarization film 5027 via the light-passing regions Z.

The light-emitting elements 5010 are placed at positions overlapping with the light-passing regions Z as viewed in directions orthogonal to the upper surface of the first substrate 5001, and each light-emitting element 5010 is smaller than the light-passing region Z. Therefore, light emitted from the light-emitting elements 5010 can be utilized with high efficiency. That is, since no light-emitting elements 5010 are placed at positions that do not overlap with the light-passing regions Z, irradiation of light that does not contribute to display can be suppressed, allowing a reduction of power consumption to be achieved.

Also, one light-emitting element 5010 or a plurality of light-emitting elements 5010 can be placed for each one light-passing region Z, and the light-emitting elements 5010 and the light-passing regions Z can be kept in an identical positional relation. Therefore, light in the backlight part constituted by the light-emitting elements 5010 is constant among pixels, free from occurrence of brightness variations. In contrast to this, in conventional backlight devices, the number of light-emitting elements 5010 is, in general, small against the number of pixels of the liquid-crystal panel. Therefore, the positional relation between the light-emitting elements 5010 and the pixels differs among pixels, causing the intensity of light derived from the light-emitting elements 5010 to differ among pixels, with occurrence of brightness variations involved in light of the backlight.

Also, since the light-emitting elements 5010 are formed on the same substrate as the first substrate 5001 for forming the liquid-crystal panel thereon, the light-emitting elements can be placed with high controllability in accordance with the light-passing regions Z. That is, alignment between the light-passing regions Z and the light-emitting elements 5010 can be fulfilled with high controllability.

Next, a manufacturing method for the LCD device of the above-described construction is explained below.

First, in a first step, a liquid-crystal panel is fabricated, for example, by commonly known ordinary process as disclosed in JP 2008-304538 A applied by the present applicant. Details of the process are the same as in JP 2008-304538 A and so omitted in description.

That is, as shown in FIG. 97, a gate electrode 5041, a gate insulator 5045, a semiconductor film 5042, a source electrode 5043, a drain electrode 5044, an insulating film 5047 and pixel electrodes 5046 are formed on the first substrate 5001, by which TFTs 5004 are formed. A black matrix 5005, a colored layer 5006 and a counter electrode 5007 are formed on a second substrate 5002. Then, the first substrate 5001 and the second substrate 5002 are laid on each other, and liquid crystals 5003 are injected to between the first substrate 5001 and the second substrate 5002. A first polarization film 5017 is formed on a one-side surface of the first substrate 5001 opposite to the liquid crystal 5003 side surface, and a second polarization film 5027 is formed on a one-side surface of the second substrate 5002 opposite to the liquid crystal 5003 side surface. Thus, a liquid-crystal panel is made up.

Thereafter, in a second step, a backlight part is formed on the first substrate 5001 of the liquid-crystal panel.

Figure 100:
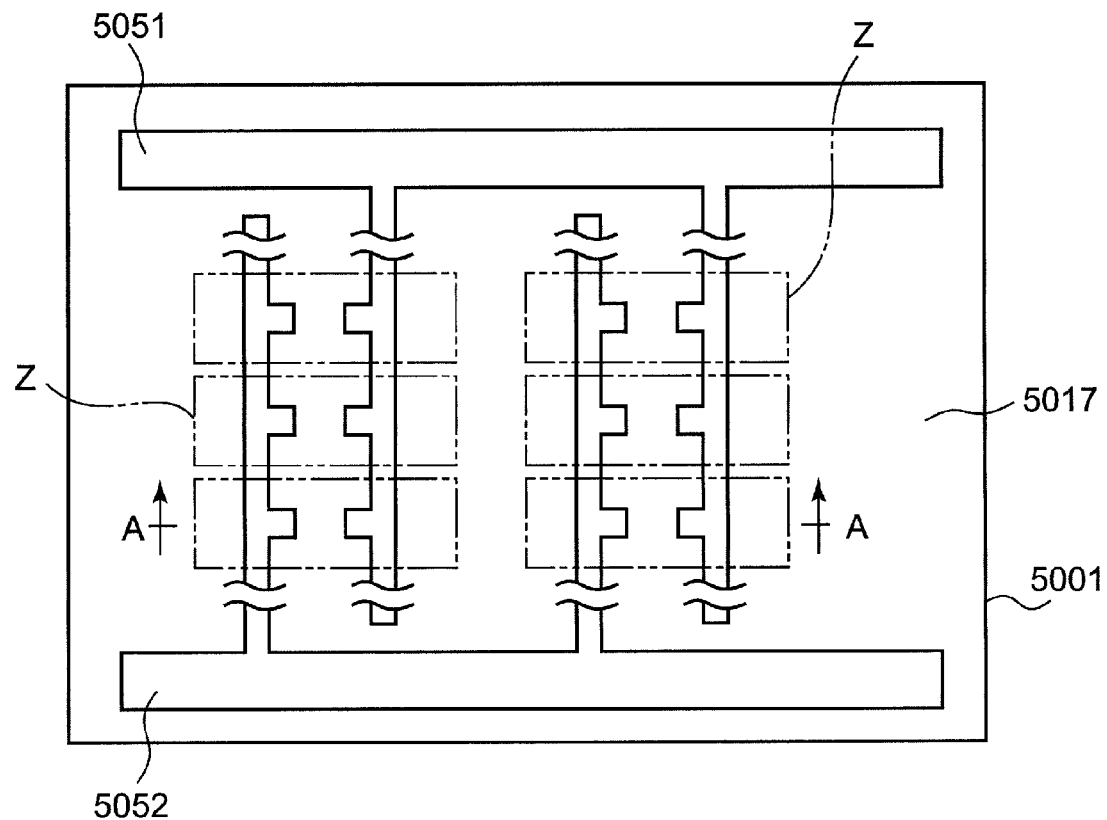

That is, as shown in FIG. 100, a first electrode 5051 and a second electrode 5052 are formed on the first polarization film 5017 formed on the first substrate 5001. The first electrode 5051 and the second electrode 5052 are so formed that the distance between the first electrode 5051 and the second electrode 5052 becomes shorter at places corresponding to the light-passing regions Z of the liquid-crystal panel. By doing so, it becomes possible that in the following step (step for placement of the light-emitting elements 5010), when the AC voltage is applied to between the first electrode 5051 and the second electrode 5052, the light-emitting elements 5010 can be placed only at portions of the shorter distance between the electrodes.

Figure 101:
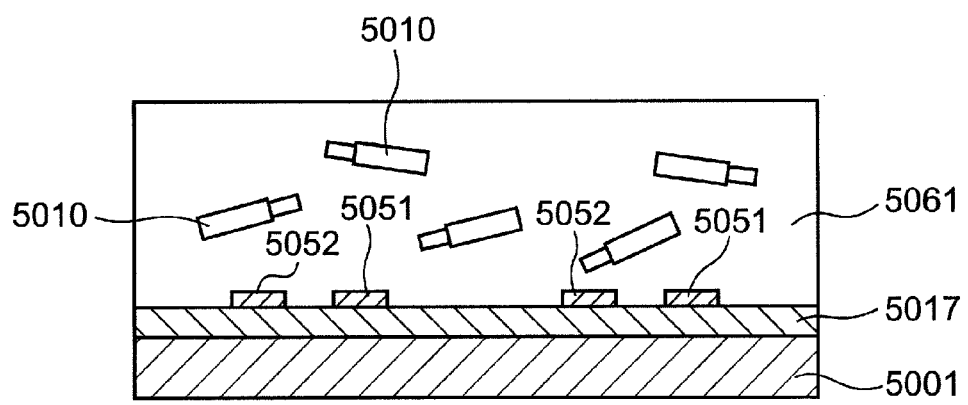
Figure 102:
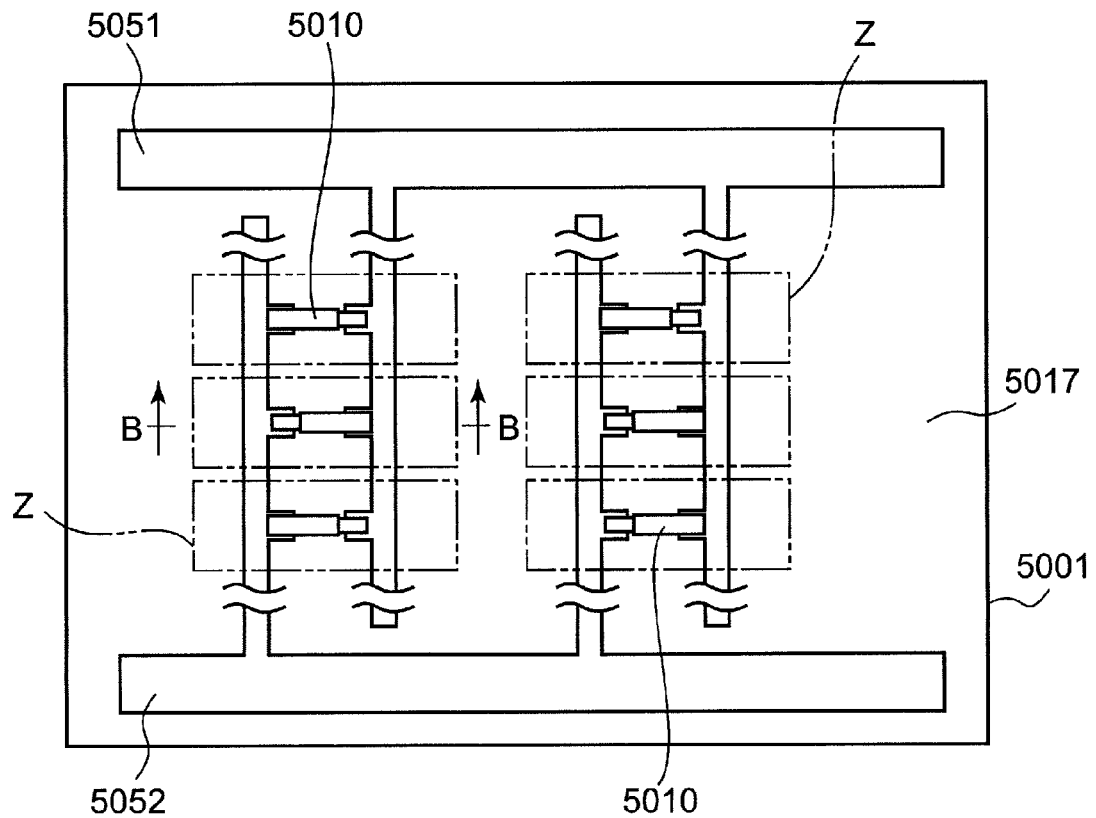

Then, by the method disclosed in JP 2008-260073 A applied by the present applicant, the light-emitting elements 5010 are arrayed to the electrodes 5051, 5052. That is, as shown in FIG. 101, the light-emitting elements 5010 fabricated by the method shown in FIGS. 99A to 99E are contained in isopropyl alcohol 5061, and the isopropyl alcohol 5061 containing the light-emitting elements 5010 is thinly applied onto the first polarization film 5017. Then, an AC voltage is applied to between the first electrode 5051 and the second electrode 5052, so that the light-emitting elements 5010 are arrayed as shown in FIG. 102. It is noted that details are similar to those of JP 2008-260073 A and so omitted.

Figure 103:
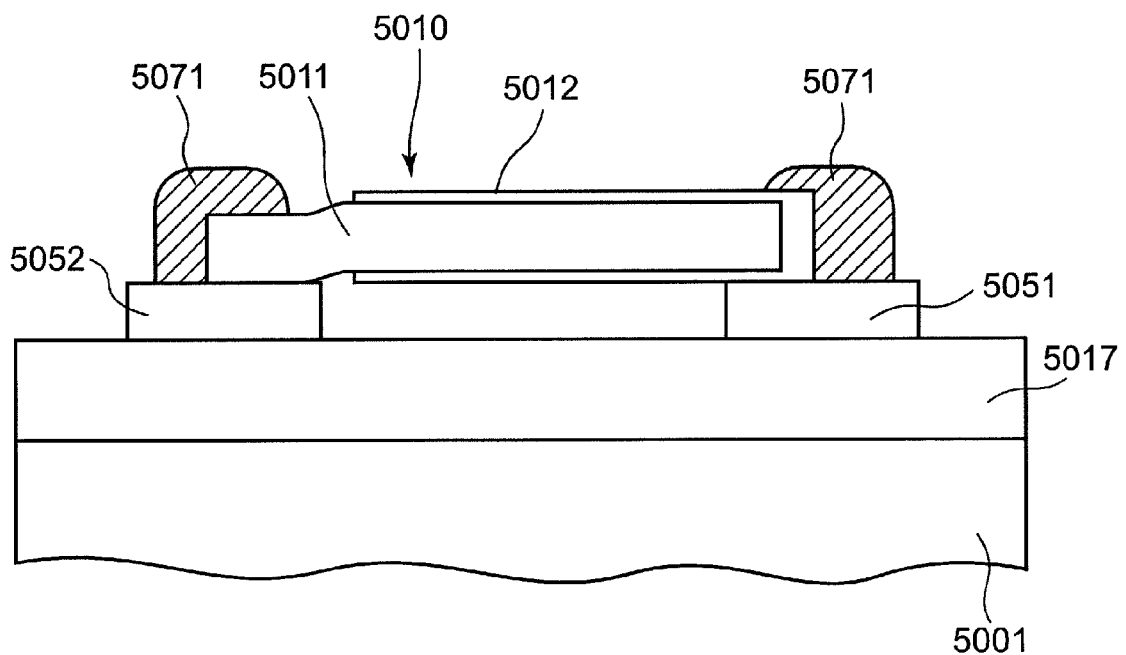

Thereafter, as shown in FIG. 103, both end portions of the arrayed light-emitting elements 5010 are connected to the first electrode 5051 and the second electrode 5052. In this process, the light-emitting elements 5010 are fixed to the electrodes 5051, 5052 by electrically conductive adhesive 5071.

In this case, the light-emitting elements 5010 are driven by application of an AC voltage to between the first electrode 5051 and the second electrode 5052. Therefore, even if the light-emitting elements 5010 are nonuniform in polarity in relation to the electrodes 5051, 5052, it is possible for a plurality of light-emitting elements 5010 to fulfill uniform light emission. Thus, there is no need for performing control for polarity uniformization of the light-emitting elements 5010, so that the manufacturing process can be prevented from being complicated.

Figure 104:
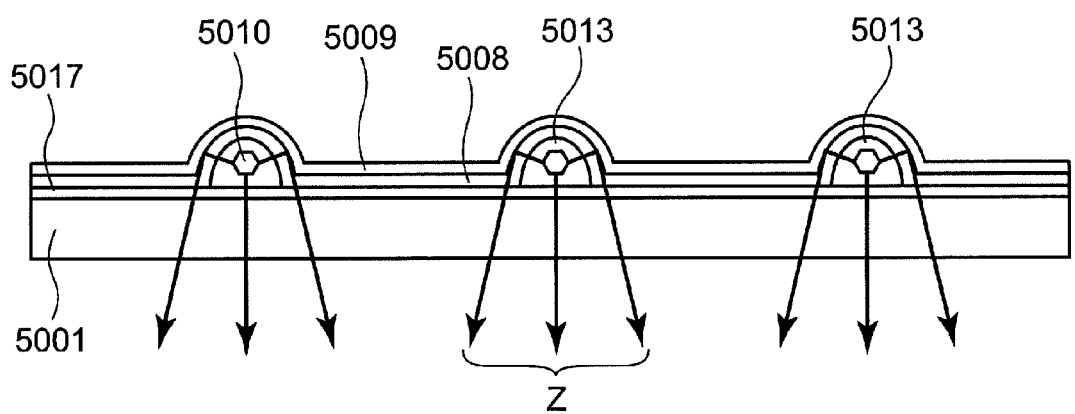

Thereafter, as shown in FIG. 104, a phosphor 5013 is formed on the light-emitting elements 5010 by an ink jet method or the like. A thickness of this phosphor 5013 is about 10 um to 200 um as an example. The phosphor 5013 is colored, for example, into yellow to form a white backlight part in combination with light-emitting elements 5010 that performs blue light emission.

Figure 105:
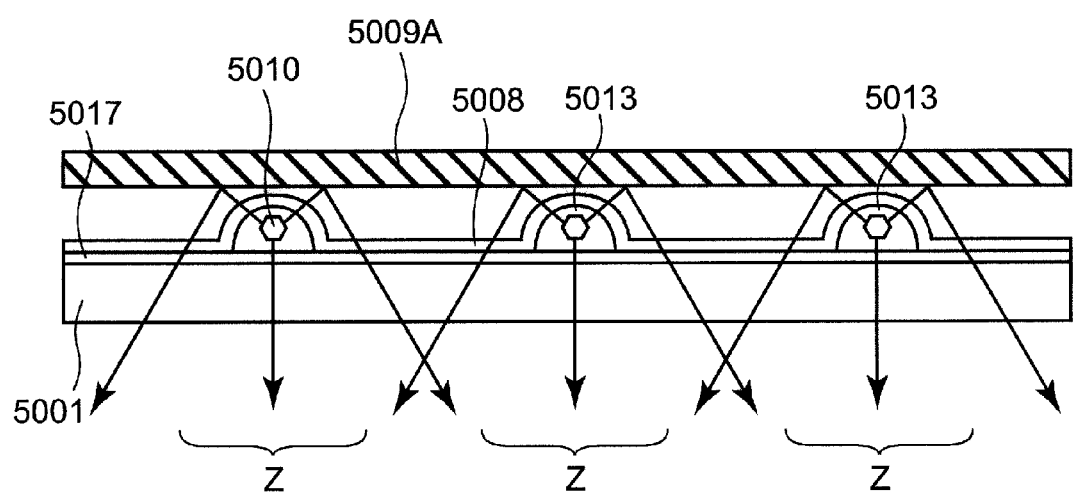

Thereafter, as shown in FIG. 104, a transparent protective film 5008 made from resin or the like is formed, and a reflection film 5009 made from aluminum or the like is stacked on the protective film 5008. Adjusting film thickness and configuration of this protective film 5008 makes it possible to fulfill light irradiation to the light-passing regions Z without waste as indicated by optical paths of arrows. In this connection, as a comparative example, given that a protective film 5009A is not stacked on the protective film 5008 but formed into a plate shape parallel to the first substrate 5001 as shown in FIG. 105, it becomes difficult to gather light emitted from the light-emitting elements 5010 to the light-passing regions Z, as indicated by optical paths of arrows. That is, light is reflected to regions other than the light-passing regions Z as well, resulting in worse use efficiency of light.

Thus, a backlight part constituted by the light-emitting elements 5010, the protective film 5008 and the reflection film 5009 is formed on the liquid-crystal panel.

According to the LCD device of the above-described construction, since the light-emitting elements 5010 are placed on the first substrate 5001, the light-emitting elements 5010 are formed on one substrate out of two substrates constituting the LCD device. Therefore, the substrate for placement of light-emitting elements, which has been necessitated in conventional backlight devices, is no longer necessitated. Thus, the backlight part constituted by the light-emitting elements 5010 can be formed thin, so that a thin-type LCD device can be realized.

Also, since the TFTs 5004 as switching elements are provided on a liquid crystal 5003 side surface of the first substrate 5001, light emitted from the light-emitting elements 5010 goes incident on the liquid crystals 5003 from the first substrate 5001 side, on which the TFTs 5004 are formed. The point that light is incident from the first substrate 5001 side on which the TFTs 5004 are formed is the same with general LCD devices. Thus, there can be realized a thin-type LCD device without largely changing the construction of the LCD device.

Twenty-Ninth Embodiment

Figure 106:
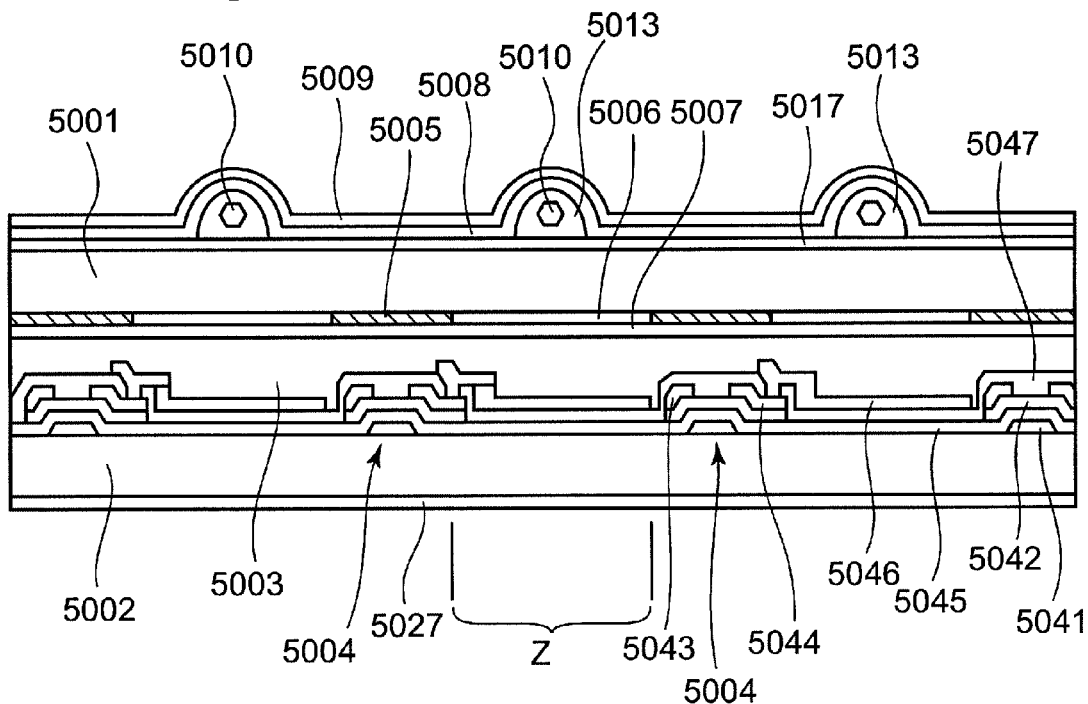

FIG. 106 shows an LCD device according to a twenty-ninth embodiment of the invention. This embodiment differs from the twenty-eighth embodiment in that in the twenty-ninth embodiment, the first substrate 5001 is a color filter substrate and the second substrate 5002 is a TFT substrate. In this twenty-ninth embodiment, like component parts in conjunction with the twenty-eighth embodiment are designated by like reference signs and their detailed description is omitted.

As shown in FIG. 106, a black matrix 5005 and a colored layer 5006 are provided on a liquid crystal 5003 side (lower side) surface of the first substrate 5001. This colored layer 5006 forms light-passing regions Z. Thus, the light-emitting elements 5010 are provided on the same substrate as the color filter substrate.

On the other hand, TFTs 5004 as switching elements are provided on a liquid crystal 5003 side (upper side) surface of the second substrate 5002. Therefore, light emitted from the light-emitting elements 5010 goes incident on liquid crystals from the substrate 5001 side opposite to the substrate 5002 side on which the TFTs 5004 are formed. Then, since the light-emitting elements 5010 and the TFTs 5004 can be formed on different substrates, respectively, the TFTs 5004 can be prevented from being damaged in the placement step of the light-emitting elements 5010, or the light-emitting elements 5010 can be prevented from being damaged in the formation step of the TFTs 5004.

Thirtieth Embodiment

Figure 107:
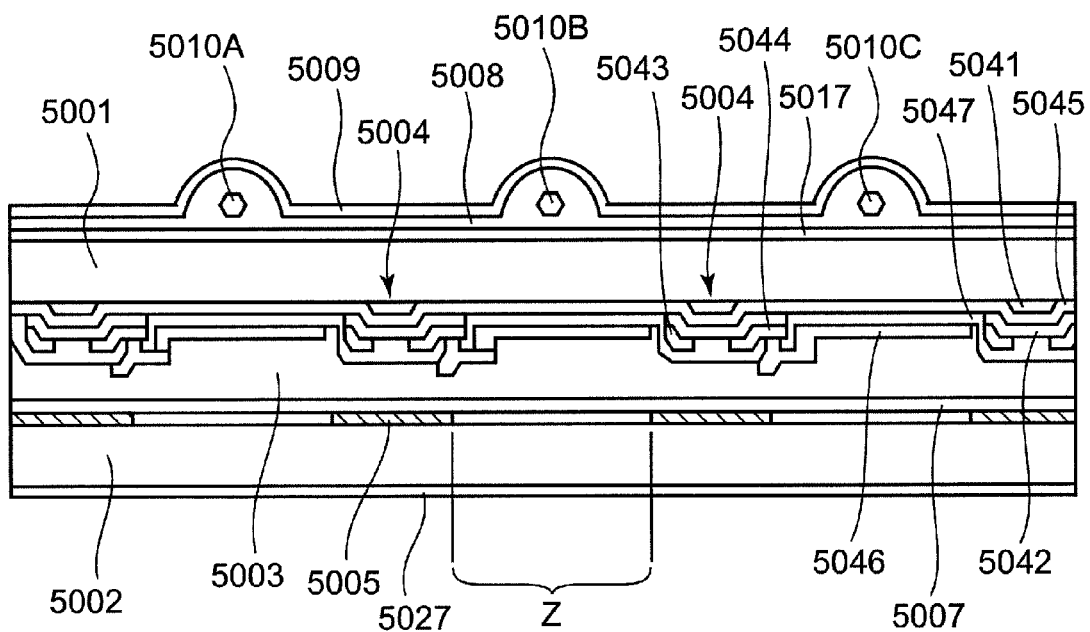

FIG. 107 shows an LCD device according to a thirtieth embodiment of the invention. This embodiment differs from the twenty-eighth embodiment in that in the thirtieth embodiment, light-emitting elements 5010A, 5010B, 5010C are provided in three types while the colored layer 5006 of FIG. 97 is not provided. In this thirtieth embodiment, like component parts in conjunction with the twenty-eighth embodiment are designated by like reference signs and their detailed description is omitted.

As shown in FIG. 107, the first light-emitting elements 5010A emit red light, the second light-emitting elements 5010B emit green light, and the third light-emitting elements 5010C emit blue light. Accordingly, there is no need for providing the colored layer 5006 in the light-passing regions Z directly under the individual light-emitting elements 5010A, 5010B, 5010C. That is, the black matrix 5005 only is provided on the liquid crystal 5003 side (upper side) surface of the second substrate 5002, and the second substrate 5002 becomes a filter substrate having a light-shield function.

Then, since the three types of light-emitting elements 5010A, 5010B, 5010C are provided as shown in FIG. 108, four electrodes 5051A, 5052A, 5053A, 5054A are necessitated. That is, one end of each of the light-emitting elements 5010A, 5010B, 5010C is connected to the first electrode 5051A, the other end of the first light-emitting element 5010A is connected to the second electrode 5052A, the other end of the second light-emitting element 5010B is connected to the third electrode 5053A, and the other end of the third light-emitting element 5010C is connected to the fourth electrode 5054A. The individual electrodes 5051A, 5052A, 5053A, 5054A serve also as driving electrodes.

Although the light-emitting elements of the twenty-eighth embodiment are provided in three types and the colored layer is omitted in the thirtieth embodiment, yet it is also allowable that the light-emitting elements of the twenty-ninth embodiment are provided in three types and the colored layer is omitted.

In addition, the present invention is not limited to the above-described embodiments. For example, individual features of the first to third embodiments may be combined together in various ways. Also, the light-emitting elements may be provided not only by light-emitting elements having so-called tubular-shaped light-emitting layers shown in the above embodiments but also by ordinary light-emitting elements having planar-shaped light-emitting layers.

Although the twenty-eighth to thirtieth embodiments have been described on light-emitting elements having the exposure portion 5011a where a one-end side outer peripheral surface of the semiconductor core 5011 is exposed, yet the light-emitting elements are not limited to this and may be ones having exposure portions where both-end outer peripheral surfaces of the semiconductor core are exposed, or otherwise ones having an exposure portion where a central-portion outer peripheral surface of the semiconductor core is exposed.

Further, although a semiconductor whose base material is GaN is used for the semiconductor core 5011 and the semiconductor layer 5012 in the twenty-eighth to thirtieth embodiments, yet the invention may also be applied to light-emitting elements using a semiconductor whose base material is GaAs, AlGaAs, GaAsP, InGaN, AlGaN, GaP, ZnSe, AlGaInP or the like. Also, although the semiconductor core is n-type and the semiconductor layer is p-type in the above description, yet the invention may also be applied to light-emitting elements of reversed conductive types. Also, although light-emitting elements having a hexagonal cylinder-shaped semiconductor core have been described above, yet the invention is, not limited to this and may be applied to light-emitting elements having a bar-like shape with a circular- or elliptical-shaped cross section, or light-emitting elements having a bar-like semiconductor core with a triangular- or other polygonal-shaped cross section.

Needless to say, further other embodiments of the invention may be constituted by including two or more embodiments out of the first to thirtieth embodiments. Also needless to say, still further embodiments of the invention may be constituted by including two or more embodiments or modifications out of the first to thirtieth embodiments and their modifications.

The invention claimed is:

1. A light-emitting device manufacturing method comprising:
   a placement step for placing a plurality of light-emitting elements on one substrate;
   an interconnection step for collectively connecting part or an entirety of metal lines to the plurality of light-emitting elements placed on the substrate; and
   a substrate dividing step for, after the placement step and the interconnection step, dividing the substrate into a plurality of divisional substrates to form a plurality of light-emitting devices in which a plurality of light-emitting elements are placed on the divisional substrates;
   wherein, in the interconnection step, each of the metal lines is placed so as to be connected to two or more of the light-emitting elements;
   wherein each of the metal lines is connected to a same region of the light-emitting element in each of the two or more of the light-emitting elements;
   wherein the metal lines are formed after the plurality of light-emitting elements are arranged on the substrate;
   wherein the substrate is an insulative substrate, and the light-emitting elements have a maximum size of 50 μm or less; and
   the insulative substrate is made of glass, ceramics, aluminum oxide or a resin.

2. The light-emitting device manufacturing method as claimed in claim 1, wherein
   the plurality of light-emitting elements are bar-like shaped, and
   the plurality of light-emitting elements are placed on the mounting surface of the substrate so that a longitudinal direction of the plurality of light-emitting elements becomes parallel to the mounting surface of the substrate.

3. The light-emitting device manufacturing method as claimed in claim 2, wherein
   each of the bar-like light-emitting elements has a tubular-shaped light-emitting surface that concentrically surrounds a bar-like core.

4. The light-emitting device manufacturing method as claimed in claim 3, wherein
   each of the bar-like light-emitting elements has a first-conductive-type bar-like semiconductor core, and a second-conductive-type tubular-shaped semiconductor layer covering an outer periphery of the semiconductor core, and
   a one-end side of the semiconductor core of the bar-like light-emitting element is exposed.

5. A light-emitting device manufacturing method comprising:
   a placement step for placing a plurality of light-emitting elements on one substrate;
   an interconnection step for collectively connecting part or an entirety of metal lines to the plurality of light-emitting elements placed on the substrate; and
   a substrate dividing step for, after the placement step and the interconnection step, dividing the substrate into a plurality of divisional substrates to form a plurality of light-emitting devices in which a plurality of light-emitting elements are placed on the divisional substrates;
   wherein each of the metal lines in each of the light-emitting devices is connected to three or more of the light-emitting elements;
   wherein the substrate is an insulative substrate, and the light-emitting elements have a maximum size of 50 μm or less; and
   the insulative substrate is made of glass, ceramics, aluminum oxide or a resin.

6. A light-emitting device manufacturing method comprising:
   a placement step for placing a plurality of light-emitting elements on one substrate;
   an interconnection step for collectively interconnecting part or an entirety of the plurality of light-emitting elements placed on the substrate; and
   a substrate dividing step for, after the placement step and the interconnection step, dividing the substrate into a plurality of divisional substrates to form a plurality of light-emitting devices in which a plurality of light-emitting elements are placed on the divisional substrates,
   wherein the plurality of light-emitting elements are bar-like shaped, and the plurality of light-emitting elements are placed on the mounting surface of the substrate so that a longitudinal direction of the plurality of light-emitting elements becomes parallel to the mounting surface of the substrate,
   wherein each of the bar-like light-emitting elements has a tubular-shaped light-emitting surface that concentrically surrounds a bar-like core,
   wherein each of the bar-like light-emitting elements has a first-conductive-type bar-like semiconductor core, and a second-conductive-type tubular-shaped semiconductor layer covers an outer periphery of the semiconductor core, and one-end side of the semiconductor core of the bar-like light-emitting element is exposed, and the semiconductor core projects from the semiconductor layer in an axial direction of the bar-like light-emitting element on the one-end side, and an outer periphery of the semiconductor core contacts an electrode.

7. The light-emitting device manufacturing method as claimed in claim 6, wherein
in the placement step, the plurality of light-emitting elements are collectively placed on the one substrate.

8. The light-emitting device manufacturing method as claimed in claim 6, wherein
an interconnect pattern for interconnecting the plurality of light-emitting elements is formed on the substrate, and
the interconnect pattern is not formed in cutting areas of the substrate involved in the substrate dividing step.

9. The light-emitting device manufacturing method as claimed in claim 6, wherein
an interconnect pattern for interconnecting the plurality of light-emitting elements is formed on the substrate, and
the interconnect pattern that, even if cut off in the substrate dividing step, does not affect electrical connections is formed in cutting areas of the substrate.

10. The light-emitting device manufacturing method as claimed in claim 6, wherein
the light-emitting elements are not placed in cutting areas of the substrate involved in the substrate dividing step.

11. The light-emitting device manufacturing method as claimed in claim 6, wherein
out of the plurality of light-emitting elements, those light-emitting elements which, even if cut off in the substrate dividing step, have no influence on a desired light emission quantity are placed in cutting areas of the substrate.

12. The light-emitting device manufacturing method as claimed in claim 6, further comprising:
a phosphor application step for, after the placement step and the interconnection step and before the substrate dividing step, applying a phosphor onto the substrate; and
a protective-film application step for, after the phosphor application step, applying a protective film onto the substrate.

13. The light-emitting device manufacturing method as claimed in claim 12, wherein
in the phosphor application step, the phosphor is applied selectively to regions where the plurality of light-emitting elements are placed.

14. The light-emitting device manufacturing method as claimed in claim 6, wherein
100 or more of the light-emitting elements are placed in each of the divisional substrates.

15. The light-emitting device manufacturing method as claimed in claim 6, wherein
in the substrate dividing step, the substrate is divided into at least two or more types of the divisional substrates of different shapes.

16. The light-emitting device manufacturing method as claimed in claim 6, wherein
the placement step for placing the plurality of light-emitting elements onto the substrate includes:
a substrate formation step for preparing the substrate having at least a first electrode and a second electrode on its mounting surface;
an application step for applying a solution containing the plurality of light-emitting elements onto the substrate; and
an array step for applying a voltage to at least the first electrode and the second electrode to make the plurality of light-emitting elements arrayed at positions defined by at least the first electrode and the second electrode.

17. The light-emitting device manufacturing method as claimed in claim 16, wherein
at least the first electrode and the second electrode are used as electrodes for driving the plurality of light-emitting elements.

18. The light-emitting device manufacturing method as claimed in claim 6, wherein
the plurality of light-emitting elements are a plurality of elements formed on an epitaxial substrate, and the individual elements are separated from on the epitaxial substrate.

19. A light-emitting device manufacturing method comprising:
a placement step for placing a plurality of light-emitting elements on one substrate;
an interconnection step for collectively connecting part or an entirety of metal lines to the plurality of light-emitting elements placed on the substrate; and
a substrate dividing step for, after the placement step and the interconnection step, dividing the substrate into a plurality of divisional substrates to form a plurality of light-emitting devices in which a plurality of light-emitting elements are placed on the divisional substrates;
wherein, in the interconnection step, each of the metal lines is placed so as to be connected to two or more of the light-emitting elements;
wherein each of the metal lines is connected to a same region of the light-emitting element in each of the two or more of the light-emitting elements;
wherein the metal lines are formed after the plurality of light-emitting elements are arranged on the substrate; and
wherein the substrate is an insulative transparent substrate or an insulative flexible board, and the light-emitting elements have a maximum size of 50 μm or less.

20. A light-emitting device manufacturing method comprising:
a placement step for placing a plurality of light-emitting elements on one substrate;
an interconnection step for collectively connecting part or an entirety of metal lines to the plurality of light-emitting elements placed on the substrate; and
a substrate dividing step for, after the placement step and the interconnection step, dividing the substrate into a plurality of divisional substrates to form a plurality of light-emitting devices in which a plurality of light-emitting elements are placed on the divisional substrates;
wherein, in the interconnection step, each of the metal lines is placed so as to be connected to two or more of the light-emitting elements;
wherein each of the metal lines is connected to a same region of the light-emitting element in each of the two or more of the light-emitting elements;
wherein the metal lines are formed after the plurality of light-emitting elements are arranged on the substrate;
wherein the substrate is an insulative substrate, and the light-emitting elements have a maximum size of 50 μm or less;
the insulative substrate is made of glass, ceramics, aluminum oxide or a resin; and
the light-emitting elements have a shape of a rectangular-shaped plate.

* * * * *